United States Patent
Koezuka et al.

(10) Patent No.: US 10,158,008 B2
(45) Date of Patent: Dec. 18, 2018

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP); Masami Jintyou, Shimotsuga (JP); Yukinori Shima, Tatebayashi (JP); Yasuharu Hosaka, Tochigi (JP); Yasutaka Nakazawa, Tochigi (JP); Takashi Hamochi, Tochigi (JP); Takahiro Sato, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/286,892

(22) Filed: Oct. 6, 2016

(65) Prior Publication Data

US 2017/0104089 A1 Apr. 13, 2017

(30) Foreign Application Priority Data

Oct. 12, 2015 (JP) .................... 2015-201657
Oct. 12, 2015 (JP) .................... 2015-201671

(51) Int. Cl.
*H01L 29/66* (2006.01)
*H01L 29/786* (2006.01)
(Continued)

(52) U.S. Cl.
CPC .... *H01L 29/66969* (2013.01); *H01L 21/0217* (2013.01); *H01L 21/02274* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |
| (Continued) | | |

FOREIGN PATENT DOCUMENTS

| EP | 1737044 A | 12/2006 |
| EP | 2226847 A | 9/2010 |
| (Continued) | | |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Whitney T Moore
(74) *Attorney, Agent, or Firm* — Robinson Intellectual Property Law Office; Eric J. Robinson

(57) ABSTRACT

A change in electrical characteristics of a semiconductor device including an oxide semiconductor is prevented, and the reliability of the semiconductor device is improved. An oxide semiconductor is formed over a substrate; an insulator is formed over the oxide semiconductor; a metal oxide is formed over the insulator; a conductor is formed over the metal oxide; a portion of the oxide semiconductor is exposed by removing the conductor, the metal oxide, and the insulator over the oxide semiconductor; plasma treatment is performed on a surface of the exposed portion of the oxide semiconductor; and a nitride insulator is formed over the exposed portion of the oxide semiconductor and over the (Continued)

conductor. The plasma treatment is performed in a mixed atmosphere of an argon gas and a nitrogen gas.

16 Claims, 97 Drawing Sheets

(51) Int. Cl.
    H01L 29/778      (2006.01)
    H01L 29/40       (2006.01)
    H01L 23/29       (2006.01)
    H01L 21/02       (2006.01)
    H01L 29/49       (2006.01)
    H01L 29/24       (2006.01)
    H01L 21/383      (2006.01)
    H01L 23/31       (2006.01)

(52) U.S. Cl.
    CPC .......... H01L 21/383 (2013.01); H01L 23/291
        (2013.01); H01L 23/3171 (2013.01); H01L
        29/24 (2013.01); H01L 29/408 (2013.01);
        H01L 29/4908 (2013.01); H01L 29/7781
        (2013.01); H01L 29/7782 (2013.01); H01L
        29/7786 (2013.01); H01L 29/7869 (2013.01);
        H01L 29/78696 (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,384,076 B2 | 2/2013 | Park et al. |
| 8,692,579 B2 | 4/2014 | Kato |
| 8,860,023 B2 | 10/2014 | Tsubuku et al. |
| 9,035,305 B2 | 5/2015 | Tsubuku et al. |
| 9,130,558 B2 | 9/2015 | Kato |
| 9,263,689 B2 | 2/2016 | O'Carroll et al. |
| 9,281,407 B2 | 3/2016 | Tsubuku et al. |
| 9,444,457 B2 | 9/2016 | Kato |
| 9,496,413 B2 | 11/2016 | Tsubuku et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252209 A1* | 11/2007 | Yamazaki ........... H01L 27/0207 257/347 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0128809 A1* | 6/2008 | Ohnuma ........... H01L 29/78675 257/347 |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0018727 A1 | 1/2012 | Endo et al. |
| 2012/0297219 A1 | 11/2012 | Kato |
| 2012/0313152 A1* | 12/2012 | Yokoi ............... H01L 21/02554 257/288 |
| 2012/0315735 A1 | 12/2012 | Koezuka et al. |
| 2013/0023087 A1 | 1/2013 | Yamazaki et al. |
| 2013/0062600 A1 | 3/2013 | Koezuka et al. |
| 2013/0069055 A1 | 3/2013 | Yamazaki et al. |
| 2013/0092925 A1 | 4/2013 | Saito et al. |
| 2013/0137255 A1 | 5/2013 | Yamade et al. |
| 2013/0164899 A1 | 6/2013 | Koezuka et al. |
| 2013/0187153 A1 | 7/2013 | Yamazaki et al. |
| 2013/0256652 A1 | 10/2013 | Lee et al. |
| 2013/0292675 A1 | 11/2013 | Tsubuku et al. |
| 2013/0309822 A1 | 11/2013 | Endo et al. |
| 2014/0001466 A1 | 1/2014 | Sasaki et al. |
| 2014/0001467 A1 | 1/2014 | Yamazaki et al. |

(56) References Cited

U.S. PATENT DOCUMENTS

| | | | |
|---|---|---|---|
| 2014/0120660 A1 | 5/2014 | Endo et al. | |
| 2014/0186998 A1 | 7/2014 | Koezuka et al. | |
| 2014/0206133 A1 | 7/2014 | Koezuka et al. | |
| 2014/0299876 A1 | 10/2014 | Yamade et al. | |
| 2014/0342499 A1 | 11/2014 | Koezuka et al. | |
| 2015/0140733 A1 | 5/2015 | Yamade et al. | |
| 2015/0155169 A1 | 6/2015 | Oota et al. | |
| 2015/0187878 A1 | 7/2015 | Yamazaki et al. | |
| 2015/0187953 A1* | 7/2015 | Koezuka | H01L 29/7869 257/43 |
| 2015/0221774 A1 | 8/2015 | Yamazaki et al. | |
| 2015/0228799 A1 | 8/2015 | Koezuka et al. | |
| 2015/0228803 A1 | 8/2015 | Koezuka et al. | |
| 2015/0249157 A1 | 9/2015 | Yamazaki et al. | |
| 2015/0249160 A1 | 9/2015 | Yamazaki et al. | |
| 2015/0263141 A1* | 9/2015 | Yamazaki | H01L 29/66969 438/104 |
| 2015/0263174 A1 | 9/2015 | Yamazaki et al. | |
| 2015/0333088 A1 | 11/2015 | Yamazaki et al. | |
| 2015/0348998 A1 | 12/2015 | Koezuka et al. | |
| 2015/0372022 A1 | 12/2015 | Okazaki et al. | |
| 2015/0372023 A1 | 12/2015 | Jintyou et al. | |
| 2016/0118502 A1 | 4/2016 | Yamazaki et al. | |
| 2016/0225795 A1 | 8/2016 | Koezuka et al. | |
| 2016/0268441 A1 | 9/2016 | Yamazaki et al. | |
| 2016/0284855 A1 | 9/2016 | Yamazaki et al. | |
| 2016/0343866 A1 | 11/2016 | Koezuka et al. | |
| 2016/0343868 A1 | 11/2016 | Koezuka et al. | |
| 2017/0104018 A1* | 4/2017 | Yamazaki | H01L 27/1218 |
| 2017/0170325 A1* | 6/2017 | Koezuka | H01L 21/465 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2009-278115 A | 11/2009 |
| JP | 2012-009836 A | 1/2012 |
| JP | 2012-257218 A | 12/2012 |
| JP | 2014-199896 A | 10/2014 |
| JP | 2015-181151 A | 10/2015 |
| JP | 2015-188079 A | 10/2015 |
| KR | 2013-0111872 A | 10/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A(Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society For Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janottia et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WSGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu, or Zn] at Temperatures Over 1000 ° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopabliity, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al.,"Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposures to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatement", Appl. Phys. Lett. (Applied Physics Letters) , Jun. 26, 2007, vol. 90, No. 26, pp. 262106-1-262106-3.

Park.S et al, "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2016/055941) dated Jan. 17, 2017.

Written Opinion (Application No. PCT/IB2016/055941) dated Jan. 17, 2017.

* cited by examiner

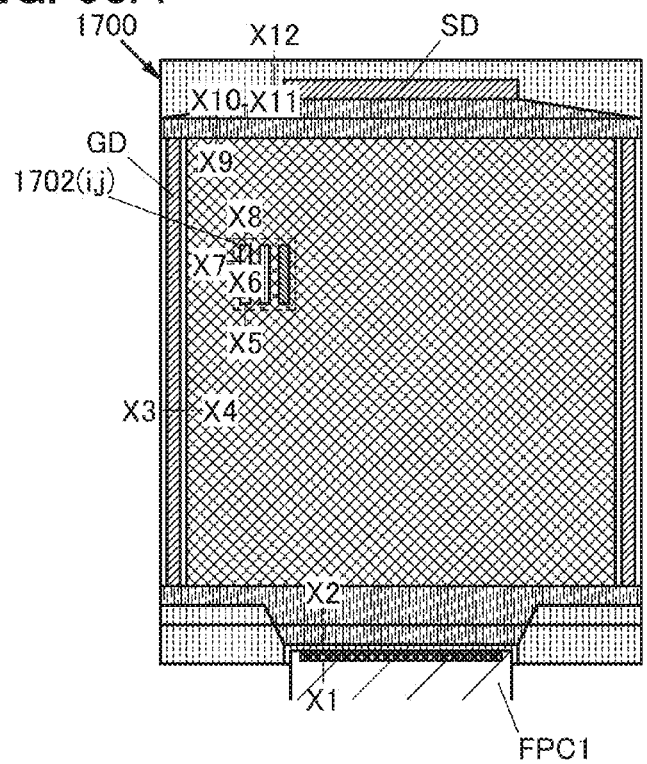
FIG. 53A
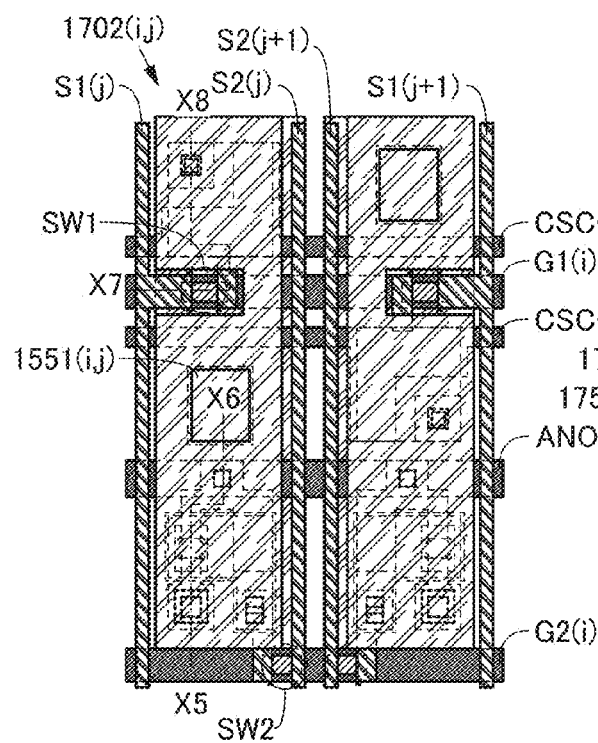
FIG. 53B1
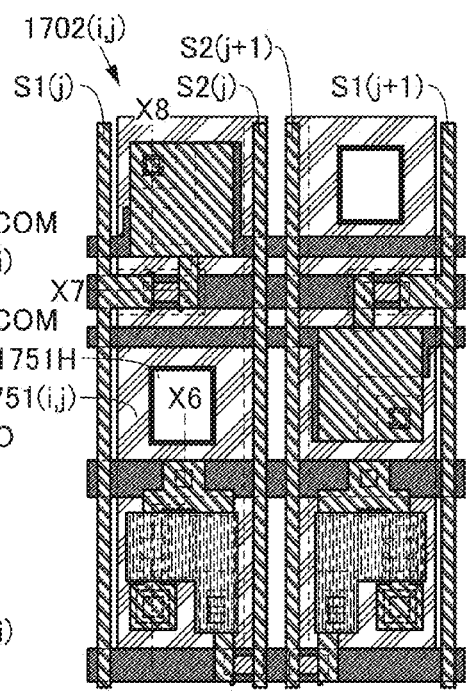
FIG. 53B2

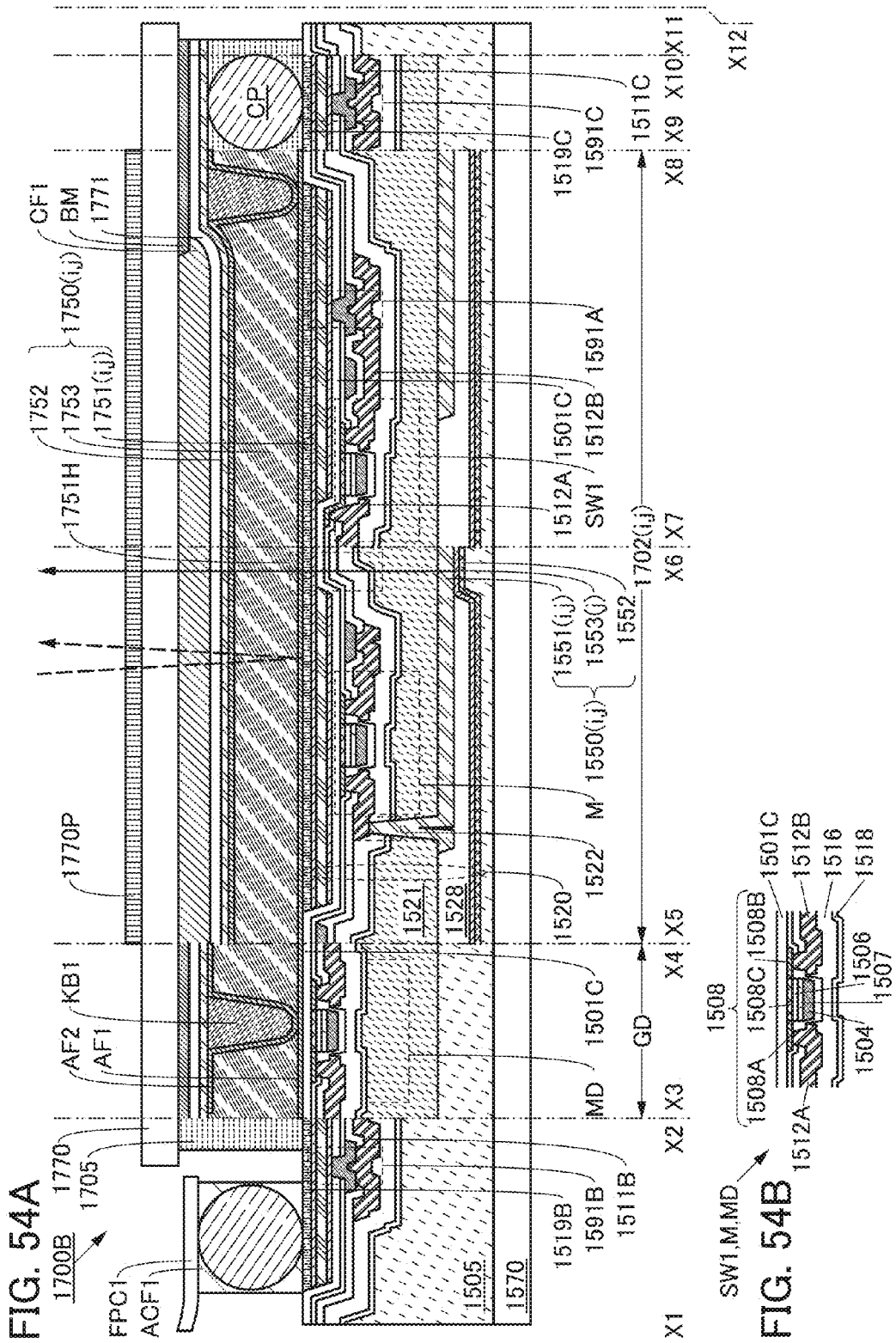

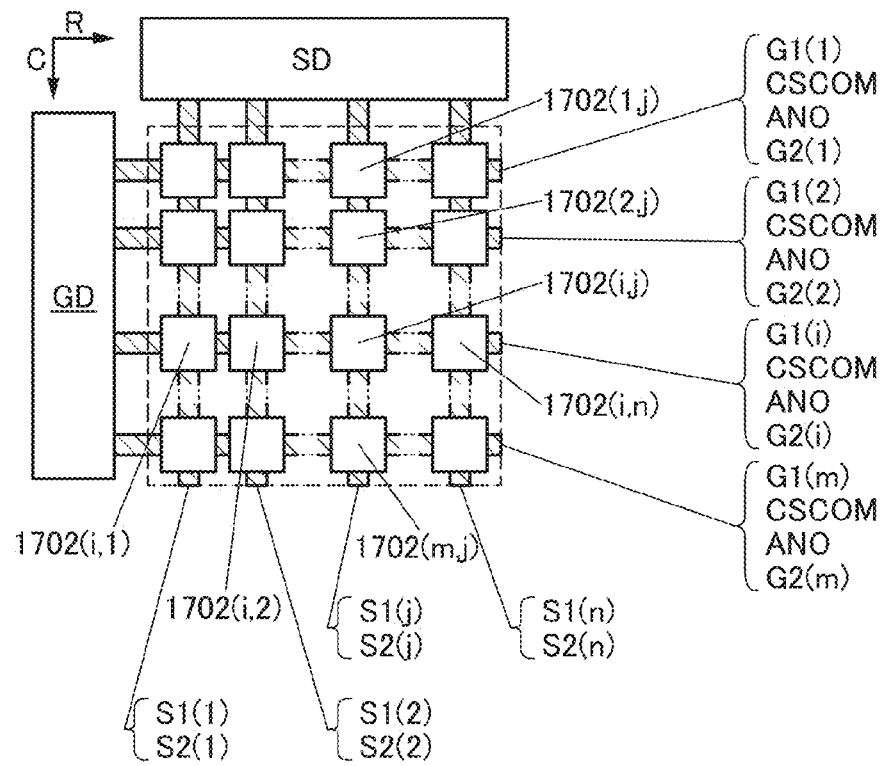
FIG. 56A
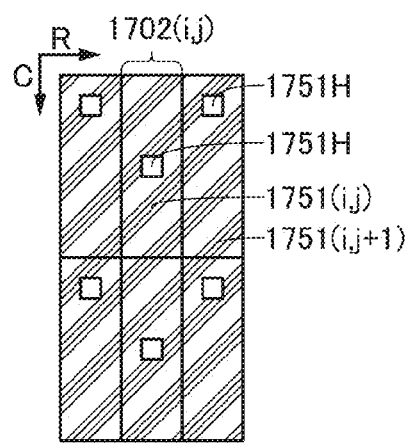
FIG. 56B1
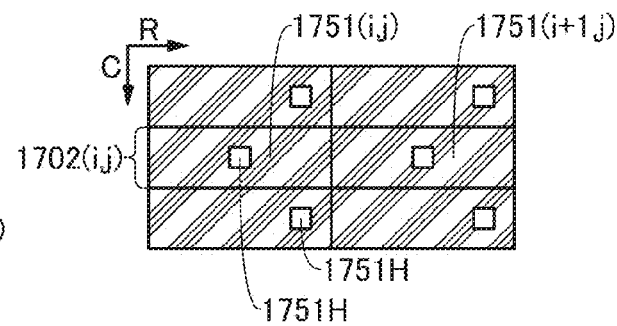
FIG. 56B2

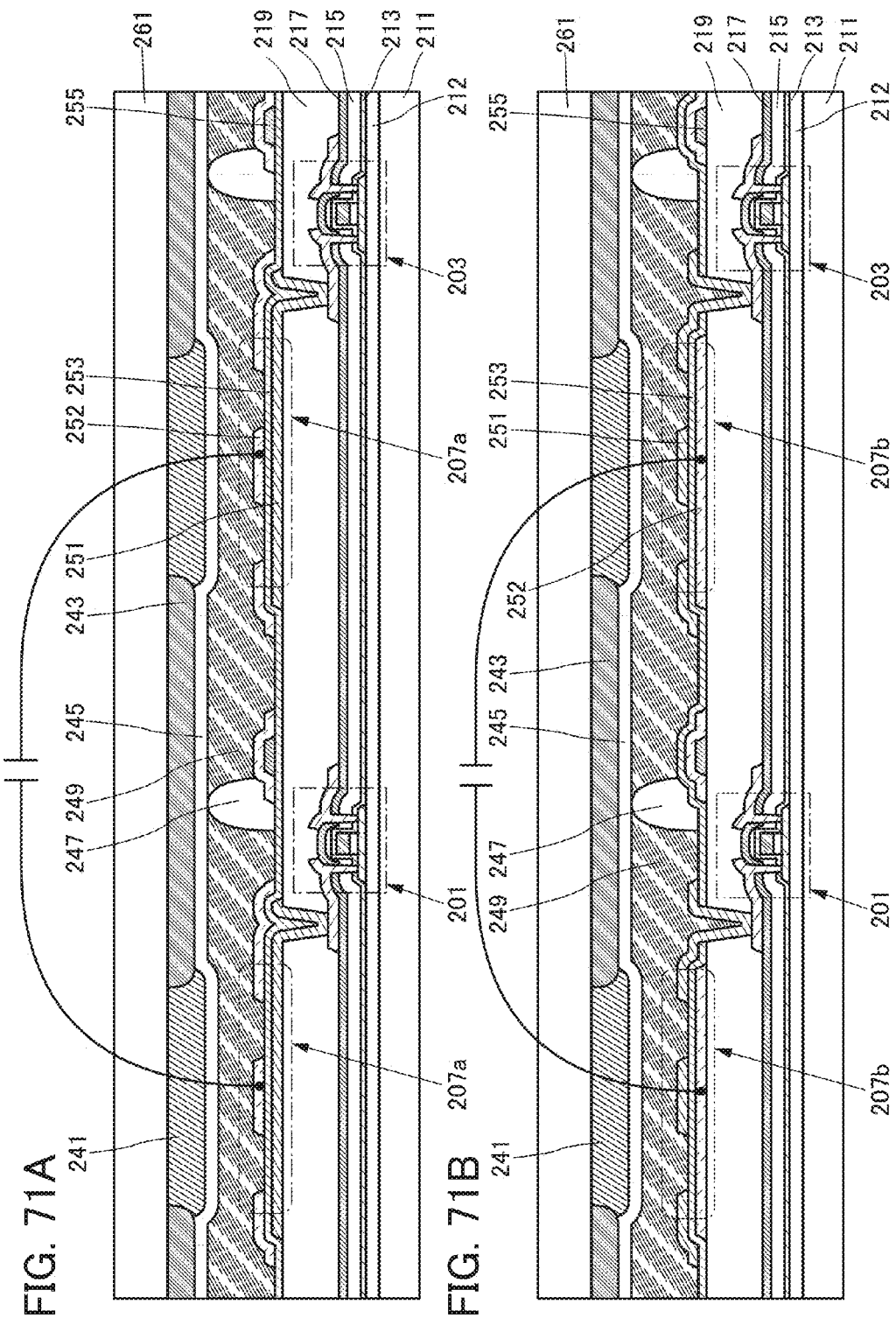

FIG. 78

| | sample G1 | sample G2 | sample G3 | sample G4 |
|---|---|---|---|---|
| thickness of 1110 | 20nm | | 50nm | |
| sheet resistance after formation of 1110 | 5.82E+03 | 4.99E+03 | 3.57E+06 | 4.20E+03 |
| sheet resistance after baking | 3.34E+04 | 1.03E+04 | 9.04E+09 | 5.31E+03 | unit:[Ω/□]

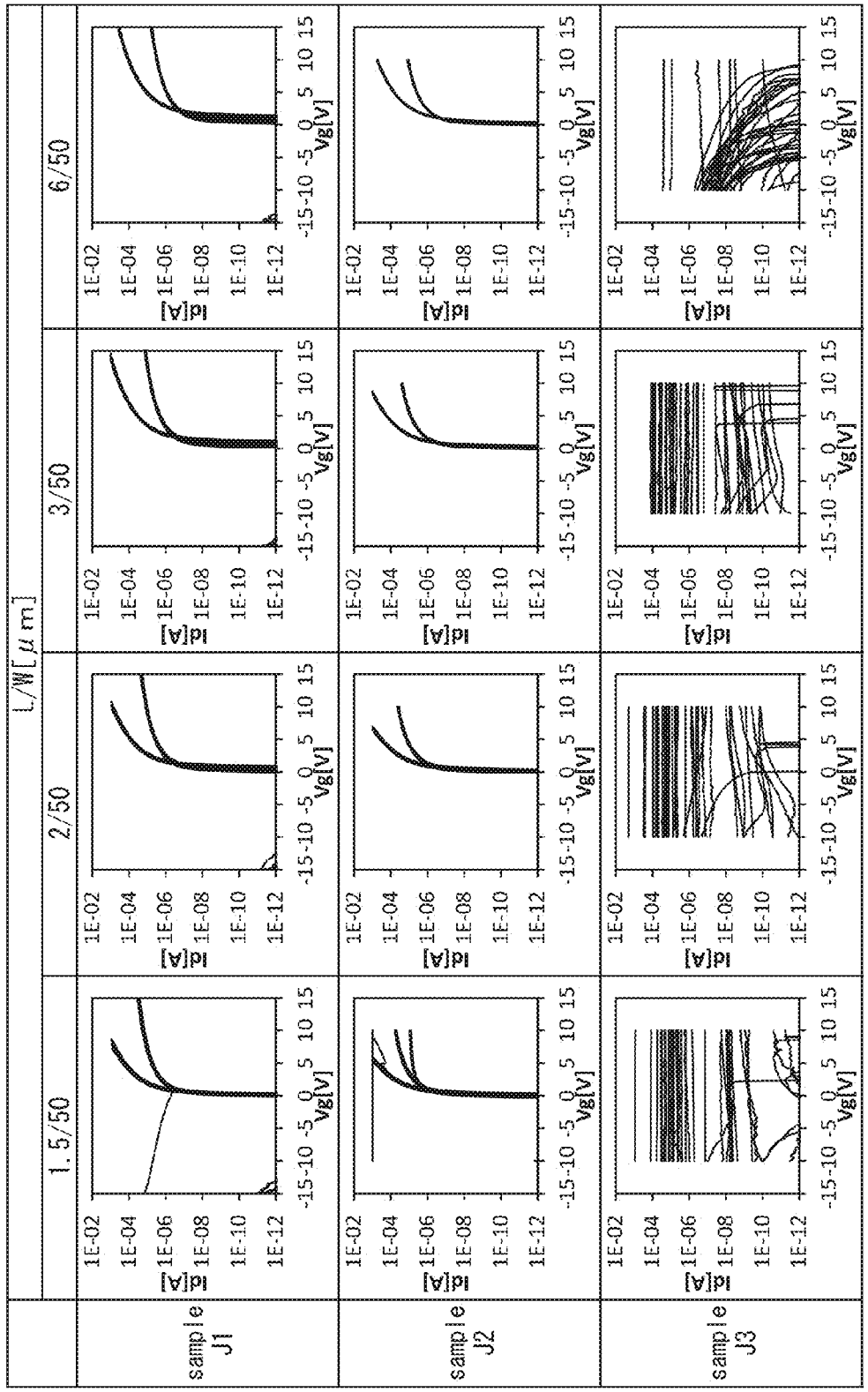

METHOD FOR MANUFACTURING SEMICONDUCTOR DEVICE

TECHNICAL FIELD

One embodiment of the present invention relates to a method for manufacturing a semiconductor device including an oxide semiconductor.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. One embodiment of the present invention particularly relates to a semiconductor device, a display device, a light-emitting device, a power storage device, a memory device, a driving method thereof, or a manufacturing method thereof.

In this specification and the like, the term "semiconductor device" means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

A technique for forming a transistor using an In—Ga—Zn-based oxide semiconductor is disclosed (see, for example, Patent Document 1). In addition, a technique for forming a self-aligned top-gate transistor using an oxide thin film is disclosed (see Patent Document 2).

Furthermore, a semiconductor device including, as a base insulator for an oxide semiconductor layer in which a channel is formed, an insulator that releases oxygen by heating to reduce oxygen vacancies in the oxide semiconductor layer is disclosed (see Patent Document 3).

PATENT DOCUMENTS

[Patent Document 1] Japanese Published Patent Application No. 2007-96055
[Patent Document 2] Japanese Published Patent Application No. 2009-278115
[Patent Document 3] Japanese Published Patent Application No. 2012-009836

DISCLOSURE OF INVENTION

In the case where a transistor is formed using an oxide semiconductor for a channel region, an oxygen vacancy which is formed in the channel region of the oxide semiconductor adversely affects the transistor characteristics. For example, the oxygen vacancy in the channel region of the oxide semiconductor causes carrier generation. The carrier generation in the channel region of the oxide semiconductor causes a change in the electrical characteristics, typically, a shift of the threshold voltage, of the transistor including the channel region in the oxide semiconductor. Furthermore, there is a problem in that electrical characteristics vary among transistors. Therefore, it is preferable that the number of oxygen vacancies in the channel region of the oxide semiconductor be as small as possible. Meanwhile, in the transistor formed using the oxide semiconductor for the channel region, the oxide semiconductor in regions in contact with a source electrode and a drain electrode preferably includes a large number of oxygen vacancies and has low resistance to reduce the contact resistance of the oxide semiconductor with the source electrode and the drain electrode.

One embodiment of the present invention is to provide a miniaturized transistor including an oxide semiconductor. Another object of one embodiment of the present invention is to provide a transistor including an oxide semiconductor and having low parasitic capacitance. Another object of one embodiment of the present invention is to prevent a change in electrical characteristics of a transistor including an oxide semiconductor and to improve the reliability of the transistor. Another object of one embodiment of the present invention is to provide a transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device using a low-resistance conductor, such as copper, as a wiring. Another object of one embodiment of the present invention is to provide a semiconductor device with low power consumption. Another object of one embodiment of the present invention is to provide a novel semiconductor device.

Note that the description of the above objects does not preclude the existence of other objects. One embodiment of the present invention does not necessarily achieve all the objects. Other objects are apparent from and can be derived from the description of the specification and the like.

One embodiment of the present invention is a semiconductor device including an oxide semiconductor over a substrate, an insulator over the oxide semiconductor, a metal oxide over the insulator, and a nitride insulator over the oxide semiconductor, the insulator, and the metal oxide. The channel length of a transistor is more than or equal to 0.2 μm and less than 1.5 μm. The thickness of the insulator is more than or equal to 10 nm and less than or equal to 200 nm.

In the above embodiment, the channel length may be more than or equal to 0.5 μm and less than or equal to 1.0 μm.

In the above embodiment, the thickness of the insulator may be more than or equal to 20 nm and less than or equal to 150 nm. In the above embodiment, the dielectric strength of the transistor is preferably more than or equal to $8.0 \times 10^6$ V/cm.

One embodiment of the present invention is a method for manufacturing a semiconductor device, including the steps of: forming an oxide semiconductor over a substrate; forming an insulator over the oxide semiconductor; forming a metal oxide over the insulator; forming a conductor over the metal oxide; exposing a portion of the oxide semiconductor by removing the conductor, the metal oxide, and the insulator over the oxide semiconductor; performing plasma treatment on a surface of the exposed portion of the oxide semiconductor; and forming a nitride insulator over the exposed portion of the oxide semiconductor and over the conductor. The plasma treatment is performed in a mixed atmosphere of an argon gas and a nitrogen gas.

In the above embodiment, the plasma treatment may be performed at a temperature higher than or equal to 150° C. and lower than 300° C.

In the above embodiment, the formation of the nitride insulator may be performed at a temperature higher than or equal to 150° C. and lower than 300° C.

In the above embodiment, the plasma treatment and the formation of the nitride insulator may be successively performed using a plasma CVD apparatus.

In the above embodiment, the metal oxide may function as a gate insulator.

In the above embodiment, the metal oxide may function as a gate electrode.

One embodiment of the present invention is a method for manufacturing an electronic device. The electronic device includes a semiconductor device, an antenna, a battery, an operation key, or a housing. The semiconductor device is manufactured by the method for manufacturing a semiconductor device in the above embodiment.

According to one embodiment of the present invention, a change in electrical characteristics of a transistor including an oxide semiconductor can be prevented and the reliability of the transistor can be improved. According to another embodiment of the present invention, a transistor including an oxide semiconductor can be provided. According to another embodiment of the present invention, a transistor including an oxide semiconductor and having high on-state current can be provided. According to another embodiment of the present invention, a transistor including an oxide semiconductor and having low off-state current can be provided. According to another embodiment of the present invention, a semiconductor device with low power consumption can be provided. According to another embodiment of the present invention, a novel semiconductor device can be provided.

Note that the description of these effects does not preclude the existence of other effects. One embodiment of the present invention does not necessarily have all the effects. Other effects are apparent from and can be derived from the description of the specification, the drawings, the claims, and the like.

BRIEF DESCRIPTION OF DRAWINGS

FIGS. 53A, 53B1, and 53B2 illustrate a structure of a display panel according to an embodiment.

FIGS. 54A and 54B illustrate a structure of a display panel according to an embodiment.

FIGS. 56A, 56B1, and 56B2 illustrate a structure of a display panel according to an embodiment.

FIGS. 71A and 71B are cross-sectional views each illustrating an example of an input/output device.

FIG. 78 shows sheet resistance measurement results of Example.

FIG. 82 shows $I_d$-$V_g$ characteristics of transistors in Example.

BEST MODE FOR CARRYING OUT THE INVENTION

Figure 1:
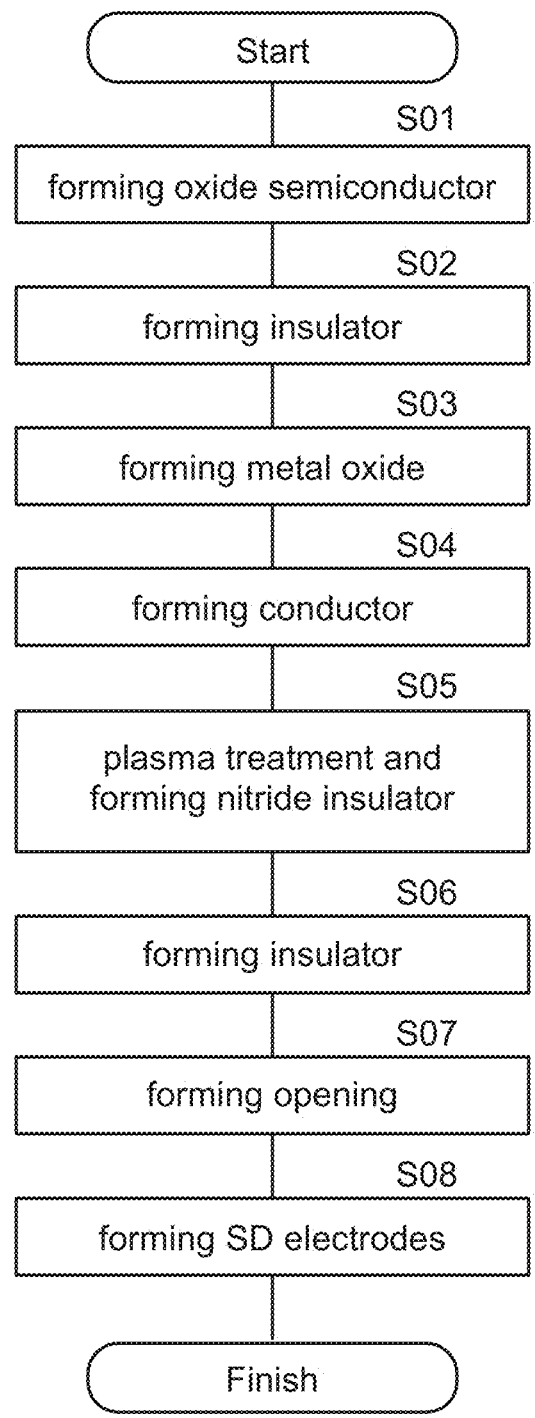
FIG. 1 is a process flow chart showing a method for manufacturing a semiconductor device.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Ordinal numbers such as "first," "second," and "third" in this specification are used in order to avoid confusion among components, and the terms do not limit the components numerically.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source. Note that in this specification and the like, a channel region refers to a region through which current mainly flows.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean there is $V_{gs}$ at which the off-state current of the transistor is lower than or equal to I. The off-state current of a transistor may refer to off-state current at a given $V_{gs}$, at $V_{gs}$ in a given range, or at $V_{gs}$ at which sufficiently low off-state current is obtained, for example.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of −0.5 V, and $1 \times 10^{-22}$ A at $V_{gs}$ of −0.8 V. The drain current of the transistor is $1 \times 10^{-19}$ A or lower at $V_{gs}$ of −0.5 V or at $V_{gs}$ in the range of −0.8 V to −0.5 V; therefore, it can be said that the off-state current of the transistor is $1 \times 10^{-19}$ A or lower. Since there is $V_{gs}$ at which the drain current of the transistor is $1 \times 10^{-22}$ A or lower, it may be said that the off-state current of the transistor is $1 \times 10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like is used (e.g., a temperature in the range of 5° C. to 35° C.) is I or lower at a certain $V_{gs}$.

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like is lower than or equal to I at a certain $V_{gs}$.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In an oxide semiconductor, an oxygen vacancy may be formed by entry of an impurity such as hydrogen. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

Embodiment 1

In this embodiment, examples of a semiconductor device including a transistor and a method for manufacturing the semiconductor device will be described with reference to FIG. 1, FIG. 2, FIGS. 3A to 3C, FIGS. 4A to 4C, FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B, FIGS. 13A and 13B, FIGS. 14A and 14B, FIGS. 15A to 15D, FIGS. 16A to 16D, FIGS. 17A and 17B, FIGS. 18A to 18D, FIGS. 19A to 19D, and FIGS. 20A to 20C.

<1-1. Structural Example 1 of Semiconductor Device>

Figure 3A:
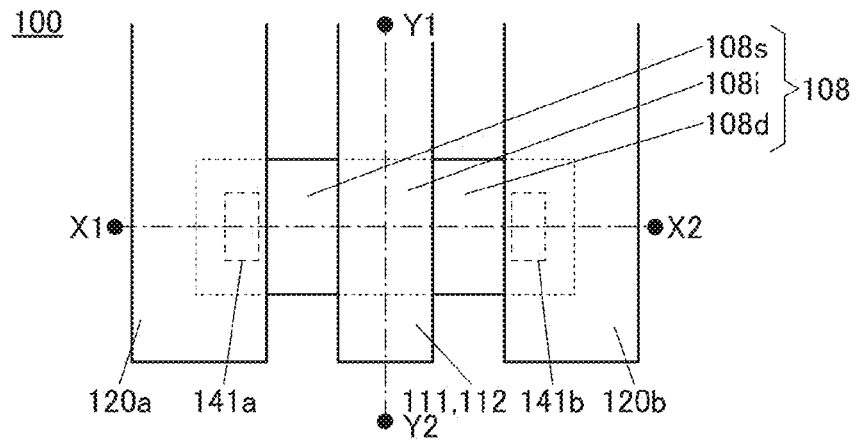
FIGS. 3A to 3C are a top view and cross-sectional views illustrating a semiconductor device.
Figure 3B:
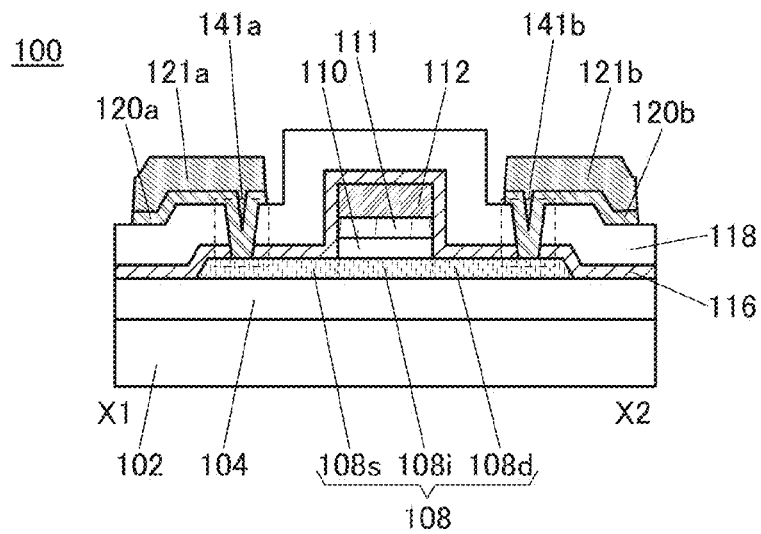
Figure 3C:
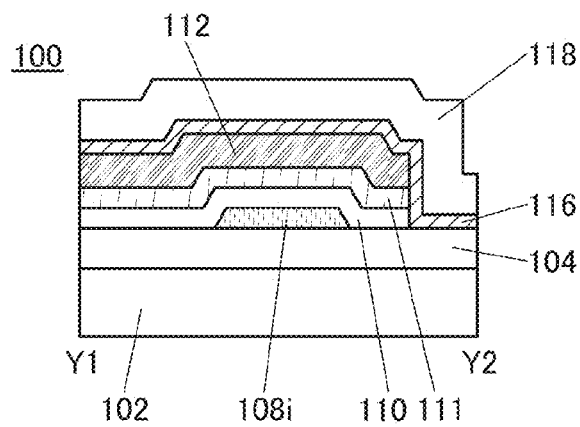

FIGS. 3A to 3C illustrate an example of a transistor included in a semiconductor device.

FIG. 3A is a top view of a transistor 100. FIG. 3B is a cross-sectional view taken along dashed-dotted line X1-X2 in FIG. 3A. FIG. 3C is a cross-sectional view taken along dashed-dotted line Y1-Y2 in FIG. 3A. For clarity, FIG. 3A does not illustrate some components such as an insulator 110. As in FIG. 3A, some components are not illustrated in some cases in top views of transistors described below.

Furthermore, the direction of dashed-dotted line X1-X2 may be referred to as a channel length (L) direction, and the direction of dashed-dotted line Y1-Y2 may be referred to as a channel width (W) direction.

The transistor 100 illustrated in FIGS. 3A to 3C includes an insulator 104 over a substrate 102; an oxide semiconductor 108 over the insulator 104; the insulator 110 over the oxide semiconductor 108; a metal oxide 111 over the insulator 110; a conductor 112 over the metal oxide 111; and an insulator 116 over the insulator 104, the oxide semiconductor 108, and the conductor 112. Note that the oxide semiconductor 108 includes a region 108$i$ overlapping with the conductor 112, a region 108$s$ in contact with the insulator 116, and a region 108$d$ in contact with the insulator 116.

Furthermore, the insulator 116 contains nitrogen or hydrogen. The insulator 116 is in contact with the region 108$s$ and the region 108$d$, so that nitrogen or hydrogen that is contained in the insulator 116 is added to the region 108$s$ and the region 108$d$. The region 108$s$ and the region 108$d$ each have a high carrier density when nitrogen or hydrogen is added thereto. The region 108$i$ functions as a channel region, the region 108$s$ functions as a source region, and the region 108$d$ functions as a drain region.

The transistor 100 may further include an insulator 118 over the insulator 116; conductors 120$a$ and 121$a$ electrically connected to the region 108$s$ through an opening 141$a$ provided in the insulators 116 and 118; and conductors 120$b$ and 121$b$ electrically connected to the region 108$d$ through an opening 141$b$ provided in the insulators 116 and 118.

In this specification and the like, the insulator 104 may be referred to as a first insulator, the insulator 110 may be referred to as a second insulator, the insulator 116 may be referred to as a third insulator, and the insulator 118 may be referred to as a fourth insulator. The conductor 112 functions as a gate electrode, the conductors 120$a$ and 121$a$ function as a source electrode, and the conductors 120$b$ and 121$b$ function as a drain electrode.

The insulator 110 and the metal oxide 111 function as a gate insulator. The insulator 110 includes an oxygen excess region. The insulator 110 is an insulator in which oxygen can be moved. In other words, the insulator 110 may be an insulator having oxygen permeability. For example, the insulator 110 may be an insulator having higher oxygen permeability than the oxide semiconductor 108 and the metal oxide 111.

Excess oxygen released from the insulator 110 is unlikely to diffuse to the conductor 112 side and is efficiently supplied to the region 108$i$ of the oxide semiconductor 108. As a result, oxygen vacancies that might be formed in the region 108$i$ can be filled with excess oxygen, which can provide a highly reliable semiconductor device.

To supply excess oxygen to the oxide semiconductor 108, excess oxygen may be supplied to the insulator 104 that is formed under the oxide semiconductor 108. However, in that case, excess oxygen contained in the insulator 104 might also be supplied to the region 108$s$ and the region 108$d$ included in the oxide semiconductor 108. When excess oxygen is supplied to the region 108$s$ and the region 108$d$, the resistance of the region 108$s$ and the region 108$d$ might be increased.

In contrast, in the structure in which the insulator 110 formed over the oxide semiconductor 108 contains excess oxygen, excess oxygen can be selectively supplied only to the region 108$i$.

Each of the regions 108$s$ and 108$d$ of the oxide semiconductor 108 contains an oxygen vacancy. In some cases, the oxygen vacancy is formed by addition of, typically, hydrogen, boron, carbon, nitrogen, fluorine, phosphorus, sulfur, chlorine, titanium, a rare gas, or the like. Typical examples of the rare gas include helium, neon, argon, krypton, and xenon. Therefore, such an element may be detected in the regions 108s and 108d in some cases. In the case where the above element which forms an oxygen vacancy is contained in the insulator 116, the constituent element of the insulator 116 diffuses into the regions 108s and 108d. Alternatively, the element which forms an oxygen vacancy is added to the regions 108s and 108d by impurity addition treatment.

An impurity element added to the oxide semiconductor cuts a bond between a metal element and oxygen in the oxide semiconductor and causes the release of oxygen, so that an oxygen vacancy is formed. Alternatively, an impurity element added to the oxide semiconductor is bonded to oxygen in the oxide semiconductor. When oxygen bonded to the impurity element is released from the oxide semiconductor, an oxygen vacancy is formed. As a result, carriers are increased in the oxide semiconductor, and thus, the conductivity thereof becomes higher.

Since the region 108s and the region 108d are in contact with the insulator 116, hydrogen or nitrogen is added from the insulator 116 to the region 108s and the region 108d; thus, the carrier density of the region 108s and the region 108d is increased.

For the structure in which the insulator 110 contains excess oxygen, a step performed after the insulator 110 is formed plays an important role. The deposition conditions of the insulator 116 are particularly important. In the case where the insulator 116 is formed at high temperatures (specifically, higher than or equal to 300° C. and lower than or equal to 450° C.), for example, excess oxygen might be released from a side surface of the insulator 110 to the outside. Thus, in a method for manufacturing a semiconductor device of one embodiment of the present invention, the formation temperature of the insulator 116 is set higher than or equal to 150° C. and lower than 300° C., preferably higher than or equal to 160° C. and lower than or equal to 270° C., and further preferably higher than or equal to 180° C. and lower than or equal to 250° C.

Here, a method for manufacturing the transistor 100 in FIGS. 3A to 3C will be described with reference to FIG. 1. Note that FIG. 1 is a process flow chart showing a method for manufacturing a semiconductor device.

The transistor 100 illustrated in FIGS. 3A to 3C is manufactured through at least first to eighth steps in FIG. 1.

[First Step: Formation of Oxide Semiconductor]

The first step includes a step of forming an oxide semiconductor (see Step S01 in FIG. 1). In the case of the transistor 100, the first step corresponds to a step of forming the oxide semiconductor 108 in the following manner: an oxide semiconductor is formed over the insulator 104, and then, the oxide semiconductor is processed into an island shape.

[Second Step: Formation of Insulator]

The second step includes a step of forming an insulator (see Step S02 in FIG. 1). In the case of the transistor 100, the second step corresponds to a step of forming the insulator 110 over the oxide semiconductor 108. Note that the insulator 110 preferably contains excess oxygen.

[Third Step: Formation of Metal Oxide]

The third step includes a step of forming a metal oxide (see Step S03 in FIG. 1). In the case of the transistor 100, the third step corresponds to a step of forming the metal oxide 111 over the insulator 110. Note that when formed using an insulating material, the metal oxide 111 functions as a gate insulator.

The metal oxide 111 is preferably deposited using a sputtering apparatus. By a sputtering method, an oxygen excess region can be easily formed in the insulator 110 which is under the metal oxide 111.

During deposition by a sputtering method, ions and sputtered particles exist between a target and the substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference $(E_2-E_0)$ and collide with the target; accordingly, the sputtered particles are ejected from the target. These sputtered particles attach to a deposition surface, thereby forming the metal oxide 111. Some ions recoil by the target and might be taken into the insulator 110, which is under the formed film, as recoil ions through the metal oxide 111. The ions in the plasma are accelerated by a potential difference $(E_2-E_1)$ and collide with the deposition surface. Some ions reach the inside of the insulator 110. The ions are taken into the insulator 110, whereby a region into which the ions are taken is formed in the insulator 110. That is, an oxygen excess region is formed in the insulator 110 in the case where the ions include oxygen.

[Fourth Step: Formation of Conductor]

The fourth step includes a step of forming a conductor (see Step S04 in FIG. 1). In the case of the transistor 100, the fourth step corresponds to a step of forming the conductor 112 over the metal oxide 111.

[Fifth Step: Formation of Nitride Insulator]

The fifth step includes a step of forming a nitride insulator over the oxide semiconductor and the gate electrode (see Step S05 in FIG. 1). In the fifth step, the nitride insulator is formed through at least two steps: plasma treatment and deposition treatment. The two steps are each performed at a temperature higher than or equal to 150° C. and lower than 300° C.

In the case of the transistor 100, the fifth step corresponds to a step of forming the insulator 116 over the oxide semiconductor 108 and the conductor 112.

As described above, the formation temperature of the insulator 116 is set higher than or equal to 150° C. and lower than 300° C., preferably higher than or equal to 160° C. and lower than or equal to 270° C., and further preferably higher than or equal to 180° C. and lower than or equal to 250° C. With the formation temperature of the insulator 116 in the above range, oxygen release from the side surface of the insulator 110 can be suppressed. Furthermore, with the formation temperature of the insulator 116 in the above range, diffusion of nitrogen or hydrogen contained in the insulator 116 into the insulator 110 can be suppressed.

The insulator 116 is formed through two steps: plasma treatment and deposition treatment. It is preferable that the plasma treatment be performed in a mixed atmosphere of an argon gas and a nitrogen gas. It is also preferable that the deposition treatment be performed using a silane gas, a nitrogen gas, and an ammonia gas.

The plasma treatment has an effect of forming oxygen vacancies in the regions 108s and 108d of the oxide semiconductor 108 by plasma damage and thus reducing the resistance of the regions 108s and 108d. By heat application, hydrogen in the region 108i of the oxide semiconductor 108 diffuses into the regions 108s and 108d. Hydrogen in an oxygen vacant site is energetically stable, as described in the specification of United States Patent Application Publication No. 2015/155169. Therefore, hydrogen diffused from the region 108i stably exists in the regions 108s and 108d, and thus, hydrogen in the region 108i can be reduced. In addition, hydrogen is supplied to the regions 108s and 108d, whereby the carrier density therein can be increased.

The use of an ammonia gas for the deposition treatment can reduce a nitrogen oxide ($NO_x$, where x is greater than 0 and less than or equal to 2 and preferably greater than or equal to 1 and less than or equal to 2; typified by NO or $NO_2$) that might be formed in the insulator 110. Note that it is preferable to perform the plasma treatment and the deposition treatment in succession in a vacuum with a plasma-enhanced chemical vapor deposition apparatus (also referred to as a PECVD apparatus or simply a plasma CVD apparatus) because manufacturing cost can be reduced.

[Sixth Step: Formation of Insulator]

The sixth step includes a step of forming an insulator over the nitride insulator (see Step S06 in FIG. 1). In the case of the transistor 100, the sixth step corresponds to a step of forming the insulator 118 over the insulator 116.

[Seventh Step: Formation of Opening]

The seventh step includes a step of forming an opening in the nitride insulator and the insulator (see Step S07 in FIG. 1). In the case of the transistor 100, the seventh step corresponds to a step of forming the openings 141a and 141b that reach the oxide semiconductor 108 in the insulator 116 and the insulator 118.

[Eighth Step: Formation of SD Electrodes]

The eighth step includes a step of forming a source electrode and a drain electrode (also referred to as SD electrodes) over the insulator so as to cover the opening (see Step S08 in FIG. 1). In the case of the transistor 100, the eighth step corresponds to a step of forming the conductors 120a, 120b, 121a, and 121b in the following manner: a conductor is formed over the insulator 118 and the conductor is processed into an island shape.

The details of the method for manufacturing the transistor 100 will be described later.

As described above, in the method for manufacturing a semiconductor device of one embodiment of the present invention, the third step, that is, the step of forming the metal oxide, is performed; accordingly, the oxygen excess region can be formed in the insulator 110. In addition, the fifth step, that is, the step of forming the nitride insulator, is performed at a temperature higher than or equal to 150° C. and lower than 300° C.; accordingly, oxygen release from the side surface of the insulator containing excess oxygen to the outside can be suppressed. Furthermore, the density of the metal oxide 111 is higher than that of the insulator 110; accordingly, oxygen diffusion from the region 108i and the insulator 110 to the conductor 112 side can be suppressed. As a result, a change in electrical characteristics of a transistor including an oxide semiconductor can be prevented and the reliability of the transistor can be improved.

Next, details of the components of the semiconductor device in FIGS. 3A to 3C will be described.

[Substrate]

The type of the substrate 102 is not limited to a certain type, and any of a variety of substrates can be used as the substrate 102. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a bonding film, paper containing a fibrous material, and a base film. As an example of a glass substrate, a barium borosilicate glass substrate, an aluminoborosilicate glass substrate, a soda lime glass substrate, or the like can be given. Examples of a flexible substrate, a bonding film, a base film, and the like include substrates of plastics typified by polyethylene terephthalate (PET), polyethylene naphthalate (PEN), and polyether sulfone (PES). Another example is a substrate of a synthetic resin such as acrylic. Other examples are substrates of polypropylene, polyester, polyvinyl fluoride, and polyvinyl chloride. Other examples are substrates of polyamide, polyimide, aramid, epoxy, an inorganic vapor deposition film, and paper. Specifically, when a transistor is formed using a semiconductor substrate, a single crystal substrate, an SOI substrate, or the like, it is possible to form a transistor with a small variation in characteristics, size, shape, or the like and with a high current capability and a small size. By forming a circuit with the use of such a transistor, power consumption of the circuit can be reduced or the circuit can be highly integrated.

Alternatively, a flexible substrate may be used as the substrate 102, and the transistor may be provided directly on the flexible substrate. Further alternatively, a separation layer may be provided between the substrate 102 and the transistor. The separation layer can be used when part or the whole of a semiconductor device formed over the separation layer is completed and separated from the substrate 102 and transferred to another substrate. In such a case, the transistor can be transferred to a substrate having low heat resistance or a flexible substrate as well. For example, the above separation layer can be an organic resin film of polyimide or the like formed over the substrate or a stack including inorganic films (e.g., a tungsten film and a silicon oxide film).

In addition to the above substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent characteristics or a transistor with low power consumption can be formed, a device with high durability can be formed, heat resistance can be provided, or reduction in weight or thickness can be achieved.

[First Insulator]

The insulator 104 can be formed by a sputtering method, a chemical vapor deposition (CVD) method, an evaporation method, a pulsed laser deposition (PLD) method, a printing method, a coating method, or the like as appropriate. For example, the insulator 104 can be formed to have a single-layer structure or stacked-layer structure of an insulator and/or a nitride insulator. To improve the properties of the interface with the oxide semiconductor 108, at least a region of the insulator 104 which is in contact with the oxide semiconductor 108 is preferably formed using an insulator. When the insulator 104 is formed using an insulator from which oxygen is released by heating, oxygen contained in the insulator 104 can be moved to the oxide semiconductor 108 by heat treatment.

The thickness of the insulator 104 can be greater than or equal to 50 nm, greater than or equal to 100 nm and less than or equal to 3000 nm, or greater than or equal to 200 nm and less than or equal to 1000 nm. By increasing the thickness of the insulator 104, the amount of oxygen released from the insulator 104 can be increased, and interface states at the interface between the insulator 104 and the oxide semiconductor 108 and oxygen vacancies included in the region 108i of the oxide semiconductor 108 can be reduced.

For example, the insulator 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulator 104 has a stacked-layer structure of a silicon nitride film and a silicon oxynitride film. With the insulator 104 having such a stacked-layer structure including a silicon nitride film as a lower layer and a silicon oxynitride film as an upper layer, oxygen can be efficiently introduced into the oxide semiconductor 108.

[Oxide Semiconductor]

The oxide semiconductor 108 is formed using a metal oxide such as an In-M-Zn oxide (M is Al, Ga, Y, or Sn). Alternatively, an In—Ga oxide or an In—Zn oxide may be used for the oxide semiconductor 108.

An oxide semiconductor according to the present invention will be described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

Next, preferred ranges of atomic ratios of indium to the element M and zinc in the oxide semiconductor according to the present invention will be described with reference to FIGS. 39A to 39C. Note that the proportion of oxygen atoms is not illustrated in FIGS. 39A to 39C. The terms of the atomic ratio of indium to the element M and zinc in the oxide semiconductor are denoted by [In], [M], and [Zn], respectively.

Figure 39A:
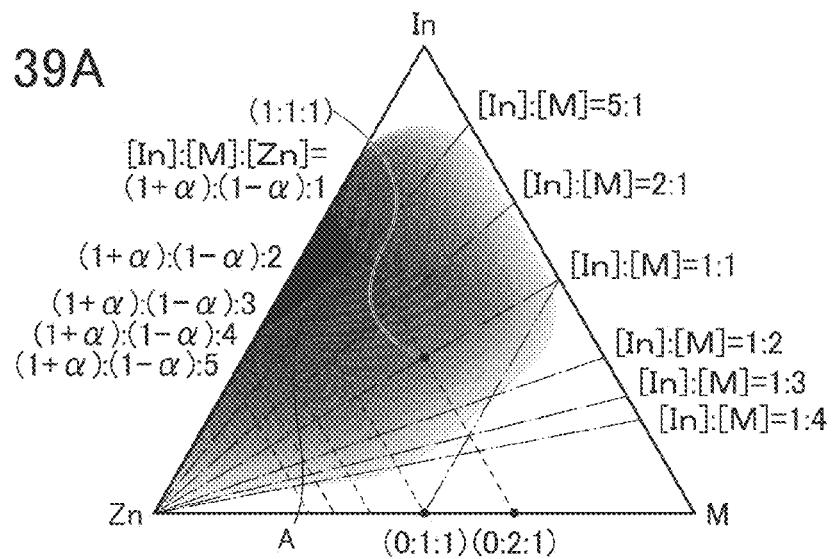
FIGS. 39A to 39C show ranges of atomic ratios of an oxide semiconductor of one embodiment of the present invention.
Figure 39B:
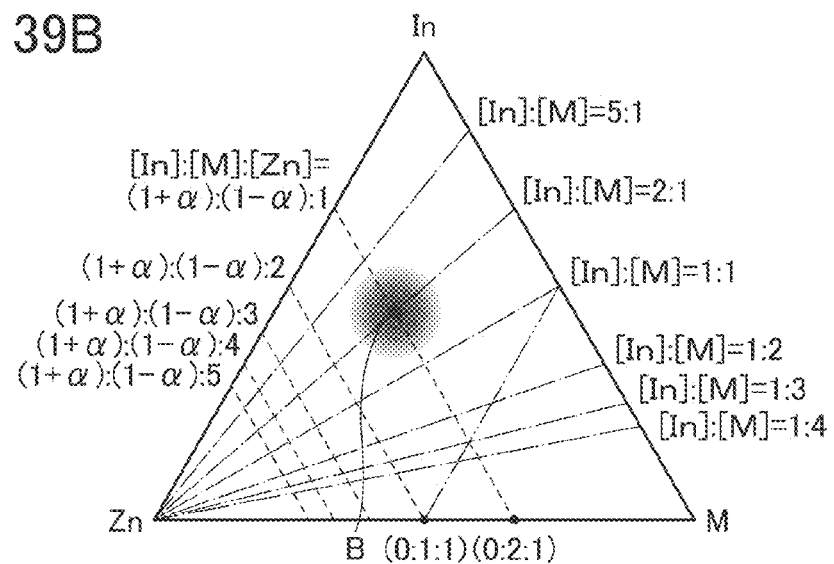
Figure 39C:
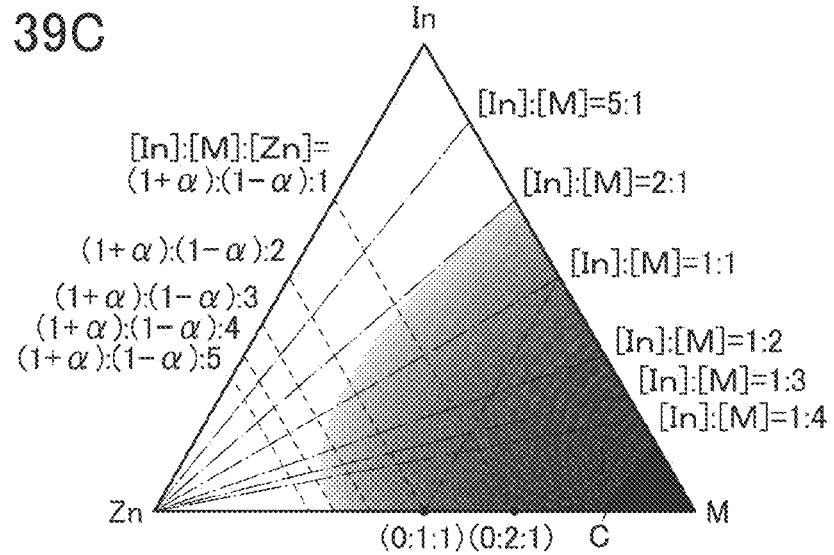

In FIGS. 39A to 39C, dashed lines correspond to a line representing the atomic ratio of [In]:[M]:[Zn]=(1+α):(1−α):1 (−1≤α≤1), a line representing the atomic ratio of [In]:[M]:[Zn]=(1+α):(1−α):2, a line representing the atomic ratio of [In]:[M]:[Zn]=(1+α):(1−α):3, a line representing the atomic ratio of [In]:[M]:[Zn]=(1+α):(1−α):4, and a line representing the atomic ratio of [In]:[M]:[Zn]=(1+α):(1−α):5.

Dashed-dotted lines correspond to a line representing the atomic ratio of [In]:[M]:[Zn]=1:1:β (β≥0), a line representing the atomic ratio of [In]:[M]:[Zn]=1:2:β, a line representing the atomic ratio of [In]:[M]:[Zn]=1:3:β, a line representing the atomic ratio of [In]:[M]:[Zn]=1:4:β, a line representing the atomic ratio of [In]:[M]:[Zn]=2:1:β, and a line representing the atomic ratio of [In]:[M]:[Zn]=5:1:β.

Long dashed double-short dashed line correspond to a line representing the atomic ratio of [In]:[M]:[Zn]=(1+γ):2:(1−γ) (−1≤γ≤1). An oxide semiconductor having the atomic ratio of [In]:[M]:[Zn]=0:2:1 or a neighborhood thereof in FIGS. 39A to 39C tends to have a spinel crystal structure.

FIGS. 39A and 39B illustrate examples of the preferred ranges of the atomic ratios of indium to the element M and zinc contained in an oxide semiconductor in one embodiment of the present invention.

Figure 40:
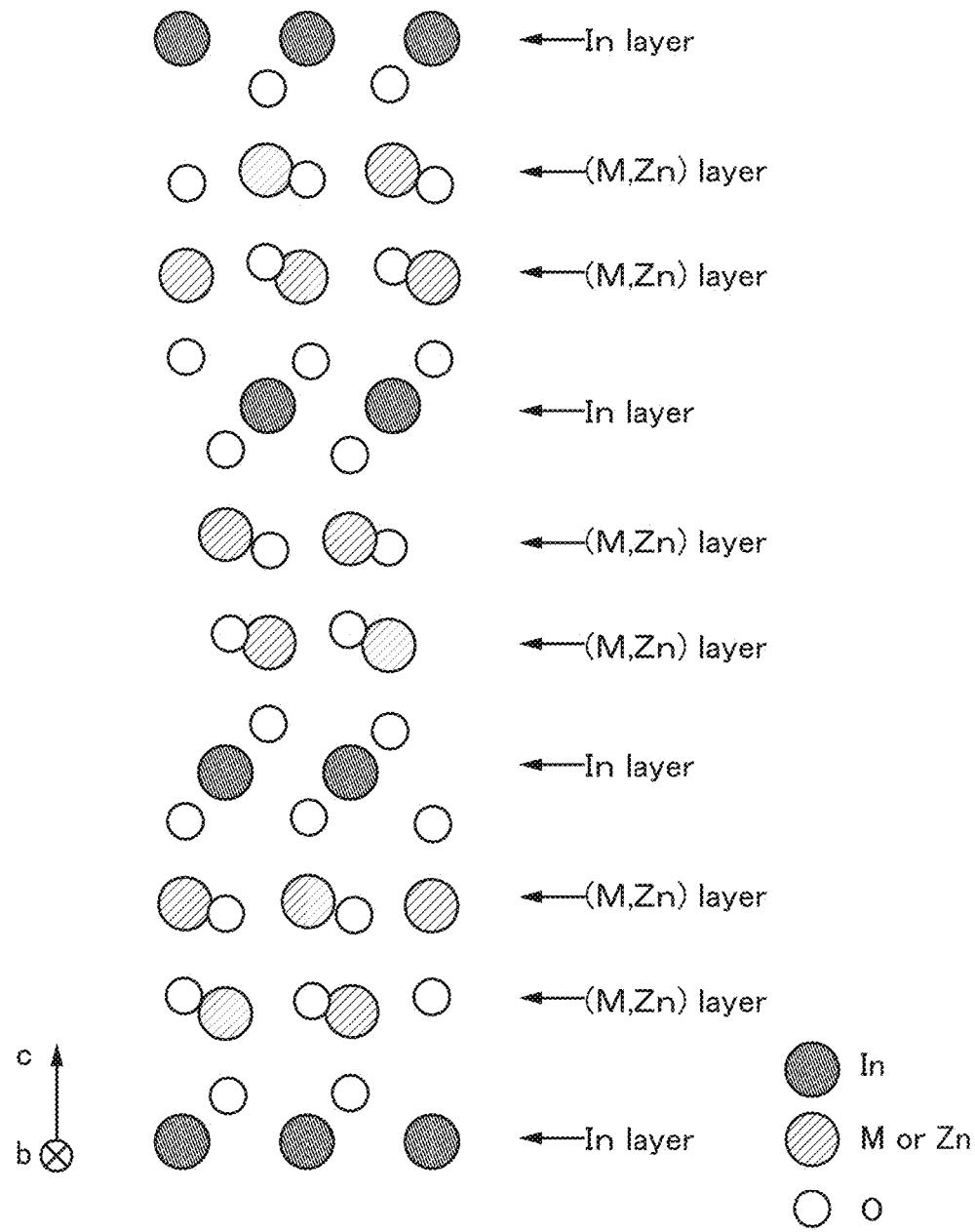
FIG. 40 illustrates a crystal of $InMZnO_4$.

FIG. 40 illustrates an example of the crystal structure of InMZnO$_4$ with an atomic ratio of [In]:[M]:[Zn]=1:1:1. The crystal structure illustrated in FIG. 40 is InMZnO$_4$ observed from a direction parallel to a b-axis. Note that a metal element in a layer that contains M, Zn, and oxygen (hereinafter, this layer is referred to as an "(M,Zn) layer") in FIG. 40 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 40.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide with an atomic ratio of [In]:[M]:[Zn]=1:1:2 has a layered structure that includes one In layer for every three (M,Zn) layers. In other words, if [Zn] is larger than [In] and [M], the proportion of (M,Zn) layers to In layers becomes higher when the oxide is crystallized.

Note that in the case where the number of (M,Zn) layers for every In layer is not an integer in the oxide, the oxide might have a plurality of kinds of layered structures where the number of (M,Zn) layers for every In layer is an integer. For example, in the case of [In]:[M]:[Zn]=1:1:1.5, the oxide might have the following layered structures: a layered structure that includes one In layer for every two (M,Zn) layers and a layered structure that includes one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

In some cases, a plurality of phases (two, three, or more phases) coexist in the oxide semiconductor. For example, in the case of the atomic ratio of [In]:[M]:[Zn]=0:2:1 or a neighborhood thereof, two phases, i.e., a spinel crystal structure and a layered crystal structure, tend to coexist. In the case of the atomic ratio of [In]:[M]:[Zn]=1:0:0 or a neighborhood thereof, two phases, i.e., a bixbyite crystal structure and a layered crystal structure, tend to coexist. In the case where a plurality of phases coexist in an oxide semiconductor, a grain boundary might be formed between different crystal structures.

In addition, an oxide semiconductor containing indium in a higher proportion can have higher carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=

0:1:0 and neighborhoods thereof (e.g., a region C in FIG. 39C), insulation performance becomes better.

Accordingly, an oxide semiconductor in one embodiment of the present invention preferably has an atomic ratio represented by a region A in FIG. 39A. With the atomic ratio, a layered structure with high carrier mobility and a few grain boundaries is easily obtained.

A region B in FIG. 39B represents atomic ratios from [In]:[M]:[Zn]=4:2:3 to [In]:[M]:[Zn]=4:2:4.1 and neighborhoods thereof. The neighborhoods include an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. The atomic ratio affects difficulty in forming a layered structure. Even oxide semiconductors with the same atomic ratio have a layered structure in some cases, but not in others, depending on formation conditions. Therefore, the illustrated regions show atomic ratios at which a layered structure of an oxide semiconductor can be formed; boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources, and thus can have a low carrier density. A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel region in a transistor, the transistor can have stable electrical characteristics.

Next, the case where the oxide semiconductor has a two-layer structure or a three-layer structure is described. A band diagram of insulators that are in contact with a layered structure of an oxide semiconductor S1, an oxide semiconductor S2, and an oxide semiconductor S3, a band diagram of insulators that are in contact with a layered structure of the oxide semiconductor S1 and the oxide semiconductor S2, and a band diagram of insulators that are in contact with a layered structure of the oxide semiconductor S2 and the oxide semiconductor S3 are described with reference to FIGS. 41A to 41C.

Figure 41A:
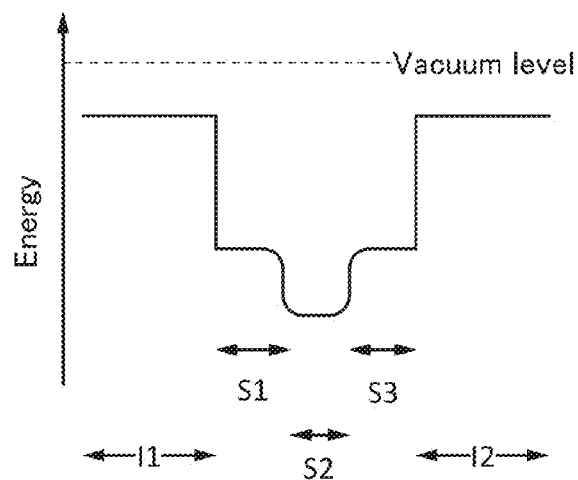
FIGS. 41A to 41C are each a band diagram of a stacked structure of an oxide semiconductor.
Figure 41B:
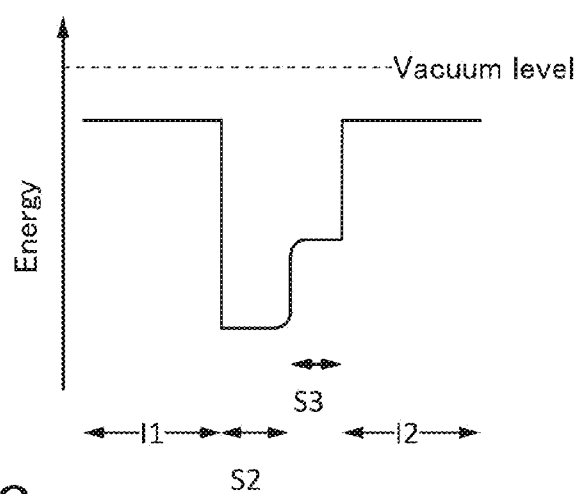
Figure 41C:
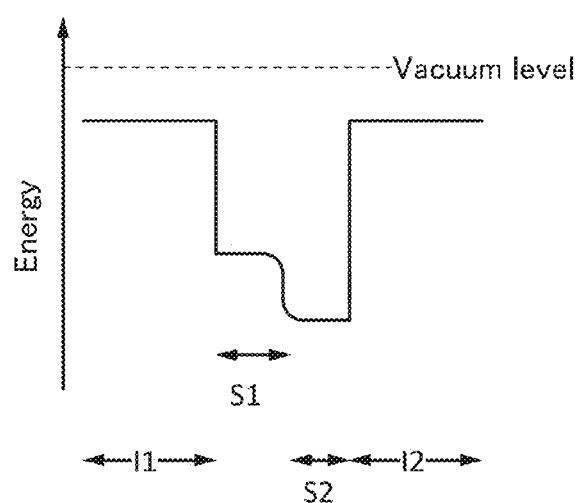

FIG. 41A is an example of a band diagram of a layered structure including an insulator I1, the oxide semiconductor S1, the oxide semiconductor S2, the oxide semiconductor S3, and an insulator I2 in a thickness direction. FIG. 41B is an example of a band diagram of a layered structure including the insulator I1, the oxide semiconductor S2, the oxide semiconductor S3, and the insulator I2 in a thickness direction. FIG. 41C is an example of a band diagram of a layered structure including the insulator I1, the oxide semiconductor S1, the oxide semiconductor S2, and the insulator I2 in a thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV.

As illustrated in FIGS. 41A to 41C, the conduction band minimum of each of the oxide semiconductors S1 to S3 is gradually varied. In other words, the conduction band minimum is continuously varied or continuously connected. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 39C can be used as the oxide semiconductors S1 and S3. Note that the region C in FIG. 39C represents the atomic ratio of [In]:[M]:[Zn]=0:1:0 or a neighborhood thereof.

In the case where an oxide semiconductor with the atomic ratio represented by the region A is used as the oxide semiconductor S2, it is particularly preferable to use an oxide semiconductor with [M]/[In] of greater than or equal to 1, preferably greater than or equal to 2, as each of the oxide semiconductors S1 and S3. In addition, it is preferable to use an oxide semiconductor with sufficiently high insulation performance and [M]/([Zn]+[In]) of greater than or equal to 1 as the oxide semiconductor S3.

Furthermore, the oxide semiconductor 108 may have a non-single-crystal structure. The non-single-crystal structure includes a c-axis aligned crystalline oxide semiconductor (CAAC-OS) described later, a polycrystalline oxide semiconductor, a microcrystalline oxide semiconductor described later, or an amorphous oxide semiconductor, for example. Among the non-single-crystal oxide semiconductors, the amorphous oxide semiconductor has the highest density of defect states, whereas the CAAC-OS has the lowest density of defect states.

Note that the oxide semiconductor 108 may be a single film or stacked films including two or more of the following regions: an amorphous oxide semiconductor region, a microcrystalline oxide semiconductor region, a polycrystalline oxide semiconductor region, a CAAC-OS region, and a single crystal oxide semiconductor region.

In the oxide semiconductor 108, the crystallinity of the region 108$i$ may be different from that of the region 108$s$ and the region 108$d$. Specifically, in the oxide semiconductor 108, the region 108$s$ and the region 108$d$ may have lower crystallinity than the region 108$i$. This is because the region 108$s$ and the region 108$d$ are damaged by the impurity addition, which results in a decrease in the crystallinity of the region 108$s$ and the region 108$d$.

The thickness of the oxide semiconductor 108 is greater than or equal to 3 nm and less than or equal to 200 nm, preferably greater than or equal to 3 nm and less than or equal to 100 nm, further preferably greater than or equal to 3 nm and less than or equal to 60 nm.

[Second Insulator]

The insulator 110 functions as a gate insulator of the transistor 100. The insulator 110 can be formed to have a single-layer structure or stacked-layer structure of an oxide insulator and/or a nitride insulator, for example.

In addition, the insulator 110 has a function of supplying oxygen to the oxide semiconductor 108, particularly to the region 108$i$. Therefore, the insulator 110 is preferably an insulator containing excess oxygen. Note that the insulator containing excess oxygen means an insulator having a function of releasing oxygen by heat treatment. For example, silicon oxide containing excess oxygen means silicon oxide which can release oxygen by heat treatment or the like.

Note that the insulator 110 is an insulator in which oxygen can be moved. In other words, the insulator 110 may be an insulator having oxygen permeability. For example, the insulator 110 may be an insulator having higher oxygen permeability than the oxide semiconductor 108 and the metal oxide 111.

The insulator containing excess oxygen has a function of reducing oxygen vacancies in the region 108$i$ in some cases. Such oxygen vacancies form defect states in the region 108$i$. In addition, hydrogen comes into the site of such an oxygen vacancy and forms an electron serving as a carrier in some cases. Therefore, by reducing the oxygen vacancies in the region 108$i$, the transistor 100 can have stable electrical characteristics.

The thickness of the insulator 110 can be greater than or equal to 10 nm and less than or equal to 200 nm, or greater than or equal to 20 nm and less than or equal to 150 nm.

It is preferable that the insulator 110 have few defects and typically have as few signals observed by electron spin resonance (ESR) spectroscopy as possible. Examples of the signals in the case of silicon oxide include a signal due to an E' center observed at a g-factor of 2.001. Note that the E' center is due to the dangling bond of silicon. As the insulator 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide (NO$_2$) might be observed in the case of silicon oxide. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is preferable to use an insulator whose spin density of a signal due to nitrogen dioxide (NO$_2$) is higher than or equal to $1\times10^{17}$ spins/cm$^3$ and lower than $1\times10^{18}$ spins/cm$^3$ as the insulator 110, for example.

Note that a nitrogen oxide (NO$_x$) such as a nitrogen dioxide (NO$_2$) forms a level in the insulator 110. The level is positioned in the energy gap of the oxide semiconductor 108. Thus, when nitrogen oxide (NO$_x$) is diffused to the interface between the insulator 110 and the oxide semiconductor 108, an electron might be trapped by the level on the insulator 110 side. As a result, the trapped electron remains in the vicinity of the interface between the insulator 110 and the oxide semiconductor 108, leading to a positive shift of the threshold voltage of the transistor. Accordingly, the use of a film with a low nitrogen oxide content as the insulator 110 can reduce a shift of the threshold voltage of the transistor.

As an insulator that releases a small amount of nitrogen oxide (NO$_x$), for example, a silicon oxynitride film can be used. The silicon oxynitride film is a film of which the amount of released ammonia is larger than the amount of released nitrogen oxide (NO$_x$) in thermal desorption spectroscopy (TDS); the typical amount of released ammonia is greater than or equal to $1\times10^{18}$/cm$^3$ and less than or equal to $5\times10^{19}$/cm$^3$. Note that the amount of released ammonia is the total amount of ammonia released by heat treatment in a range of 50° C. to 650° C. or 50° C. to 550° C. in TDS.

Since nitrogen oxide (NO$_x$) reacts with ammonia and oxygen in heat treatment, the use of an insulator that releases a large amount of ammonia reduces nitrogen oxide (NO$_x$).

Note that in the case where the insulator 110 is analyzed by SIMS, nitrogen concentration in the film is preferably lower than or equal to $6\times10^{20}$ atoms/cm$^3$.

[Metal Oxide]

An oxide insulator such as aluminum oxide, magnesium oxide, gallium oxide, germanium oxide, yttrium oxide, zirconium oxide, lanthanum oxide, neodymium oxide, hafnium oxide, or tantalum oxide or a mixed material thereof can be used as the metal oxide 111. A stack of any of the above materials may be used. Therefore, in this embodiment, the metal oxide 111 can also be referred to as an insulator and may function as a gate insulator in some cases.

In particular, a high-k material such as aluminum oxide (AlO$_x$), hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or hafnium oxide is preferably used as the metal oxide 111. The use of such a high-k material enables a reduction in gate leakage of a transistor.

Note that as the density of the metal oxide 111 increases with respect to the density of the insulator 110, it becomes more probable that the amount of oxygen diffused into the insulator 110 increases. For example, in the case of using silicon oxide with a density of 2.2 g/cm$^3$ as the insulator 110 and aluminum oxide with a density of 4.0 g/cm$^3$ as the metal oxide 111, it is highly probable that excess oxygen diffuses from the metal oxide 111 into the insulator 110.

Therefore, the amount of oxygen diffused to the insulator 110 side can be increased when the density of the metal oxide is set higher than the density of the insulator 110 by 0.5 g/cm$^3$ or more, preferably 1.0 g/cm$^3$ or more, further preferably 1.5 g/cm$^3$ or more.

The metal oxide 111 may have a function of preventing impurity diffusion from a component of a structure body formed over the metal oxide 111. Specifically, aluminum oxide has an excellent blocking effect and is highly impermeable to oxygen and an impurity such as hydrogen or moisture. Accordingly, during and after the manufacturing process of the transistor, aluminum oxide can suitably function as a protective film that has effects of preventing entry of impurities such as hydrogen and moisture into the oxide semiconductor 108, preventing release of oxygen from the oxide semiconductor 108, and preventing release of oxygen from the insulator 110.

[Third Insulator]

The insulator 116 contains nitrogen or hydrogen. The insulator 116 may contain fluorine. As the insulator 116, for example, a nitride insulator can be used. The nitride insulator can be formed using silicon nitride, silicon nitride oxide, silicon oxynitride, silicon nitride fluoride, silicon fluoronitride, or the like. The hydrogen concentration in the insulator 116 is preferably higher than or equal to $1\times10^{22}$ atoms/cm$^3$. Furthermore, the insulator 116 is in contact with the region 108s and the region 108d of the oxide semiconductor 108. Thus, the concentration of an impurity (nitrogen or hydrogen) in the region 108s and the region 108d in contact with the insulator 116 is increased, leading to an increase in the carrier density of the region 108s and the region 108d.

[Fourth Insulator]

As the insulator 118, an oxide insulator can be used. Alternatively, a stack including an oxide insulator and a nitride insulator can be used as the insulator 118. The insulator 118 can be formed using, for example, silicon oxide, silicon oxynitride, silicon nitride oxide, aluminum oxide, hafnium oxide, gallium oxide, or Ga—Zn oxide.

Furthermore, the insulator 118 preferably functions as a barrier film against hydrogen, water, and the like from the outside.

The thickness of the insulator 118 can be greater than or equal to 30 nm and less than or equal to 500 nm, or greater than or equal to 100 nm and less than or equal to 400 nm.

[Conductor]

The conductors 112, 120a, 120b, 121a, and 121b can be formed by a sputtering method, a vacuum evaporation method, a pulsed laser deposition (PLD) method, a thermal CVD method, or the like. The conductors 112, 120a, 120b, 121a, and 121b can be formed using, for example, a metal element selected from aluminum, chromium, copper, tantalum, titanium, molybdenum, nickel, iron, cobalt, and tungsten, an alloy containing the metal element as a component, or an alloy containing any of the metal elements in combination. Furthermore, one or more metal elements selected from manganese and zirconium may be used.

In addition, the conductor 112 may have a single-layer structure or a stacked-layer structure of two or more layers. Although the two-layer structure of the conductors 120a and 121a and the two-layer structure of the conductors 120b and 121b are illustrated in the diagrams, a single-layer structure or a stacked-layer structure of three or more layers may be used. For example, the following structure may be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order; or a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

Note that it is preferable that a light-shielding metal film be used as the conductor 112 because the region 108i formed under the conductor 112 can be shielded from light.

It is particularly preferable to use a material containing copper for the conductors 121a and 121b. The use of a material containing copper for the conductors 121a and 121b can reduce the resistance. A signal delay or the like can be suppressed even in the case of using a large-sized substrate as the substrate 102, for example.

It is particularly preferable that a material with high adhesion to both the oxide semiconductor 108 and the conductors 121a and 121b be used for the conductors 120a and 120b. For example, in the case of using a material containing copper for the conductors 121a and 121b, it is preferable to use tungsten, tantalum, titanium, a nitride thereof, or the like for the conductors 120a and 120b.

<1-2. Structural Example 2 of Semiconductor Device>

Next, a structure of a transistor included in a semiconductor device different from that in FIGS. 3A to 3C will be described with reference to FIGS. 4A to 4C.

Figure 4A:
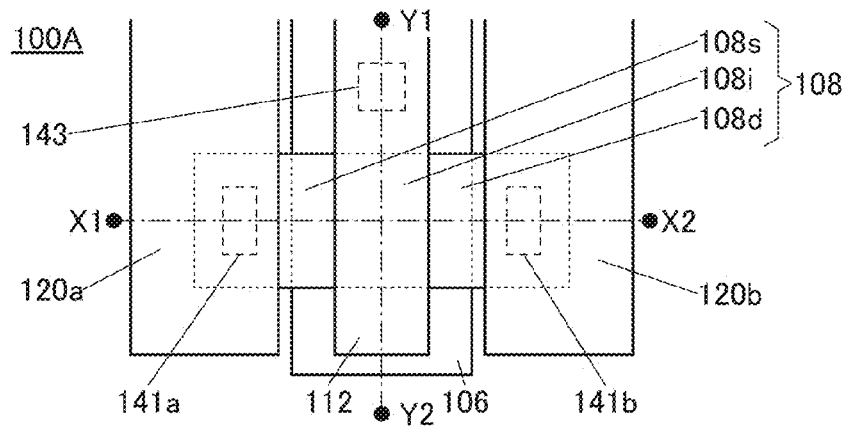
FIGS. 4A to 4C are a top view and cross-sectional views illustrating a semiconductor device.

FIG. 4A is a top view of a transistor 100A. FIG. 4B is a cross-sectional view taken along dashed-dotted line X1-X2 in FIG. 4A. FIG. 4C is a cross-sectional view taken along dashed-dotted line Y1-Y2 in FIG. 4A.

Figure 4B:
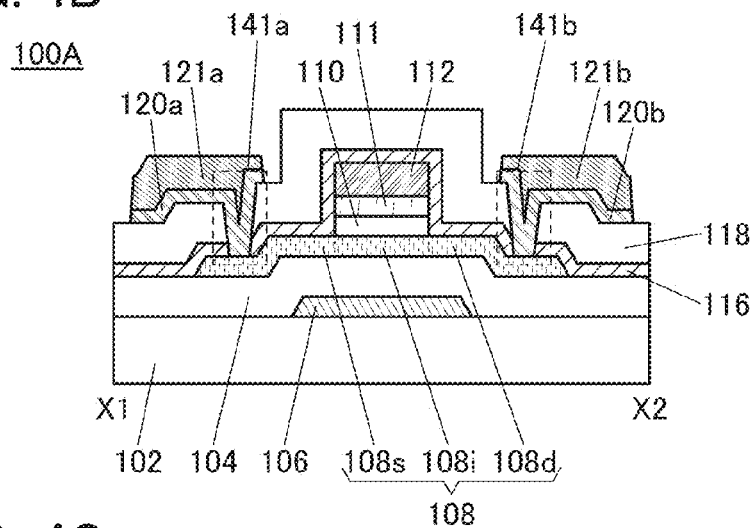
Figure 4C:
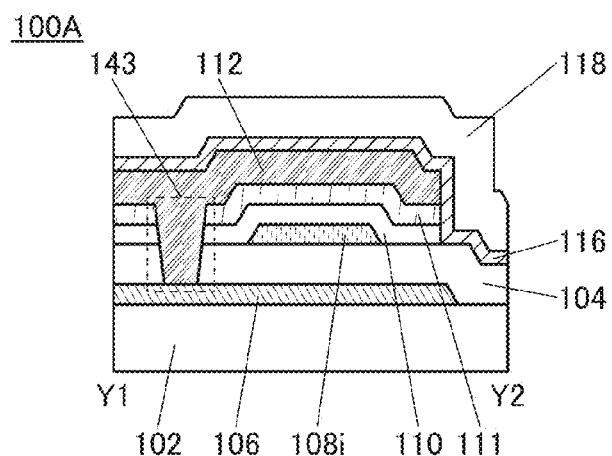

The transistor 100A illustrated in FIGS. 4A to 4C includes a conductor 106 over the substrate 102; the insulator 104 over the conductor 106; the oxide semiconductor 108 over the insulator 104; the insulator 110 over the oxide semiconductor 108; the metal oxide 111 over the insulator 110; the conductor 112 over the metal oxide 111; and the insulator 116 over the insulator 104, the oxide semiconductor 108, and the conductor 112. Note that the oxide semiconductor 108 includes the region 108i overlapping with the conductor 112, the region 108s in contact with the insulator 116, and the region 108d in contact with the insulator 116.

The transistor 100A includes the conductor 106 and an opening 143 in addition to the components of the transistor 100 described above.

Note that the opening 143 is provided in the insulators 104 and 110 and the metal oxide 111. The conductor 106 is electrically connected to the conductor 112 through the opening 143. Thus, the same potential is applied to the conductor 106 and the conductor 112. Note that different potentials may be applied to the conductor 106 and the conductor 112 without providing the opening 143. Alternatively, the conductor 106 may be used as a light-shielding film without providing the opening 143. When the conductor 106 is formed using a light-shielding material, for example, light irradiation of the region 108i from the bottom can be reduced.

In the case of the structure of the transistor 100A, the conductor 106 functions as a first gate electrode (also referred to as a bottom-gate electrode), the conductor 112 functions as a second gate electrode (also referred to as a top-gate electrode), the insulator 104 functions as a first gate insulator, and the insulator 110 functions as a second gate insulator.

The conductor 106 can be formed using a material similar to the above-described materials of the conductors 112, 120a, 120b, 121a, and 121b. It is particularly preferable to use a material containing copper for the conductor 106 because the resistance can be reduced. For example, the conductor 106 has a stacked-layer structure in which a titanium nitride film, a tantalum nitride film, or a tungsten film is provided over a copper film. A stacked-layer structure is preferable in which a titanium nitride film, a tantalum nitride film, or a tungsten film is provided as each of the conductors 120a and 120b and a copper film is provided as each of the conductors 121a and 121b. In that case, when the transistor 100A is used as a pixel transistor and/or a driving transistor of a display device, parasitic capacitance generated between the conductor 106 and the conductors 120a and 121a and between the conductor 106 and the conductors 120b and 121b can be reduced. Thus, the conductors 106, 120a, 120b, 121a, and 121b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 4A to 4C has a structure in which conductors functioning as gate electrodes are provided over and under the oxide semiconductor 108. As in the transistor 100A, a semiconductor device of one embodiment of the present invention may have a plurality of gate electrodes.

Here, a method for manufacturing the transistor 100A in FIGS. 4A to 4C will be described with reference to FIG. 2. Note that FIG. 2 is a process flow chart showing a method for manufacturing a semiconductor device.

Figure 2:
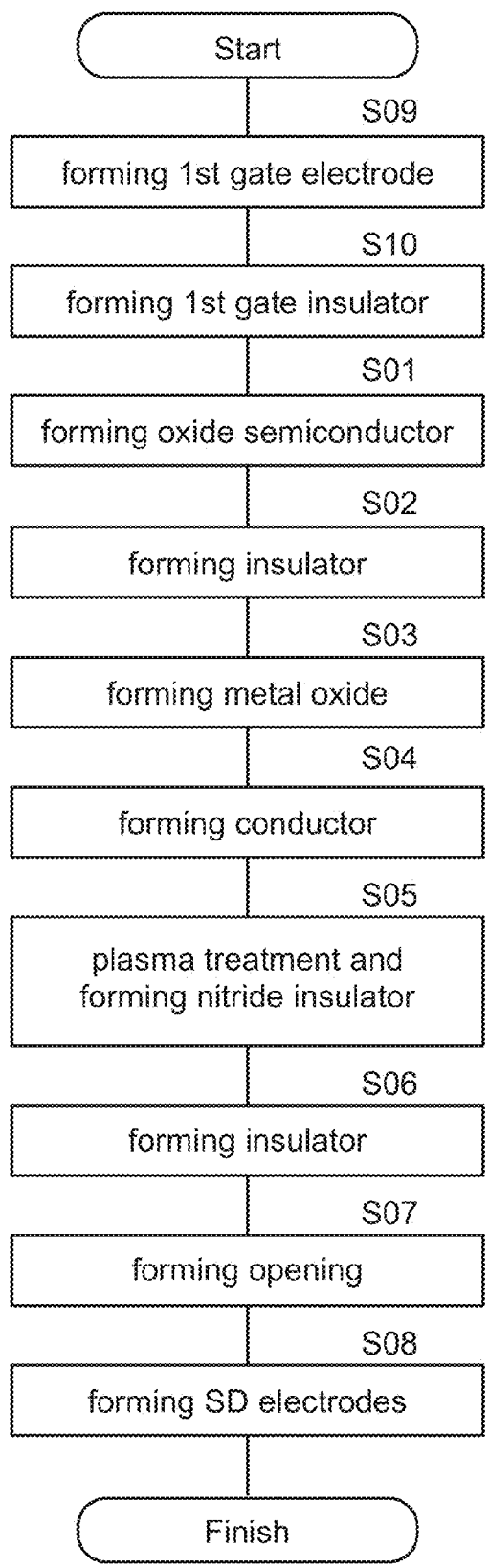
FIG. 2 is a process flow chart showing a method for manufacturing a semiconductor device.

The transistor 100A illustrated in FIGS. 4A to 4C is manufactured through at least first to tenth steps in FIG. 2.

[Ninth Step: Formation of First Gate Electrode]

The ninth step includes a step of forming a first gate electrode (see Step S09 in FIG. 2). In the case of the transistor 100A, the ninth step corresponds to a step of forming the conductor 106 over the substrate 102.

[Tenth Step: Formation of First Gate Insulator]

The tenth step includes a step of forming a first gate insulator over the first gate electrode (see Step S10 in FIG. 2). In the case of the transistor 100A, the tenth step corresponds to a step of forming the insulator 104 over the substrate 102 and the conductor 106.

After the tenth step, the transistor 100A can be manufactured through the first to eighth steps described in <1-1. Structural example 1 of semiconductor device>.

The details of the method for manufacturing the transistor 100A will be described later.

As described above, in the method for manufacturing a semiconductor device of one embodiment of the present invention, the third step, that is, the step of forming the metal oxide, is performed; accordingly, the oxygen excess region can be formed in the insulator 110. In addition, the fifth step, that is, the step of forming the nitride insulator, is performed at a temperature higher than or equal to 150° C. and lower than 300° C.; accordingly, oxygen release from the side surface of the insulator containing excess oxygen to the outside can be suppressed. Furthermore, the density of the metal oxide 111 is higher than that of the insulator 110; accordingly, oxygen diffusion from the region 108i and the insulator 110 to the conductor 112 side can be suppressed. As a result, a change in electrical characteristics of a transistor including an oxide semiconductor can be prevented and the reliability of the transistor can be improved.

As illustrated in FIG. 4C, the oxide semiconductor 108 faces the conductor 106 functioning as a first gate electrode and the conductor 112 functioning as a second gate electrode and is positioned between the two conductors functioning as the gate electrodes.

Furthermore, the length of the conductor 112 in the channel width direction is larger than the length of the oxide semiconductor 108 in the channel width direction. In the channel width direction, the whole oxide semiconductor 108 is covered with the conductor 112 with the insulator 110 and the metal oxide 111 provided therebetween. Since the conductor 112 is connected to the conductor 106 through the opening 143 provided in the insulators 104 and 110 and the metal oxide 111, a side surface of the oxide semiconductor 108 in the channel width direction faces the conductor 112 with the insulator 110 and the metal oxide 111 provided therebetween.

In other words, in the channel width direction of the transistor 100A, the conductors 106 and 112 are connected to each other through the opening 143 provided in the insulators 104 and 110 and the metal oxide 111, and the conductors 106 and 112 surround the oxide semiconductor 108 with the insulators 104 and 110 and the metal oxide 111 positioned therebetween.

Such a structure enables the oxide semiconductor 108 included in the transistor 100A to be electrically surrounded by electric fields of the conductor 106 functioning as a first gate electrode and the conductor 112 functioning as a second gate electrode. A device structure of a transistor, like that of the transistor 100A, in which electric fields of a first gate electrode and a second gate electrode electrically surround the oxide semiconductor 108 in which a channel region is formed can be referred to as a surrounded channel (S-channel) structure.

Since the transistor 100A has the S-channel structure, an electric field for inducing a channel can be effectively applied to the oxide semiconductor 108 by the conductor 106 or the conductor 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor 108 is surrounded by the conductor 106 and the conductor 112, the mechanical strength of the transistor 100A can be increased.

When seen in the channel width direction of the transistor 100A, an opening different from the opening 143 may be formed on the side of the oxide semiconductor 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling a threshold voltage $V_{thA}$ of the transistor. The fixed potential $V_b$ may be the potential $V_1$ or the potential $V_2$. In that case, a potential generator circuit for generating the fixed potential $V_b$ is not necessary, which is preferable. The fixed potential $V_b$ may be different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential $V_1$ and the potential $V_2$ of the signal A may be different from the potential $V_3$ and the potential $V_4$ of the signal B. For example, if a gate insulator for the gate to which the signal B is input is thicker than a gate insulator for the gate to which the signal A is input, the potential amplitude of the signal B ($V_3 - V_4$) may be larger than the potential amplitude of the signal A ($V_1 - V_2$). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential $V_1$ and the signal B has the potential $V_3$, or the transistor is turned off only when the signal A has the potential $V_2$ and the signal B has the potential $V_4$. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 100A are similar to those of the transistor 100 described above and have similar effects.

<1-3. Structural Example 3 of Semiconductor Device>

Next, structures of transistors included in a semiconductor device different from that in FIGS. 4A to 4C will be described with reference to FIGS. 5A and 5B, FIGS. 6A and 6B, FIGS. 7A and 7B, FIGS. 8A and 8B, and FIGS. 9A and 9B.

Figure 5A:
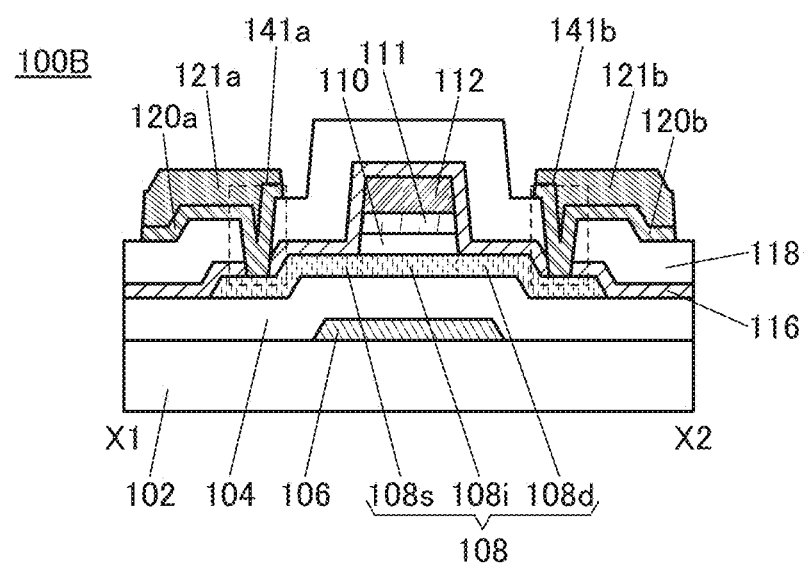
FIGS. 5A and 5B are cross-sectional views illustrating a semiconductor device.
Figure 5B:
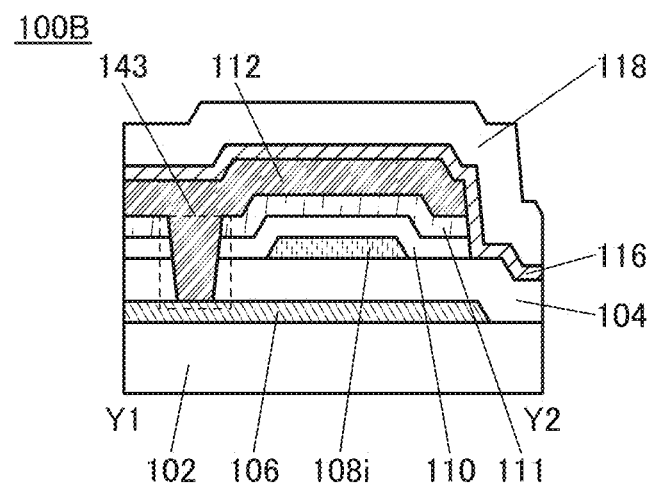
Figure 6A:
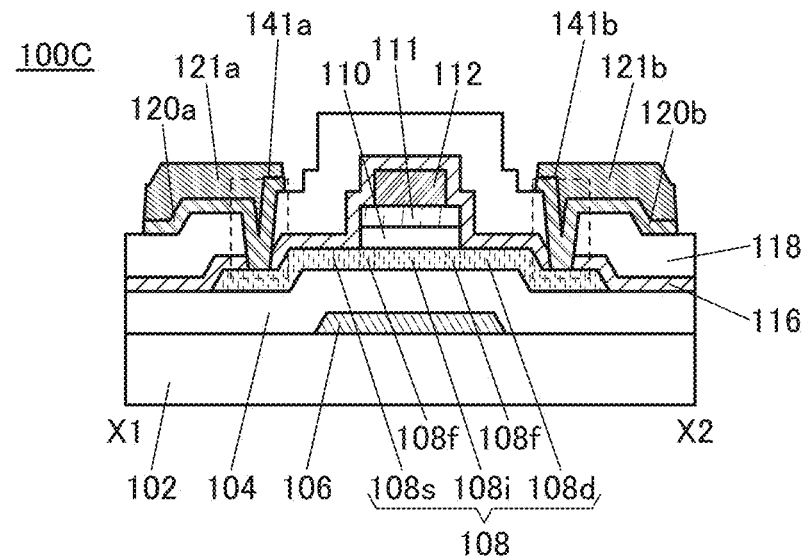
FIGS. 6A and 6B are cross-sectional views illustrating a semiconductor device.
Figure 6B:
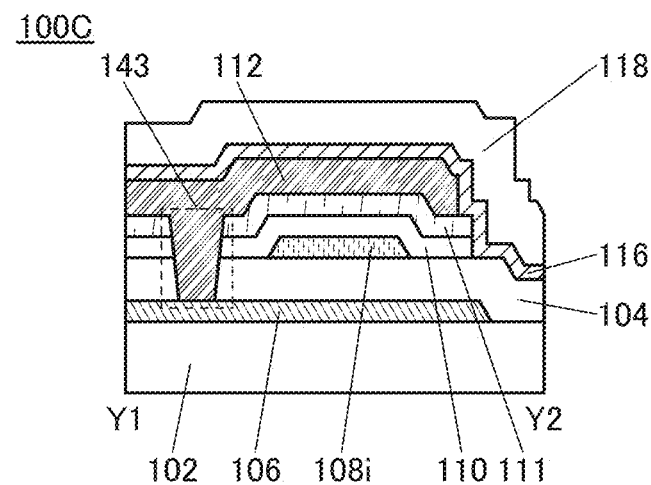
Figure 7A:
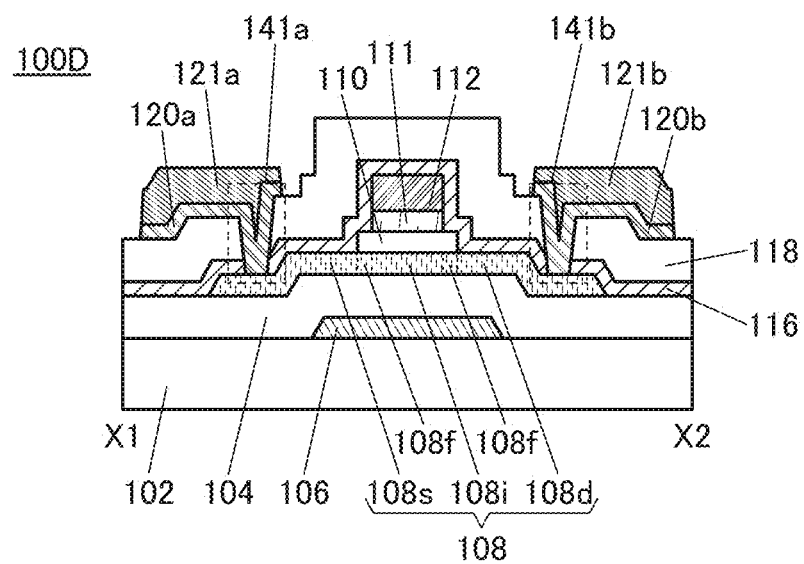
FIGS. 7A and 7B are cross-sectional views illustrating a semiconductor device.
Figure 7B:
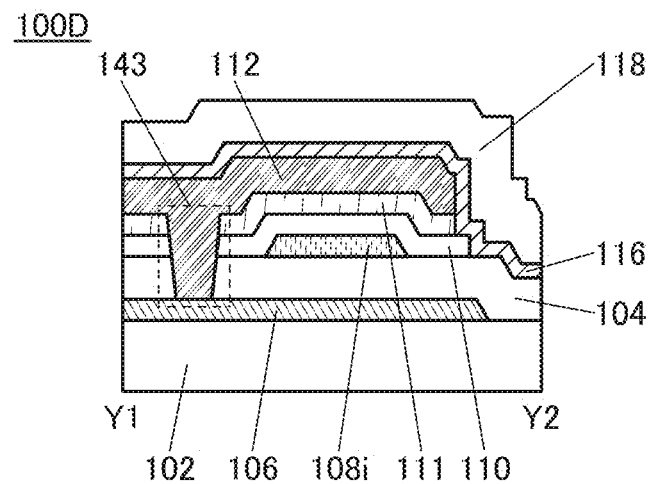
Figure 8A:
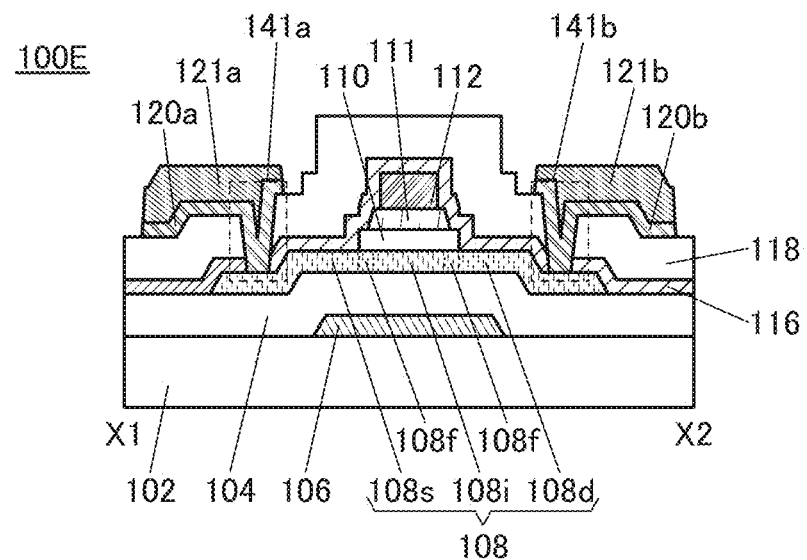
FIGS. 8A and 8B are cross-sectional views illustrating a semiconductor device.
Figure 8B:
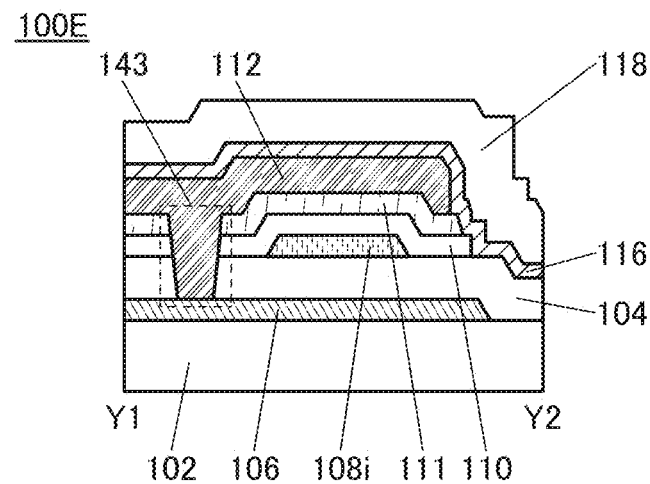
Figure 9A:
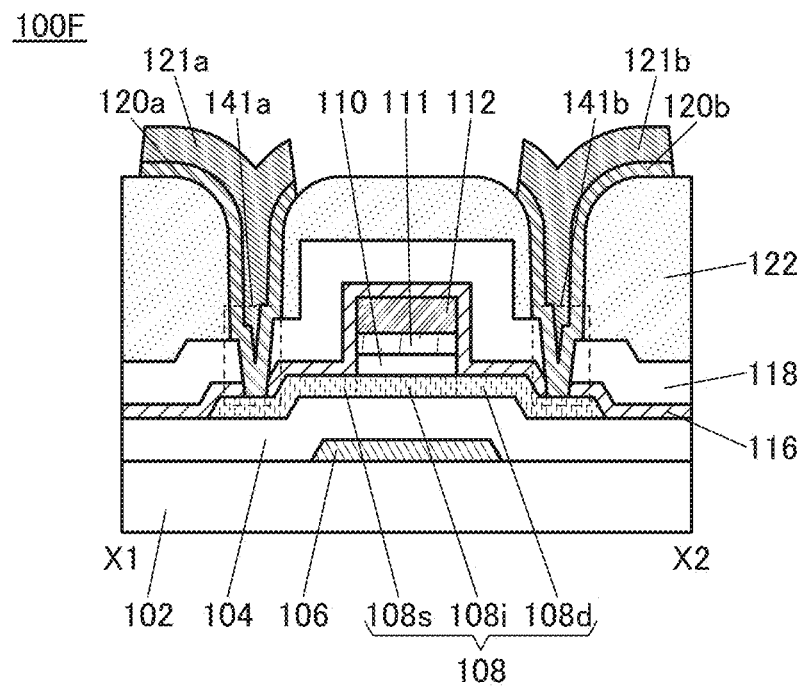
FIGS. 9A and 9B are cross-sectional views illustrating a semiconductor device.
Figure 9B:
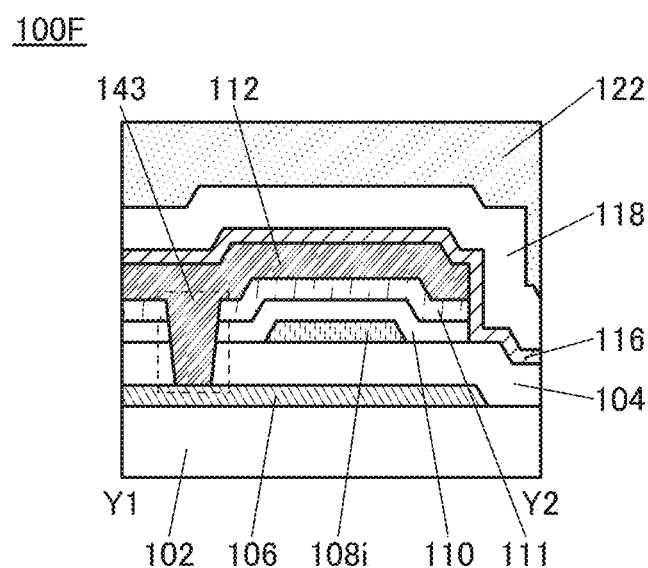

FIGS. 5A and 5B are cross-sectional views of a transistor 100B. FIGS. 6A and 6B are cross-sectional views of a transistor 100C. FIGS. 7A and 7B are cross-sectional views of a transistor 100D. FIGS. 8A and 8B are cross-sectional views of a transistor 100E. FIGS. 9A and 9B are cross-sectional views of a transistor 100F. Note that top views of the transistor 100B, the transistor 100C, the transistor 100D, the transistor 100E, and the transistor 100F are similar to that of the transistor 100A illustrated in FIG. 4A and thus are not described here.

The transistor 100B illustrated in FIGS. 5A and 5B is different from the above-described transistor 100A in the shape of the insulator 110, the metal oxide 111, and the conductor 112. Specifically, in the cross section of the transistor in the channel length (L) direction, the shape of the insulator 110, the metal oxide 111, and the conductor 112 is a rectangle in the transistor 100A but is a tapered shape in the transistor 100B. More specifically, in the cross section of the transistor in the channel length (L) direction, an upper end portion of the conductor 112 in the transistor 100A is substantially aligned with a lower end portion of the insulator 110, whereas an upper end portion of the conductor 112 in the transistor 100B is located inward from a lower end portion of the insulator 110. In other words, a side end portion of the insulator 110 is located outward from a side end portion of the conductor 112.

To fabricate the transistor 100A, the conductor 112, the metal oxide 111, and the insulator 110 are collectively formed by a dry etching method using the same mask. To fabricate the transistor 100B, the conductor 112, the metal oxide 111, and the insulator 110 are formed by a combination of a wet etching method and a dry etching method using the same mask.

A structure like that of the transistor 100A is preferable because end portions of the region 108s and the region 108d can be substantially aligned with end portions of the conductor 112. Meanwhile, a structure like that of the transistor 100B is preferable because the coverage with the insulator 116 can be improved.

The transistor 100C illustrated in FIGS. 6A and 6B is different from the above-described transistor 100A in the shape of the conductor 112, the metal oxide 111, and the insulator 110. Specifically, in the cross section of the transistor 100C in the channel length (L) direction, a lower end portion of the conductor 112 is not aligned with an upper end portion of the metal oxide 111. The lower end portion of the conductor 112 is located inward from the upper end portion of the metal oxide 111.

For example, the structure of the transistor 100C can be obtained in the following manner: the conductor 112 is formed by a wet etching method and the metal oxide 111 and the insulator 110 are formed by a dry etching method using the same mask.

With the structure of the transistor 100C, regions 108f are formed in the oxide semiconductor 108 in some cases. The regions 108f are formed between the region 108i and the region 108s and between the region 108i and the region 108d.

The regions 108f function as high-resistance regions or low-resistance regions. The high-resistance regions have the same level of resistance as the region 108i and do not overlap with the conductor 112 functioning as a gate electrode. In the case where the regions 108f are high-resistance regions, the regions 108f function as offset regions. To suppress a decrease in the on-state current of the transistor 100C, the regions 108f functioning as offset regions may each have a length of 1 μm or less in a cross section in the channel length (L) direction.

The low-resistance regions have a resistance that is lower than that of the region 108i and higher than that of the region 108s and the region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by supplying nitrogen or hydrogen from the insulator 116 to the regions 108f or by adding an impurity element from above the conductor 112 and the insulator 110 using the conductor 112 and the insulator 110 as a mask so that the impurity element is added to the oxide semiconductor 108 through the insulator 110.

The transistor 100D illustrated in FIGS. 7A and 7B is different from the above-described transistor 100A in the shape of the conductor 112, the metal oxide 111, and the insulator 110. Specifically, in the cross section of the transistor 100D in the channel length (L) direction, a lower end portion of the metal oxide 111 is not aligned with an upper end portion of the insulator 110. Specifically, the lower end portion of the metal oxide 111 is located inward from the upper end portion of the insulator 110.

For example, the structure of the transistor 100D can be obtained in the following manner: the conductor 112 and the metal oxide 111 are formed by a dry etching method and the insulator 110 is formed by a wet etching method using the same mask.

With the structure of the transistor 100D, the regions 108*f* are formed in the oxide semiconductor 108 in some cases. The regions 108*f* are formed between the region 108*i* and the region 108*s* and between the region 108*i* and the region 108*d*.

The transistor 100E illustrated in FIGS. 8A and 8B is different from the above-described transistor 100A in the shape of the conductor 112, the metal oxide 111, and the insulator 110. Specifically, in the cross section of the transistor 100E in the channel length (L) direction, a lower end portion of the metal oxide 111 is not aligned with an upper end portion of the insulator 110. Specifically, the lower end portion of the metal oxide 111 is located inward from the upper end portion of the insulator 110. In addition, an upper end portion of the metal oxide 111 is not aligned with a lower end portion of the conductor 112. Specifically, the upper end portion of the metal oxide 111 is located outward from the lower end portion of the conductor 112.

For example, in the case where the metal oxide is a material that is difficult to etch (also referred to as a hardly etchable material), the structure of the transistor 100E can be obtained in the following manner: the conductor 112 and the metal oxide 111 are etched by a dry etching method and the insulator 110 is formed by a wet etching method using the same mask.

With the structure of the transistor 100E, the regions 108*f* are formed in the oxide semiconductor 108 in some cases. The regions 108*f* are formed between the region 108*i* and the region 108*s* and between the region 108*i* and the region 108*d*.

The transistor 100F illustrated in FIGS. 9A and 9B is different from the above-described transistor 100A in that an insulator 122 functioning as a planarization film is provided over the insulator 118. The other components of the transistor 100F are similar to those of the transistor 100A described above and have similar effects.

The insulator 122 has a function of covering unevenness and the like caused by the transistor or the like. The insulator 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that the size of each opening in the insulator 122 is not limited to that in FIGS. 9A and 9B, in which the openings are larger than the openings 141*a* and 141*b*, and may be smaller than or equal to the size of each of the openings 141*a* and 141*b*, for example.

In addition, the structure is not limited to the example in FIGS. 9A and 9B, in which the conductors 120*a*, 120*b*, 121*a*, and 121*b* are provided over the insulator 122; for example, the insulator 122 may be provided over the conductors 120*a*, 120*b*, 121*a*, and 121*b* formed over the insulator 118.

<1-4. Structural Example 4 of Semiconductor Device>

Next, structures of transistors included in a semiconductor device different from that in FIGS. 4A to 4C will be described with reference to FIGS. 10A and 10B, FIGS. 11A and 11B, FIGS. 12A and 12B, FIGS. 13A and 13B, and FIGS. 14A and 14B.

Figure 10A:
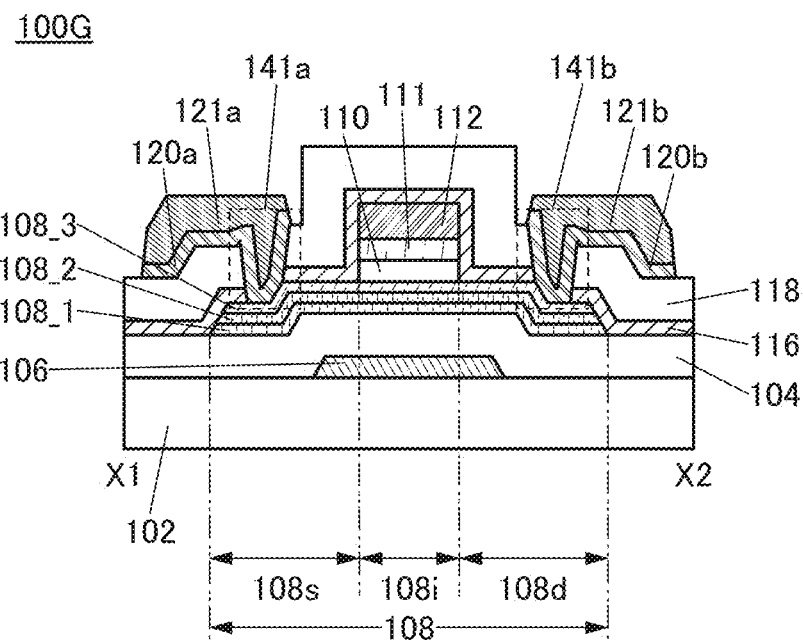
FIGS. 10A and 10B are cross-sectional views illustrating a semiconductor device.
Figure 10B:
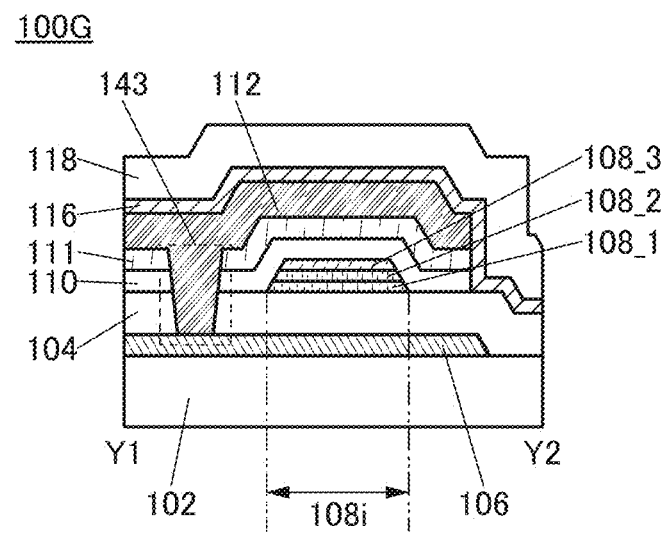
Figure 11A:
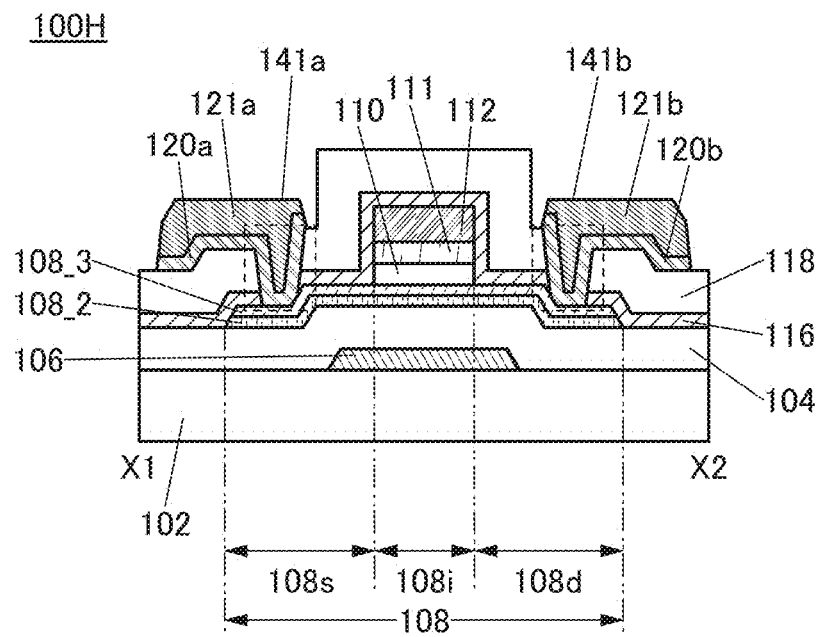
FIGS. 11A and 11B are cross-sectional views illustrating a semiconductor device.
Figure 11B:
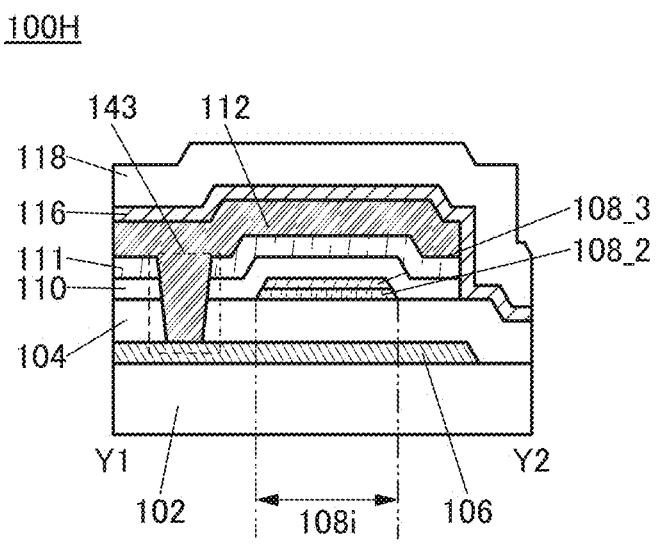
Figure 12A:
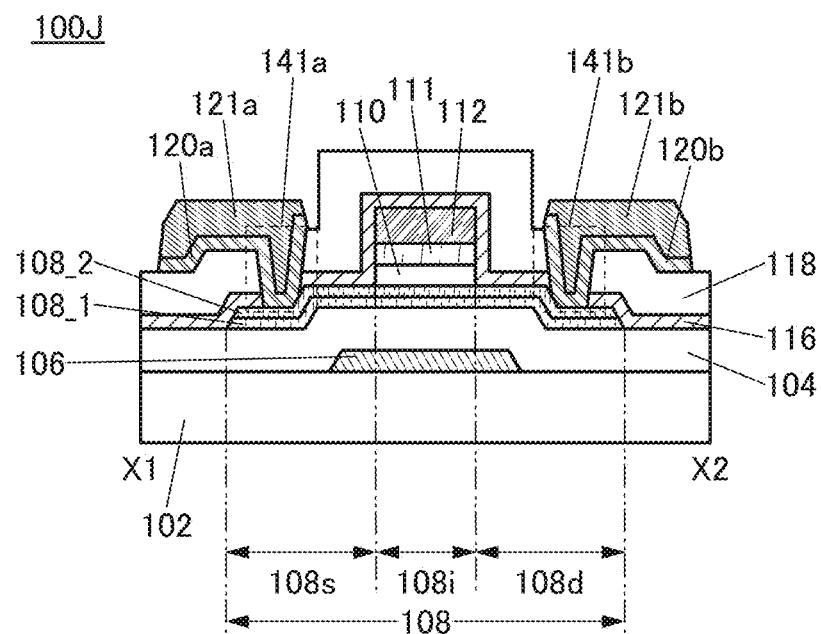
FIGS. 12A and 12B are cross-sectional views illustrating a semiconductor device.
Figure 12B:
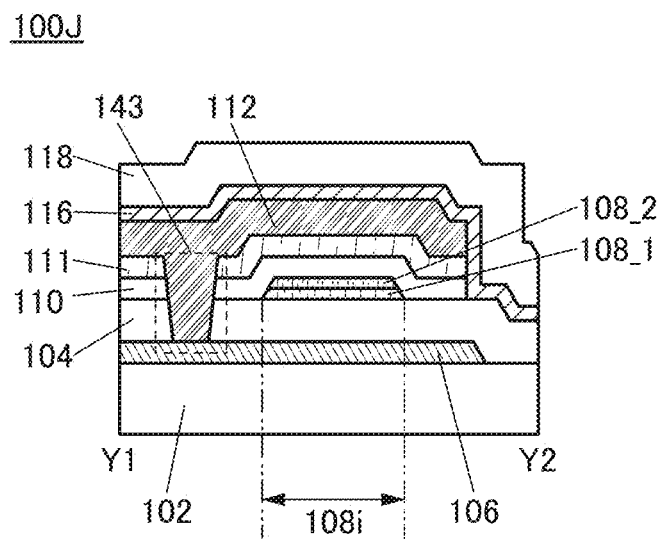
Figure 13A:
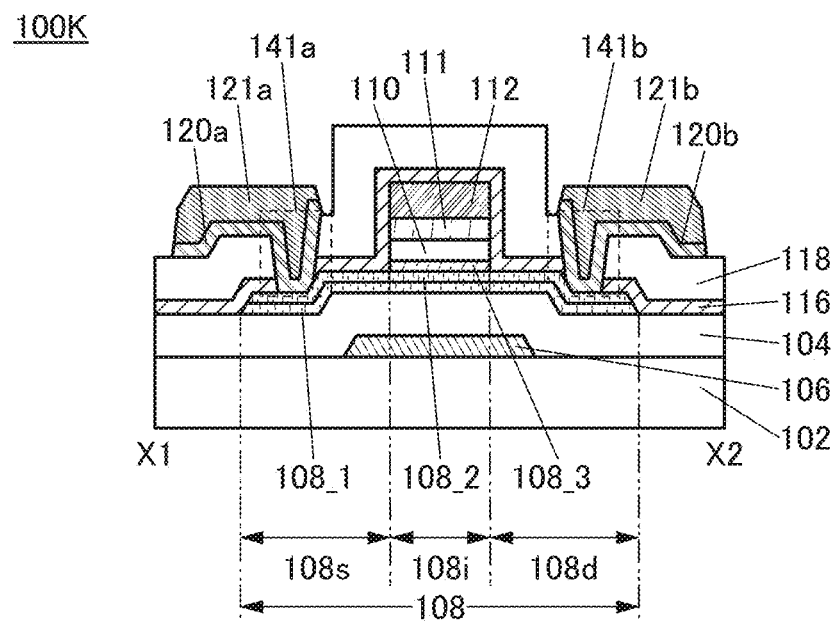
FIGS. 13A and 13B are cross-sectional views illustrating a semiconductor device.
Figure 13B:
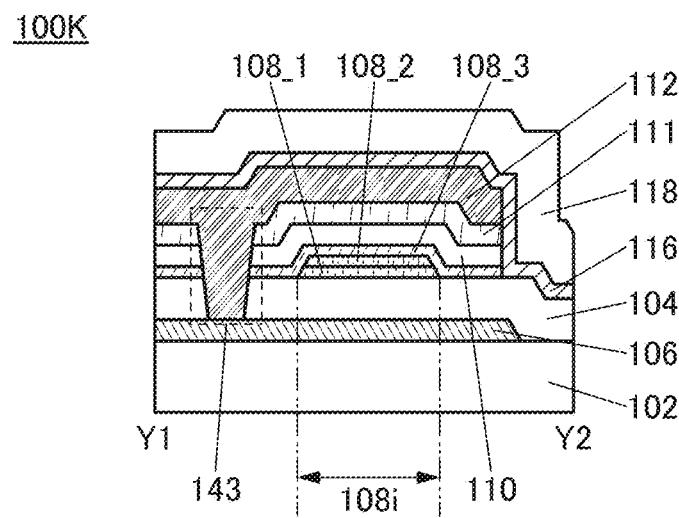
Figure 14A:
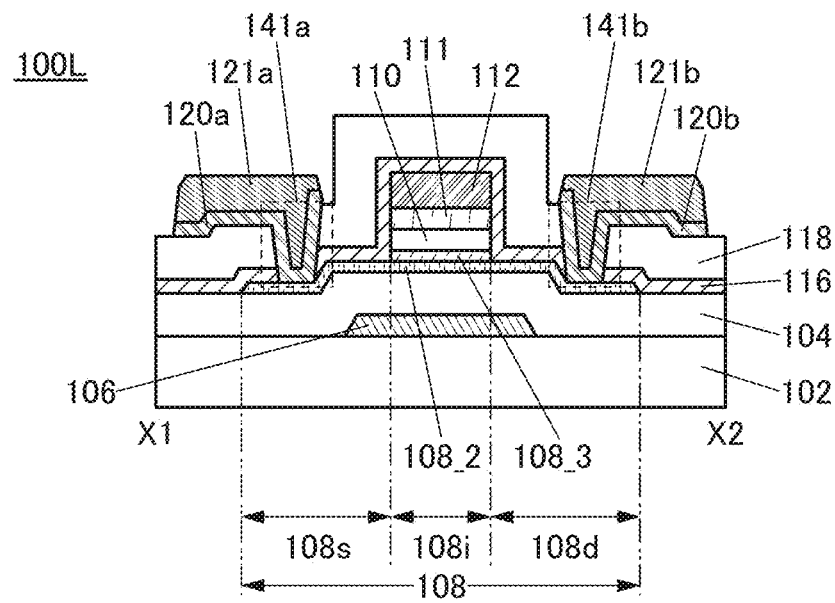
FIGS. 14A and 14B are cross-sectional views illustrating a semiconductor device.
Figure 14B:
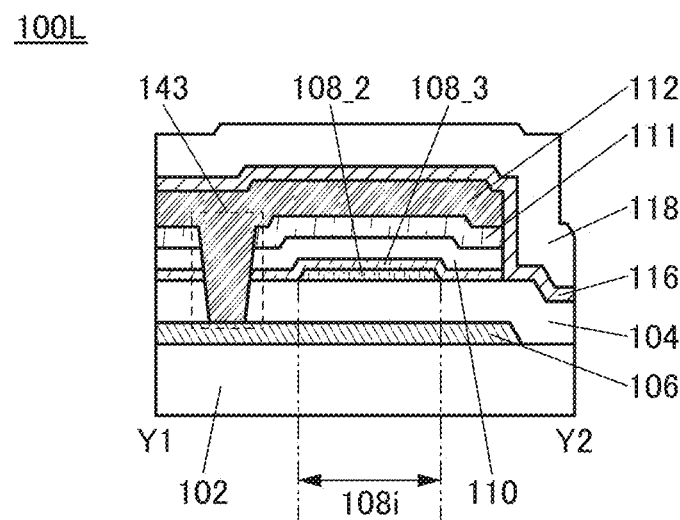

FIGS. 10A and 10B are cross-sectional views of a transistor 100G, FIGS. 11A and 11B are cross-sectional views of a transistor 100H, FIGS. 12A and 12B are cross-sectional views of a transistor 100J, FIGS. 13A and 13B are cross-sectional views of a transistor 100K, and FIGS. 14A and 14B are cross-sectional views of a transistor 100L. Note that top views of the transistor 100G, the transistor 100H, the transistor 100J, the transistor 100K, and the transistor 100L are similar to that of the transistor 100A illustrated in FIG. 4A and thus are not described here.

The transistors 100G, 100H, 100J, 100K, and 100L are different from the above-described transistor 100A in the structure of the oxide semiconductor 108. The other components of the transistors 100G, 100H, 100J, 100K, and 100L are similar to those of the transistor 100A described above and have similar effects.

The oxide semiconductor 108 of the transistor 100G illustrated in FIGS. 10A and 10B includes an oxide semiconductor 108_1 over the insulator 104, an oxide semiconductor 108_2 over the oxide semiconductor 108_1, and an oxide semiconductor 108_3 over the oxide semiconductor 108_2. The region 108*i*, the region 108*s*, and the region 108*d* each have a three-layer structure of the oxide semiconductor 108_1, the oxide semiconductor 108_2, and the oxide semiconductor 108_3.

The oxide semiconductor 108 of the transistor 100H illustrated in FIGS. 11A and 11B includes the oxide semiconductor 108_2 over the insulator 104, and the oxide semiconductor 108_3 over the oxide semiconductor 108_2. The region 108*i*, the region 108*s*, and the region 108*d* each have a two-layer structure of the oxide semiconductor 108_2 and the oxide semiconductor 108_3.

The oxide semiconductor 108 of the transistor 100J illustrated in FIGS. 12A and 12B includes the oxide semiconductor 108_1 over the insulator 104, and the oxide semiconductor 108_2 over the oxide semiconductor 108_1. The region 108*i*, the region 108*s*, and the region 108*d* each have a two-layer structure of the oxide semiconductor 108_1 and the oxide semiconductor 108_2.

The oxide semiconductor 108 of the transistor 100K illustrated in FIGS. 13A and 13B includes the oxide semiconductor 108_1 over the insulator 104, the oxide semiconductor 108_2 over the oxide semiconductor 108_1, and the oxide semiconductor 108_3 over the oxide semiconductor 108_2. The region 108*i* has a three-layer structure of the oxide semiconductor 108_1, the oxide semiconductor 108_2, and the oxide semiconductor 108_3. The region 108*s* and the region 108*d* each have a two-layer structure of the oxide semiconductor 108_1 and the oxide semiconductor 108_2. Note that in the cross section of the transistor 100K in the channel width (W) direction, the oxide semiconductor 108_3 covers side surfaces of the oxide semiconductor 108_1 and the oxide semiconductor 108_2.

The oxide semiconductor 108 of the transistor 100L illustrated in FIGS. 14A and 14B includes the oxide semiconductor 108_2 over the insulator 104, and the oxide semiconductor 108_3 over the oxide semiconductor 108_2. The region 108*i* has a two-layer structure of the oxide semiconductor 108_2 and the oxide semiconductor 108_3. The region 108*s* and the region 108*d* each have a single-layer structure of the oxide semiconductor 108_2. Note that in the cross section of the transistor 100L in the channel width (W) direction, the oxide semiconductor 108_3 covers side surfaces of the oxide semiconductor 108_2.

A side surface of the region 108*i* in the channel width (W) direction or a region in the vicinity of the side surface is easily damaged by processing, resulting in a defect (e.g., oxygen vacancy), or easily contaminated by an impurity attached thereto. Therefore, even when the region 108*i* is substantially intrinsic, stress such as an electric field applied thereto activates the side surface of the region 108*i* in the channel width (W) direction or the region in the vicinity of the side surface and turns it into a low-resistance (n-type) region easily. Moreover, if the side surface of the region 108i in the channel width (W) direction or the region in the vicinity of the side surface is an n-type region, a parasitic channel may be formed because the n-type region serves as a carrier path.

Thus, in the transistor 100K and the transistor 100L, the region 108i has a stacked-layer structure and side surfaces of the region 108i in the channel width (W) direction are covered with one layer of the stacked layers. With such a structure, defects on or in the vicinity of the side surfaces of the region 108i can be reduced or adhesion of an impurity to the side surfaces of the region 108i or to regions in the vicinity of the side surfaces can be suppressed.

<1-5. Method 1 for Manufacturing Semiconductor Device>

Next, an example of the method for manufacturing the transistor 100 illustrated in FIG. 1 will be described with reference to FIGS. 15A to 15D, FIGS. 16A to 16D, and FIGS. 17A and 17B. Note that FIGS. 15A to 15D, FIGS. 16A to 16D, and FIGS. 17A and 17B are cross-sectional views in the channel length (L) direction and the channel width (W) direction and illustrate a method for manufacturing the transistor 100.

First, the insulator 104 is formed over the substrate 102. Subsequently, an oxide semiconductor is formed over the insulator 104. Then, the oxide semiconductor is processed into an island shape, whereby an oxide semiconductor 107 is formed (see FIG. 15A).

The insulator 104 can be formed by a sputtering method, a CVD method, an evaporation method, a pulsed laser deposition (PLD) method, a printing method, a coating method, or the like as appropriate. In this embodiment, as the insulator 104, a 400-nm-thick silicon nitride film and a 50-nm-thick silicon oxynitride film are formed with a plasma CVD apparatus. Note that the oxide semiconductor 107 may be formed over the substrate 102 without forming the insulator 104.

After the insulator 104 is formed, oxygen may be added to the insulator 104. As oxygen added to the insulator 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulator 104, and then, oxygen may be added to the insulator 104 through the film.

The film that suppresses oxygen release can be formed using a conductor or a semiconductor containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulator 104 can be increased.

The oxide semiconductor 107 can be formed by a sputtering method, a coating method, a pulsed laser deposition method, a laser ablation method, a thermal CVD method, or the like. Note that the oxide semiconductor can be processed into the oxide semiconductor 107 in the following manner: a mask is formed over the oxide semiconductor by a lithography process, and then, the oxide semiconductor is partly etched using the mask. Alternatively, the isolated oxide semiconductor 107 may be directly formed by a printing method.

As a power supply device for generating plasma when the oxide semiconductor is formed by a sputtering method, an RF power supply device, an AC power supply device, a DC power supply device, or the like can be used as appropriate. As a sputtering gas for forming the oxide semiconductor, a rare gas (typically argon), oxygen, or a mixed gas of a rare gas and oxygen is used as appropriate. In the mixed gas of a rare gas and oxygen, the proportion of oxygen to the rare gas is preferably increased.

To increase the crystallinity of the oxide semiconductor formed by a sputtering method, for example, the oxide semiconductor is preferably deposited at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the oxide semiconductor 107, a 35-nm-thick oxide semiconductor is deposited with a sputtering apparatus using an In—Ga—Zn metal oxide (In:Ga:Zn=4:2:4.1 [atomic ratio]) as a sputtering target.

After the oxide semiconductor 107 is formed, the oxide semiconductor 107 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert atmosphere containing nitrogen or a rare gas such as helium, neon, argon, xenon, or krypton. Alternatively, the heat treatment may be performed in an inert atmosphere first, and then, in an oxygen atmosphere. It is preferable that the above inert atmosphere and the above oxygen atmosphere not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor while it is heated or by performing heat treatment after the deposition of the oxide semiconductor, the hydrogen concentration in the oxide semiconductor, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 15A:
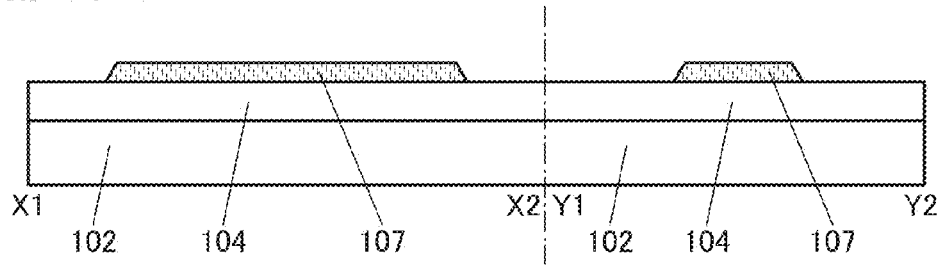
FIGS. 15A to 15D are cross-sectional views illustrating a method for manufacturing a semiconductor device.
Figure 15B:
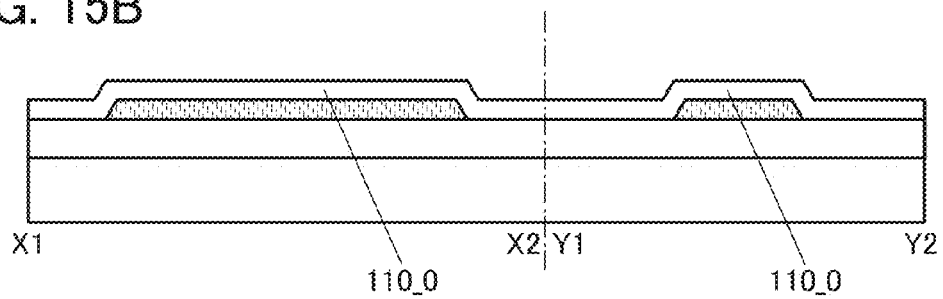

Next, an insulator 110_0 is formed over the insulator 104 and the oxide semiconductor 107 (see FIG. 15B).

For the insulator 110_0, a silicon oxide film or a silicon oxynitride film can be formed with a plasma CVD apparatus. In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulator 110_0 with the plasma CVD apparatus under the conditions that the flow rate of the oxidizing gas is more than 20 times and less than 100 times, preferably more than or equal to 40 times and less than or equal to 80 times the flow rate of the deposition gas and that the pressure in a treatment chamber is lower than 100 Pa or lower than or equal to 50 Pa.

As the insulator 110_0, a dense silicon oxide film or a dense silicon oxynitride film can be formed under the following conditions: the substrate placed in a vacuum-evacuated treatment chamber of the plasma CVD apparatus is held at a temperature higher than or equal to 280° C. and lower than or equal to 400° C.; the pressure in the treatment chamber into which a source gas is introduced is set to be higher than or equal to 20 Pa and lower than or equal to 350 Pa, preferably higher than or equal to 100 Pa and lower than or equal to 300 Pa; and a high-frequency power is supplied to an electrode provided in the treatment chamber.

The insulator 110_0 may be formed by a plasma CVD method using a microwave. A microwave refers to a wave in the frequency range of 300 MHz to 300 GHz. In the case of using a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulator 110_0 having few defects can be formed.

Alternatively, the insulator 110_0 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetras oxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulator 110_0 having high coverage can be formed.

In this embodiment, as the insulator 110_0, a 20-nm-thick silicon oxide film is formed with the plasma CVD apparatus.

Figure 15C:
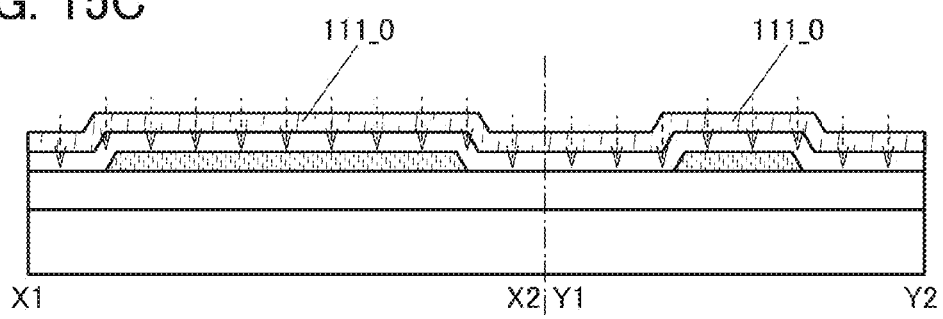

Next, a metal oxide 111_0 is formed over the insulator 110_0 (see FIG. 15C). In FIG. 15C, oxygen added to the insulator 110_0 is schematically shown by arrows.

As the metal oxide 111_0, aluminum oxide can be formed with a sputtering apparatus. In that case, a deposition gas preferably includes oxygen and a rare gas. Note that the proportion of the rare gas in the deposition gas is 1 vol % or more, preferably 3 vol % or more, further preferably 10 vol % or more, and still further preferably 20 vol % or more.

As a sputtering method, an RF sputtering method, a DC sputtering method, an AC sputtering method, or the like can be used. In the case where the metal oxide 111 has an insulating property, it is particularly preferable to use an RF sputtering method. The plasma density is higher in an RF sputtering method than in a DC sputtering method. Therefore, oxygen ions have high energy and excess oxygen is easily supplied to the insulator 110_0.

In the case where an aluminum oxide film is used as the metal oxide 111_0 and deposited to a thickness of 4 nm or more, an oxygen excess region can be formed in the insulator 110_0. On the other hand, in the case where the aluminum oxide film over the insulator 110_0 is deposited to a thickness of 20 nm or more, the supply of oxygen ions in the deposition gas to the insulator 110_0 is suppressed. Therefore, the thickness of the metal oxide 111_0 is preferably more than or equal to 4 nm and less than or equal to 20 nm.

Aluminum oxide has a higher dielectric constant than silicon oxide used for the insulator 110_0. Therefore, the formation of the metal oxide 111_0 enables the total thickness of the gate insulator to be relatively small.

In this embodiment, a 20-nm-thick aluminum oxide film is formed as the metal oxide 111_0 with an RF sputtering apparatus.

Next, a conductor 112_0 is formed over the metal oxide 111_0. The conductor 112_0 can be formed using a material selected from the above-mentioned materials. In this embodiment, for the conductor 112_0, a stack including a 15-nm-thick tungsten film and a 100-nm-thick titanium film is formed with a sputtering apparatus.

To process the conductor 112_0 to be the conductor 112, a wet etching method and/or a dry etching method can be used. In this embodiment, in the processing of the conductor 112_0 into the conductor 112, the titanium film is etched by a dry etching method and then the tungsten film is etched by a dry etching method.

Figure 15D:
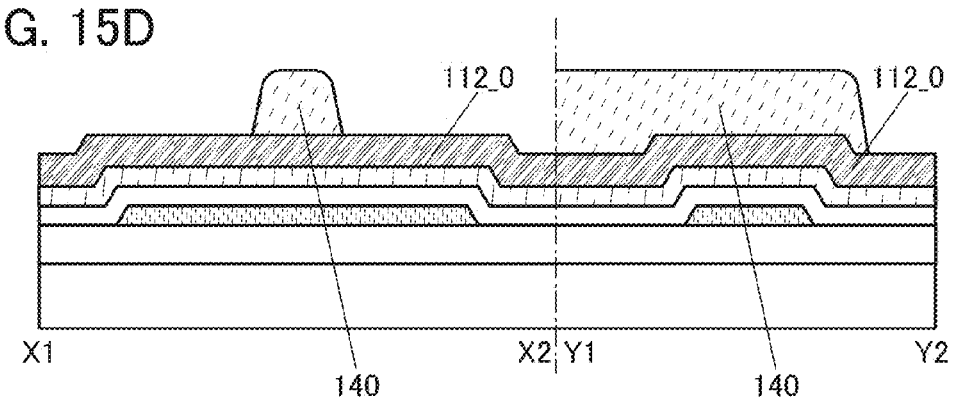

Subsequently, a mask 140 is formed by a lithography process in a desired position over the conductor 112_0 (see FIG. 15D).

Next, etching is performed from above the mask 140 to process the conductor 112_0, the metal oxide 111_0, and the insulator 110_0. Then, the mask 140 is removed, so that the island-shaped conductor 112, the island-shaped metal oxide 111, and the island-shaped insulator 110 are formed (see FIG. 16A).

To process the conductor 112_0, the metal oxide 111_0, and the insulator 110_0, a wet etching method and/or a dry etching method can be used. In this embodiment, the conductor 112_0, the metal oxide 111_0, and the insulator 110_0 are processed by a dry etching method.

In the processing of the conductor 112_0, the metal oxide 111_0, and the insulator 110_0, the thickness of the oxide semiconductor 107 in a region not overlapping with the conductor 112 is decreased in some cases. In other cases, in the processing of the conductor 112_0, the metal oxide 111_0, and the insulator 110_0, the thickness of the insulator 104 in a region not overlapping with the oxide semiconductor 107 is decreased. In the processing of the conductor 112_0, the metal oxide 111_0, and the insulator 110_0, an etchant or an etching gas (e.g., chlorine) might be added to the oxide semiconductor 107 or the constituent element of the conductor 112_0, the metal oxide 111_0, or the insulator 110_0 might be added to the oxide semiconductor 107.

Next, the oxide semiconductor 108 is formed by performing plasma treatment on the oxide semiconductor 107. The plasma treatment is performed under the following conditions: the substrate temperature is 220° C.; an argon gas at a flow rate of 100 sccm and a nitrogen gas at a flow rate of 1000 sccm are introduced into a chamber; the pressure is 40 Pa; and an RF power of 1000 W is supplied between parallel-plate electrodes provided in a plasma CVD apparatus.

Regions of the oxide semiconductor 107 which are exposed to plasma become the region 108s and the region 108d. A region of the oxide semiconductor 107 which overlaps with the conductor 112 becomes the region 108i. Accordingly, the oxide semiconductor 108 including the region 108i, the region 108s, and the region 108d is formed (see FIG. 16B).

In this example, the size of the region 108i in the cross section in the channel length (L) direction is more than or equal to 0.2 µm and less than 1.5 µm, preferably more than or equal to 0.5 µm and less than or equal to 1.0 µm.

Figure 16A:
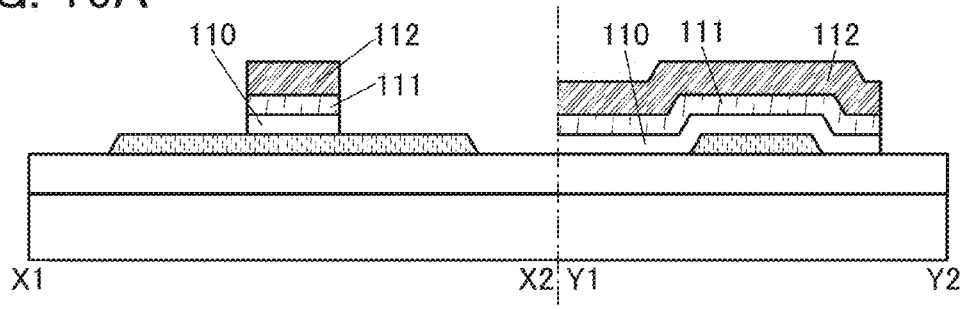
FIGS. 16A to 16D are cross-sectional views illustrating a method for manufacturing a semiconductor device.
Figure 16B:
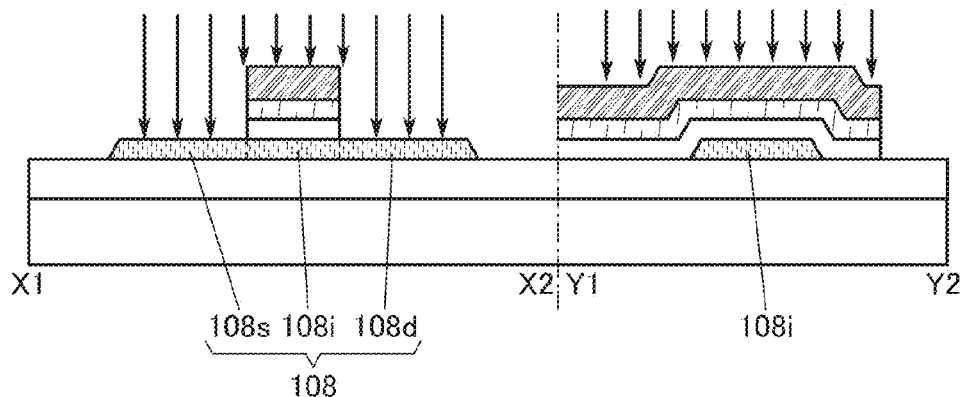

In FIG. 16B, the plasma treatment is schematically shown by arrows.

Figure 16C:
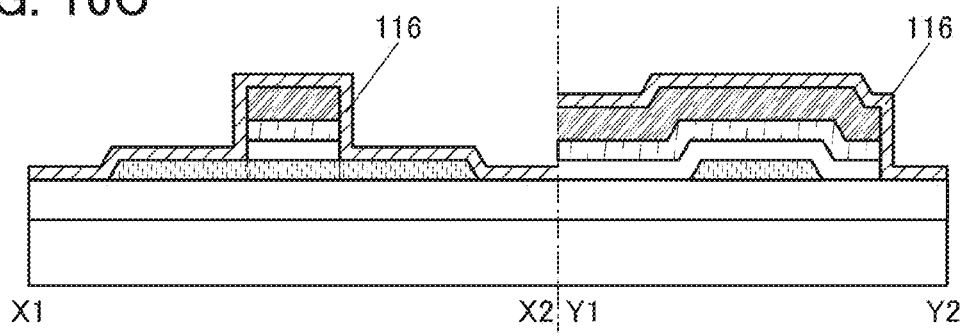

Next, the insulator 116 is formed over the insulator 104, the oxide semiconductor 108, and the conductor 112 (see FIG. 16C). Note that the insulator 116 formed in contact with the regions 108s and 108d may enable the resistance of the regions to be decreased by impurity diffusion from the insulator 116.

The insulator 116 can be formed using a material selected from the above-mentioned materials. In this embodiment, as the insulator 116, a 100-nm-thick silicon nitride oxide film is formed with a plasma CVD apparatus.

The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and a power of 1000 W is supplied to the RF power source (27.12 MHz).

The above-described two steps, i.e., the plasma treatment and the deposition treatment of the silicon nitride oxide film, are successively performed at a temperature of 220° C.

When a silicon nitride oxide film is used for the insulator 116, nitrogen or hydrogen in the silicon nitride oxide film can be supplied to the region 108s and the region 108d in contact with the insulator 116. In addition, when the formation temperature of the insulator 116 is the above temperature, release of excess oxygen contained in the insulator 110 to the outside can be suppressed.

Figure 16D:
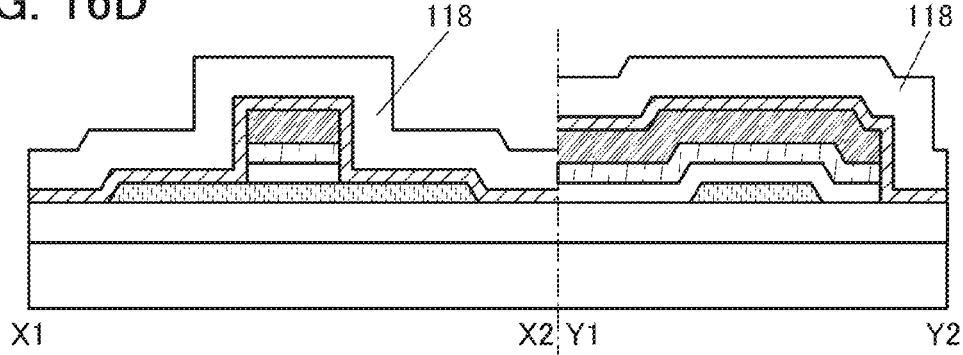

Next, the insulator 118 is formed over the insulator 116 (see FIG. 16D).

The insulator 118 can be formed using a material selected from the above-mentioned materials. In this embodiment, as the insulator 118, a 300-nm-thick silicon oxynitride film is formed with a plasma CVD apparatus.

Figure 17A:
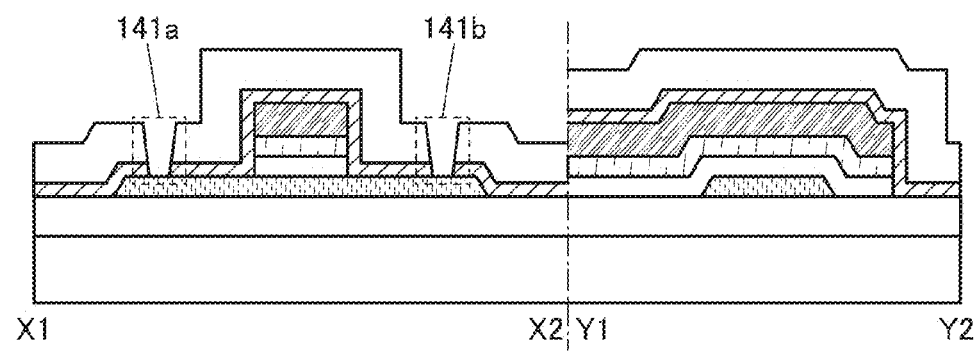
FIGS. 17A and 17B are cross-sectional views illustrating a method for manufacturing a semiconductor device.

Subsequently, a mask is formed by lithography in a desired position over the insulator 118, and then, the insulator 118 and the insulator 116 are partly etched, so that the opening 141a reaching the region 108s and the opening 141b reaching the region 108d are formed (see FIG. 17A).

To etch the insulator 118 and the insulator 116, a wet etching method and/or a dry etching method can be used. In this embodiment, the insulator 118 and the insulator 116 are processed by a dry etching method.

Figure 17B:
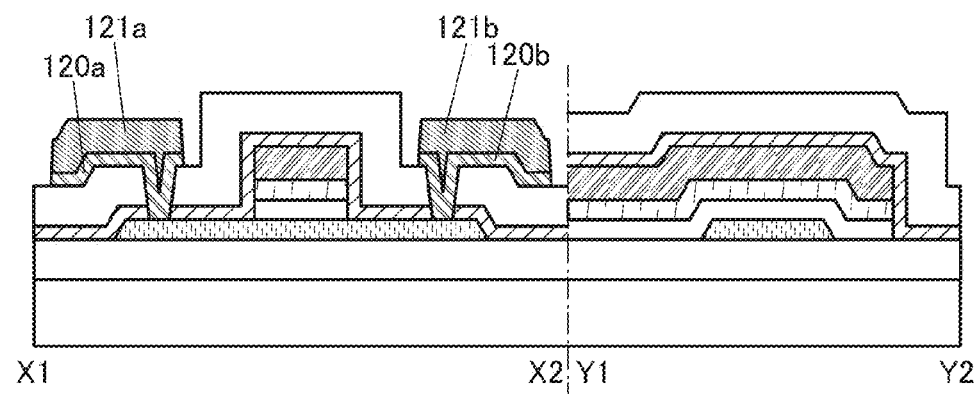

Next, conductors are formed over the region 108s, the region 108d, and the insulator 118 so as to cover the openings 141a and 141b and the conductors are processed into a desired shape, whereby the conductors 120a, 120b, 121a, and 121b are formed (see FIG. 17B).

The conductors 120a, 120b, 121a, and 121b can be formed using a material selected from the above-mentioned materials. In this embodiment, a stack including a 50-nm-thick tungsten film to be the conductors 120a and 120b and a 400-nm-thick copper film to be the conductors 121a and 121b is formed with a sputtering apparatus.

To process the conductors to be the conductors 120a, 120b, 121a, and 121b, a wet etching method and/or a dry etching method can be used. In this embodiment, in the processing of the conductors into the conductors 120a, 120b, 121a, and 121b, the copper film is etched by a wet etching method and then the tungsten film is etched by a dry etching method.

Through the above steps, the transistor 100 in FIGS. 3A to 3C can be manufactured.

Note that the films constituting a part of the transistor 100 (the insulator, the metal oxide, the oxide semiconductor, the conductor, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although a sputtering method and a plasma-enhanced chemical vapor deposition (PECVD) method are typical deposition methods, a thermal CVD method may also be used. As an example of a thermal CVD method, a metal organic chemical vapor deposition (MOCVD) method can be given.

Deposition by a thermal CVD method is performed in the following manner: a source gas and an oxidizer are supplied at a time to a chamber in which the pressure is set to an atmospheric pressure or a reduced pressure, and the source gas and the oxidizer react with each other in the vicinity of the substrate or over the substrate. As seen above, no plasma is generated during deposition by a thermal CVD method, which has an advantage in that no defect due to plasma damage is formed.

Films of the conductor, the insulator, the oxide semiconductor, the metal oxide, and the like can be formed by a thermal CVD method such as an MOCVD method. For example, in the case where an In—Ga—Zn—O film is deposited, trimethylindium ($In(CH_3)_3$), trimethylgallium ($Ga(CH_3)_3$), and dimethylzinc ($Zn(CH_3)_2$) are used. Without being limited to the above combination, triethylgallium ($Ga(C_2H_5)_3$) can be used instead of trimethylgallium, and diethylzinc ($Zn(C_2H_5)_2$) can be used instead of dimethylzinc.

In the case where a hafnium oxide film is formed with a deposition apparatus employing an ALD method, two kinds of gases are used, namely, ozone ($O_3$) as an oxidizer and a source gas which is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide) hafnium).

In the case where an aluminum oxide film is formed with a deposition apparatus employing an ALD method, two kinds of gases are used, namely, $H_2O$ as an oxidizer and a source gas which is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be deposited, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

In the case where an oxide semiconductor such as an In—Ga—Zn—O film is formed with a deposition apparatus employing an ALD method, an $In(CH_3)_3$ gas and an $O_3$ gas are used to form an In—O layer, a $Ga(CH_3)_3$ gas and an $O_3$ gas are used to form a Ga—O layer, and then, a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling water with an inert gas such as Ar may be used instead of an $O_3$ gas, it is preferable to use an $O_3$ gas, which does not contain H.

<1-6. Method 2 for Manufacturing Semiconductor Device>

Next, an example of a method for manufacturing the transistor 100A in FIGS. 4A to 4C will be described with reference to FIGS. 18A to 18D, FIGS. 19A to 19D, and FIGS. 20A to 20C. Note that FIGS. 18A to 18D, FIGS. 19A to 19D, and FIGS. 20A to 20C are cross-sectional views in the channel length (L) direction and the channel width (W) direction and illustrate a method for manufacturing the transistor 100A.

First, the conductor 106 is formed over the substrate 102. Then, the insulator 104 is formed over the substrate 102 and the conductor 106, and an oxide semiconductor is formed over the insulator 104. After that, the oxide semiconductor is processed into an island shape, whereby the oxide semiconductor 107 is formed (see FIG. 18A).

The conductor 106 can be formed using a material and a method similar to those of the conductors 120a, 120b, 121a, and 121b. In this embodiment, as the conductor 106, a stack including a 50-nm-thick tantalum nitride film and a 100-nm-thick copper film is formed by a sputtering method.

Next, the insulator 110_0 and the metal oxide 111_0 are formed over the insulator 104 and the oxide semiconductor 107. Oxygen might be added to the insulator 110_0 during the formation of the metal oxide 111_0 (see FIG. 18B).

Figure 18A:
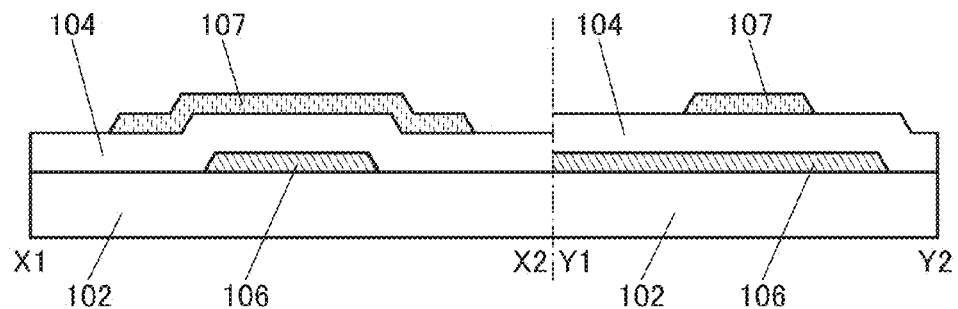
FIGS. 18A to 18D are cross-sectional views illustrating a method for manufacturing a semiconductor device.
Figure 18B:
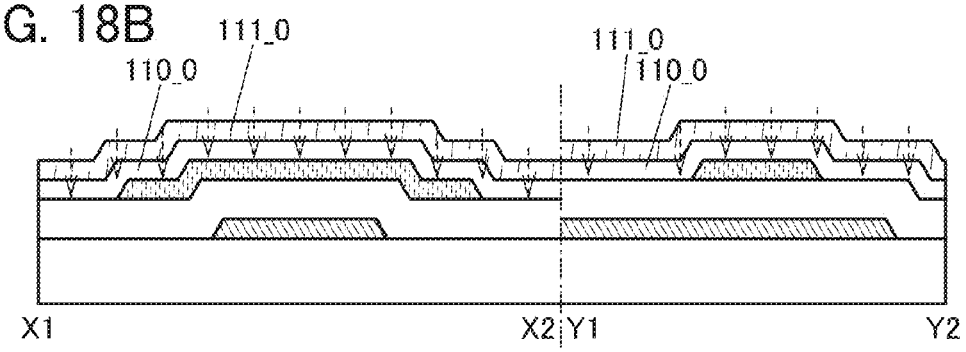
Figure 18C:
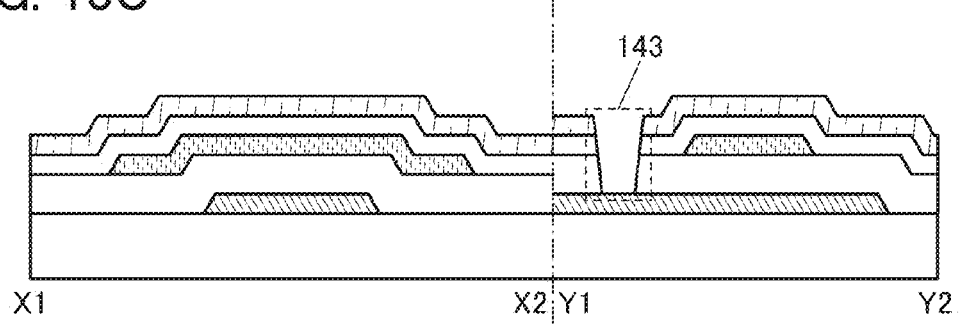

Subsequently, a mask is formed by lithography in a desired position over the metal oxide 111_0, and then, the insulator 110_0, the metal oxide 111_0, and the insulator 104 are partly etched, so that the opening 143 reaching the conductor 106 is formed (see FIG. 18C).

To form the opening 143, a wet etching method and/or a dry etching method can be used. In this embodiment, the opening 143 is formed by a dry etching method.

Figure 18D:
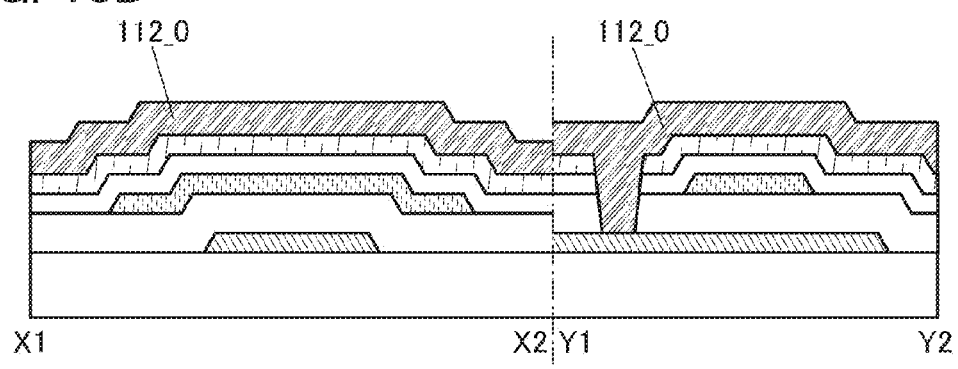

Next, the conductor 112_0 is formed over the conductor 106, the insulator 110_0, and the metal oxide 111_0 so as to cover the opening 143 (see FIG. 18D). Furthermore, the conductor 112_0 formed to cover the opening 143 is electrically connected to the conductor 106.

Figure 19A:
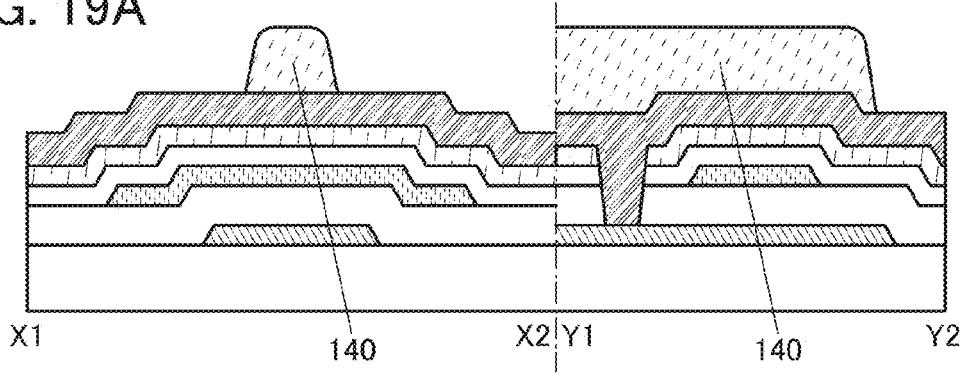
FIGS. 19A to 19D are cross-sectional views illustrating a method for manufacturing a semiconductor device.
Figure 19B:
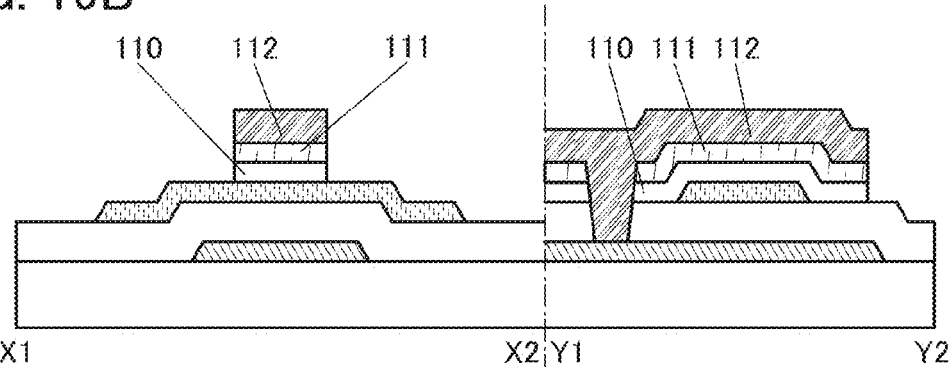

Subsequently, the mask 140 is formed by a lithography process in a desired position over the conductor 112_0 (see FIG. 19A).

Next, etching is performed from above the mask 140 to process the conductor 112_0, the metal oxide 111_0, and the insulator 110_0. After the processing of the conductor 112_0, the metal oxide 111_0, and the insulator 110_0, the mask 140 is removed. As a result of the processing of the conductor 112_0, the metal oxide 111_0, and the insulator 110_0, the island-shaped conductor 112, the island-shaped metal oxide 111, and the island-shaped insulator 110 are formed (see FIG. 19B).

In this embodiment, the conductor 112_0, the metal oxide 111_0, and the insulator 110_0 are processed by a dry etching method.

Next, the oxide semiconductor 108 is formed by performing plasma treatment on the oxide semiconductor 107. Regions of the oxide semiconductor 107 which are exposed to plasma become the region 108s and the region 108d. A region of the oxide semiconductor 107 which overlaps with the conductor 112 becomes the region 108i. Accordingly, the oxide semiconductor 108 including the region 108i, the region 108s, and the region 108d is formed (see FIG. 19C).

In this example, the size of the region 108i in the cross section in the channel length (L) direction is more than or equal to 0.5 µm and less than or equal to 2.0 µm, preferably less than or equal to 1.5 µm.

Figure 19C:
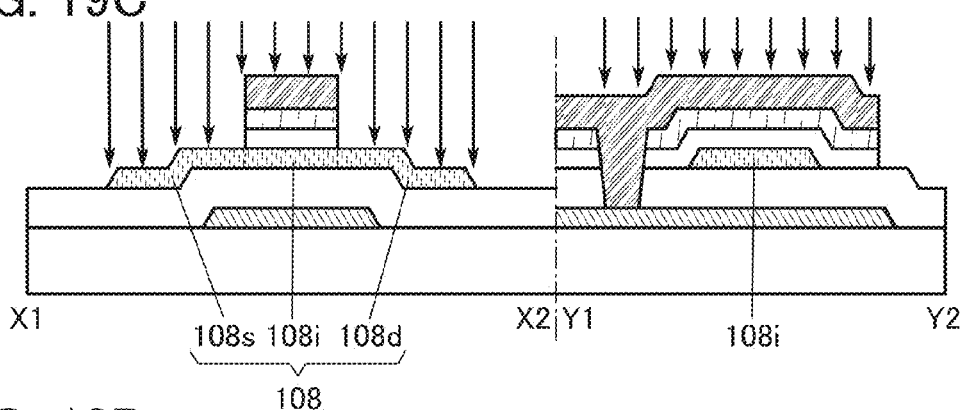
Figure 19D:
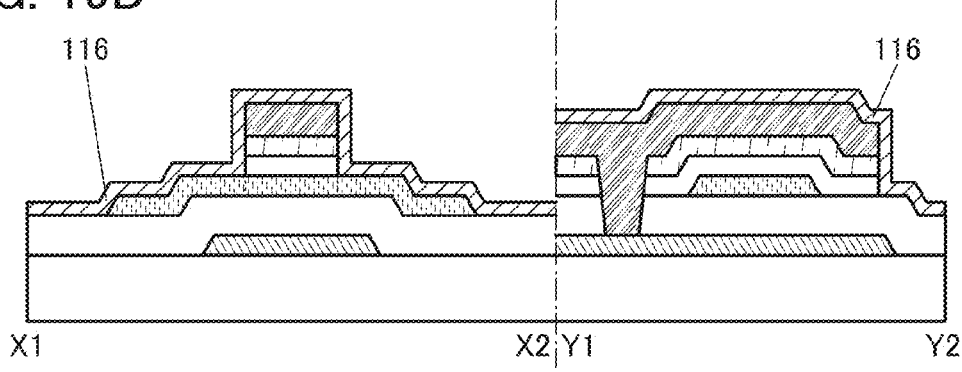

In FIG. 19C, the plasma treatment is schematically shown by arrows.

Next, the insulator 116 is formed over the insulator 104, the oxide semiconductor 108, and the conductor 112. Note that the insulator 116 formed in contact with the regions 108s and 108d may enable the resistance of the regions to be decreased by impurity diffusion from the insulator 116 (see FIG. 19D).

The above-described two steps, i.e., the plasma treatment and the deposition treatment of the silicon nitride oxide film, are successively performed at a temperature of 220° C.

When a silicon nitride oxide film is used for the insulator 116, nitrogen or hydrogen in the silicon nitride oxide film can be supplied to the region 108s and the region 108d in contact with the insulator 116. In addition, when the formation temperature of the insulator 116 is the above temperature, release of excess oxygen contained in the insulator 110 to the outside can be suppressed.

Figure 20A:
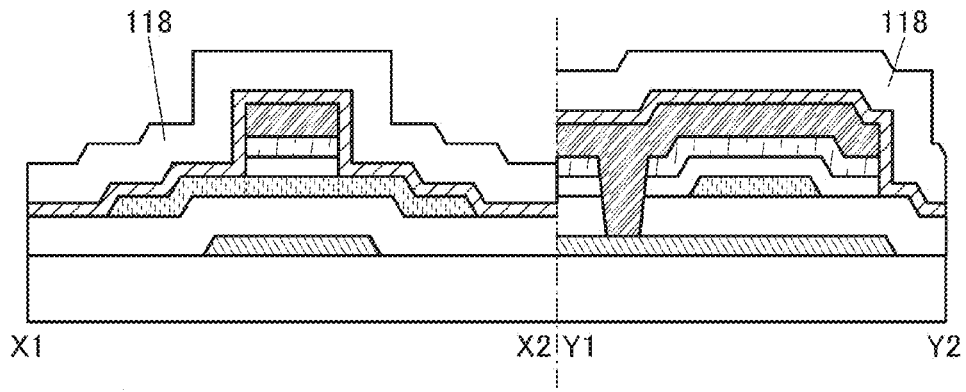
FIGS. 20A to 20C are cross-sectional views illustrating a method for manufacturing a semiconductor device.

Next, the insulator 118 is formed over the insulator 116 (see FIG. 20A).

Figure 20B:
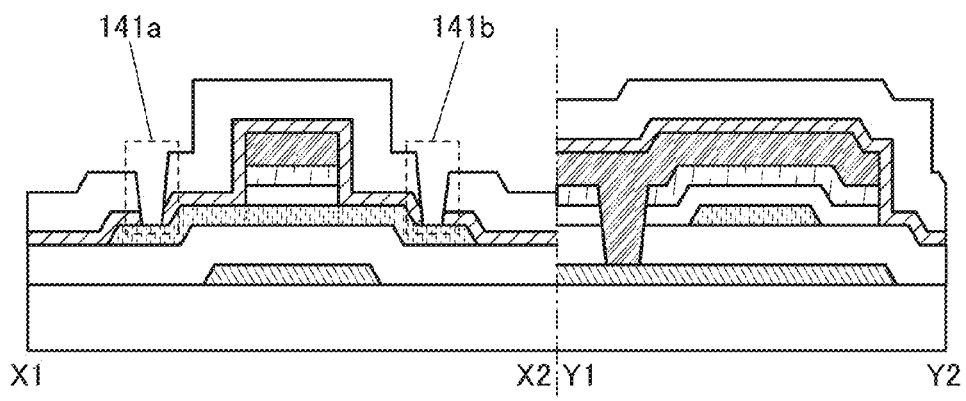

Subsequently, a mask is formed by lithography in a desired position over the insulator 118, and then, the insulator 118 and the insulator 116 are partly etched, so that the opening 141a reaching the region 108s and the opening 141b reaching the region 108d are formed (see FIG. 20B).

Figure 20C:
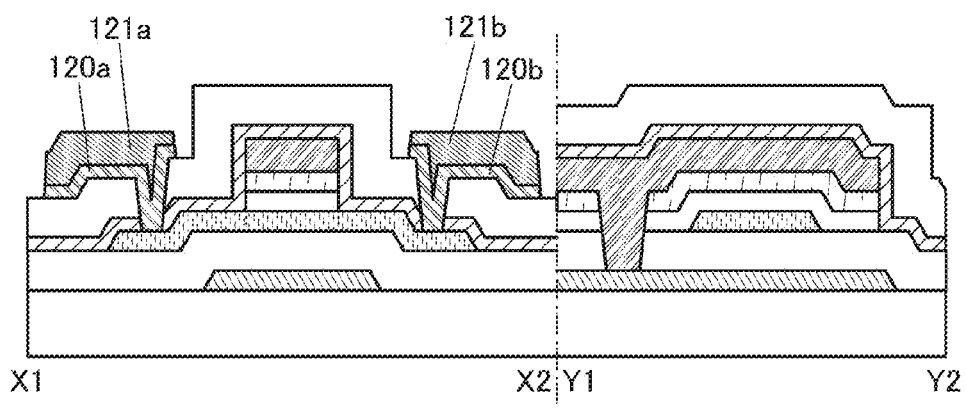

Next, conductors are formed over the region 108s, the region 108d, and the insulator 118 so as to cover the openings 141a and 141b and the conductors are processed into a desired shape, whereby the conductors 120a, 120b, 121a, and 121b are formed (see FIG. 20C).

Through the above steps, the transistor 100A in FIGS. 4A to 4C can be manufactured.

One embodiment of the present invention is not limited to the example described in this embodiment, in which the transistor includes an oxide semiconductor. Depending on circumstances or conditions, in one embodiment of the present invention, the transistor does not necessarily include an oxide semiconductor. For example, a channel region, the vicinity of the channel region, a source region, or a drain region of the transistor may be formed using a material containing silicon (Si), germanium (Ge), silicon germanium (SiGe), gallium arsenide (GaAs), or the like.

The structures and the methods described in this embodiment can be combined as appropriate with any of the structures and the methods described in the other embodiments and examples.

Embodiment 2

In this embodiment, examples of a semiconductor device including a transistor and a method for manufacturing the semiconductor device will be described with reference to FIGS. 21A to 21C, FIGS. 22A to 22D, FIGS. 23A and 23B, FIGS. 24A and 24B, FIGS. 25A and 25B, FIGS. 26A and 26B, FIGS. 27A and 27B, FIGS. 28A and 28B, FIGS. 29A and 29B, FIGS. 30A and 30B, FIGS. 31A and 31B, FIGS. 32A and 32B, FIGS. 33A to 33D, FIGS. 34A to 34D, FIGS. 35A and 35B, FIGS. 36A to 36D, FIGS. 37A to 37D, and FIGS. 38A to 38C.

Although an insulator is used as the metal oxide formed between the insulator 110 and the conductor 112 in Embodiment 1, a conductor is used as the metal oxide in the semiconductor device described in this embodiment. In other words, the difference is as follows: the metal oxide 111 in each of the transistors 100 and 100A to 100L has an insulating property, whereas a metal oxide 113 in each of transistors 100M to 100Y has a conductive property. Therefore, components of the transistors 100M to 100Y which have functions similar to those of the components of the transistor 100 are denoted by the same reference numerals as those of the transistor 100.

<2-1. Structural Example 5 of Semiconductor Device>

Figure 21A:
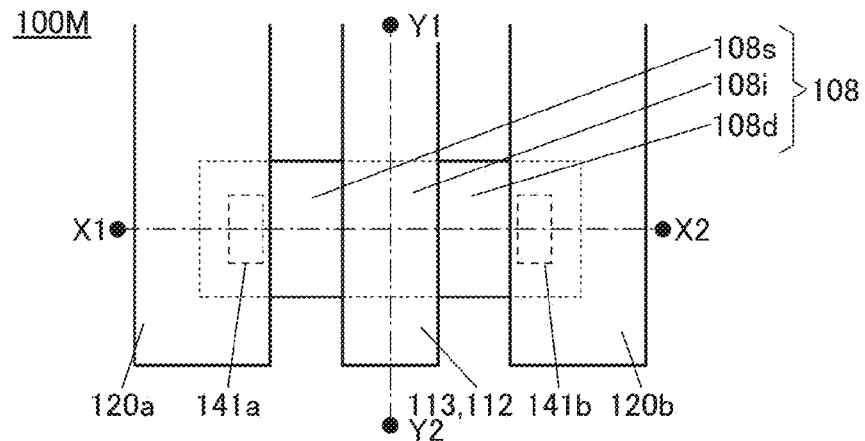
FIGS. 21A to 21C are a top view and cross-sectional views illustrating a semiconductor device.
Figure 21B:
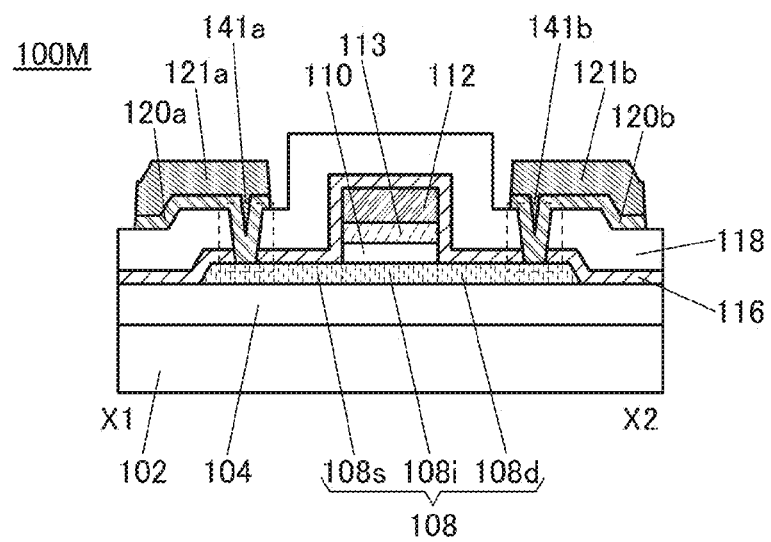
Figure 21C:
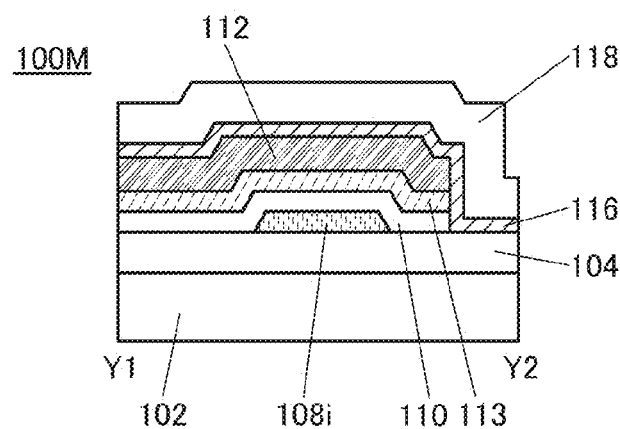

FIGS. 21A to 21C illustrate an example of a transistor included in a semiconductor device.

FIG. 21A is a top view of the transistor 100M. FIG. 21B is a cross-sectional view taken along dashed-dotted line X1-X2 in FIG. 21A. FIG. 21C is a cross-sectional view taken along dashed-dotted line Y1-Y2 in FIG. 21A. For clarity, FIG. 21A does not illustrate some components such as the insulator 110. As in FIG. 21A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

The transistor 100M illustrated in FIGS. 21A to 21C includes the insulator 104 over the substrate 102; the oxide semiconductor 108 over the insulator 104; the insulator 110 over the oxide semiconductor 108; the metal oxide 113 over the insulator 110; the conductor 112 over the metal oxide 113; and the insulator 116 over the insulator 104, the oxide semiconductor 108, and the conductor 112. Note that the oxide semiconductor 108 includes the region 108$i$ overlapping with the conductor 112, the region 108$s$ in contact with the insulator 116, and the region 108$d$ in contact with the insulator 116.

The transistor 100M may further include the insulator 118 over the insulator 116; the conductors 120$a$ and 121$a$ electrically connected to the region 108$s$ through the opening 141$a$ provided in the insulators 116 and 118; and the conductors 120$b$ and 121$b$ electrically connected to the region 108$d$ through the opening 141$b$ provided in the insulators 116 and 118.

Note that the metal oxide 113 functions as part of a gate electrode.

Here, a method for manufacturing the transistor 100M in FIGS. 21A to 21C will be described with reference to FIG. 1. Note that FIG. 1 is a process flow chart showing a method for manufacturing a semiconductor device.

The transistor 100M illustrated in FIGS. 21A to 21C is manufactured through at least first to eighth steps in FIG. 1. Note that the difference between the third step described in <1-1. Structural example 1 of semiconductor device> and the third step in this embodiment is as follows: the metal oxide having an insulating property is formed in the former, whereas the metal oxide having a conductive property is formed in the latter.

[Third Step: Formation of Metal Oxide]

The third step includes a step of forming a metal oxide (see Step S03 in FIG. 1). In the case of the transistor 100M, the third step corresponds to a step of forming the metal oxide 113 over the insulator 110. The metal oxide 113 formed using a conductive material functions as a gate electrode.

As described above, the metal oxide 113 is preferably deposited using a sputtering apparatus.

[Fourth Step: Formation of Conductor]

The fourth step includes a step of forming a conductor (see Step S04 in FIG. 1). In the case of the transistor 100M, the fourth step corresponds to a step of forming the conductor 112 over the metal oxide 113.

Note that the conductor 112 may be formed using a light-transmitting conductor or a light-shielding conductor. The use of a light-shielding conductor can reduce malfunctions of the transistor due to light. In the case where the metal oxide 113 has a sufficient conductive property, this step may be omitted.

After the fourth step, the transistor 100M can be manufactured through the fifth to eighth steps described in <1-1. Structural example 1 of semiconductor device>.

The details of the method for manufacturing the transistor 100M will be described later.

As described above, in the method for manufacturing a semiconductor device of one embodiment of the present invention, the third step, that is, the step of forming the metal oxide, is performed; accordingly, the oxygen excess region can be formed in the insulator 110. In addition, the fifth step, that is, the step of forming the nitride insulator, is performed at a temperature higher than or equal to 150° C. and lower than 300° C.; accordingly, oxygen release from the side surface of the insulator containing excess oxygen to the outside can be suppressed. Furthermore, the density of the metal oxide 113 is higher than that of the insulator 110; accordingly, oxygen diffusion from the region 108$i$ and the insulator 110 to the conductor 112 side can be suppressed. As a result, a change in electrical characteristics of a transistor including an oxide semiconductor can be prevented and the reliability of the transistor can be improved.

Next, details of the components of the semiconductor device in FIGS. 21A to 21C will be described.

[Metal Oxide]

In the case where an oxide semiconductor typified by an In—Ga—Zn oxide is used as the metal oxide 113, the oxide semiconductor can have a high carrier density when nitrogen or hydrogen is supplied from the insulator 116. In other words, the oxide semiconductor functions as an oxide conductor (OC). Therefore, in this embodiment, the metal oxide 113 can also be referred to as a conductor and may function as a gate electrode in some cases.

The metal oxide 113 can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO).

The metal oxide 113 may have a function of preventing impurity diffusion from a component of a structure body formed over the metal oxide 113.

Note that it is preferable that a light-shielding metal film be used as the conductor 112 because the region 108$i$ formed under the conductor 112 can be shielded from light. The use of a metal film for the conductor 112 produces any of the following effects: the resistance of the metal oxide 113 is reduced by the diffusion of the constituent element of the metal film to the metal oxide 113 side, the resistance is reduced by damage (e.g., sputtering damage) during the deposition of the metal film, and the resistance is reduced when oxygen vacancies are formed by the diffusion of oxygen in the metal oxide 113 into the metal film. Since the metal oxide 113 has a function of a gate electrode, the formation of the conductor 112 may be omitted.

<2-2. Structural Example 6 of Semiconductor Device>

Next, a structure of a transistor included in a semiconductor device different from that in FIGS. 21A to 21C will be described with reference to FIGS. 22A, 22B, and 22C or 22D.

Figure 22A:
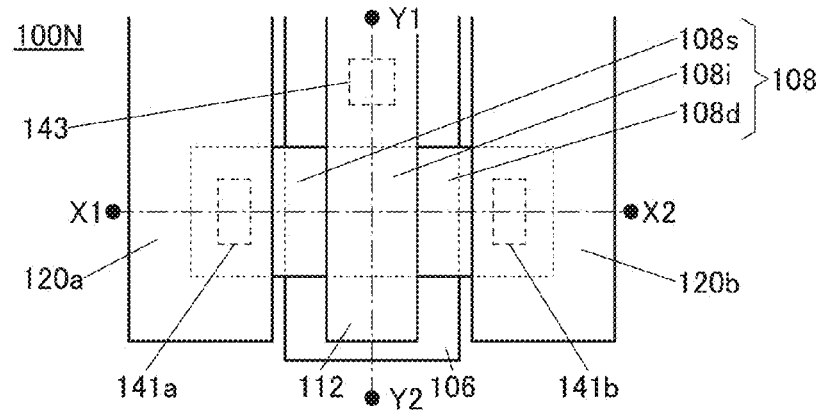
FIGS. 22A to 22D are a top view and cross-sectional views illustrating a semiconductor device.
Figure 22B:
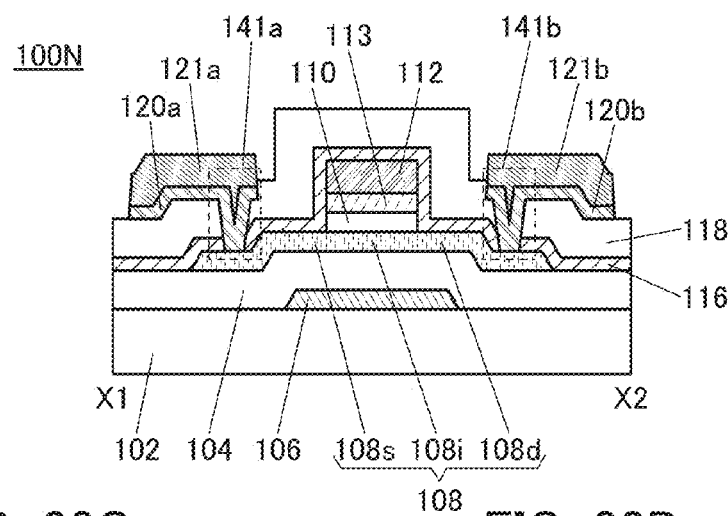
Figure 22C:
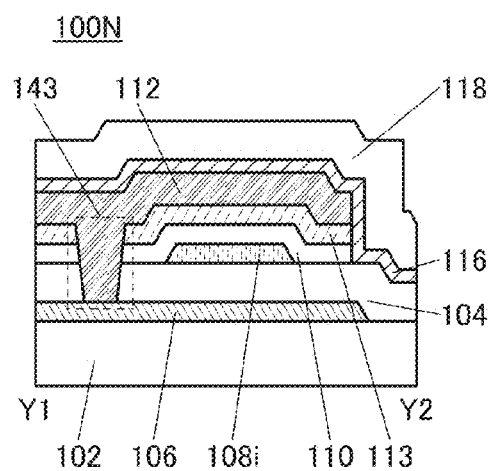
Figure 22D:
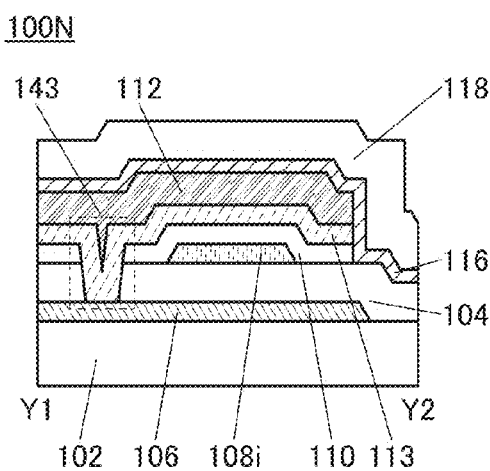

FIG. 22A is a top view of the transistor 100N. FIG. 22B is a cross-sectional view taken along dashed-dotted line X1-X2 in FIG. 22A. FIG. 22C or 22D is a cross-sectional view taken along dashed-dotted line Y1-Y2 in FIG. 22A.

Note that the difference between the transistor 100A and the transistor 100N is as follows: the metal oxide 111 in the transistor 100A has an insulating property, whereas the metal oxide 113 in the transistor 100N has a conductive property. Therefore, components of the transistor 100N which have functions similar to those of the components of the transistor 100A are denoted by the same reference numerals as those of the transistor 100A.

The transistor 100N illustrated in FIGS. 22A, 22B, and 22C or 22D includes the conductor 106 over the substrate 102; the insulator 104 over the conductor 106; the oxide semiconductor 108 over the insulator 104; the insulator 110 over the oxide semiconductor 108; the metal oxide 113 over the insulator 110; the conductor 112 over the metal oxide 113; and the insulator 116 over the insulator 104, the oxide semiconductor 108, and the conductor 112. Note that the oxide semiconductor 108 includes the region 108$i$ overlapping with the conductor 112, the region 108$s$ in contact with the insulator 116, and the region 108$d$ in contact with the insulator 116.

The transistor 100N includes the conductor 106 and the opening 143 in addition to the components of the transistor 100M described above.

Note that the opening 143 is provided in the insulators 104 and 110 and the metal oxide 113 in FIG. 22C. The conductor 106 is electrically connected to the conductor 112 through the opening 143. Thus, the same potential is applied to the conductor 106, the metal oxide 113, and the conductor 112.

The opening 143 may be provided in the insulator 104 and the insulator 110 as illustrated in FIG. 22D. In this case, the conductor 106 is electrically connected to the metal oxide 113 and the conductor 112 through the opening 143. Thus, the same potential is applied to the conductor 106, the metal oxide 113, and the conductor 112.

Different potentials may be applied to the conductor 106 and the conductor 112 without providing the opening 143. Alternatively, the conductor 106 may be used as a light-shielding film without providing the opening 143. When the conductor 106 is formed using a light-shielding material, for example, light irradiation of the region 108$i$ from the bottom can be reduced.

In the case of the structure of the transistor 100N, the conductor 106 functions as a first gate electrode (also referred to as a bottom-gate electrode), the conductor 112 functions as a second gate electrode (also referred to as a top-gate electrode), the insulator 104 functions as a first gate insulator, and the insulator 110 functions as a second gate insulator.

The conductor 106 can be formed using a material similar to the above-described materials of the conductors 112, 120$a$, 120$b$, 121$a$, and 121$b$. It is particularly preferable to use a material containing copper for the conductor 106 because the resistance can be reduced. For example, the conductor 106 preferably has a stacked-layer structure in which a copper film is provided over a titanium nitride film, a tantalum nitride film, or a tungsten film. The conductor 106 can be used not only as the first gate electrode of the transistor 100N, but also as a power source supply wiring, a signal supply wiring, a connection wiring, or the like of the display device.

In this manner, unlike the transistor 100 described above, the transistor 100N in FIGS. 22A, 22B, and 22C or 22D has a structure in which conductors functioning as gate electrodes are provided over and under the oxide semiconductor 108. As in the transistor 100N, a semiconductor device of one embodiment of the present invention may have a plurality of gate electrodes.

Here, a method for manufacturing the transistor 100N in FIGS. 22A, 22B, and 22C or 22D will be described with reference to FIG. 2. Note that FIG. 2 is a process flow chart showing a method for manufacturing a semiconductor device.

The transistor 100N illustrated in FIGS. 22A, 22B, and 22C or 22D is manufactured through at least the first to tenth steps in FIG. 2.

[Ninth Step: Formation of First Gate Electrode]

The ninth step includes a step of forming a first gate electrode (see Step S09 in FIG. 2). In the case of the transistor 100N, the ninth step corresponds to a step of forming the conductor 106 over the substrate 102.

[Tenth Step: Formation of First Gate Insulator]

The tenth step includes a step of forming a first gate insulator over the first gate electrode (see Step S10 in FIG. 2). In the case of the transistor 100N, the tenth step corresponds to a step of forming the insulator 104 over the substrate 102 and the conductor 106.

After the tenth step, the transistor 100N can be manufactured through the first to eighth steps described in <2-1. Structural example 5 of semiconductor device>.

The details of the method for manufacturing the transistor 100N will be described later.

As described above, in the method for manufacturing a semiconductor device of one embodiment of the present invention, the third step, that is, the step of forming the metal oxide 113, is performed; accordingly, the oxygen excess region can be formed in the insulator 110. In addition, the fifth step, that is, the step of forming the nitride insulator, is performed at a temperature higher than or equal to 150° C. and lower than 300° C.; accordingly, oxygen release from the side surface of the insulator containing excess oxygen to the outside can be suppressed. Furthermore, the density of the metal oxide 113 is higher than that of the insulator 110; accordingly, oxygen diffusion from the region 108$i$ and the insulator 110 to the conductor 112 side can be suppressed. As a result, a change in electrical characteristics of a transistor including an oxide semiconductor can be prevented and the reliability of the transistor can be improved.

As illustrated in FIG. 22C or 22D, the oxide semiconductor 108 faces the conductor 106 functioning as a first gate electrode and the conductor 112 and the metal oxide 113 functioning as a second gate electrode and is positioned between the two conductors functioning as the gate electrodes.

Furthermore, the length of the conductor 112 in the channel width direction is larger than the length of the oxide semiconductor 108 in the channel width direction. In the channel width direction, the whole oxide semiconductor 108 is covered with the conductor 112 and the metal oxide 113 with the insulator 110 provided therebetween. Since the conductor 112 is connected to the conductor 106 through the opening 143 provided in the insulators 104 and 110, a side surface of the oxide semiconductor 108 in the channel width direction faces the conductor 112 and the metal oxide 113 with the insulator 110 provided therebetween.

In other words, in the channel width direction of the transistor 100N, the conductors 106 and 112 and the metal oxide 113 are connected to each other through the opening 143 provided in the insulators 104 and 110, and the conductors 106 and 112 and the metal oxide 113 surround the oxide semiconductor 108 with the insulators 104 and 110 positioned therebetween.

Such a structure enables the oxide semiconductor 108 included in the transistor 100N to be electrically surrounded by electric fields of the conductor 106 functioning as a first gate electrode and the conductor 112 and the metal oxide 113 functioning as a second gate electrode. A device structure of a transistor, like that of the transistor 100N, in which electric fields of a first gate electrode and a second gate electrode electrically surround the oxide semiconductor 108 in which a channel region is formed can be referred to as a surrounded channel (S-channel) structure.

Since the transistor 100N has the S-channel structure, an electric field for inducing a channel can be effectively applied to the oxide semiconductor 108 by the conductor 106 or the conductor 112 and the metal oxide 113; thus, the current drive capability of the transistor 100N can be improved and high on-state current characteristics can be obtained. As a result of the high on-state current, it is possible to reduce the size of the transistor 100N. Furthermore, since the transistor 100N has a structure in which the oxide semiconductor 108 is surrounded by the conductor 106, the conductor 112, and the metal oxide 113, the mechanical strength of the transistor 100 N can be increased.

When seen in the channel width direction of the transistor 100N, an opening different from the opening 143 may be formed on the side of the oxide semiconductor 108 on which the opening 143 is not formed.

When a transistor has a pair of gate electrodes between which a semiconductor film is positioned as in the transistor 100N, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The other components of the transistor 100N are similar to those of the transistor 100M described above and have similar effects.

<2-3. Structural Example 7 of Semiconductor device>

Next, structures of transistors included in a semiconductor device different from that in FIGS. 22A, 22B, and 22C or 22D will be described with reference to FIGS. 23A and 23B, FIGS. 24A and 24B, FIGS. 25A and 25B, FIGS. 26A and 26B, and FIGS. 27A and 27B.

Figure 23A:
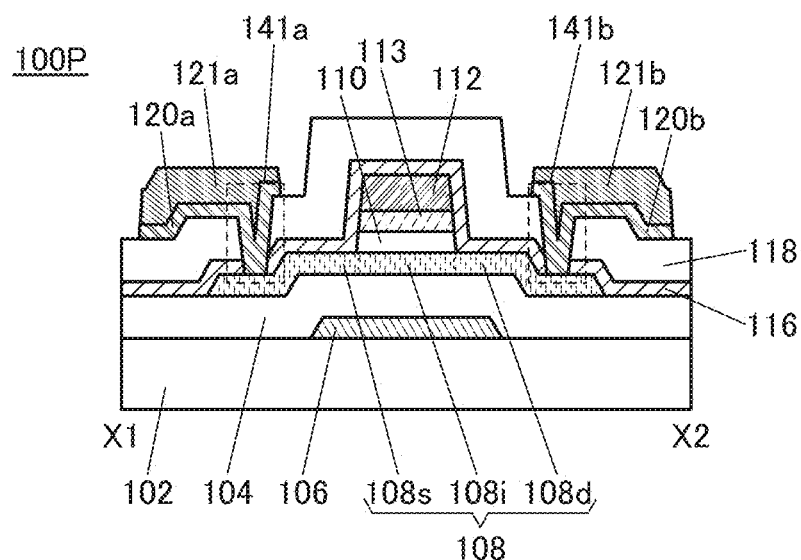
FIGS. 23A and 23B are cross-sectional views illustrating a semiconductor device.
Figure 23B:
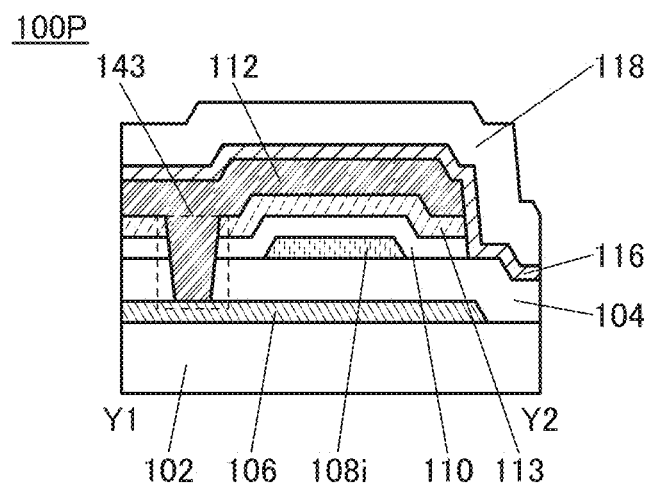
Figure 24A:
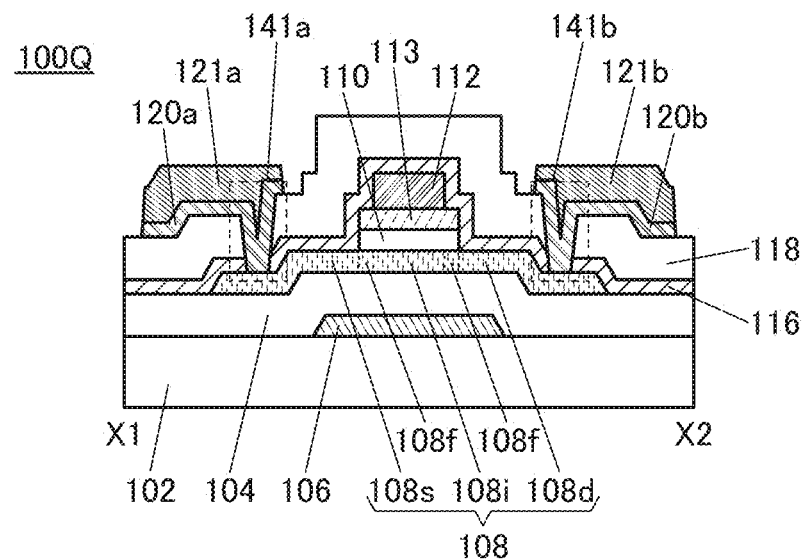
FIGS. 24A and 24B are cross-sectional views illustrating a semiconductor device.
Figure 24B:
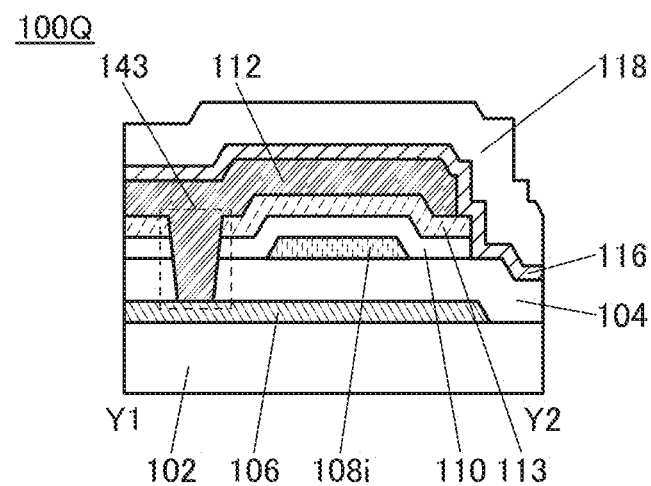
Figure 25A:
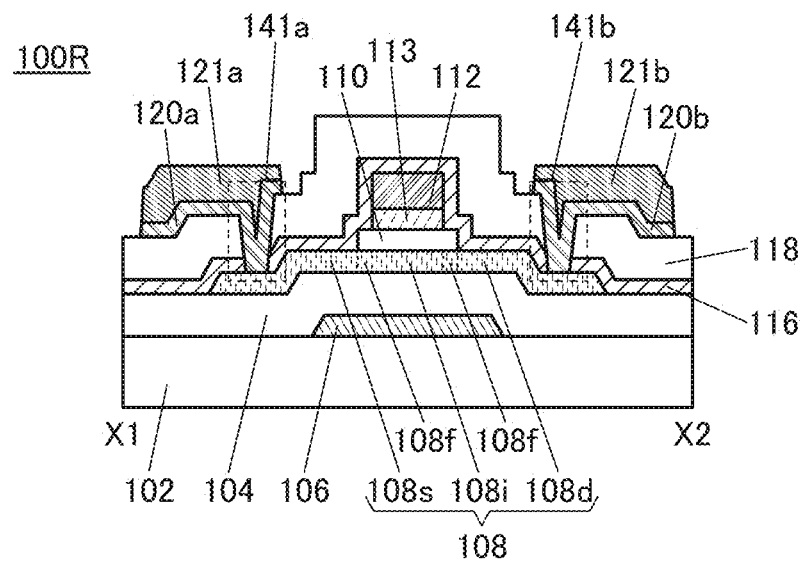
FIGS. 25A and 25B are cross-sectional views illustrating a semiconductor device.
Figure 25B:
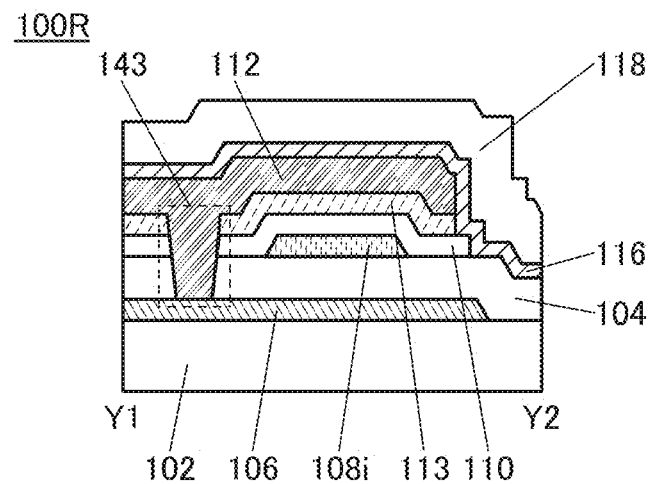
Figure 26A:
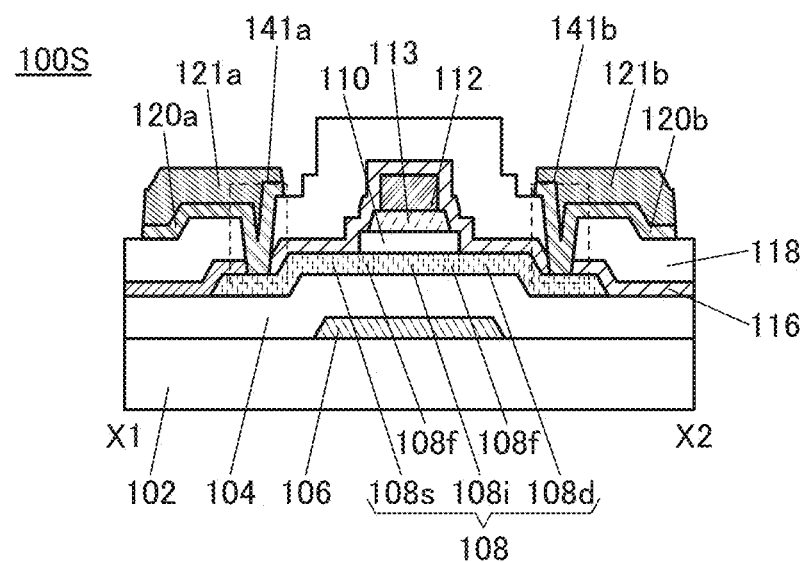
FIGS. 26A and 26B are cross-sectional views illustrating a semiconductor device.
Figure 26B:
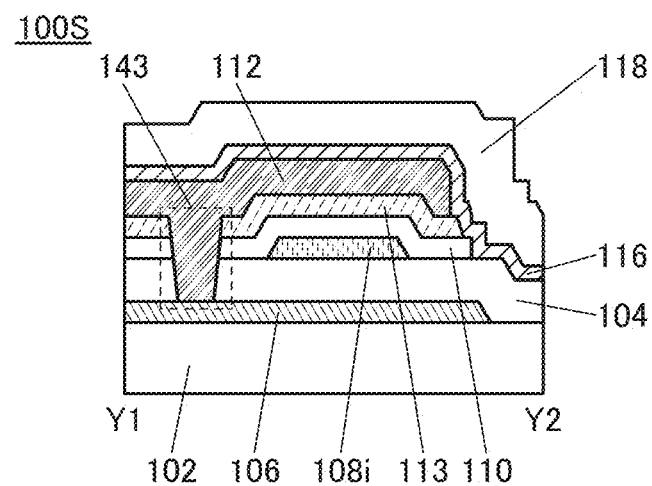
Figure 27A:
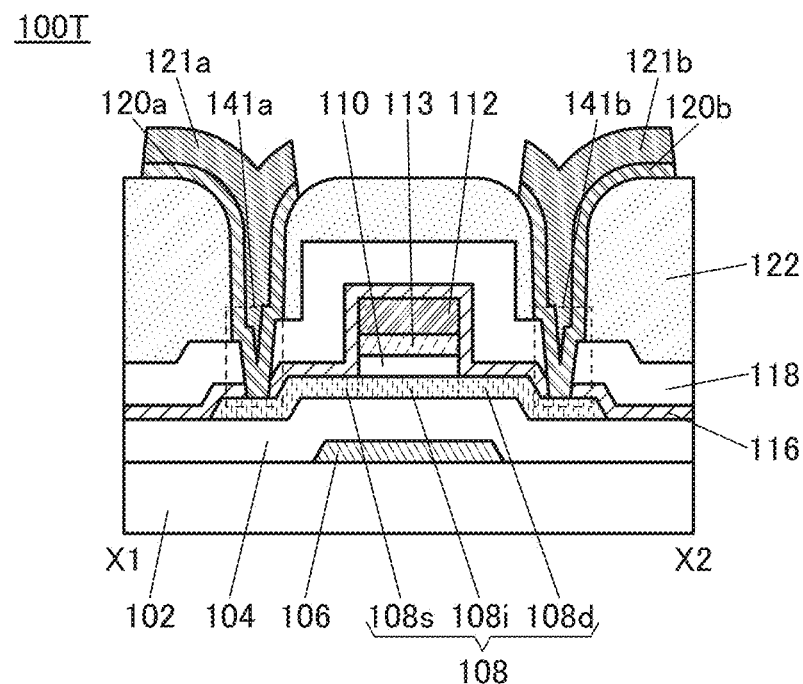
FIGS. 27A and 27B are cross-sectional views illustrating a semiconductor device.
Figure 27B:
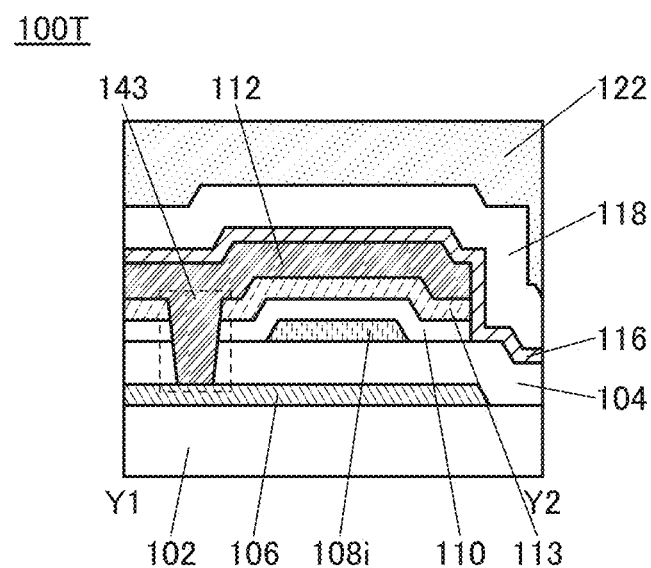

FIGS. 23A and 23B are cross-sectional views of the transistor 100P. FIGS. 24A and 24B are cross-sectional views of the transistor 100Q. FIGS. 25A and 25B are cross-sectional views of the transistor 100R. FIGS. 26A and 26B are cross-sectional views of the transistor 100S. FIGS. 27A and 27B are cross-sectional views of the transistor 100T. Although the opening 143 is provided in the metal oxide 113 in FIGS. 23A to 27B as in FIG. 22C, the conductor 106 and the conductor 112 may be electrically connected to each other through the metal oxide 113 as illustrated in FIG. 22D. Note that top views of the transistor 100P, the transistor 100Q, the transistor 100R, the transistor 100S, and the transistor 100T are similar to that of the transistor 100N illustrated in FIG. 22A and thus are not described here.

The transistor 100P illustrated in FIGS. 23A and 23B is different from the above-described transistor 100N in the shape of the insulator 110, the metal oxide 113, and the conductor 112. Specifically, in the cross section of the transistor in the channel length (L) direction, the shape of the insulator 110, the metal oxide 113, and the conductor 112 is a rectangle in the transistor 100N but is a tapered shape in the transistor 100P. More specifically, in the cross section of the transistor in the channel length (L) direction, an upper end portion of the conductor 112 in the transistor 100N is substantially aligned with a lower end portion of the insulator 110, whereas an upper end portion of the conductor 112 in the transistor 100P is located inward from a lower end portion of the insulator 110. In other words, a side end portion of the insulator 110 is located outward from a side end portion of the conductor 112.

To fabricate the transistor 100N, the conductor 112, the metal oxide 113, and the insulator 110 are collectively formed by a dry etching method using the same mask. To fabricate the transistor 100P, the conductor 112, the metal oxide 113, and the insulator 110 are formed by a combination of a wet etching method and a dry etching method using the same mask.

A structure like that of the transistor 100N is preferable because end portions of the region 108s and the region 108d can be substantially aligned with end portions of the conductor 112. Meanwhile, a structure like that of the transistor 100P is preferable because the coverage with the insulator 116 can be improved.

The transistor 100Q illustrated in FIGS. 24A and 24B is different from the above-described transistor 100N in the shape of the conductor 112, the metal oxide 113, and the insulator 110. Specifically, in the cross section of the transistor 100Q in the channel length (L) direction, a lower end portion of the conductor 112 is not aligned with an upper end portion of the metal oxide 113. The lower end portion of the conductor 112 is located inward from the upper end portion of the metal oxide 113.

For example, the structure of the transistor 100Q can be obtained in the following manner: the conductor 112 is formed by a wet etching method and the metal oxide 113 and the insulator 110 are formed by a dry etching method using the same mask.

With the structure of the transistor 100Q, the regions 108f are formed in the oxide semiconductor 108 in some cases. The regions 108f are formed between the region 108i and the region 108s and between the region 108i and the region 108d.

The regions 108f function as high-resistance regions or low-resistance regions. The high-resistance regions have the same level of resistance as the region 108i and do not overlap with the conductor 112 functioning as a gate electrode. In the case where the regions 108f are high-resistance regions, the regions 108f function as offset regions. To suppress a decrease in the on-state current of the transistor 100Q, the regions 108f functioning as offset regions may each have a length of 1 μm or less in a cross section in the channel length (L) direction. The regions 108f functioning as LDD regions can relieve an electric field in the drain region, thereby reducing a change in the threshold voltage of the transistor due to the electric field in the drain region.

The transistor 100R illustrated in FIGS. 25A and 25B is different from the above-described transistor 100N in the shape of the conductor 112, the metal oxide 113, and the insulator 110. Specifically, in the cross section of the transistor 100R in the channel length (L) direction, a lower end portion of the metal oxide 113 is not aligned with an upper end portion of the insulator 110. Specifically, the lower end portion of the metal oxide 113 is located inward from the upper end portion of the insulator 110.

For example, the structure of the transistor 100R can be obtained in the following manner: the conductor 112 and the metal oxide 113 are formed by a dry etching method and the insulator 110 is formed by a wet etching method using the same mask.

With the structure of the transistor 100R, the regions 108f are formed in the oxide semiconductor 108 in some cases.

The regions 108f are formed between the region 108i and the region 108s and between the region 108i and the region 108d.

The regions 108f function as low-resistance regions. The low-resistance regions have a resistance that is lower than that of the region 108i and higher than that of the region 108s and the region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by diffusion of nitrogen or hydrogen from the insulator 116, the region 108s, and the region 108d to the regions 108f. Alternatively, the regions 108f are formed by adding an impurity element from above the conductor 112, the metal oxide 113, and the insulator 110 using the conductor 112, the metal oxide 113, and the insulator 110 as a mask so that the impurity element is added to the oxide semiconductor 108 through the metal oxide 113 and the insulator 110.

The transistor 100S illustrated in FIGS. 26A and 26B is different from the above-described transistor 100N in the shape of the conductor 112, the metal oxide 113, and the insulator 110. Specifically, in the cross section of the transistor 100S in the channel length (L) direction, a lower end portion of the metal oxide 113 is not aligned with an upper end portion of the insulator 110. Specifically, the lower end portion of the metal oxide 113 is located inward from the upper end portion of the insulator 110. In addition, an upper end portion of the metal oxide 113 is not aligned with a lower end portion of the conductor 112. Specifically, the upper end portion of the metal oxide 113 is located outward from the lower end portion of the conductor 112.

For example, in the case where the metal oxide is a material that is difficult to etch (also referred to as a hardly etchable material), the structure of the transistor 100S can be obtained in the following manner: the conductor 112 and the metal oxide 113 are etched by a dry etching method and the insulator 110 is formed by a wet etching method using the same mask.

With the structure of the transistor 100S, the regions 108f are formed in the oxide semiconductor 108 in some cases. The regions 108f are formed between the region 108i and the region 108s and between the region 108i and the region 108d.

The transistor 100T illustrated in FIGS. 27A and 27B is different from the above-described transistor 100N in that the insulator 122 functioning as a planarization film is provided over the insulator 118. The other components of the transistor 100T are similar to those of the transistor 100N described above and have similar effects.

The insulator 122 has a function of covering unevenness and the like caused by the transistor or the like. The insulator 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that the size of each opening in the insulator 122 is not limited to that in FIGS. 27A and 27B, in which the openings are larger than the openings 141a and 141b, and may be smaller than or equal to the size of each of the openings 141a and 141b, for example.

In addition, the structure is not limited to the example in FIGS. 27A and 27B, in which the conductors 120a, 120b, 121a, and 121b are provided over the insulator 122; for example, the insulator 122 may be provided over the conductors 120a, 120b, 121a, and 121b formed over the insulator 118.

<2-4. Structural Example 8 of Semiconductor device>

Next, structures of transistors included in a semiconductor device different from that in FIGS. 22A, 22B, and 22C or 22D will be described with reference to FIGS. 28A and 28B, FIGS. 29A and 29B, FIGS. 30A and 30B, FIGS. 31A and 31B, and FIGS. 32A and 32B.

Figure 28A:
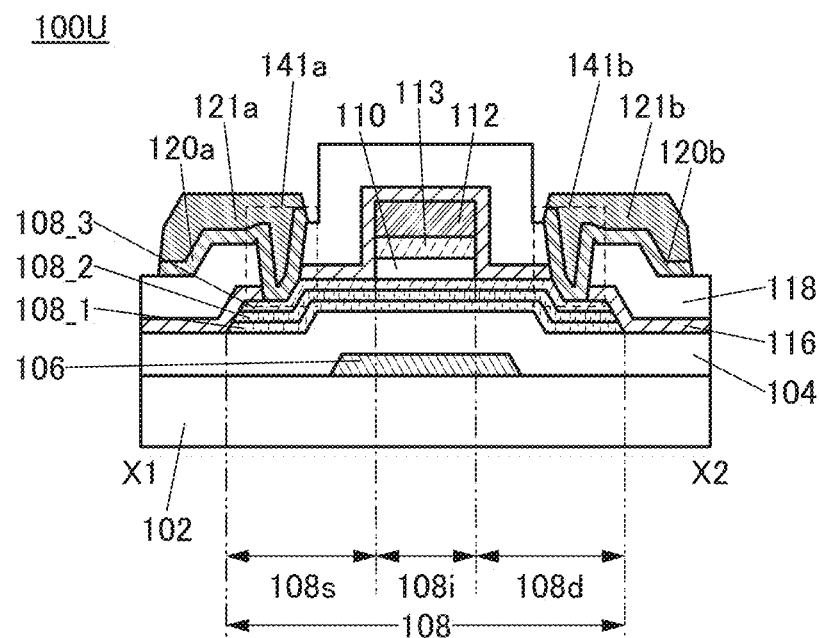
FIGS. 28A and 28B are cross-sectional views illustrating a semiconductor device.
Figure 28B:
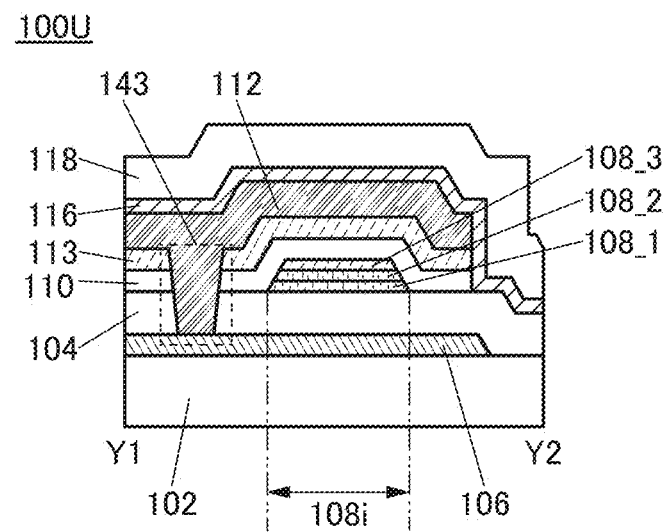
Figure 29A:
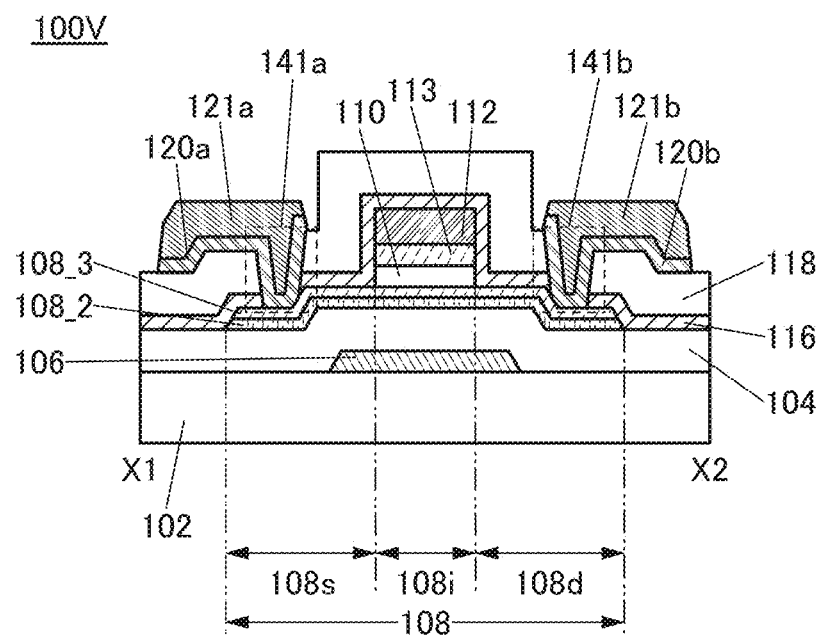
FIGS. 29A and 29B are cross-sectional views illustrating a semiconductor device.
Figure 29B:
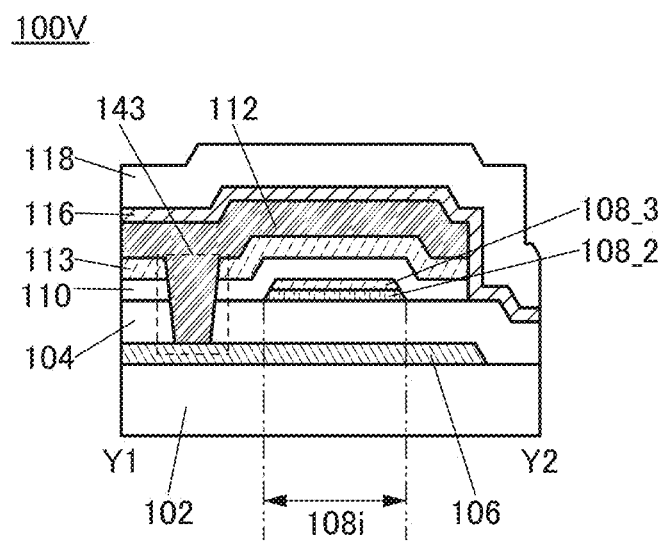
Figure 30A:
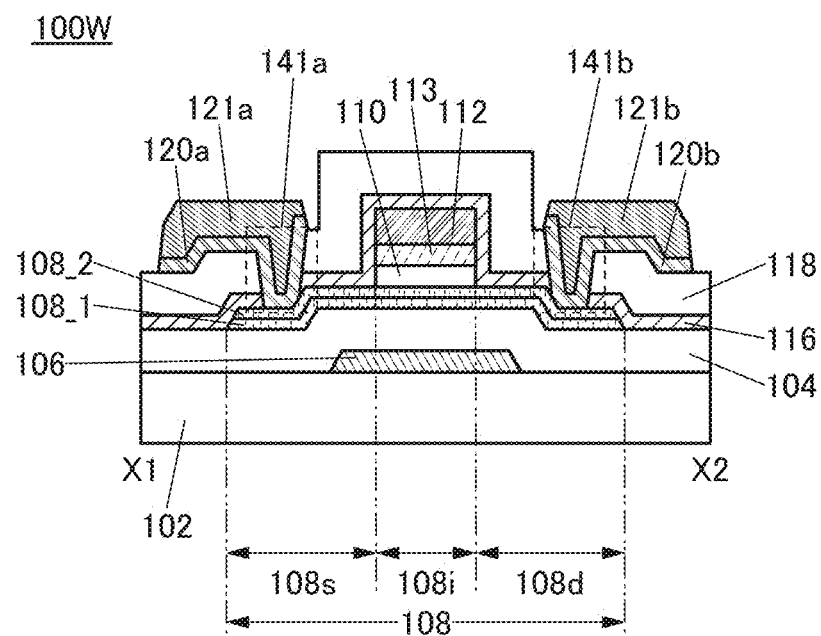
FIGS. 30A and 30B are cross-sectional views illustrating a semiconductor device.
Figure 30B:
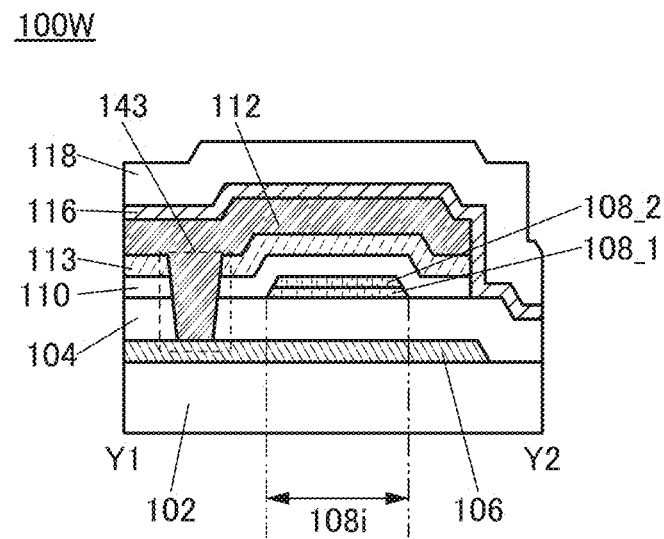
Figure 31A:
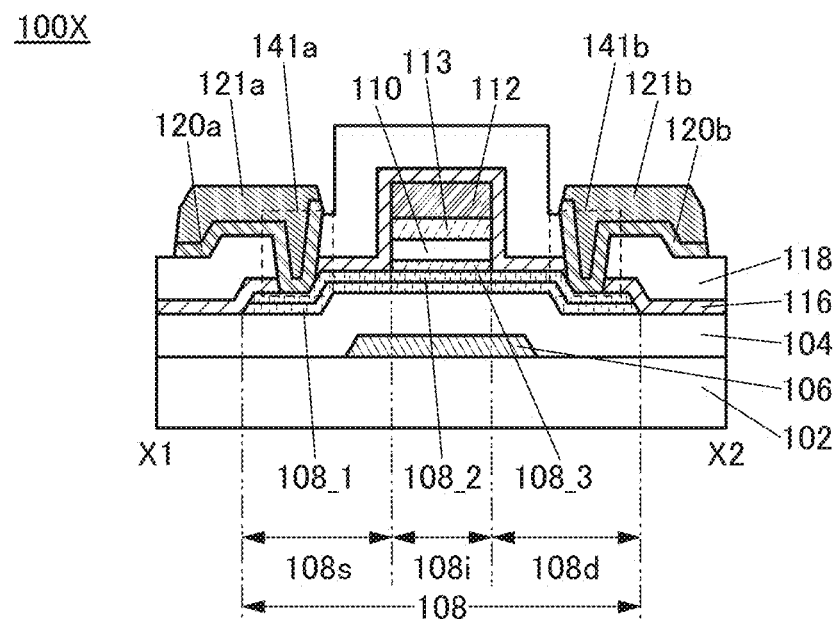
FIGS. 31A and 31B are cross-sectional views illustrating a semiconductor device.
Figure 31B:
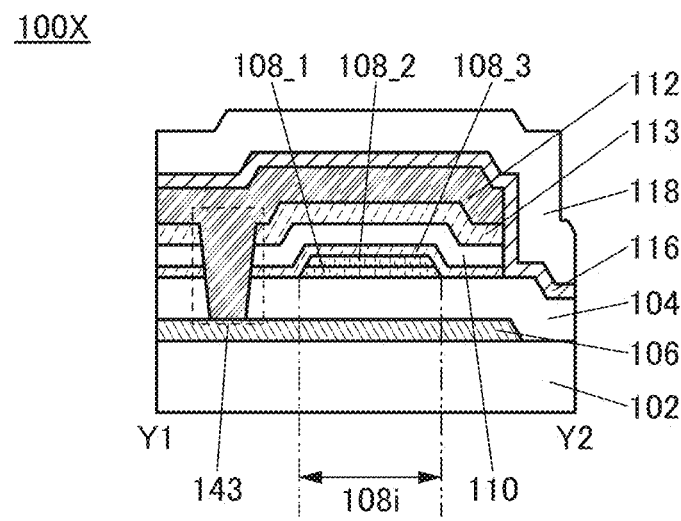
Figure 32A:
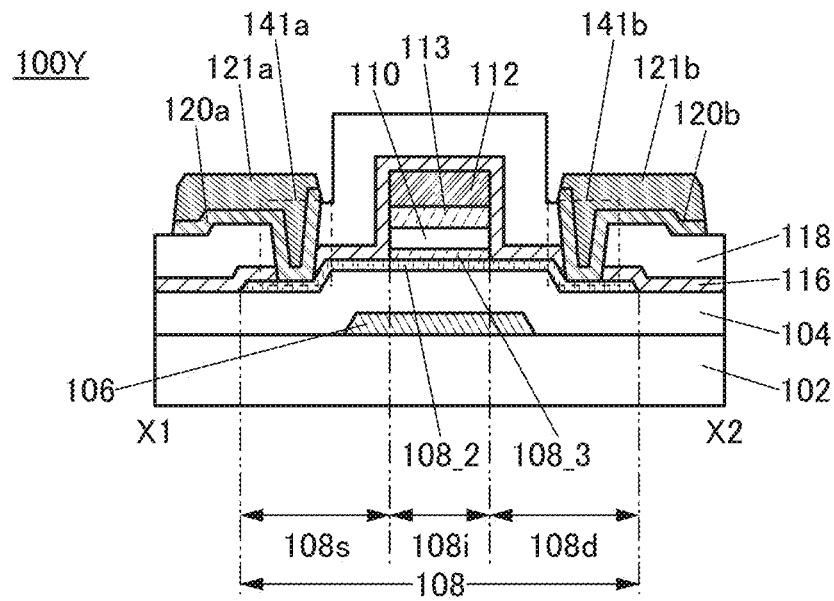
FIGS. 32A and 32B are cross-sectional views illustrating a semiconductor device.
Figure 32B:
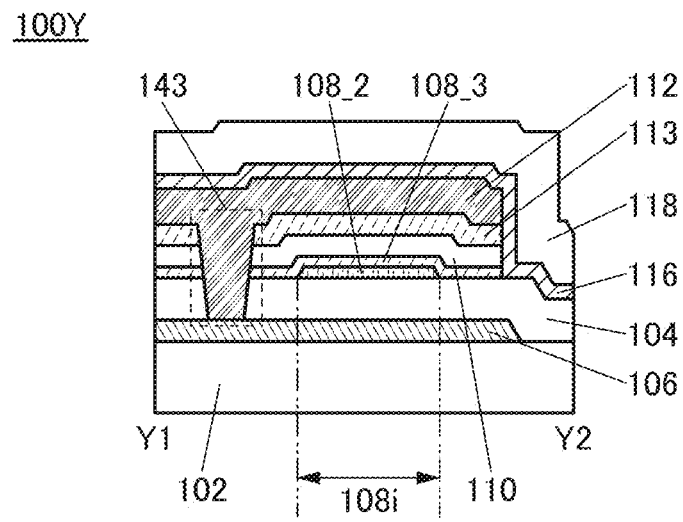

FIGS. 28A and 28B are cross-sectional views of the transistor 100U, FIGS. 29A and 29B are cross-sectional views of the transistor 100V, FIGS. 30A and 30B are cross-sectional views of the transistor 100W, FIGS. 31A and 31B are cross-sectional views of the transistor 100X, and FIGS. 32A and 32B are cross-sectional views of the transistor 100Y. Although the opening 143 is provided in the metal oxide 113 in FIGS. 28A to 32B as in FIG. 22C, the conductor 106 and the conductor 112 may be electrically connected to each other through the metal oxide 113 as illustrated in FIG. 22D. Note that top views of the transistor 100U, the transistor 100V, the transistor 100W, the transistor 100X, and the transistor 100Y are similar to that of the transistor 100N illustrated in FIG. 22A and thus are not described here.

The transistors 100U, 100V, 100W, 100X, and 100Y are different from the above-described transistor 100N in the structure of the oxide semiconductor 108. The other components of the transistors 100U, 100V, 100W, 100X, and 100Y are similar to those of the transistor 100N described above and have similar effects.

The oxide semiconductor 108 of the transistor 100U illustrated in FIGS. 28A and 28B includes the oxide semiconductor 108_1 over the insulator 104, the oxide semiconductor 108_2 over the oxide semiconductor 108_1, and the oxide semiconductor 108_3 over the oxide semiconductor 108_2. The region 108i, the region 108s, and the region 108d each have a three-layer structure of the oxide semiconductor 108_1, the oxide semiconductor 108_2, and the oxide semiconductor 108_3.

The oxide semiconductor 108 of the transistor 100V illustrated in FIGS. 29A and 29B includes the oxide semiconductor 108_2 over the insulator 104, and the oxide semiconductor 108_3 over the oxide semiconductor 108_2. The region 108i, the region 108s, and the region 108d each have a two-layer structure of the oxide semiconductor 108_2 and the oxide semiconductor 108_3.

The oxide semiconductor 108 of the transistor 100W illustrated in FIGS. 30A and 30B includes the oxide semiconductor 108_1 over the insulator 104, and the oxide semiconductor 108_2 over the oxide semiconductor 108_1. The region 108i, the region 108s, and the region 108d each have a two-layer structure of the oxide semiconductor 108_1 and the oxide semiconductor 108_2.

The oxide semiconductor 108 of the transistor 100X illustrated in FIGS. 31A and 31B includes the oxide semiconductor 108_1 over the insulator 104, the oxide semiconductor 108_2 over the oxide semiconductor 108_1, and the oxide semiconductor 108_3 over the oxide semiconductor 108_2. The region 108i has a three-layer structure of the oxide semiconductor 108_1, the oxide semiconductor 108_2, and the oxide semiconductor 108_3. The region 108s and the region 108d each have a two-layer structure of the oxide semiconductor 108_1 and the oxide semiconductor 108_2. Note that in the cross section of the transistor 100X in the channel width (W) direction, the oxide semiconductor 108_3 covers side surfaces of the oxide semiconductor 108_1 and the oxide semiconductor 108_2.

The oxide semiconductor 108 of the transistor 100Y illustrated in FIGS. 32A and 32B includes the oxide semiconductor 108_2 over the insulator 104, and the oxide semiconductor 108_3 over the oxide semiconductor 108_2. The region 108i has a two-layer structure of the oxide semiconductor 108_2 and the oxide semiconductor 108_3. The region 108s and the region 108d each have a single-layer structure of the oxide semiconductor 108_2. Note that in the cross section of the transistor 100Y in the channel width (W) direction, the oxide semiconductor 108_3 covers side surfaces of the oxide semiconductor 108_2.

A side surface of the region 108i in the channel width (W) direction or a region in the vicinity of the side surface is easily damaged by processing, resulting in a defect (e.g., oxygen vacancy), or easily contaminated by an impurity attached thereto. Therefore, even when the region 108i is substantially intrinsic, stress such as an electric field applied thereto activates the side surface of the region 108i in the channel width (W) direction or the region in the vicinity of the side surface and turns it into a low-resistance (n-type) region easily. Moreover, if the side surface of the region 108i in the channel width (W) direction or the region in the vicinity of the side surface is an n-type region, a parasitic channel may be formed because the n-type region serves as a carrier path.

Thus, in the transistor 100X and the transistor 100Y, the region 108i has a stacked-layer structure and side surfaces of the region 108i in the channel width (W) direction are covered with one layer of the stacked layers. With such a structure, defects on or in the vicinity of the side surfaces of the region 108i can be suppressed or adhesion of an impurity to the side surfaces of the region 108i or to regions in the vicinity of the side surfaces can be reduced.

<2-5. Method 3 for Manufacturing Semiconductor Device>

Next, an example of the method for manufacturing the transistor 100M illustrated in FIGS. 21A to 21C will be described with reference to FIGS. 33A to 33D, FIGS. 34A to 34D, and FIGS. 35A and 35B. Note that FIGS. 33A to 33D, FIGS. 34A to 34D, and FIGS. 35A and 35B are cross-sectional views in the channel length (L) direction and the channel width (W) direction and illustrate a method for manufacturing the transistor 100M.

First, the insulator 104 is formed over the substrate 102. Subsequently, an oxide semiconductor is formed over the insulator 104. Then, the oxide semiconductor is processed into an island shape, whereby the oxide semiconductor 107 is formed. Next, the insulator 110_0 is formed over the insulator 104 and the oxide semiconductor 107 (see FIG. 33A).

Figure 33A:
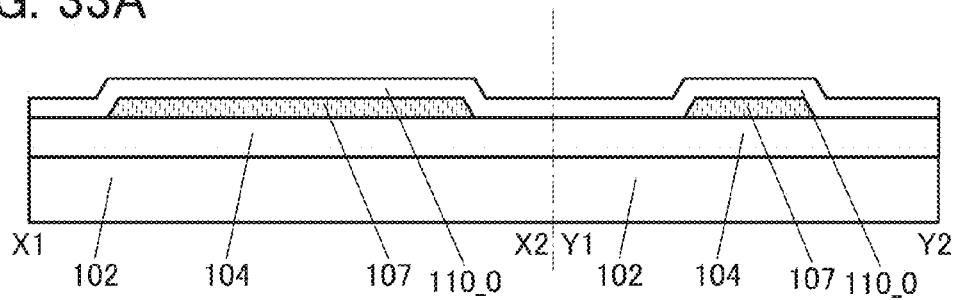
FIGS. 33A to 33D are cross-sectional views illustrating a method for manufacturing a semiconductor device.
Figure 33B:
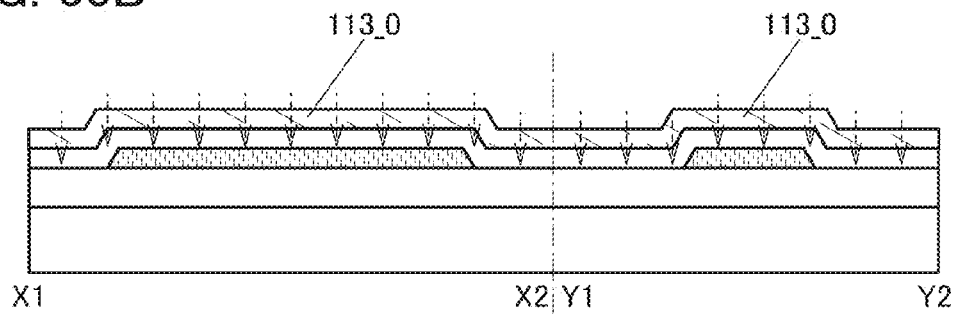

Next, a metal oxide 113_0 is formed over the insulator 110_0 (see FIG. 33B). Oxygen might be added to the insulator 110_0 during the formation of the metal oxide 113_0. In FIG. 33B, oxygen added to the insulator 110_0 is schematically shown by arrows.

An oxide semiconductor typified by an In—Ga—Zn oxide can be used as the metal oxide 113_0. The metal oxide 113_0 can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO).

In the case where an oxide semiconductor is used as the metal oxide 113_0, the metal oxide 113_0 is preferably formed by a sputtering method in an atmosphere containing an oxygen gas. Formation of the metal oxide 113_0 in an atmosphere containing an oxygen gas allows suitable addition of oxygen to the metal oxide 113_0. Note that a method for forming the metal oxide 113_0 is not limited to a sputtering method, and other methods such as an ALD method may be used.

In this embodiment, a 100-nm-thick IGZO film containing an In—Ga—Zn oxide (In:Ga:Zn=4:2:4.1 [atomic ratio]) is formed as the metal oxide 113_0 by a sputtering method. Oxygen addition treatment may be performed on the insulator 110_0 before or after the formation of the metal oxide 113_0. The oxygen addition treatment can be performed similarly to the oxygen addition that can be performed after the formation of the insulator 104.

Next, the conductor 112_0 is formed over the metal oxide 113_0. In the case of forming a metal film as the conductor 112_0, the resistance of the metal oxide 113_0 may be reduced by damage (e.g., sputtering damage) during the deposition of the metal film, and the metal oxide 113_0 may become a metal oxide 113_1 having a conductive property. Besides the damage during the deposition, the use of the metal film as the conductor 112_0 produces either of the following effects: the resistance of the metal oxide 113_0 is reduced by the diffusion of the constituent element of the metal film to the metal oxide 113_0 side, and the resistance is reduced when oxygen vacancies are formed by the diffusion of oxygen in the metal oxide 113_0 into the metal film (see FIG. 33C).

Figure 33C:
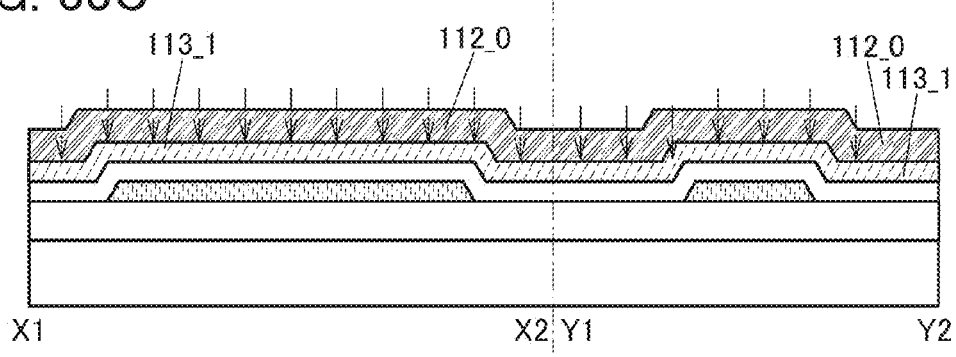

In other words, the metal oxide 113_1 functions as an oxide conductor (OC). Therefore, in this embodiment, the metal oxide 113 can also be referred to as a conductor and may function as a gate electrode in some cases. In FIG. 33C, damage to the metal oxide 113_1 or the constituent element of the metal film is schematically shown by arrows.

Note that the conductor 112_0 can be formed using a material selected from the above-mentioned materials. In this embodiment, for the conductor 112_0, a stack including a 15-nm-thick tungsten film and a 100-nm-thick titanium film is formed with a sputtering apparatus.

Figure 33D:
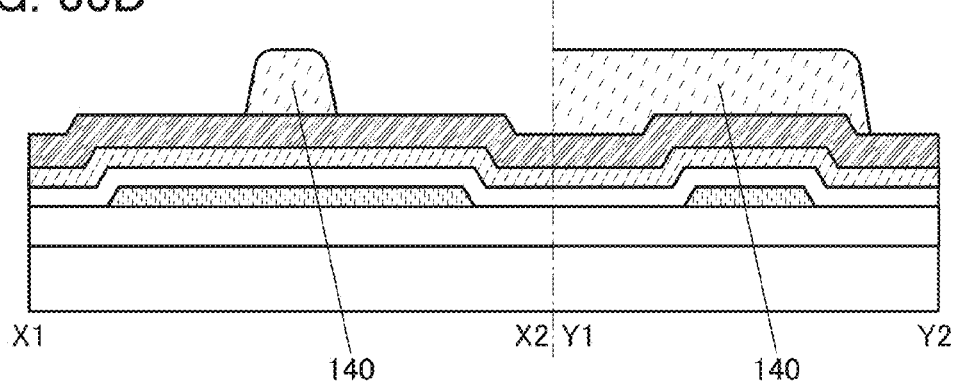

Subsequently, the mask 140 is formed by a lithography process in a desired position over the conductor 112_0 (see FIG. 33D).

Next, etching is performed from above the mask 140 to process the conductor 112_0, the metal oxide 113_1, and the insulator 110_0. Then, the mask 140 is removed, so that the island-shaped conductor 112, the island-shaped metal oxide 113, and the island-shaped insulator 110 are formed (see FIG. 34A).

To process the conductor 112_0 to be the conductor 112, a wet etching method and/or a dry etching method can be used. In this embodiment, in the processing of the conductor 112_0 into the conductor 112, the titanium film is etched by a dry etching method and then the tungsten film is etched by a dry etching method.

In this embodiment, the conductor 112_0, the metal oxide 113_1, and the insulator 110_0 are processed by a dry etching method.

Next, the oxide semiconductor 108 is formed by performing plasma treatment on the oxide semiconductor 107. The plasma treatment is performed under the following conditions: the substrate temperature is 220° C., an argon gas at a flow rate of 100 sccm and a nitrogen gas at a flow rate of 1000 sccm are introduced into a chamber; the pressure is 40 Pa; and an RF power of 1000 W is supplied between parallel-plate electrodes provided in a plasma CVD apparatus.

Regions of the oxide semiconductor 107 which are exposed to plasma become the region 108s and the region 108d. A region of the oxide semiconductor 107 which overlaps with the conductor 112 becomes the region 108i. Accordingly, the oxide semiconductor 108 including the region 108i, the region 108s, and the region 108d is formed (see FIG. 34B).

In this example, the size of the region 108i in the cross section in the channel length (L) direction is more than or equal to 0.2 μm and less than 1.5 μm, preferably more than or equal to 0.5 μm and less than or equal to 1.0 μm.

Figure 34A:
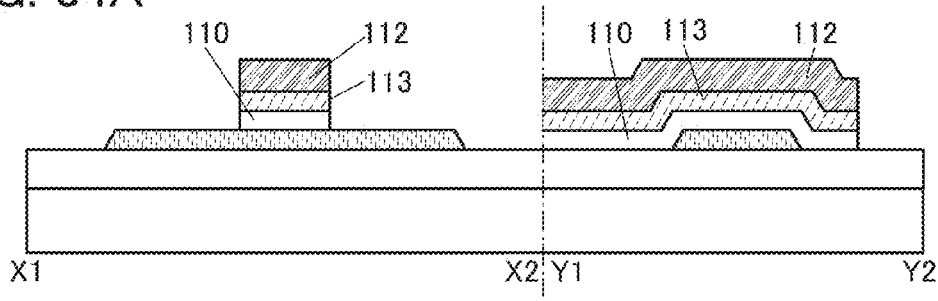
FIGS. 34A to 34D are cross-sectional views illustrating a method for manufacturing a semiconductor device.
Figure 34B:
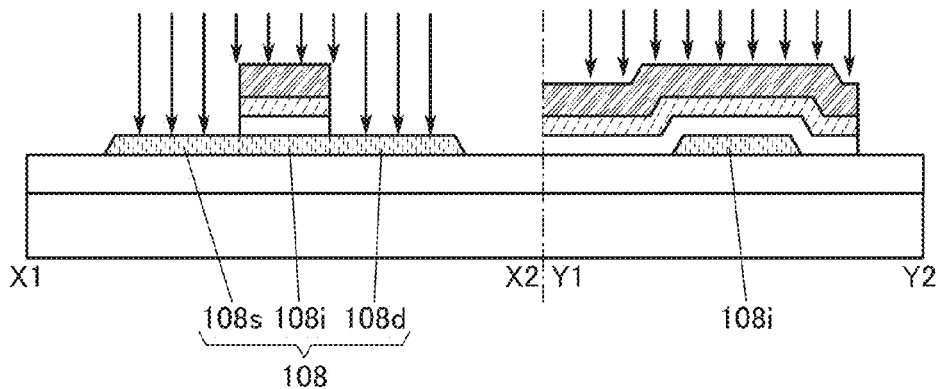

In FIG. 34B, the plasma treatment is schematically shown by arrows.

Next, the insulator 116 is formed over the insulator 104, the oxide semiconductor 108, and the conductor 112. Note that the insulator 116 formed in contact with the regions 108s and 108d may enable the resistance of the regions to be decreased by impurity diffusion from the insulator 116.

Note that the insulator 116 can be formed using a material selected from the above-mentioned materials. In this embodiment, as the insulator 116, a 100-nm-thick silicon nitride oxide film is formed with a plasma CVD apparatus.

The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and a power of 1000 W is supplied to the RF power source (27.12 MHz).

The above-described two steps, i.e., the plasma treatment and the deposition treatment of the silicon nitride oxide film, are successively performed at a temperature of 220° C.

Figure 34C:
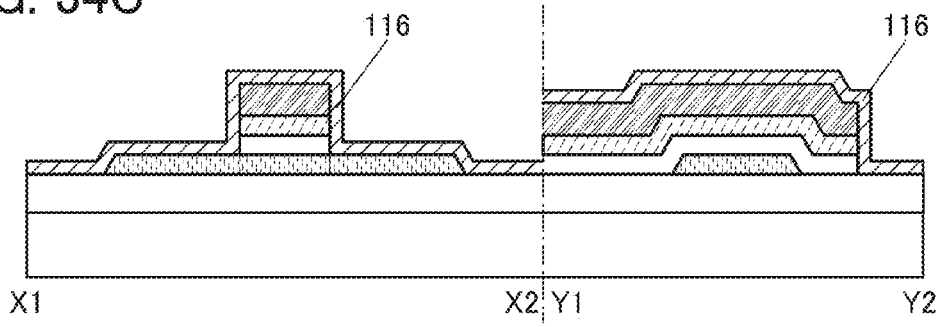

When a silicon nitride oxide film is used for the insulator 116, nitrogen or hydrogen in the silicon nitride oxide film can be supplied to the region 108s and the region 108d in contact with the insulator 116 (see FIG. 34C). In addition, when the formation temperature of the insulator 116 is the above temperature, release of excess oxygen contained in the insulator 110 to the outside can be suppressed. The metal oxide 113 can have a high carrier density when nitrogen or hydrogen is supplied from the insulator 116.

Figure 34D:
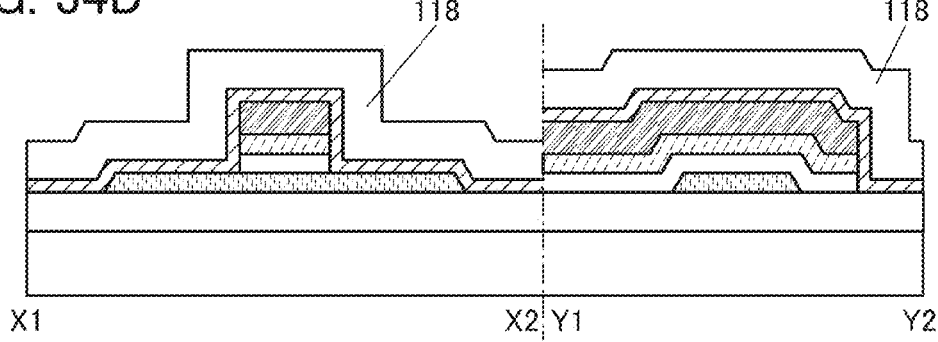

Next, the insulator 118 is formed over the insulator 116 (see FIG. 34D).

The insulator 118 can be formed using a material selected from the above-mentioned materials. In this embodiment, as the insulator 118, a 300-nm-thick silicon oxynitride film is formed with a plasma CVD apparatus.

Figure 35A:
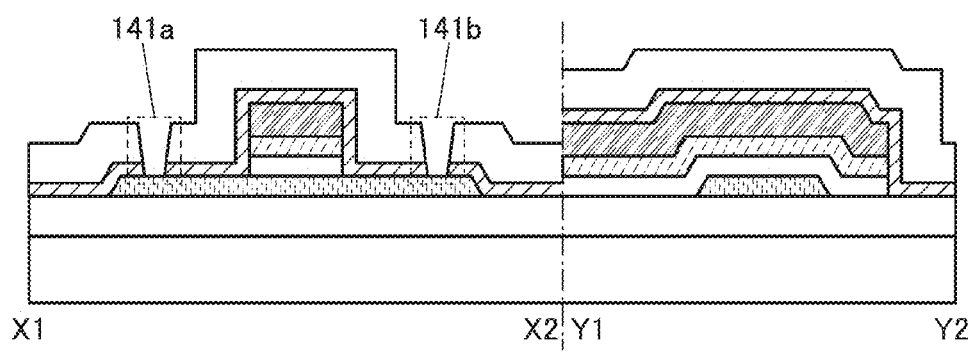
FIGS. 35A and 35B are cross-sectional views illustrating a method for manufacturing a semiconductor device.

Subsequently, a mask is formed by lithography in a desired position over the insulator 118, and then, the insulator 118 and the insulator 116 are partly etched, so that the opening 141a reaching the region 108s and the opening 141b reaching the region 108d are formed (see FIG. 35A).

To etch the insulator 118 and the insulator 116, a wet etching method and/or a dry etching method can be used. In this embodiment, the insulator 118 and the insulator 116 are processed by a dry etching method.

Figure 35B:
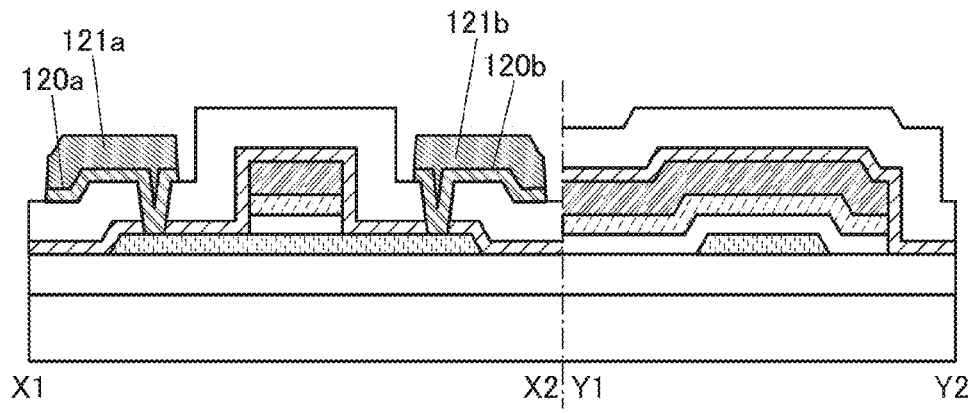

Next, conductors are formed over the region 108s, the region 108d, and the insulator 118 so as to cover the openings 141a and 141b and the conductors are processed into a desired shape, whereby the conductors 120a, 120b, 121a, and 121b are formed (see FIG. 35B).

The conductors 120a, 120b, 121a, and 121b can be formed using a material selected from the above-mentioned materials. In this embodiment, a stack including a 50-nm-thick tungsten film to be the conductors 120a and 120b and a 400-nm-thick copper film to be the conductors 121a and 121b is formed with a sputtering apparatus.

To process the conductors to be the conductors 120a, 120b, 121a, and 121b, a wet etching method and/or a dry etching method can be used. In this embodiment, in the processing of the conductors into the conductors 120a, 120b, 121a, and 121b, the copper film is etched by a wet etching method and then the tungsten film is etched by a dry etching method.

Through the above steps, the transistor 100M in FIGS. 21A to 21C can be manufactured.

<2-6. Method 4 for Manufacturing Semiconductor Device>

Next, an example of a method for manufacturing the transistor 100N in FIGS. 22A, 22B, and 22C or 22D will be described with reference to FIGS. 36A to 36D, FIGS. 37A to 37D, and FIGS. 38A to 38C. Note that FIGS. 36A to 36D, FIGS. 37A to 37D, and FIGS. 38A to 38C are cross-sectional views in the channel length (L) direction and the channel width (W) direction and illustrate a method for manufacturing the transistor 100N.

First, the conductor 106 is formed over the substrate 102. Then, the insulator 104 is formed over the substrate 102 and the conductor 106, and an oxide semiconductor is formed over the insulator 104. After that, the oxide semiconductor is processed into an island shape, whereby the oxide semiconductor 107 is formed (see FIG. 36A).

The conductor 106 can be formed using a material and a method similar to those of the conductors 120a, 120b, 121a, and 121b. In this embodiment, as the conductor 106, a stack including a 50-nm-thick tantalum nitride film and a 100-nm-thick copper film is formed by a sputtering method.

Next, the insulator 110_0 and the metal oxide 113_0 are formed over the insulator 104 and the oxide semiconductor 107. Oxygen might be added to the insulator 110_0 during the formation of the metal oxide 113_0 (see FIG. 36B).

Figure 36A:
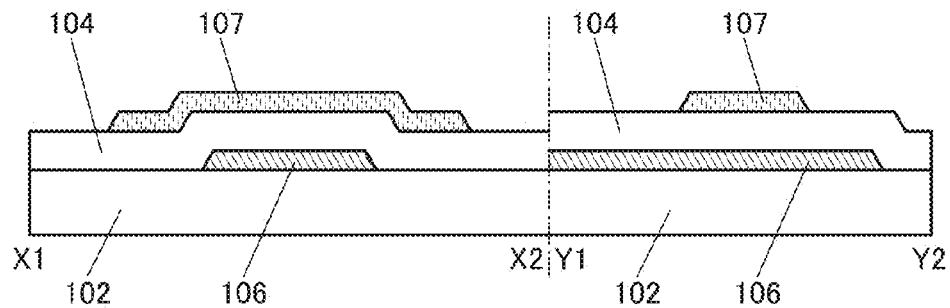
FIGS. 36A to 36D are cross-sectional views illustrating a method for manufacturing a semiconductor device.
Figure 36B:
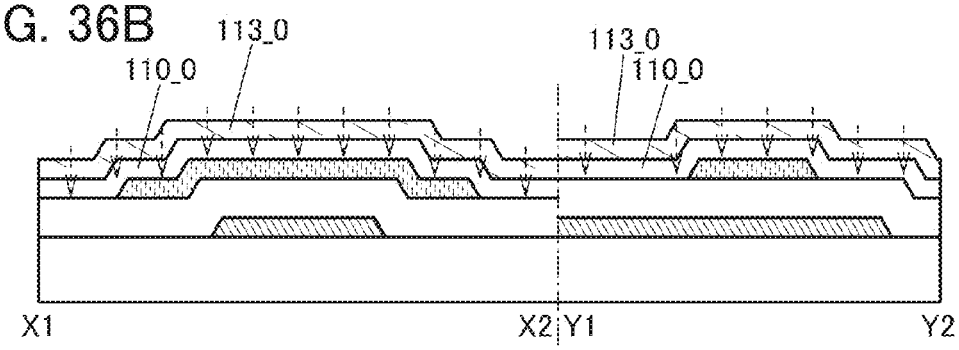
Figure 36C:
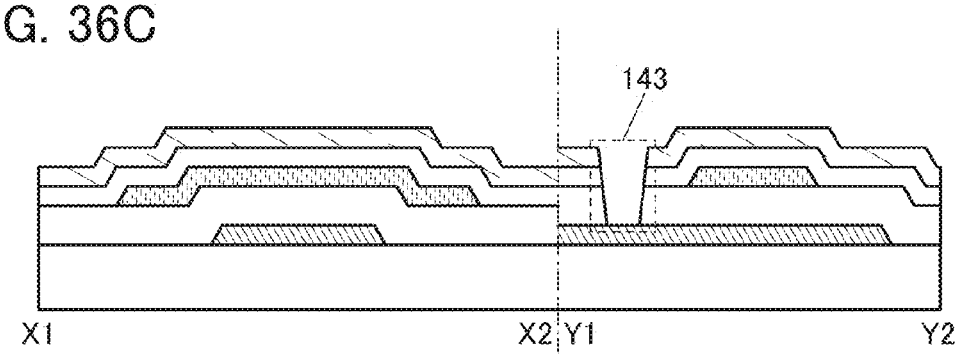
Figure 36D:
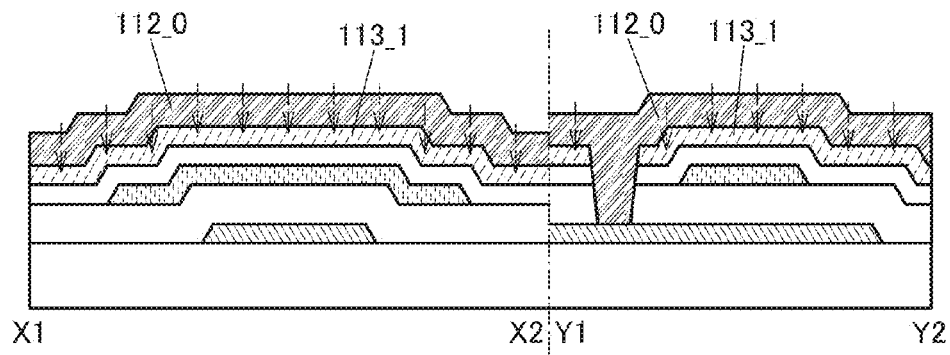

Subsequently, a mask is formed by lithography in a desired position over the metal oxide 113_0, and then, the insulator 110_0, the metal oxide 113_0, and the insulator 104 are partly etched, so that the opening 143 reaching the conductor 106 is formed (see FIG. 36C).

To form the opening 143, a wet etching method and/or a dry etching method can be used. In this embodiment, the opening 143 is formed by a dry etching method.

Next, the conductor 112_0 is formed over the conductor 106, the insulator 110_0, and the metal oxide 113_0 so as to cover the opening 143. In the case where an oxide semiconductor is used as the metal oxide 113_0, the metal oxide 113_0 may become the metal oxide 113_1 having a conductive property at the time of forming the conductor 112_0 (see FIG. 36D). Furthermore, the conductor 112_0 formed to cover the opening 143 is electrically connected to the conductor 106.

Note that the opening 143 may be formed before the metal oxide 113_0 is deposited as illustrated in FIG. 22D. In that case, the metal oxide 113_0 and the conductor 112_0 are formed over the conductor 106 and the insulator 110_0 so as to cover the opening 143. In the case where an oxide semiconductor is used as the metal oxide 113_0, the metal oxide 113_0 may become the metal oxide 113_1 having a conductive property at the time of forming the conductor 112_0. In the case where the metal oxide 113_0 and the conductor 112_0 are formed to cover the opening 143, the metal oxide 113_1 and the conductor 112_0 are electrically connected to the conductor 106.

Figure 37A:
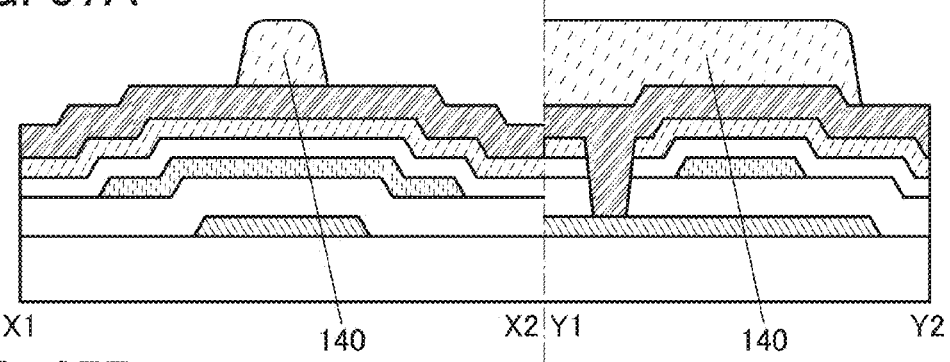
FIGS. 37A to 37D are cross-sectional views illustrating a method for manufacturing a semiconductor device.
Figure 37B:
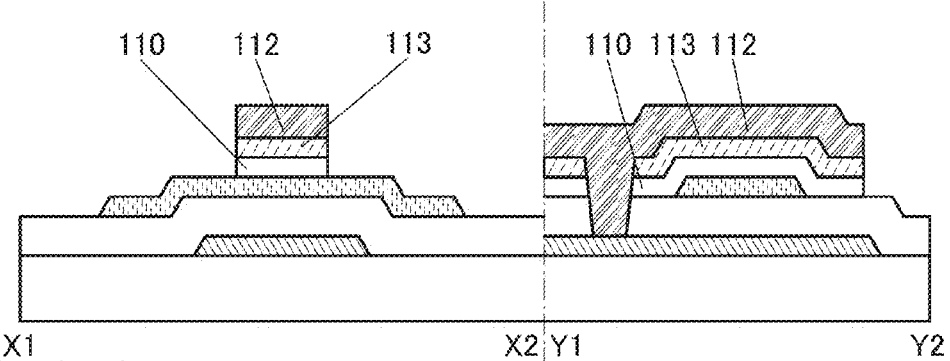

Subsequently, the mask 140 is formed by a lithography process in a desired position over the conductor 112_0 (see FIG. 37A).

Next, etching is performed from above the mask 140 to process the conductor 112_0, the metal oxide 113_1, and the insulator 110_0. After the processing of the conductor 112_0, the metal oxide 113_1, and the insulator 110_0, the mask 140 is removed. As a result of the processing of the conductor 112_0, the metal oxide 113_1, and the insulator 110_0, the island-shaped conductor 112, the island-shaped metal oxide 113, and the island-shaped insulator 110 are formed (see FIG. 37B).

In this embodiment, the conductor 112_0, the metal oxide 113_1, and the insulator 110_0 are processed by a dry etching method.

Next, the oxide semiconductor 108 is formed by performing plasma treatment on the oxide semiconductor 107. Regions of the oxide semiconductor 107 which are exposed to plasma become the region 108s and the region 108d. A region of the oxide semiconductor 107 which overlaps with the conductor 112 becomes the region 108i. Accordingly, the oxide semiconductor 108 including the region 108i, the region 108s, and the region 108d is formed (see FIG. 37C).

In this example, the size of the region 108i in the cross section in the channel length (L) direction is more than or equal to 0.2 µm and less than 1.5 µm, preferably more than or equal to 0.5 µm and less than or equal to 1.0 µm.

Figure 37C:
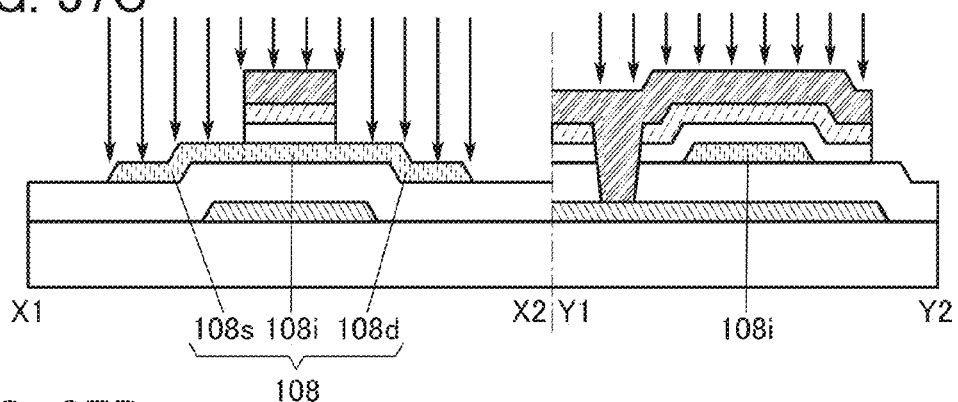
Figure 37D:
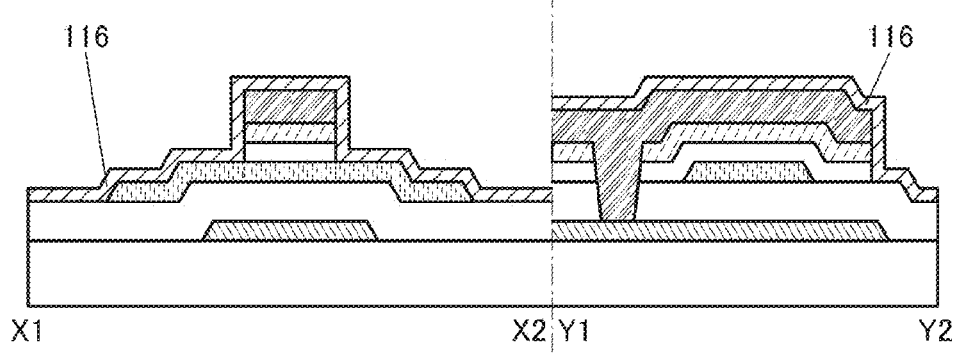

In FIG. 37C, the plasma treatment is schematically shown by arrows.

Next, the insulator 116 is formed over the insulator 104, the oxide semiconductor 108, and the conductor 112. Note that the insulator 116 formed in contact with the regions 108s and 108d may enable the resistance of the regions to be decreased by impurity diffusion from the insulator 116 (see FIG. 37D).

The above-described two steps, i.e., the plasma treatment and the deposition treatment of the silicon nitride oxide film, are successively performed at a temperature of 220° C.

When a silicon nitride oxide film is used for the insulator 116, nitrogen or hydrogen in the silicon nitride oxide film can be supplied to the region 108s and the region 108d in contact with the insulator 116. In addition, when the formation temperature of the insulator 116 is the above temperature, release of excess oxygen contained in the insulator 110 to the outside can be suppressed.

Figure 38A:
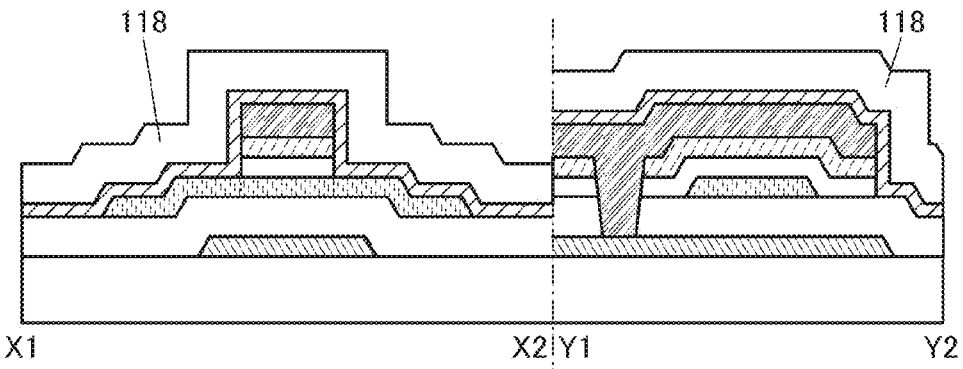
FIGS. 38A to 38C are cross-sectional views illustrating a method for manufacturing a semiconductor device.

Next, the insulator 118 is formed over the insulator 116 (see FIG. 38A).

Figure 38B:
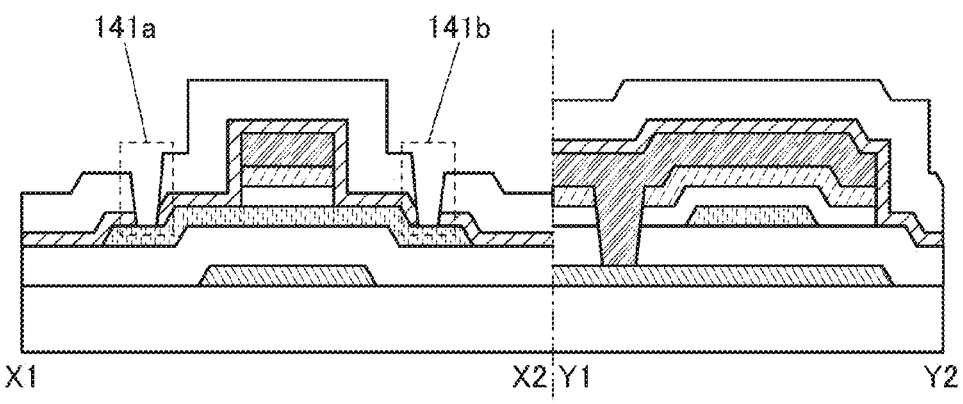

Subsequently, a mask is formed by lithography in a desired position over the insulator 118, and then, the insulator 118 and the insulator 116 are partly etched, so that the opening 141a reaching the region 108s and the opening 141b reaching the region 108d are formed (see FIG. 38B).

Figure 38C:
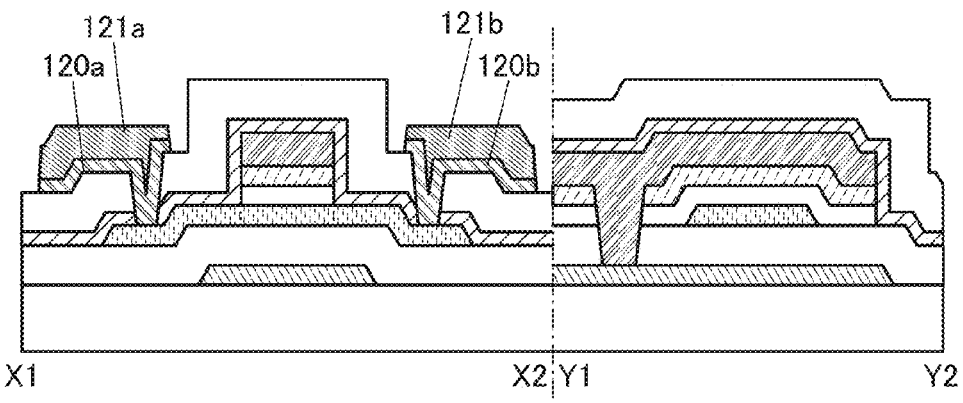

Next, conductors are formed over the region 108s, the region 108d, and the insulator 118 so as to cover the openings 141a and 141b and the conductors are processed into a desired shape, whereby the conductors 120a, 120b, 121a, and 121b are formed (see FIG. 38C).

Through the above steps, the transistor 100N in FIGS. 22A, 22B, and 22C or 22D can be manufactured.

One embodiment of the present invention is not limited to the example described in this embodiment, in which the transistor includes an oxide semiconductor. In one embodiment of the present invention, the transistor does not necessarily include an oxide semiconductor. For example, a channel region, the vicinity of the channel region, a source region, or a drain region of the transistor may be formed using a material containing silicon (Si), germanium (Ge), silicon germanium (SiGe), gallium arsenide (GaAs), or the like.

The structures and the methods described in this embodiment can be combined as appropriate with any of the structures and the methods described in the other embodiments and examples.

Embodiment 3

In this embodiment, the oxide semiconductor included in the transistor described in the above embodiment will be described below with reference to FIGS. 42A to 42E, FIGS. 43A to 43E, FIGS. 44A to 44D, FIGS. 45A and 45B, and FIG. 46.

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that includes a void. Because of its instability, an a-like OS has physical properties similar to those of an amorphous oxide semiconductor.

<CAAC-OS>

First, the details of the CAAC-OS are described.

The CAAC-OS is one of oxide semiconductors having a plurality of c-axis-aligned crystal parts (also referred to as pellets).

Figure 42A:
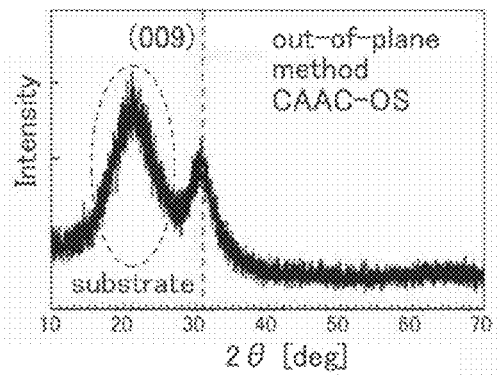
FIGS. 42A to 42E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 42A. This peak is derived from the (009) plane of the InGaZnO$_4$ crystal, which indicates that crystals in the CAAC-OS have c-axis alignment, and that the c-axes are aligned in a direction substantially perpendicular to a surface over which a CAAC-OS film is formed (also referred to as a formation surface) or the top surface of the CAAC-OS film. Note that another peak may appear when 2θ is around 36°, in addition to the peak at 2θ of around 31°. The peak at 2θ of around 36° is attributed to a crystal structure classified into the space group Fd-3m; thus, this peak is preferably not exhibited in the CAAC-OS.

Figure 42B:
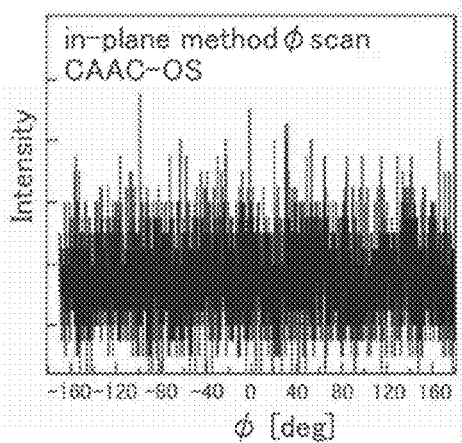
Figure 42C:
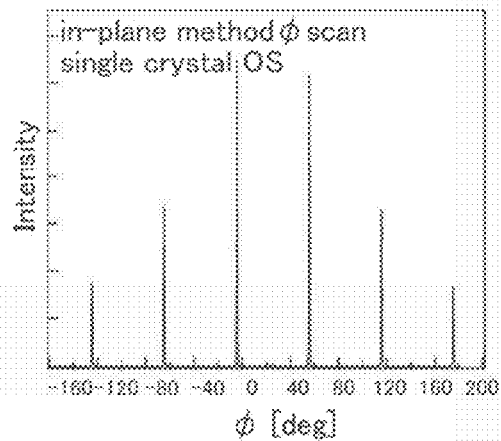
Figure 42D:
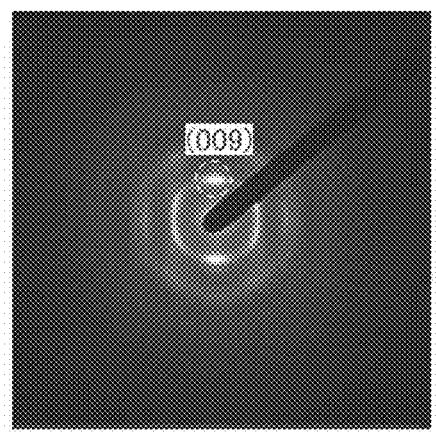

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), as shown in FIG. 42B, a peak is not clearly observed. In contrast, in the case where single crystal InGaZnO$_4$ is subjected to φ scan with 2θ fixed at around 56°, as shown in FIG. 42C, six peaks which are derived from crystal planes equivalent to the (110) plane are observed. Accordingly, the structural analysis using XRD shows that the directions of the a-axes and b-axes are irregularly oriented in the CAAC-OS.

Figure 42E:
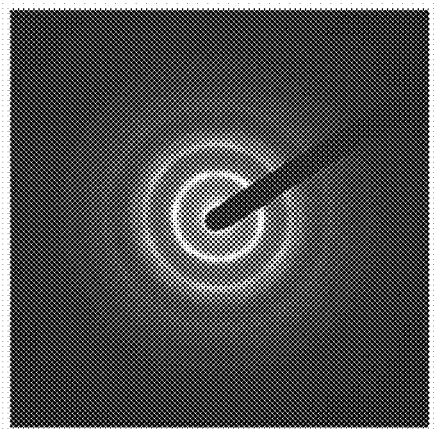

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 42D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 42E shows a diffraction pattern obtained in such a manner that an electron beam with a probe diameter of 300 nm is incident on the same sample in a direction perpendicular to the sample surface. As shown in FIG. 42E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 42E is considered to be derived from the (010) plane, the (100) plane, and the like of the InGaZnO$_4$ crystal. The second ring in FIG. 42E is considered to be derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 43A:
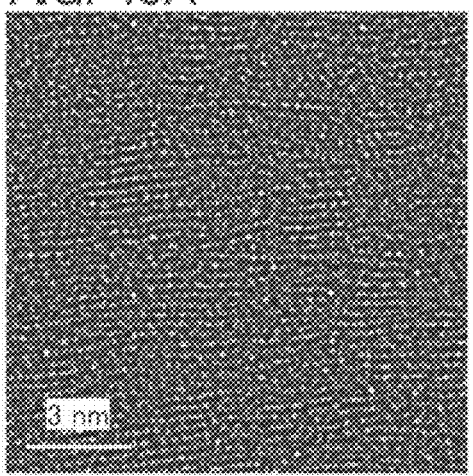
FIGS. 43A to 43E show a cross-sectional TEM image and plan-view TEM images of a CAAC-OS and images obtained through analysis thereof.

FIG. 43A shows a high-resolution TEM image of a cross section of the CAAC-OS which is observed in a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

FIG. 43A shows pellets in which metal atoms are arranged in a layered manner. FIG. 43A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 43D:
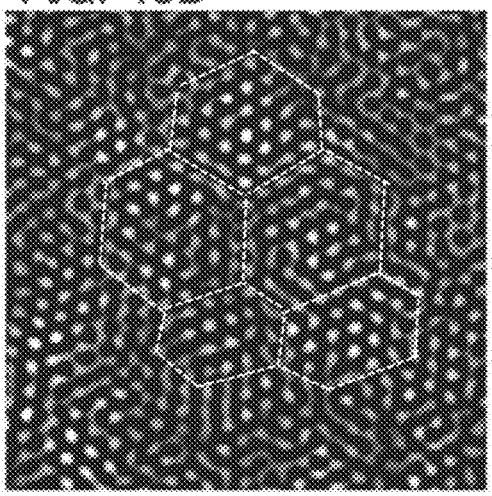
Figure 43B:
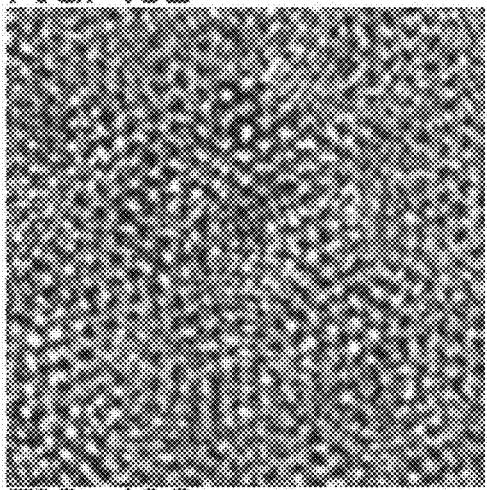
Figure 43E:
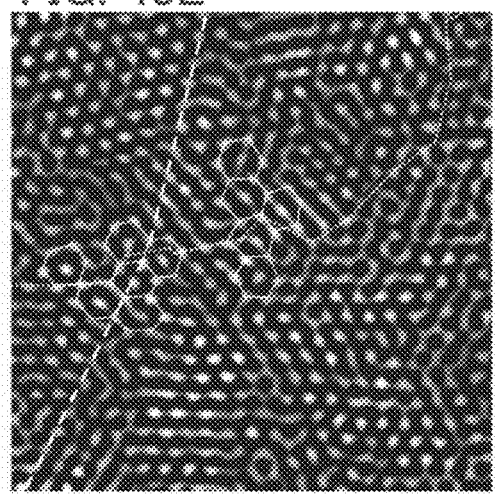
Figure 43C:
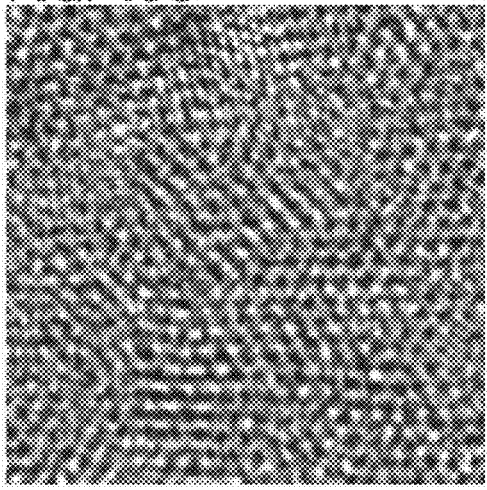

FIGS. 43B and 43C show Cs-corrected high-resolution TEM images of a plane of the CAAC-OS observed in the direction substantially perpendicular to the sample surface. FIGS. 43D and 43E are images obtained by image processing of FIGS. 43B and 43C. The method of image processing is as follows. The image in FIG. 43B is subjected to fast Fourier transform (FFT) to obtain an FFT image. Then, mask processing is performed on the obtained FFT image such that part in the range from 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 43D, a portion in which the lattice arrangement is broken is shown by dashed lines. A region surrounded by dashed lines corresponds to one pellet. The portion shown by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 43E, a dotted line denotes a portion where the direction of a lattice arrangement changes between a region with a uniform lattice arrangement and another region with a uniform lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, a change in interatomic bond distance by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8\times10^{11}/cm^3$, preferably lower than $1\times10^{11}/cm^3$, further preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<nc-OS>

Next, the nc-OS will be described here.

Analysis of an nc-OS by XRD will be described. When the structure of an nc-OS is analyzed by an out-of-plane method, a peak indicating orientation does not appear. That is, a crystal of an nc-OS does not have orientation.

Figure 44A:
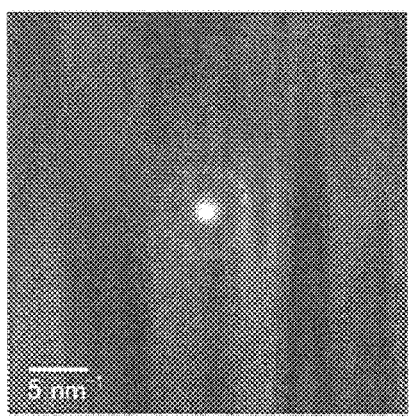
FIGS. 44A to 44D show electron diffraction patterns and a cross-sectional TEM image of an nc-OS.
Figure 44B:
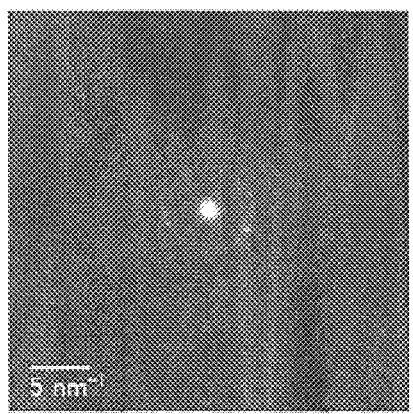

For example, when an electron beam with a probe diameter of 50 nm is incident on a 34-nm-thick region of a thinned nc-OS including an $InGaZnO_4$ crystal in the direction parallel to the formation surface, a ring-like diffraction pattern (nanobeam electron diffraction pattern) shown in FIG. 44A is observed. FIG. 44B shows a diffraction pattern (nanobeam electron diffraction pattern) obtained when an electron beam with a probe diameter of 1 nm is incident on the same sample. In FIG. 44B, a plurality of spots is observed in a ring-like region. Thus, ordering in an nc-OS is not observed with an electron beam with a probe diameter of 50 nm but is observed with an electron beam with a probe diameter of 1 nm.

Figure 44C:
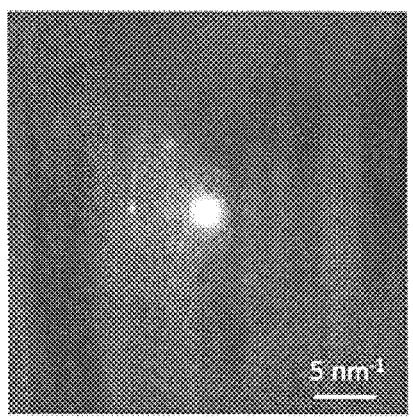

When an electron beam with a probe diameter of 1 nm is incident on a region with a thickness less than 10 nm, an electron diffraction pattern in which six spots are arranged in an approximately regular hexagonal shape as shown in FIG. 44C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 44D:
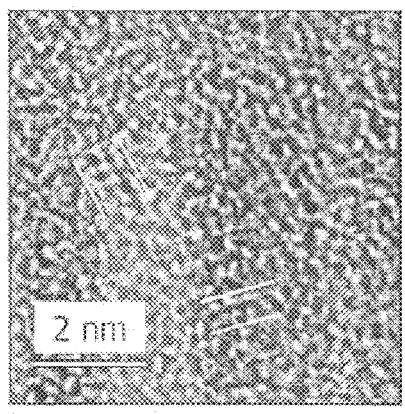

FIG. 44D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<a-like OS>

The a-like OS has a structure intermediate between those of the nc-OS and the amorphous oxide semiconductor.

Figure 45A:
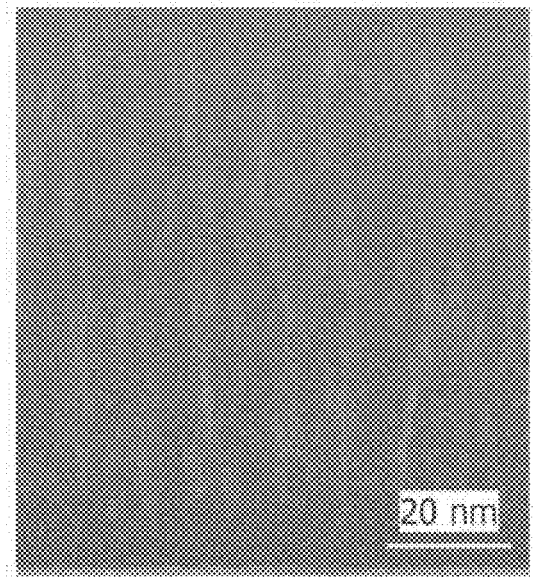
FIGS. 45A and 45B show cross-sectional TEM images of an a-like OS.
Figure 45B:
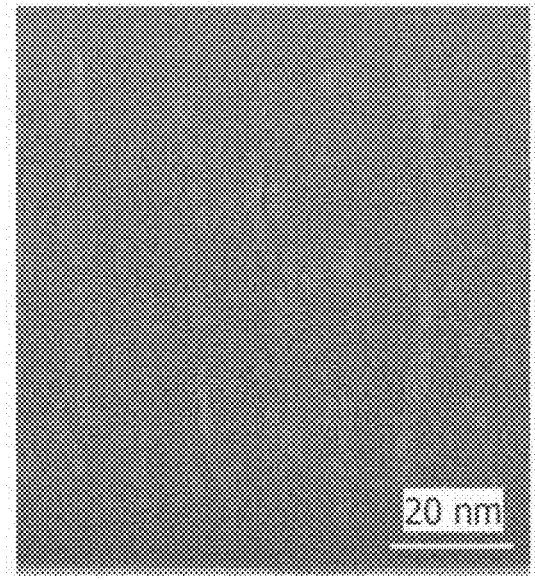

FIGS. 45A and 45B show high-resolution cross-sectional TEM images of the a-like OS. FIG. 45A is the high-resolution cross-sectional TEM image of the a-like OS taken at the start of the electron irradiation. FIG. 45B is the high-resolution cross-sectional TEM image of the a-like OS taken after the irradiation with electrons (e$^-$) at $4.3\times10^8$ e$^-$/nm$^2$. FIGS. 45A and 45B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that the a-like OS has an unstable structure as compared with the CAAC-OS and the nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of $InGaZnO_4$ in the following description. Each lattice fringe corresponds to the a-b plane of the $InGaZnO_4$ crystal.

Figure 46:
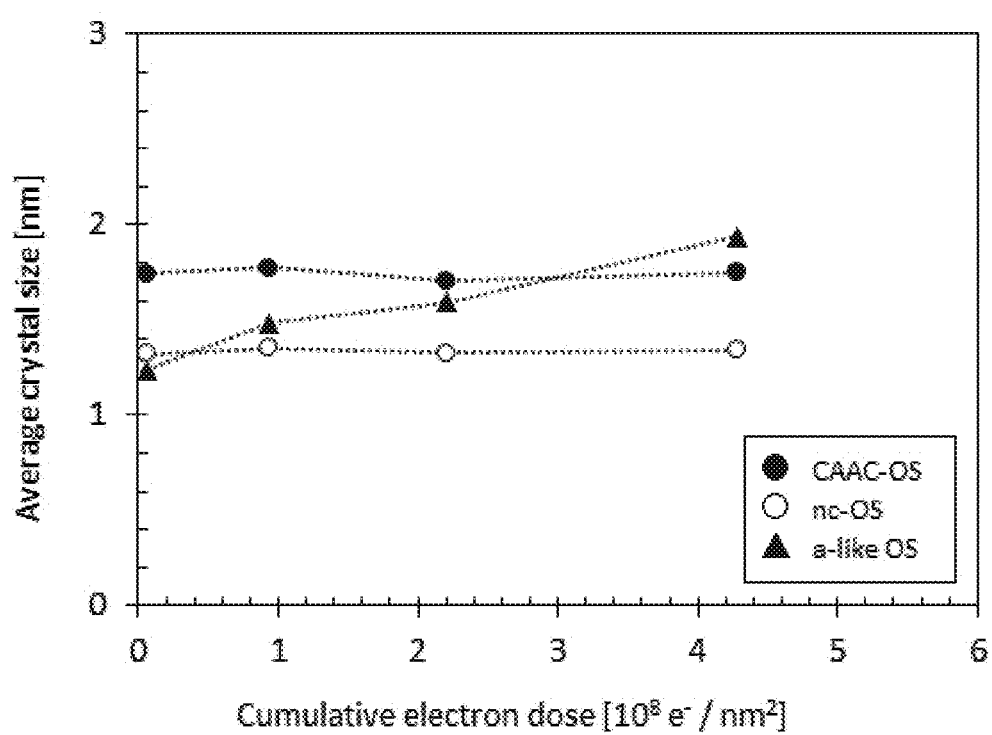
FIG. 46 shows changes of crystal parts of an In—Ga—Zn oxide owing to electron irradiation.
Figure 47A:
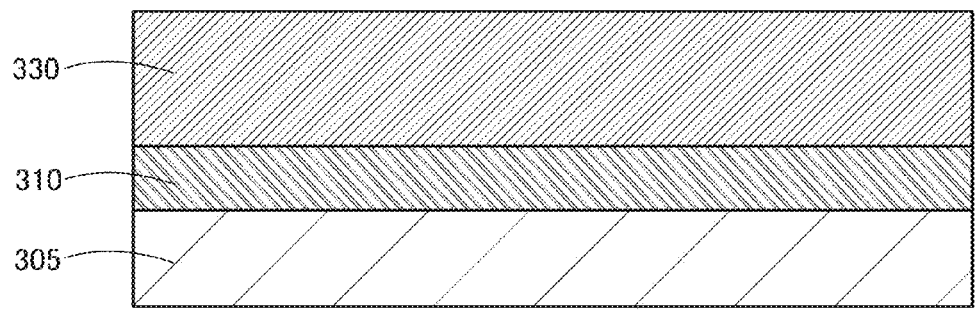
FIGS. 47A to 47C are cross-sectional views illustrating a method for manufacturing a semiconductor device.
Figure 47B:
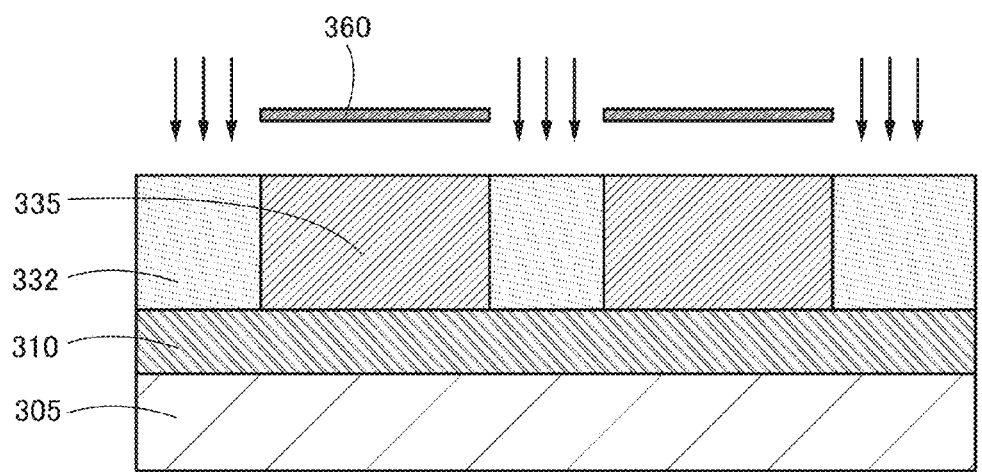
Figure 47C:
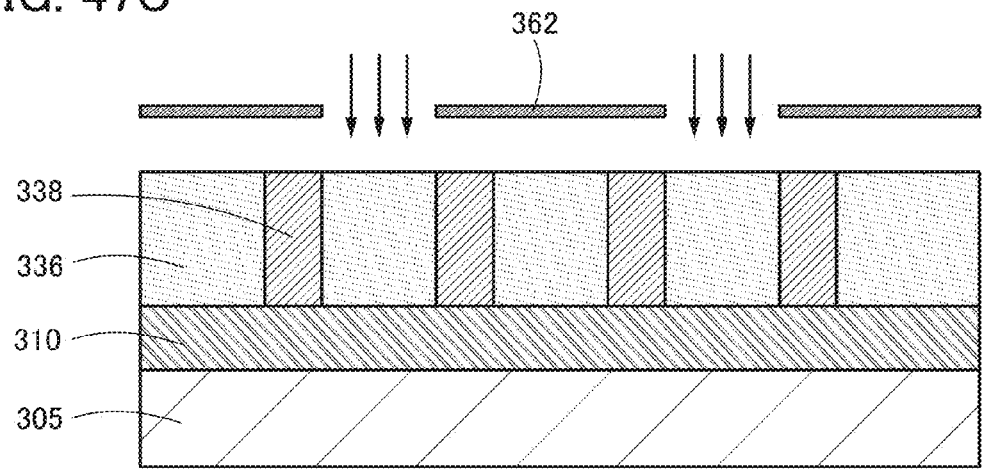

FIG. 46 shows changes in the average size of crystal parts (at 22 points to 30 points) in each sample. Note that the crystal part size corresponds to the length of a lattice fringe. FIG. 46 indicates that the crystal part size in the a-like OS increases with an increase in the cumulative electron dose in obtaining TEM images, for example. As shown in FIG. 46, a crystal part with a size of approximately 1.2 nm (also referred to as an initial nucleus) at the start of TEM observation grows to a size of approximately 1.9 nm at a cumulative electron (e$^-$) dose of $4.2\times10^8$ e$^-$/nm$^2$. In contrast, the crystal part sizes in the nc-OS and the CAAC-OS show little change from the start of electron irradiation to a cumulative electron dose of $4.2 \times 10^8$ e$^-$/nm$^2$. As shown in FIG. 46, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e$^-$/(nm$^2$·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor whose atomic ratio of In to Ga and Zn is 1:1:1, the density of single crystal InGaZnO$_4$ with a rhombohedral crystal structure is 6.357 g/cm$^3$. Accordingly, in the case of the oxide semiconductor whose atomic ratio of In to Ga and Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga and Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structures described in this embodiment can be combined as appropriate with any of the structures described in the other embodiments and examples.

Embodiment 4

In this embodiment, examples of processing methods of a wiring or an electrode with a line width smaller than the limit of resolution which is one of performances of a light exposure apparatus used in a lithography method are described with reference to cross-sectional views in FIGS. 47A to 47C, FIGS. 48A to 48C, FIGS. 87A to 87C, FIGS. 88A to 88C, FIGS. 89A to 89C, FIG. 90, FIGS. 91A to 91C, FIGS. 92A and 92B, FIGS. 93A and 93B, FIGS. 94A and 94B, and FIGS. 95A to 95C.

L/S means a width of a wiring and a distance between the wiring and an adjacent wiring. L and S indicate a line and a space, respectively.

<Processing Method 1>

An example of a processing method is described with reference to the cross-sectional views in FIGS. 47A to 47C and FIGS. 48A to 48C.

First, a conductor 310 is deposited over a substrate 305. Although an example where the conductor 310 is deposited over the substrate 305 is shown in this embodiment, one embodiment of the present invention is not limited thereto. For example, the conductor 310 may be deposited over an insulating layer or a semiconductor device. The conductor 310 may be deposited to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

In this specification, the conductors, the insulators, and the semiconductors can be formed by a sputtering method, a chemical vapor deposition (CVD) method, a molecular beam epitaxy (MBE) method, a pulsed laser deposition (PLD) method, an atomic layer deposition (ALD) method, a thermal oxidation method, a plasma oxidation method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a plasma CVD method, a high quality film can be obtained at relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a thermal CVD method, and thus the yield of a semiconductor device can be increased. In addition, since plasma damage does not occur in the deposition by a thermal CVD method, a film with few defects can be obtained.

An ALD method also causes less plasma damage to an object. Since an ALD method does not cause plasma damage either during deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, a resist 330 is applied over the conductor 310. As the resist 330, a positive resist (whose portion not exposed to light remains and whose portion exposed to light is removed) or a negative resist (whose portion not exposed to light is removed and whose portion exposed to light remains) can be used. In this embodiment, an example where a positive resist is used is described (see FIG. 47A).

Next, first light exposure is performed on the resist 330 with a light exposure apparatus. In the first light exposure, a photomask 360 is used. An exposed region 332 and an unexposed region 335 which is shielded from light by the photomask 360 and not exposed to light are formed through the first light exposure. The width L of the photomask 360 is approximately twice the width S thereof, and the width S is the minimum width that is the performance limit of the light exposure apparatus (see FIG. 47B).

An example of 1:1 magnification exposure is described for convenience in this embodiment; however, in the case where a reduction projection lens is used to perform light exposure on the resist 330, the widths of an exposed region and an unexposed region can be reduced in the light exposure. Typically, each of the widths of the regions is reduced to ⅕.

Next, second light exposure is performed with the light exposure apparatus. In the second light exposure, a photomask 362 is used. The L/S of the photomask 362 is the same as the L/S of the photomask 360 used in the first light exposure. Note that the light exposure is performed so that the center portion of the light-transmitting region of the photomask 362 is aligned with the center portion of the unexposed region 335 which is not exposed to light through the first light exposure. The non-light-transmitting region of the photomask 362 is aligned with both ends of the unexposed region 335. An exposed region 336 and an unexposed region 338 are formed through the second light exposure. When the width L is twice the width S, and the width S is the minimum width that is the performance limit of the light exposure apparatus as described above, the width W of the unexposed region 338 satisfies W=(2S−S)/2=S/2 and is ½ of S which is the performance limit of the light exposure apparatus (see FIG. 47C). In this embodiment, an example where the width L of each of the photomasks 360 and 362 is twice the width S thereof is described; however, the ratio of the width L to the width S can be changed as appropriate.

Figure 48A:
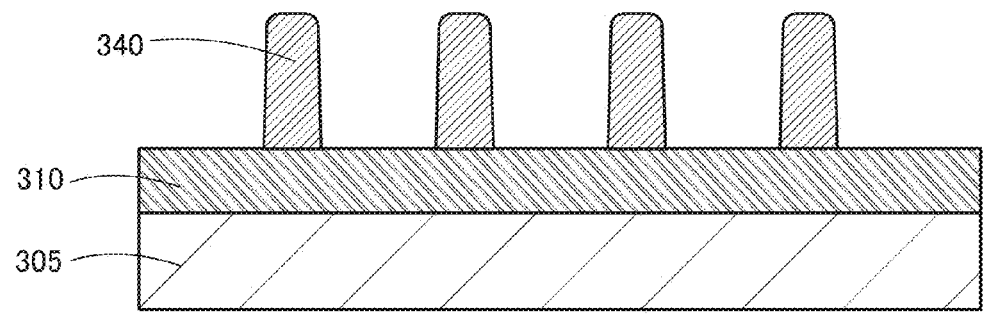
FIGS. 48A to 48C are cross-sectional views illustrating a method for manufacturing a semiconductor device.

Next, an unnecessary portion of the resist is removed by treatment using a developer, so that resist masks 340 are formed (see FIG. 48A).

Figure 48B:
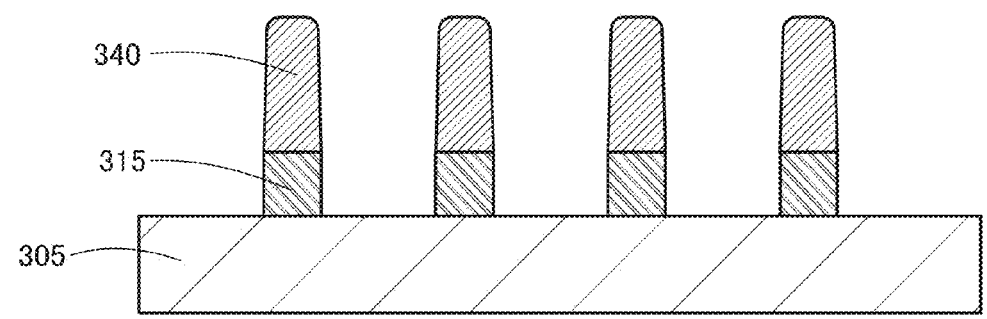
Figure 48C:
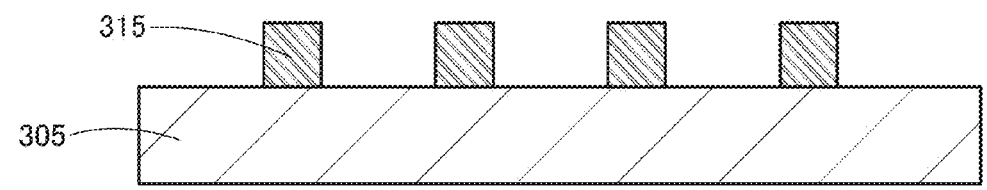

Next, an unnecessary portion of the conductor 310 is etched using the resist masks 340 as etching masks, so that conductors 315 are formed (see FIG. 48B).

Then, the resist masks 340 are removed. The resist masks 340 can be removed by plasma treatment using oxygen. Alternatively, the resist masks 340 may be removed by wet etching treatment using a chemical solution. Alternatively, the resist masks 340 may be removed in the following manner: plasma treatment using oxygen is performed and then, wet etching treatment using a chemical solution is performed. The width of each of the conductors 315 is S/2, and a wiring or an electrode with a size smaller than the resolution limit of the light exposure apparatus can be formed (see FIG. 48C).

<Processing Method 2>

An example of a processing method which is different from the above example is described with reference to the cross-sectional views in FIGS. 87A to 87C and FIGS. 88A to 88C.

First, the conductor 310 is deposited over the substrate 305. Next, a conductor 320 is deposited over the conductor 310. The conductor 320 may be deposited to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, gallium, tin, and oxygen, a semiconductor containing indium, gallium, tin, and oxygen, a conductor containing titanium and nitrogen, or the like may be used.

Although an example where the conductor 320 is deposited over the conductor 310 is shown in this embodiment, an insulator may be deposited instead of the conductor. Alternatively, a multilayer film may be formed by stacking an insulator and a conductor.

Figure 87A:
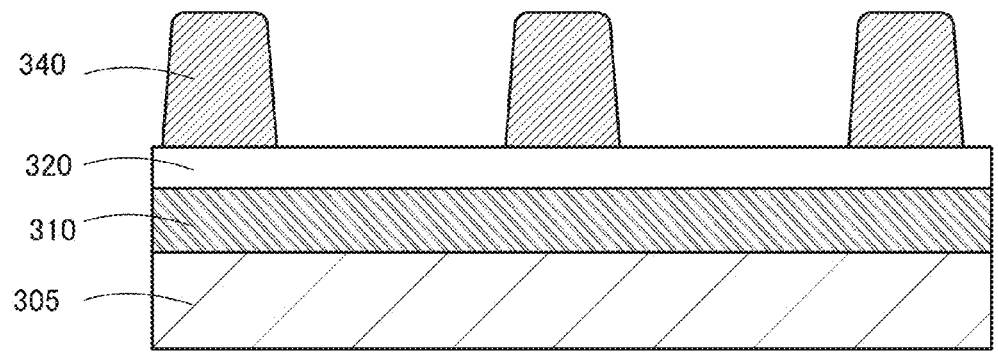
FIGS. 87A to 87C are cross-sectional views illustrating a method for manufacturing a semiconductor device.

Next, resist masks 340 are formed over the conductor 320 by a first lithography method (see FIG. 87A). The width L of each of the resist masks 340 is equal to, for example, the minimum width that is the performance limit of the light exposure apparatus, and the width S thereof is approximately twice the width L.

Figure 87B:
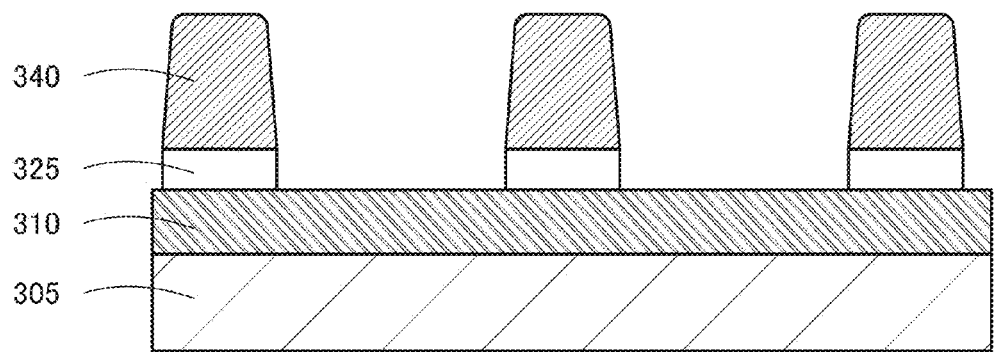
Figure 87C:
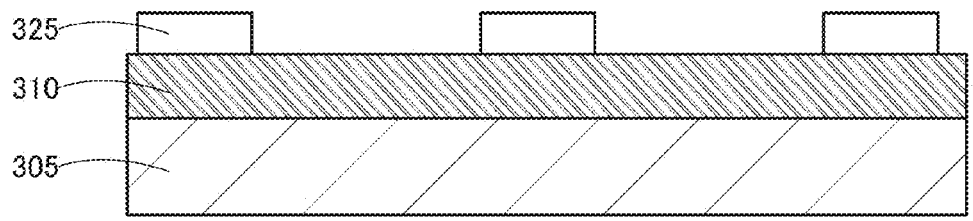

Next, an unnecessary portion of the conductor 320 is etched using the resist masks 340 as etching masks, so that conductors 325 are formed (see FIG. 87B).

Then, the resist masks 340 are removed. The resist masks 340 can be removed by plasma treatment using oxygen. Alternatively, the resist masks 340 may be removed by wet etching treatment using a chemical solution. Alternatively, the resist masks 340 may be removed in the following manner: plasma treatment using oxygen is performed and then, wet etching treatment using a chemical solution is performed (see FIG. 87C).

Figure 88A:
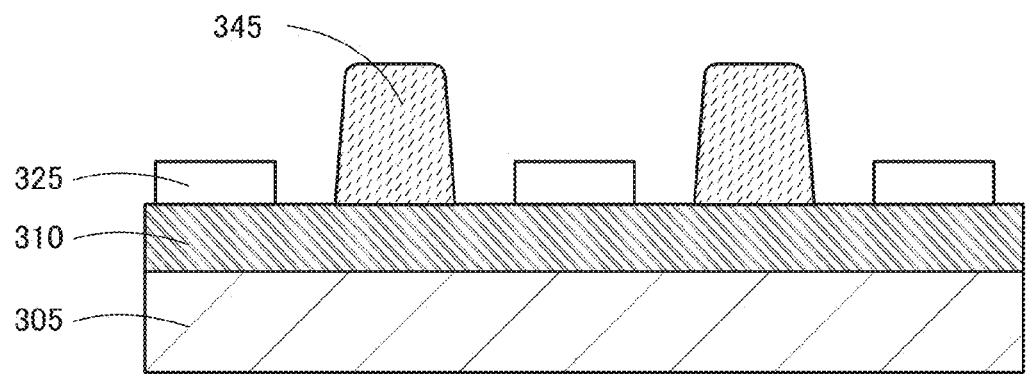
FIGS. 88A to 88C are cross-sectional views illustrating a method for manufacturing a semiconductor device.

Next, resist masks 345 are formed by a second lithography method (see FIG. 88A). Like the width L of each of the resist masks 340, the width L of each of the resist masks 345 is equal to, for example, the minimum width that is the performance limit of the light exposure apparatus, and the width S thereof is approximately twice the width L. In addition, each of the resist masks 345 is formed such that the center portion of the resist mask 345 is aligned with the center portion of a region between the adjacent conductors 325.

By using two lithography methods as described above, a width S of L/2 which is smaller than the minimum width that is the performance limit of the light exposure apparatus can be achieved.

Figure 88B:
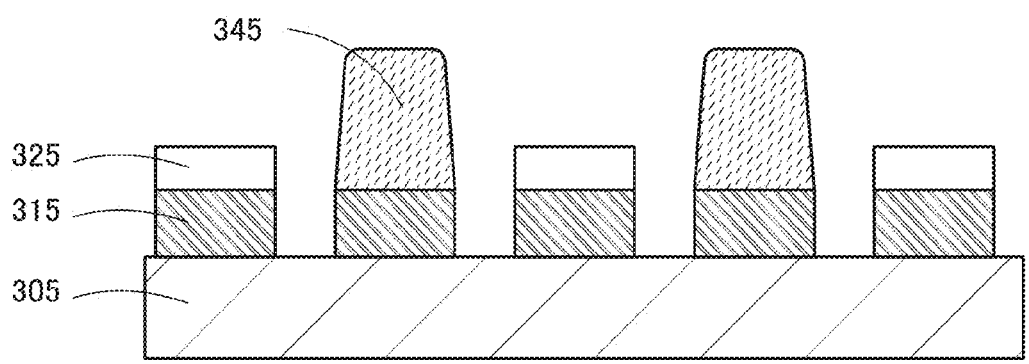

Next, an unnecessary portion of the conductor 310 is etched using the resist masks 345 and the conductors 325 as etching masks, so that conductors 315 are formed (see FIG. 88B).

Then, the resist masks 345 are removed. The resist masks 345 can be removed by plasma treatment using oxygen. Alternatively, the resist masks 345 may be wet etching treatment using a chemical solution. Alternatively, the resist masks 345 may be removed in the following manner: plasma treatment using oxygen is performed and then, wet etching treatment using a chemical solution is performed.

Then, the conductors 325 are removed. The conductors 325 can be removed by a dry etching method or a wet etching method; it is preferable to use a wet etching method, in which case the ratio of the etching rate of the conductors 325 to the etching rates of the conductors 315 and the substrate 305 can be increased. Specifically, the ratio of the etching rate of the conductors 325 to the etching rate of the conductors 315 and the etching rate of the substrate 305 can be 20:1:1 or more. Thus, it is preferable to use the wet etching method because a thickness decrease of the conductors 315, a shape change of the substrate 305, or the like can be prevented.

Figure 88C:
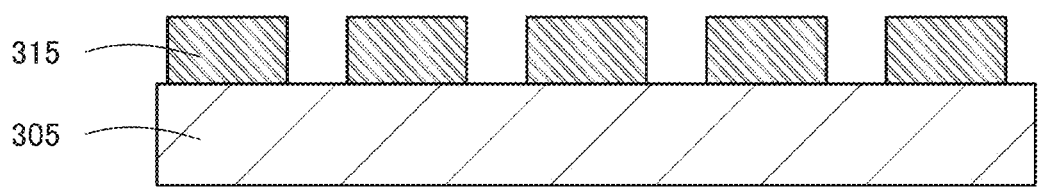

As described above, the width of a space S between adjacent wirings of the conductors 315 can be L/2, and a wiring or an electrode with an S smaller than the resolution limit of the light exposure apparatus can be manufactured (see FIG. 88C).

<Processing Method 3>

An example of a processing method which is different from the above example is described with reference to the cross-sectional views in FIGS. 89A to 89C and FIG. 90.

First, the conductor 310 is deposited over the substrate 305. Although an example where the conductor 310 is deposited over the substrate 305 is shown in this embodiment, one embodiment of the present invention is not limited thereto. For example, the conductor 310 may be deposited over an insulating layer or a semiconductor device. The conductor 310 may be deposited to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Figure 89A:
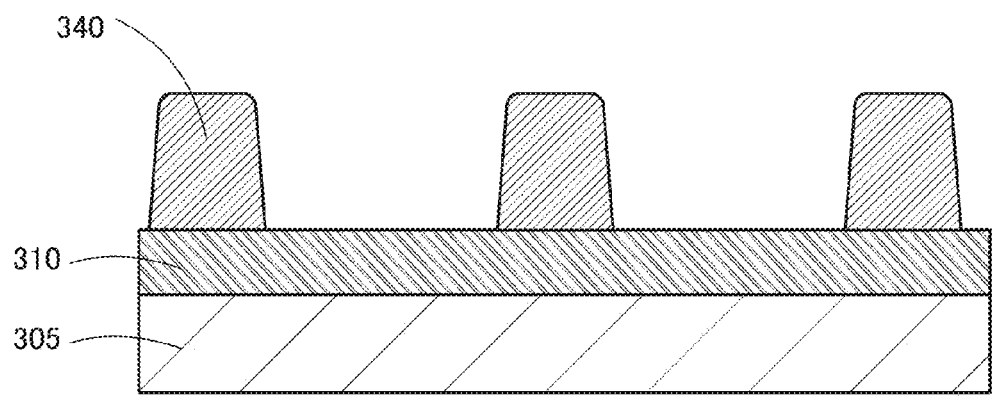
FIGS. 89A to 89C are cross-sectional views illustrating a method for manufacturing a semiconductor device.

Next, the resist masks 340 are formed over the conductor 310 by a first lithography method (see FIG. 89A). The width L of each of the resist masks 340 is, for example, the minimum width that is the performance limit of the light exposure apparatus, and the width S thereof is approximately twice the width L.

Next, curing treatment is performed on the resist masks 340. As the curing treatment, heat treatment in a nitrogen gas atmosphere or ultraviolet treatment may be performed, or heat treatment in a nitrogen gas atmosphere and ultraviolet treatment may be performed at the same time.

Next, the resist masks 345 are formed by a second lithography method. Like the width L of each of the resist masks 340, the width L of each of the resist masks 345 is, for example, the minimum width that is the performance limit of the light exposure apparatus, and the width S thereof is approximately twice the width L. In addition, each of the resist masks 345 is formed such that the center portion of the resist mask 345 is aligned with the center portion of a region between the resist masks 340.

Figure 89B:
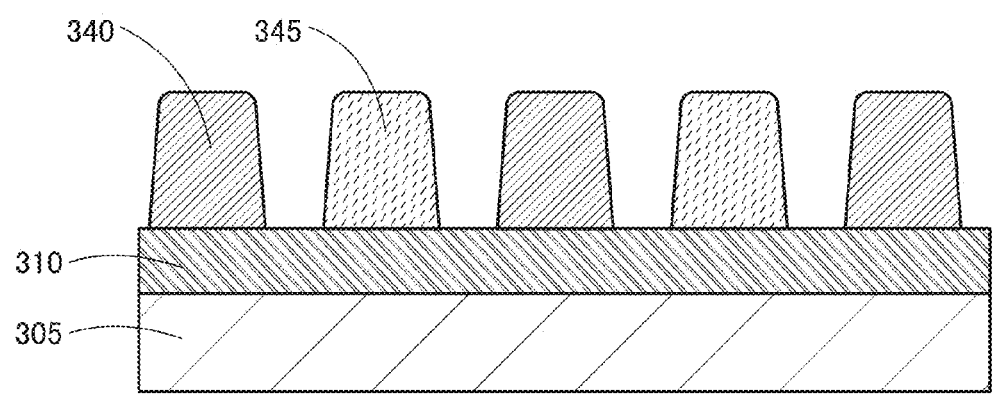

The second lithography method does not cause a shape change, a disappearance, or the like of the resist masks 340 because the curing treatment has been performed on the resist masks 340 (see FIG. 89B).

By using two lithography methods as described above, a width S of L/2 which is smaller than the minimum width that is the performance limit of the light exposure apparatus can be achieved.

Figure 89C:
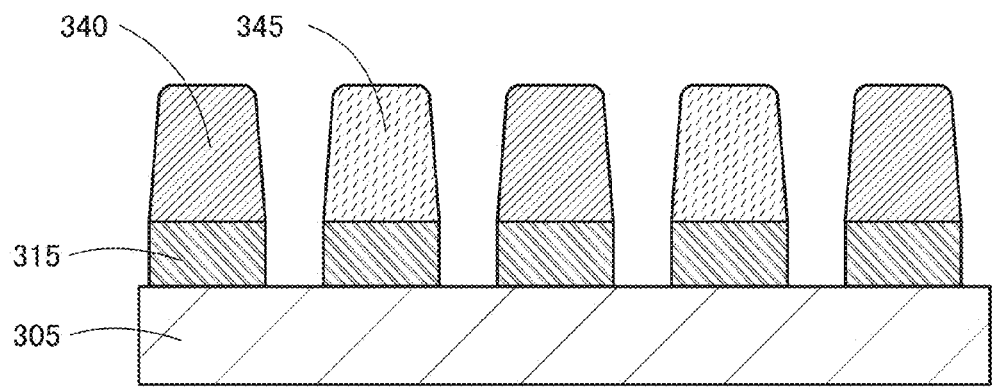
Figure 90:
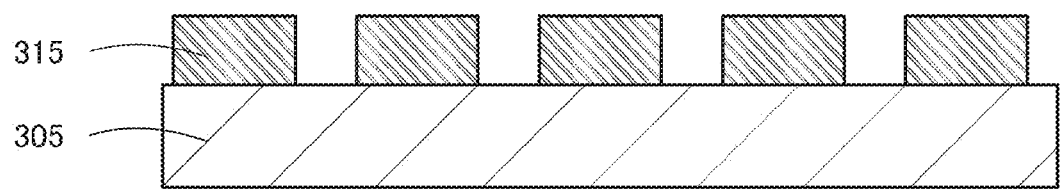
FIG. 90 is a cross-sectional view illustrating a method for manufacturing a semiconductor device.

Next, an unnecessary portion of the conductor 310 is etched using the resist masks 340 and the resist masks 345 as etching masks, so that the conductors 315 are formed (see FIG. 89C).

Then, the resist masks 340 and the resist masks 345 are removed. The resist masks 340 and the resist masks 345 can be removed by plasma treatment using oxygen. Alternatively, the resist masks 340 and the resist masks 345 may be removed by wet etching treatment using a chemical solution. Alternatively, the resist masks 340 and the resist masks 345 may be removed in the following manner: plasma treatment using oxygen is performed and then, wet etching treatment using a chemical solution is performed. In the above manner, the width of the space S between adjacent wirings of the conductors 315 can be L/2, and a wiring or an electrode with an S smaller than the resolution limit of the light exposure apparatus can be manufactured (see FIG. 90).

<Processing Method 4>

An example of a processing method which is different from the above example is described with reference to the cross-sectional views in FIGS. 91A to 91C and FIGS. 92A and 92B.

First, the conductor 310 is deposited over the substrate 305. Although an example where the conductor 310 is deposited over the substrate 305 is shown in this embodiment, one embodiment of the present invention is not limited thereto. For example, the conductor 310 may be deposited over an insulating layer or a semiconductor device. The conductor 310 may be deposited to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Figure 91A:
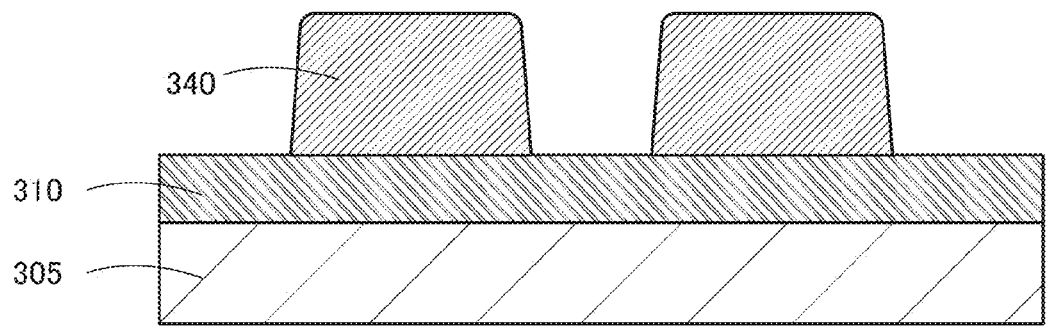
FIGS. 91A to 91C are cross-sectional views illustrating a method for manufacturing a semiconductor device.

Next, the resist masks 340 are formed over the conductor 310 by a lithography method (see FIG. 91A). The width L of each of the resist masks 340 is, for example, approximately twice the width S thereof, and the width S is equal to the minimum width that is the performance limit of the light exposure apparatus.

Figure 91B:
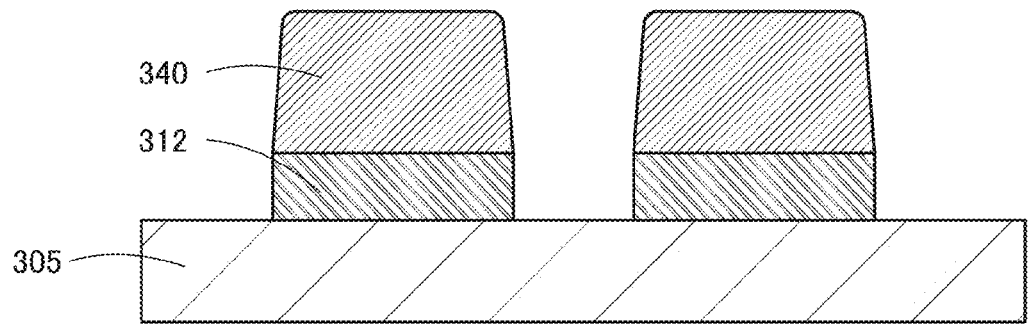

Next, an unnecessary portion of the conductor 310 is etched using the resist masks 340 as etching masks, so that conductors 312 are formed (see FIG. 91B).

Then, the resist masks 340 are removed. The resist masks 340 can be removed by plasma treatment using oxygen. Alternatively, the resist masks 340 may be removed by wet etching treatment using a chemical solution. Alternatively, the resist masks 340 may be removed in the following manner: plasma treatment using oxygen is performed and then, wet etching treatment using a chemical solution is performed.

Next, the resist masks 345 are formed over the substrate 305 and the conductors 312 by a lithography method. The L/S of each of the resist masks 345 is equal to the L/S of each of the resist masks 340. The width L of the resist mask 345 is, for example, twice the width S thereof, and the width S is equal to the minimum width that is the performance limit of the light exposure apparatus.

Figure 91C:
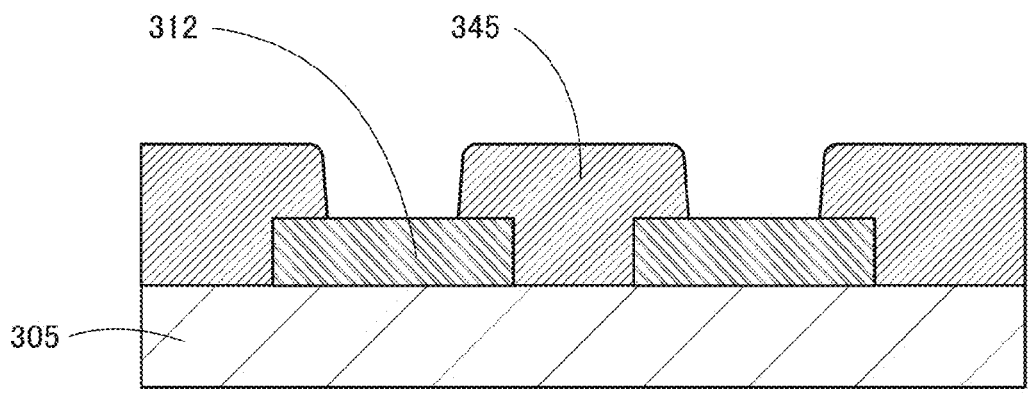

When the center of each of the resist masks 345 is aligned with the center portion of a region between the adjacent conductors 312, the width of a region where the resist mask 345 and the conductor 312 overlap with each other is equal to S/2 (see FIG. 91C).

Figure 92A:
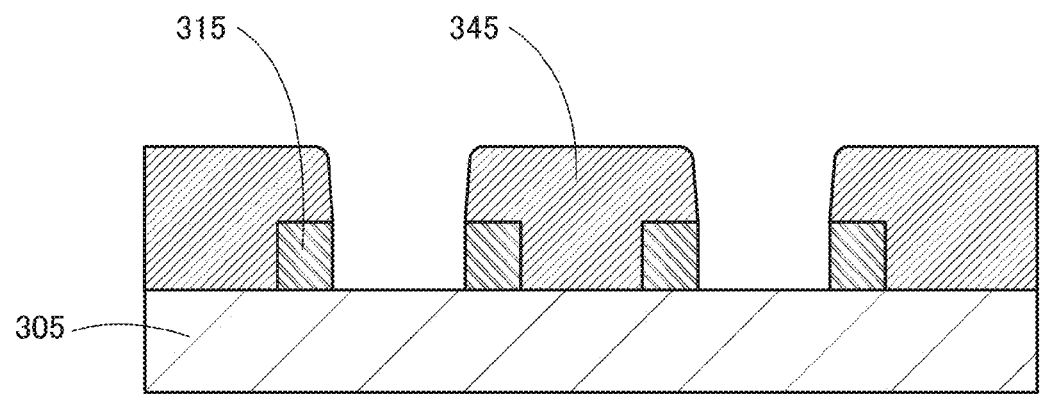
FIGS. 92A and 92B are cross-sectional views illustrating a method for manufacturing a semiconductor device.
Figure 92B:
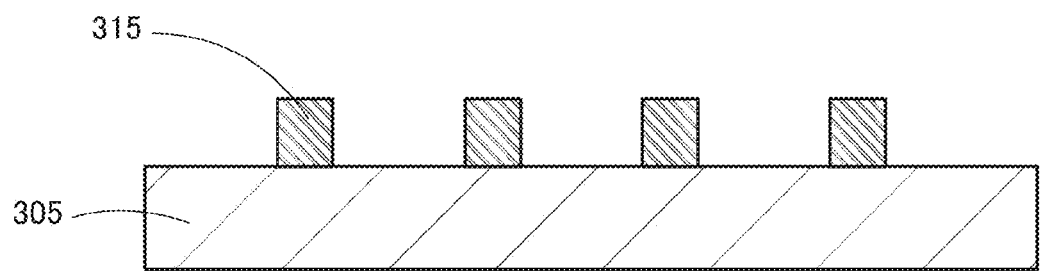

Next, an unnecessary portion of the conductors 312 is etched using the resist masks 345 as etching masks, so that conductors 315 are formed (see FIG. 92A).

Then, the resist masks 345 are removed. The resist masks 345 can be removed by plasma treatment using oxygen. Alternatively, the resist masks 345 may be removed by wet etching treatment using a chemical solution. Alternatively, the resist masks 345 may be removed in the following manner: plasma treatment using oxygen is performed and then, wet etching treatment using a chemical solution is performed. The width of each of the conductors 315 can be S/2, and a wiring or an electrode including the conductor 315 with a size smaller than the resolution limit of the light exposure apparatus can be manufactured (see FIG. 92B).

<Processing Method 5>

An example of a processing method which is different from the above example is described with reference to the cross-sectional views in FIGS. 93A and 93B, FIGS. 94A and 94B, and FIGS. 95A to 95C.

First, the conductor 310 is deposited over the substrate 305. Although an example where the conductor 310 is deposited over the substrate 305 is shown in this embodiment, one embodiment of the present invention is not limited thereto. For example, the conductor 310 may be deposited over an insulating layer or a semiconductor device. The conductor 310 may be deposited to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Next, the conductor 320 is deposited over the conductor 310. The conductor 320 may be deposited to have a single-layer structure or a stacked-layer structure including a conductor containing, for example, one or more kinds of boron, nitrogen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Although an example where the conductor 320 is deposited over the conductor 310 is shown in this embodiment, an insulator may be deposited instead of the conductor. Alternatively, a multilayer film may be formed by stacking an insulator and a conductor.

Figure 93A:
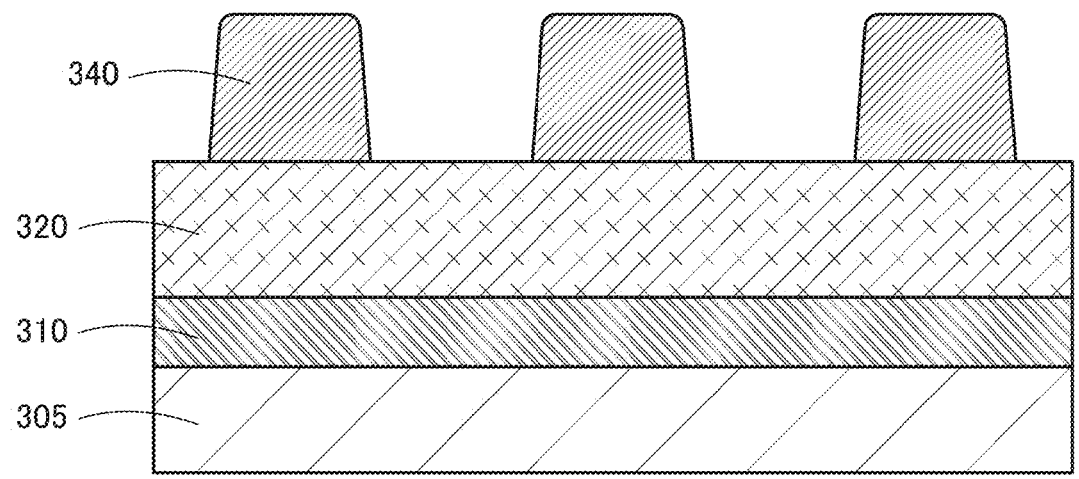
FIGS. 93A and 93B are cross-sectional views illustrating a method for manufacturing a semiconductor device.
Figure 93B:
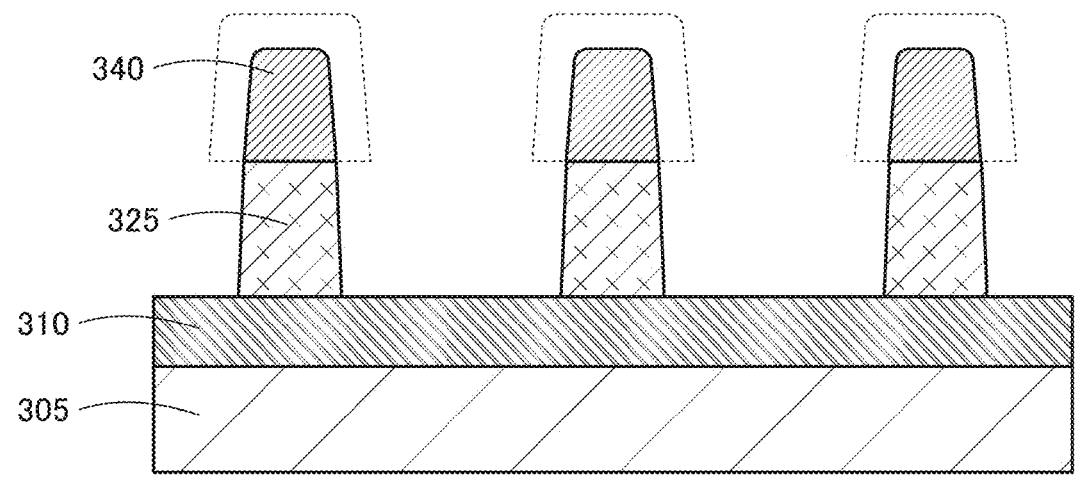

Next, the resist masks 340 are formed over the conductor 320 by a lithography method (see FIG. 93A). The resist masks formed here each have the minimum L/S possible for the light exposure apparatus used in the lithography method.

Next, an unnecessary portion of the conductor 320 is etched using the resist masks 340 as etching masks, so that the conductors 325 are formed. The conductor 320 is preferably etched by a dry etching method to achieve microfabrication. During the etching of the conductor 320, the size of each of the resist masks 340 is decreased by partial etching; thus, the line width of each of the conductors 325 can be made smaller than the line width of the resist mask. The line width of the conductor 325 can be further decreased by extending the time for etching the conductor 320 (see FIG. 93B).

Then, the resist masks 340 are removed. The resist masks 340 can be removed by plasma treatment using oxygen. Alternatively, the resist masks 340 may be removed by wet etching treatment using a chemical solution. Alternatively, the resist masks 340 may be removed in the following manner: plasma treatment using oxygen is performed and then, wet etching treatment using a chemical solution is performed.

Figure 94A:
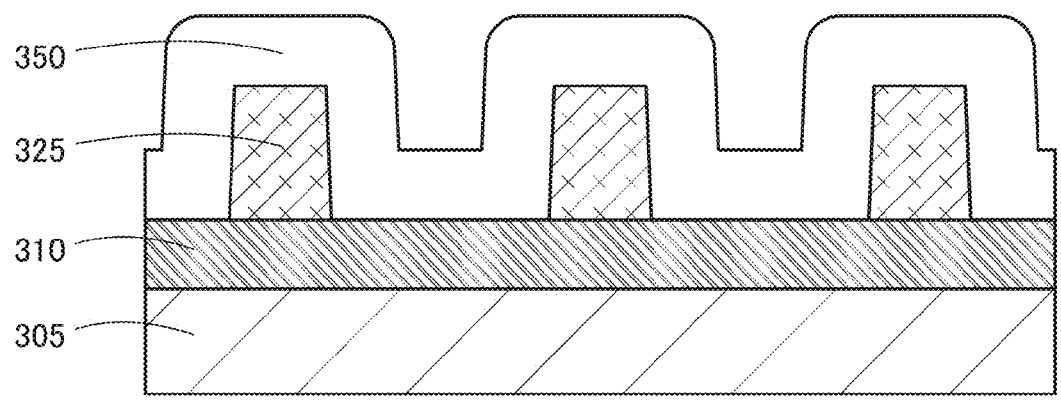
FIGS. 94A and 94B are cross-sectional views illustrating a method for manufacturing a semiconductor device.

Next, an insulator 350 is deposited so as to cover the conductor 310 and the conductors 325 (see FIG. 94A). The insulator 350 may be deposited to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 350 preferably contains silicon oxide, silicon nitride, silicon nitride oxide, or silicon oxynitride.

Figure 94B:
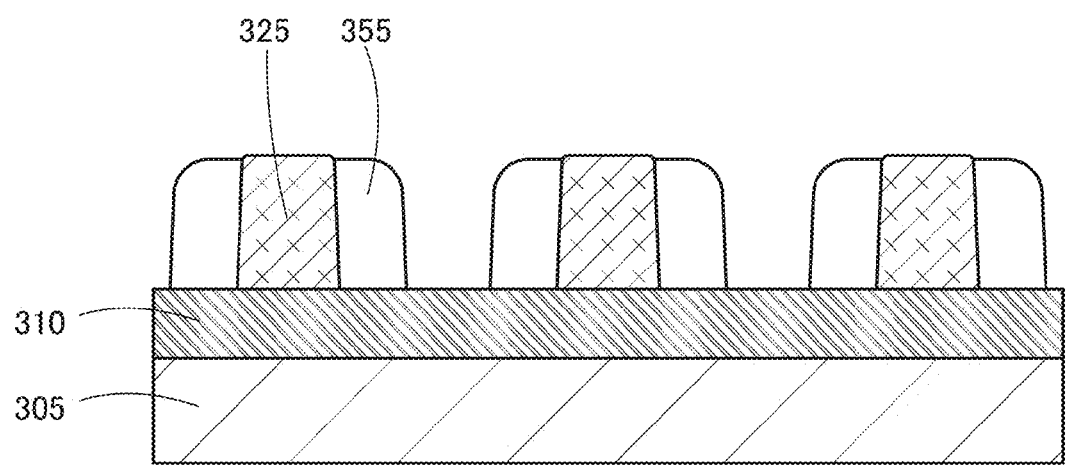
Figure 95A:
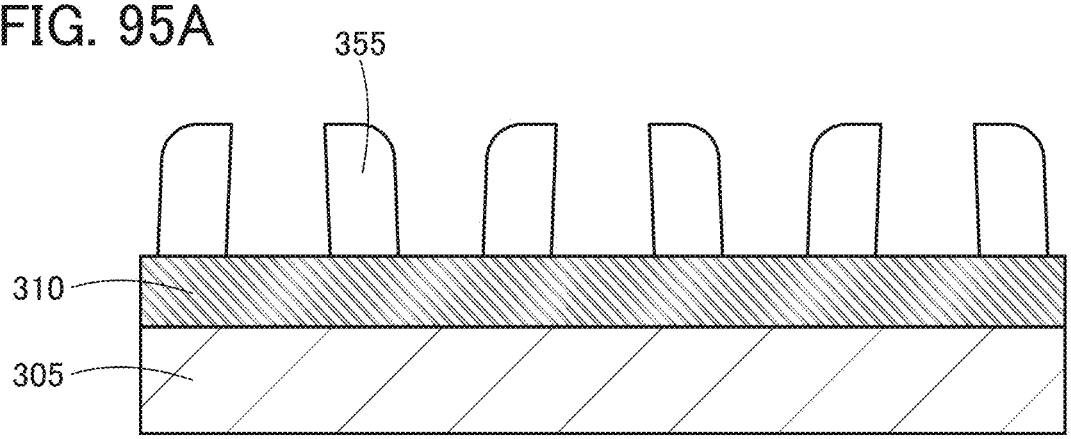
FIGS. 95A to 95C are cross-sectional views illustrating a method for manufacturing a semiconductor device.
Figure 95B:
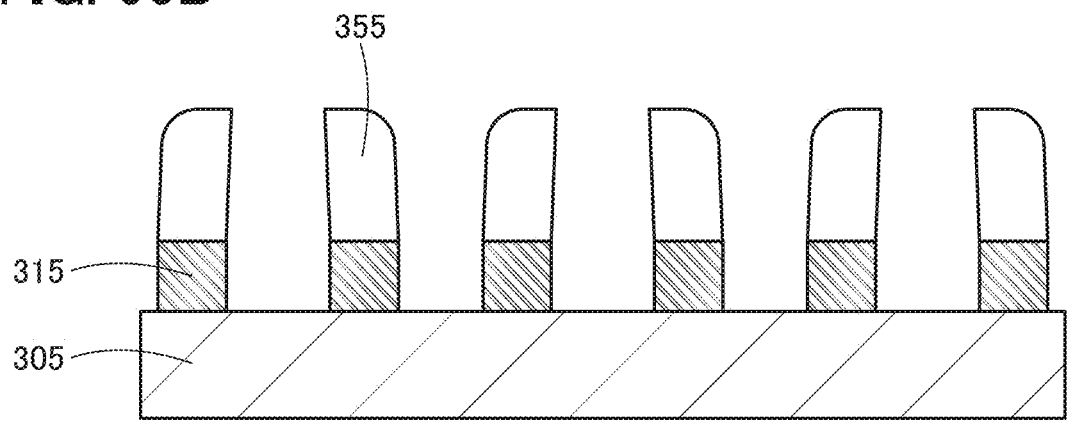
Figure 95C:
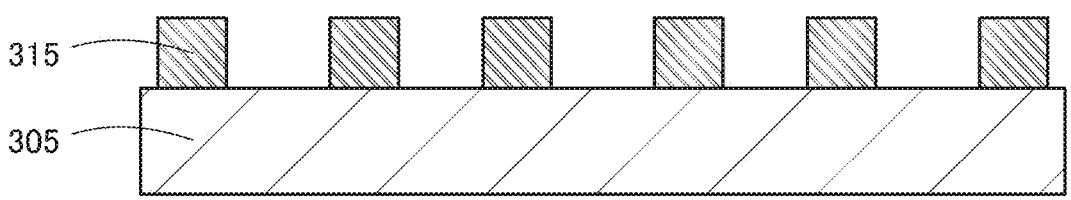

Next, the insulator 350 is etched until upper surfaces of the conductors 325 and the conductor 310 are exposed, so that insulators 355 are formed at the sides of the conductors 325 (see FIG. 94B). The insulator 350 is preferably etched by a dry etching method. It is particularly preferable to use anisotropic etching which proceeds in a direction perpendicular to a plane that is parallel to a lower surface of the substrate 305.

Then, the conductors 325 are removed. The conductors 325 can be removed by a dry etching method or a wet etching method; it is preferable to use a wet etching method, in which case the ratio of the etching rate of the conductors 325 to the etching rate of the insulators 355 can be increased. Specifically, the ratio of the etching rate of the conductors 325 to the etching rate of the insulators 355 can be 20:1 or more. Alternatively, the wet etching method enables portions of the conductor 310 behind the insulators 355 to be etched because the etching proceeds isotropically. Thus, it is preferable to use the wet etching method because a thickness decrease of the insulators 355, a shape change of the insulators 355, a residue of the conductors 325, or the like can be prevented. In this manner, a hard mask including the insulators 355 is formed (see FIG. 95A).

The coverage of the conductors 325 with the insulator 350 determines the line width of the insulators 355. That is, the coverage C of the conductors 325 with the insulator 350 is defined by C=B/A, where A is the thickness of the insulator 350 over the upper surfaces of the conductors 325 and B is the thickness of the insulator 350 at the sides of the conductors 325. For example, when the coverage C with the insulator 350 is 0.8 and the thickness A of the insulator 350 is 1000 nm, the thickness B of the insulator 350 at the sides of the conductors 325 is 800 nm. Therefore, the thickness of the insulator 355, i.e., the line width of the insulator 355, is 800 nm. The insulator 355 having an intended line width can be formed by measuring the coverage with the insulator 350 in advance and adjusting the thickness of the insulator 355. In the above manner, the insulators 355 can be formed without the use of a lithography process; thus, an L/S smaller than the resolution of the light exposure apparatus used in lithography can be achieved. The coverage C with the insulator 350 is more than or equal to 0.3 and less than or equal to 1.0, preferably more than or equal to 0.5 and less than or equal to 1.0.

Next, the conductor 310 is partly etched using the insulators 355 as etching masks, so that the conductors 315 are formed. The conductor 310 is preferably etched by a dry etching method (see FIG. 95B).

Then, the insulators 355 are removed. The insulators 355 can be etched by a dry etching method or a wet etching method. By using the above-described method of one embodiment of the present invention, a wiring or an electrode including the conductor 315 with an L/S smaller than the resolution limit of the light exposure apparatus can be manufactured (see FIG. 95C).

The structures described in this embodiment can be combined as appropriate with any of the structures described in the other embodiments and examples.

Embodiment 5

In this embodiment, an example of a display device that includes any of the transistors described in the above embodiments will be described below with reference to FIG. 49, FIG. 50, FIG. 51, FIG. 52, FIGS. 53A, 53B1, and 53B2, FIGS. 54A and 54B, FIG. 55, FIGS. 56A, 56B1, and 56B2, and FIG. 57.

Figure 49:
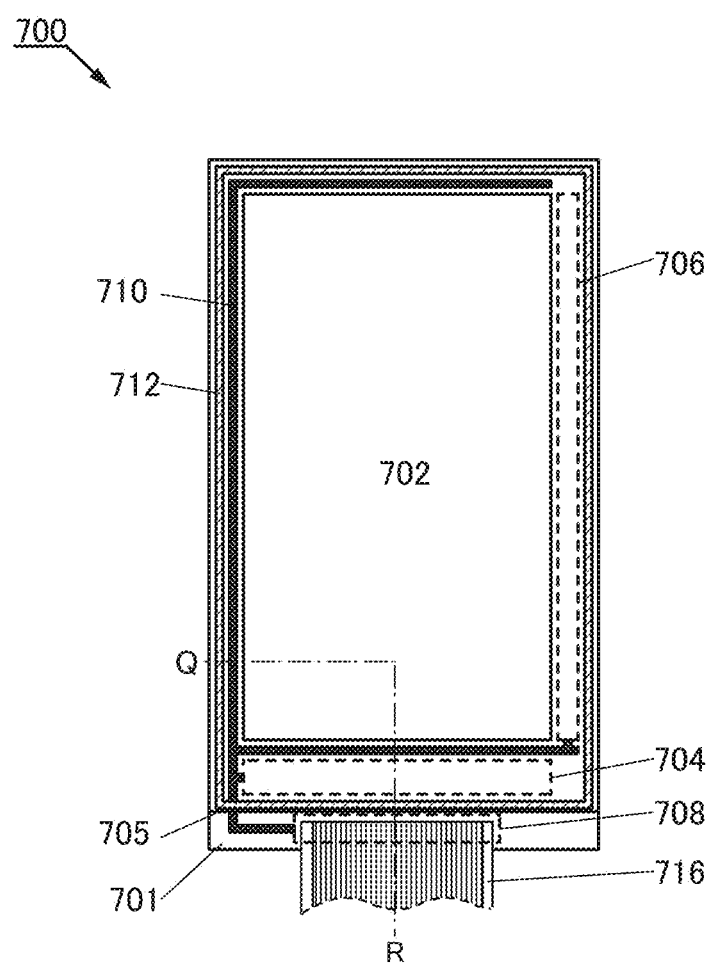
FIG. 49 is a top view illustrating one embodiment of a display device.

FIG. 49 is a top view illustrating an example of a display device. A display device 700 in FIG. 49 includes a pixel portion 702 provided over a first substrate 701, a source driver circuit portion 704 and a gate driver circuit portion 706 which are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 49, a display element is provided between the first substrate 701 and the second substrate 705.

In the display device 700, a flexible printed circuit (FPC) terminal portion 708 which is electrically connected to the pixel portion 702, the source driver circuit portion 704, and the gate driver circuit portion 706 is provided in a region different from the region which is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be mounted on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ between color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 50:
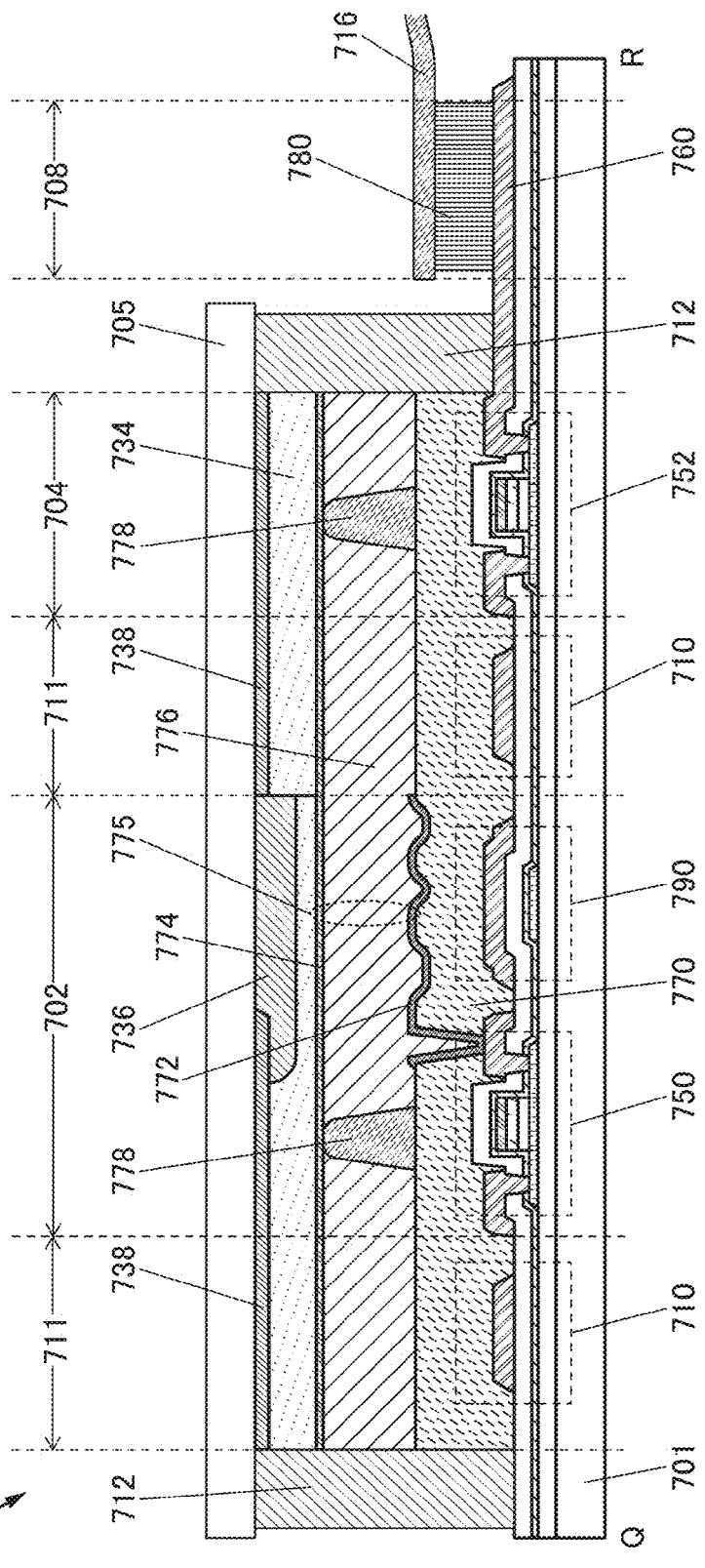
FIG. 50 is a cross-sectional view illustrating one embodiment of a display device.
Figure 51:
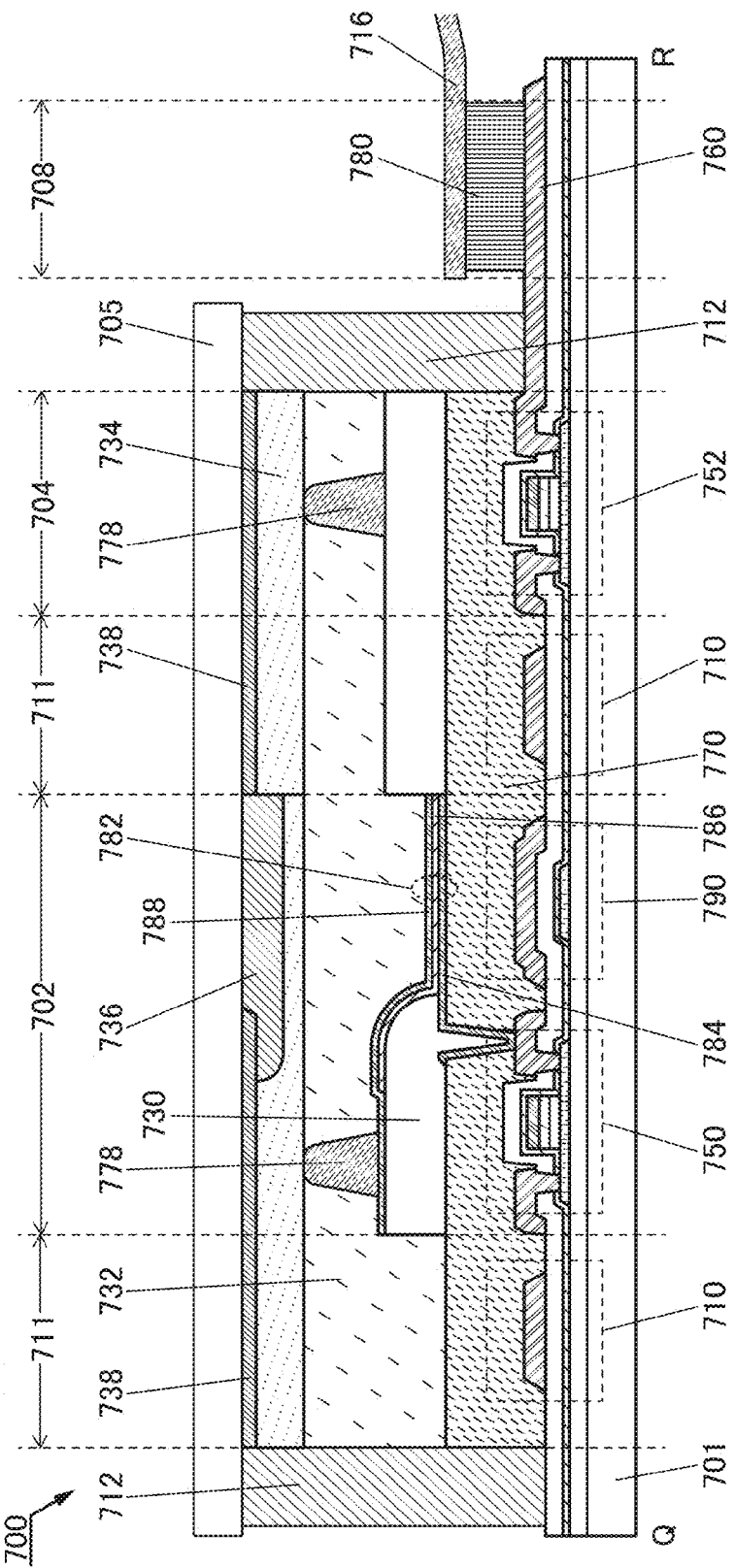
FIG. 51 is a cross-sectional view illustrating one embodiment of a display device.

In this embodiment, a structure including a liquid crystal element as a display element and a structure including an EL element as a display element will be described with reference to FIG. 50 and FIG. 51. FIG. 50 is a cross-sectional view taken along dashed-dotted line Q-R in FIG. 49 and illustrates the structure including a liquid crystal element as a display element. FIG. 51 is a cross-sectional view taken along dashed-dotted line Q-R in FIG. 49 and illustrates the structure including an EL element as a display element.

Portions common to FIG. 50 and FIG. 51 will be described first, and then, different portions will be described.
<5-1. Portions Common to Display Devices>

The display device 700 in each of FIG. 50 and FIG. 51 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistor used in this embodiment includes an oxide semiconductor film which is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device which includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, the transistor capable of high-speed operation can also be used in the pixel portion, whereby a high-quality image can be provided.

With the transistor having high field-effect mobility, the resolution of a display device can be increased. For example, the transistor can be favorably used for a pixel circuit or a driver circuit of a high-resolution display device typified by a display device with 4 K×2 K pixels (3840 pixels in the horizontal direction and 2160 pixels in the vertical direction) or 8 K×4 K pixels (7680 pixels in the horizontal direction and 4320 pixels in the vertical direction). The transistor used in this embodiment in which the generation of parasitic capacitance is reduced can operate at high speed, and thus is capable of suppressing signal delay. Therefore, the quality of images of the display device can be improved.

In FIG. 50 and FIG. 51, a planarization insulator 770 is provided over the transistor 750, the transistor 752, and the capacitor 790.

The planarization insulator 770 can be formed using a heat-resistant organic material such as a polyimide resin, an acrylic resin, a polyimide amide resin, a benzocyclobutene resin, a polyamide resin, or an epoxy resin. Note that the planarization insulator 770 may be formed by stacking a plurality of insulators formed using any of these materials. A structure without the planarization insulator 770 may also be employed.

Although FIG. 50 and FIG. 51 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors.

In the case where the pixel portion 702 and the source driver circuit portion 704 include different transistors, any of the transistors described in Embodiment 1 and a bottom-gate transistor such as an inverted staggered transistor may be used in combination. Specifically, a structure in which any of the transistors described in Embodiment 1 is used in the pixel portion 702 and an inverted staggered transistor is used in the source driver circuit portion 704, or a structure in which an inverted staggered transistor is used in the pixel portion 702 and any of the transistors described in Embodiment 1 is used in the source driver circuit portion 704 may be employed. Note that the term "source driver circuit portion 704" can be replaced by the term "gate driver circuit portion".

The signal line 710 is formed through the same process as the conductors functioning as source electrodes and drain electrodes of the transistors 750 and 752. Note that the signal line 710 may be formed using a conductor which is formed through a process different from the process of forming the source electrodes and the drain electrodes of the transistors 750 and 752. For example, an oxide semiconductor formed through the same process as an oxide semiconductor functioning as a gate electrode may be used. In the case where the signal line 710 is formed using a material containing a copper element, signal delay or the like due to wiring resistance is reduced, which enables display on a large screen.

The FPC terminal portion 708 includes a connection electrode 760, an anisotropic conductor 780, and the FPC 716. Note that the connection electrode 760 is formed through the same process as the conductors functioning as source electrodes and drain electrodes of the transistors 750 and 752. The connection electrode 760 is electrically connected to a terminal included in the FPC 716 through the anisotropic conductor 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulator and is provided to control the distance (cell gap) between the first substrate 701 and the second substrate 705. Alternatively, a spherical spacer may also be used as the structure 778.

A light-shielding film 738 functioning as a black matrix, a coloring film 736 functioning as a color filter, and an insulator 734 in contact with the light-shielding film 738 and the coloring film 736 are provided on the second substrate 705 side.

<5-2. Structure Example of Display Device including Liquid Crystal Element>

The display device 700 in FIG. 50 includes a liquid crystal element 775. The liquid crystal element 775 includes a conductor 772, a conductor 774, and a liquid crystal layer 776. The conductor 774 is provided on the second substrate 705 side and functions as a counter electrode. The display device 700 in FIG. 50 can display an image in such a manner that transmission or non-transmission of light is controlled by the alignment state in the liquid crystal layer 776 which is changed depending on the voltage applied between the conductor 772 and the conductor 774.

The conductor 772 is connected to the conductor functioning as the source electrode or the drain electrode of the transistor 750. The conductor 772 is formed over the planarization insulator 770 and functions as a pixel electrode, that is, one electrode of the display element. The conductor 772 functions as a reflective electrode. The display device 700 in FIG. 50 is a reflective color liquid crystal display device which displays an image by utilizing external light that is reflected by the conductor 772 and then extracted through the coloring film 736.

A conductor that transmits visible light or a conductor that reflects visible light can be used as the conductor 772. For example, a material containing an element selected from indium (In), zinc (Zn), and tin (Sn) may be used for the conductor that transmits visible light. For example, a material containing aluminum or silver may be used for the conductor that reflects visible light. In this embodiment, a conductor that reflects visible light is used as the conductor 772.

Note that projections and depressions are provided in part of the planarization insulator 770 in the pixel portion 702 of the display device 700 in FIG. 50. For example, the projections and depressions can be formed in the following manner: the planarization insulator 770 is formed using a resin film, and projections and depressions are formed on the surface of the resin film. The conductor 772 functioning as a reflective electrode is formed along the projections and depressions. Accordingly, external light that is incident on the conductor 772 can be diffusely reflected by the surface of the conductor 772, whereby visibility can be improved.

Figure 52:
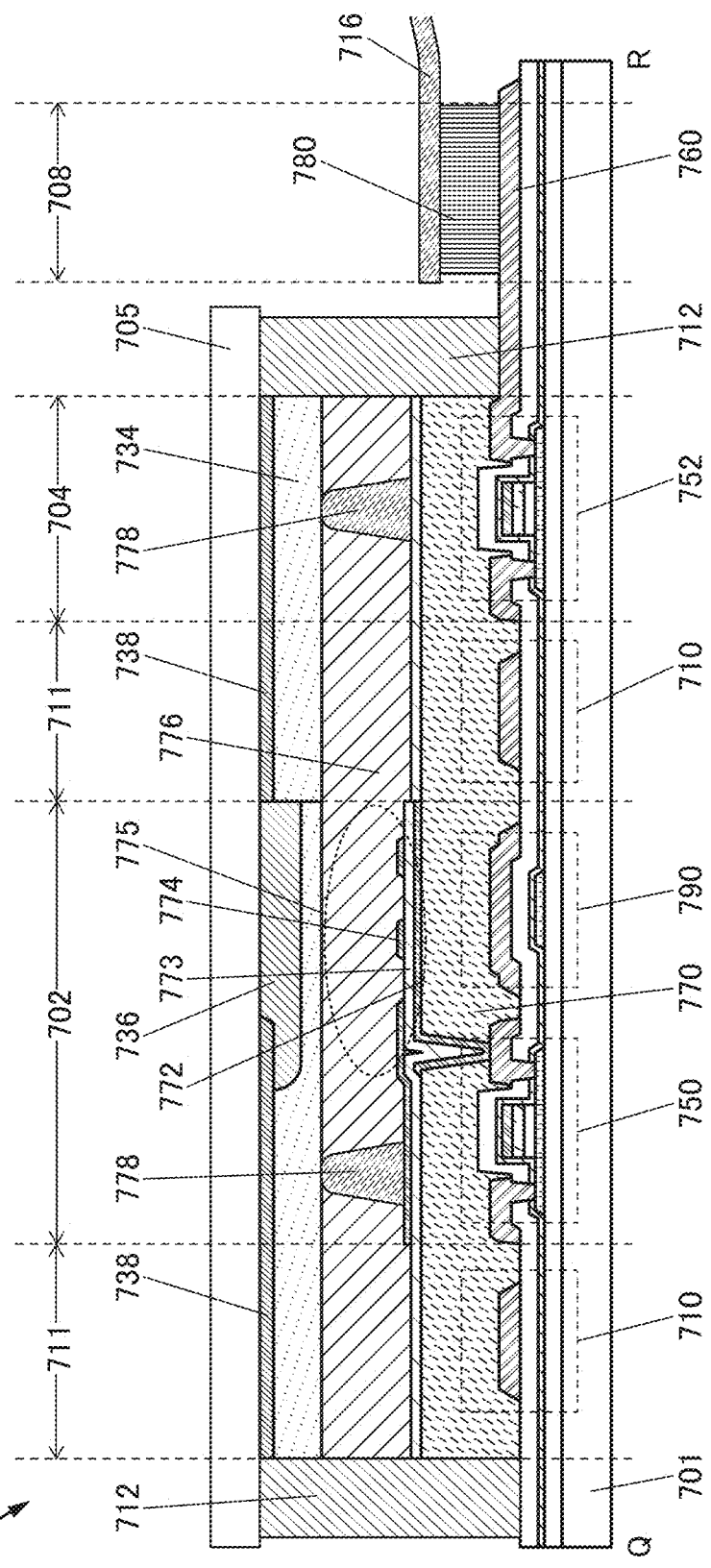
FIG. 52 is a cross-sectional view illustrating one embodiment of a display device.

Note that the display device 700 is not limited to the example in FIG. 50, which illustrates a reflective color liquid crystal display device, and may be a transmissive color liquid crystal display device in which a conductor that transmits visible light is used as the conductor 772. In a transmissive color liquid crystal display device, projections and depressions are not necessarily provided on the planarization insulator 770. FIG. 52 illustrates an example of a transmissive color liquid crystal display device. FIG. 52 is a cross-sectional view of a structure in which a liquid crystal element is used as the display element, taken along dashed-dotted line Q-R in FIG. 49. The display device 700 illustrated in FIG. 52 is an example of employing a transverse electric field mode (e.g., an FFS mode) as a driving mode of the liquid crystal element. In the structure illustrated in FIG. 52, an insulator 773 is provided over the conductor 772 functioning as a pixel electrode, and the conductor 774 is provided over the insulator 773. In such a structure, the conductor 774 functions as a common electrode, and an electric field generated between the conductor 772 and the conductor 774 through the insulator 773 can control the alignment state in the liquid crystal layer 776.

Although not illustrated in FIG. 50 and FIG. 52, the conductor 772 and/or the conductor 774 may be provided with an alignment film on a side in contact with the liquid crystal layer 776. Although not illustrated in FIG. 50 and FIG. 52, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material which exhibits a blue phase has a small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. Examples of a possible vertical alignment mode include a multi-domain vertical alignment (MVA) mode, a patterned vertical alignment (PVA) mode, and an advanced super view (ASV) mode.

<5-3. Display Device including Light-Emitting Element>

The display device 700 illustrated in FIG. 51 includes a light-emitting element 782. The light-emitting element 782 includes a conductor 784, an EL layer 786, and a conductor 788. The display device 700 illustrated in FIG. 51 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The conductor 784 is connected to a conductor functioning as a source electrode or a drain electrode of the transistor 750. The conductor 784 is formed over the planarization insulator 770 and functions as a pixel electrode, that is, one electrode of the display element. A conductor that transmits visible light or a conductor that reflects visible light can be used as the conductor 784. For example, a material containing an element selected from indium (In), zinc (Zn), and tin (Sn) may be used for the conductor that transmits visible light. For example, a material containing aluminum or silver may be used for the conductor that reflects visible light.

In the display device 700 in FIG. 51, an insulator 730 is provided over the planarization insulator 770 and the conductor 784. The insulator 730 covers part of the conductor 784. Note that the light-emitting element 782 has a top-emission structure. Therefore, the conductor 788 has a light-transmitting property and transmits light emitted from the EL layer 786. Although the top-emission structure is described as an example in this embodiment, the structure is not limited thereto. For example, a bottom-emission structure in which light is emitted to the conductor 784 side or a dual-emission structure in which light is emitted to both the conductor 784 side and the conductor 788 side may also be employed.

The coloring film 736 is provided to overlap with the light-emitting element 782, and the light-shielding film 738 is provided in the lead wiring portion 711 and the source driver circuit portion 704 to overlap with the insulator 730. The coloring film 736 and the light-shielding film 738 are covered with the insulator 734. A space between the light-emitting element 782 and the insulator 734 is filled with a sealing film 732. The structure of the display device 700 is not limited to the example in FIG. 51, in which the coloring film 736 is provided. For example, a structure without the coloring film 736 may also be employed in the case where the EL layer 786 is formed by separate coloring.

The structures described in this embodiment can be combined as appropriate with any of the structures described in the other embodiments and examples.

Embodiment 6

In this embodiment, the structure of a display panel of one embodiment of the present invention will be described with reference to FIGS. 53A to 53B2, FIGS. 54A and 54B, FIG. 55, and FIGS. 56A to 56B2.

FIGS. 53A, 53B1, and 53B2 illustrate the structure of a display panel 1700 of one embodiment of the present invention. FIG. 53A is a bottom view of the display panel 1700 of one embodiment of the present invention. FIG. 53B1 is a bottom view illustrating part of FIG. 53A. FIG. 53B2 is a bottom view omitting some components illustrated in FIG. 53B1.

FIGS. 54A and 54B illustrate the structure of the display panel 1700 of one embodiment of the present invention. FIG. 54A is a cross-sectional view taken along lines X1-X2, X3-X4, X5-X6, X7-X8, X9-X10, and X11-X12 in FIG. 53A. FIG. 54B is a cross-sectional view illustrating the structure of part of the display panel.

Figure 55:
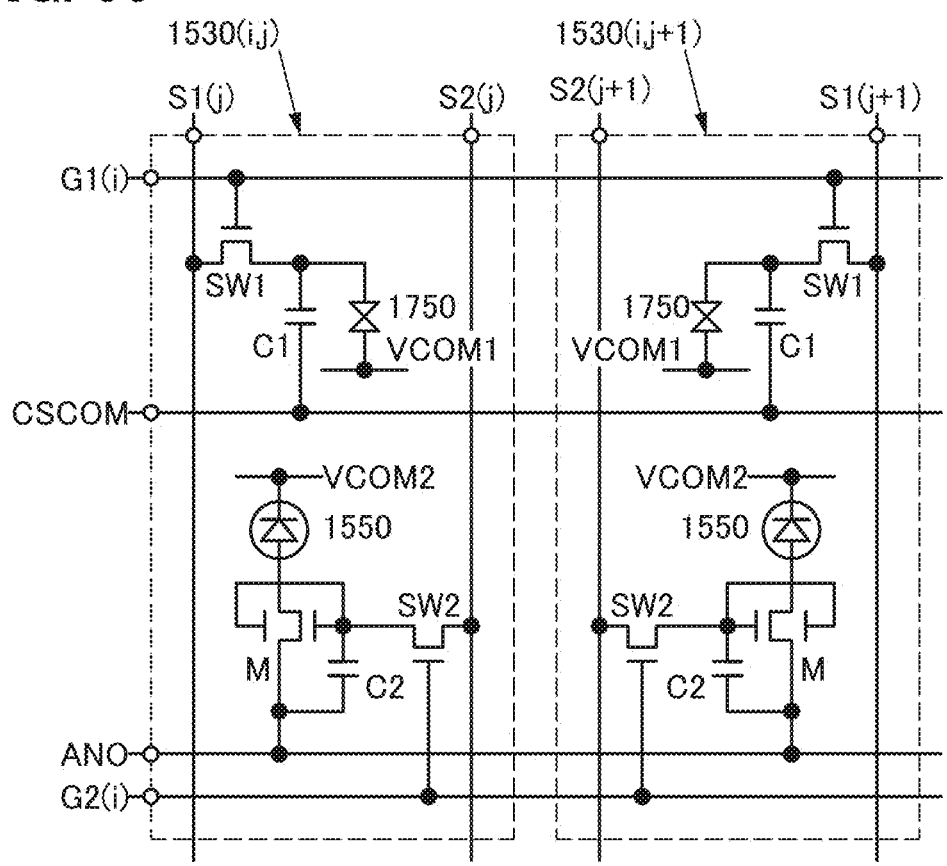
FIG. 55 is a circuit diagram illustrating a pixel circuit according to an embodiment.

FIG. 55 illustrates the structure of the display panel 1700 of one embodiment of the present invention. FIG. 55 is a circuit diagram of a pixel circuit 1530($i, j$) and a pixel circuit 1530($i, j+1$) which are included in the display panel 1700 of one embodiment of the present invention.

FIGS. 56A, 56B1, 56B2 illustrate the structure of the display panel 1700 of one embodiment of the present invention. FIG. 56A is a block diagram illustrating arrangement of pixels, wirings, or the like which can be used for the display panel 1700 of one embodiment of the present invention. FIGS. 56B1 and 56B2 are schematic views illustrating the arrangement of openings 1751H which can be used for the display panel 1700 of one embodiment of the present invention.

<Structure Example of Display Panel>

The display panel 1700 described in this embodiment includes a signal line S1($j$) and a pixel 1702($i, j$) (see FIGS. 53B1 and 53B2).

The pixel 1702($i, j$) is electrically connected to the signal line S1($j$).

The pixel 1702($i, j$) includes a first display element 1750($i, j$), a first conductive film, a second conductive film, an insulating film 1501C, the pixel circuit 1530($i, j$), and a second display element 1550($i, j$) (see FIG. 54A and FIG. 55).

The first conductive film is electrically connected to the first display element 1750($i, j$) (see FIG. 54A). For example, the first conductive film can be used for the first electrode 1751($i, j$) of the first display element 1750($i, j$).

The second conductive film has a region overlapping with the first conductive film. For example, the second conductive film can be used as a conductive film 1512B serving as a source electrode or a drain electrode of a transistor which can be used as a switch SW1.

The insulating film 1501C has a region interposed between the second conductive film and the first conductive film.

The pixel circuit 1530(*i*, *j*) is electrically connected to the second conductive film. For example, the transistor in which the second conductive film is used as the conductive film 1512B serving as a source electrode or a drain electrode can be used as the switch SW1 of the pixel circuit 1530(*i*, *j*) (see FIG. 54A and FIG. 55).

The second display element 1550(*i*, *j*) is electrically connected to the pixel circuit 1530(*i*, *j*).

The insulating film 1501C includes an opening 1591A (see FIG. 54A).

The second conductive film is electrically connected to the first conductive film in the opening 1591A. For example, the conductive film 1512B is electrically connected to the first electrode 1751(*i*, *j*) which also serves as the first conductive film.

The pixel circuit 1530(*i*, *j*) is electrically connected to the signal line S1(*j*) (see FIG. 55). Note that the conductive film 1512A is electrically connected to the signal line S1(*j*) (see FIG. 54A and FIG. 55).

The first electrode 1751(*i*, *j*) has an edge portion embedded in the insulating film 1501C.

Furthermore, the pixel circuit 1530(*i*, *j*) of the display panel described in this embodiment includes the switch SW1. The switch SW1 includes a transistor that includes an oxide semiconductor.

The second display element 1550(*i*, *j*) of the display panel described in this embodiment has a function of performing display in the same direction as any of display directions of the first display element 1750(*i*, *j*). For example, a dashed arrow in the drawing denotes the direction in which the first display element 1750(*i*, *j*) performs display by adjusting the intensity of external light reflection. In addition, a solid arrow in the drawing denotes the direction in which the second display element 1550(*i*, *j*) performs display (see FIG. 54A).

In addition, the second display element 1550(*i*, *j*) of the display panel described in this embodiment has a function of displaying in a region surrounded by a region where the first display element 1750(*i*, *j*) performs display (see FIG. 56B1 or 56B2). Note that the first display element 1750(*i*, *j*) performs display in a region overlapping with the first electrode 1751(*i*, *j*) and that the second display element 1550(*i*, *j*) performs display in a region overlapping with the opening 1751H.

Furthermore, the first display element 1750(*i*, *j*) of the display panel described in this embodiment includes a reflective film which reflects incident light and has a function of adjusting the intensity of the reflected light. The reflective film has the opening 1751H. Note that for example, the first conductive film, the first electrode 1751(*i*, *j*), or the like can be used as the reflective film of the first display element 1750(*i*, *j*).

Furthermore, the second display element 1550(*i*, *j*) has a function of emitting light toward the opening 1751H.

In addition, the display panel described in this embodiment includes the pixel 1702(*i*, *j*), one pixel group consisting of pixels 1702(*i*, 1) to 1702(*i*, *n*), another pixel group consisting of pixels 1702(1, j) to 1702(*m*, j), and a scan line G1(*i*) (see FIG. 56A). Note that i is an integer greater than or equal to 1 and less than or equal to m, j is an integer greater than or equal to 1 and less than or equal to n, and each of m and n is an integer greater than or equal to 1.

The display panel described in this embodiment includes a scan line G2(*i*), a wiring CSCOM, and a wiring ANO.

The one pixel group consisting of the pixels 1702(*i*, 1) to 1702(*i*, *n*) includes the pixel 1702(*i*, *j*), and are arranged in a row direction (indicated by an arrow R in the drawing).

The other pixel group consisting of the pixels 1702(1, j) to 1702(*m*, j) includes the pixel 1702(*i*, *j*), and are arranged in a column direction (indicated by an arrow C in the drawing) intersecting with the row direction.

The scan line G1(*i*) is electrically connected to the group of pixels 1702(*i*, 1) to 1702(*i*, *n*) arranged in the row direction.

The signal line S1(*j*) is electrically connected to the other group of the pixels 1702(1, j) to 1702(*m*, j) arranged in the column direction.

For example, the pixel 1702(*i*, *j*+1) adjacent to the pixel 1702(*i*, *j*) in the row direction includes an opening in a position different from that of the opening 1751H in the pixel 1702(*i*, *j*) (see FIG. 56B1).

For example, the pixel 1702(*i*+1, j) adjacent to the pixel 1702(*i*, *j*) in the column direction includes an opening in a position different from that of the opening 1751H in the pixel 1702(*i*, *j*) (see FIG. 56B2). Note that for example, the first electrode 1751(*i*, *j*) can be used as the reflective film.

The display panel of one embodiment of the present invention includes a first display element, a first conductive film electrically connected to the first display element, a second conductive film having a region overlapping with the first conductive film, an insulating film having a region sandwiched between the second conductive film and the first conductive film, a pixel circuit electrically connected to the second conductive film, and a second display element electrically connected to the pixel circuit. The insulating film has an opening. The second conductive film is electrically connected to the first conductive film in the opening.

Accordingly, the first display element and the second display element which perform display using different methods can be driven, for example, with the pixel circuit which can be formed in the same process. As a result, a novel display panel that is highly convenient or reliable can be provided.

In addition, the display panel described in this embodiment includes a terminal 1519B and a conductive film 1511B (see FIG. 54A).

The insulating film 1501C has a region interposed between the terminal 1519B and the conductive film 1511B. In addition, the insulating film 1501C includes an opening 1591B.

The terminal 1519B is electrically connected to the conductive film 1511B in the opening 1591B. In addition, the conductive film 1511B is electrically connected to the pixel circuit 1530(*i*, *j*). Note that for example, when the first electrode 1751(*i*, *j*) or the first conductive film is used as the reflective film, a surface serving as a contact with the terminal 1519B is oriented in the same direction as a surface of the first electrode 1751(*i*, *j*) that faces light incident to the first display element 1750(*i*, *j*).

Thus, power or signals can be supplied to the pixel circuit through the terminal. As a result, a novel display panel that is highly convenient or reliable can be provided.

In addition, the first display element 1750(*i*, *j*) of the display panel described in this embodiment includes a layer 1753 containing a liquid-crystal material, the first electrode 1751(*i*, *j*), and a second electrode 1752. Note that the second electrode 1752 is provided so that an electric field for controlling the alignment of the liquid crystal material is generated between the second electrode 1752 and the first electrode 1751(i, j).

Furthermore, the display panel described in this embodiment includes an alignment film AF1 and an alignment film AF2. The alignment film AF2 is provided so that the layer 1753 containing a liquid crystal material is interposed between the alignment films AF1 and AF2.

In addition, the second display element 1550(i, j) of the display panel described in this embodiment includes a third electrode 1551(i, j), a fourth electrode 1552, and a layer 1553(j) containing a light-emitting organic compound.

The fourth electrode 1552 has a region overlapping with the third electrode 1551(i, j). The layer 1553(f) containing a light-emitting organic compound is positioned between the third electrode 1551 and the fourth electrode 1552. The third electrode 1551(i, j) is electrically connected to the pixel circuit 1530(i, j) in a contact portion 1522.

Moreover, the pixel 1702(i, j) of the display panel described in this embodiment includes a coloring film CF1, a light-shielding film BM, an insulating film 1771, and a functional film 1770P.

The coloring film CF1 has a region overlapping with the first display element 1750(i, j). The light-shielding film BM has an opening in a region overlapping with the first display element 1750(i, j).

The insulating film 1771 is positioned between the coloring film CF1 and the layer 1753 containing a liquid crystal material or between the light-shielding film BM and the layer 1753 containing a liquid crystal material. Thus, unevenness due to the thickness of the coloring film CF1 can be avoided. Alternatively, impurities can be prevented from being diffused from the light-shielding film BM, the coloring film CF1, or the like to the layer 1753 containing a liquid crystal material.

The functional film 1770P has a region overlapping with the first display element 1750(i, j). The functional film 1770P is provided so that a substrate 1770 is interposed between the functional film 1770P and the first display element 1750(i, j).

In addition, the display panel described in this embodiment includes a substrate 1570, the substrate 1770, and a functional layer 1520.

The substrate 1770 has a region overlapping with the substrate 1570. The functional layer 1520 is positioned between the substrates 1570 and 1770.

The functional layer 1520 includes the pixel circuit 1530 (i, j), the second display element 1550(i, j), an insulating film 1521, and an insulating film 1528. Furthermore, the functional layer 1520 includes an insulating film 1518 and an insulating film 1516.

The insulating film 1521 is positioned between the pixel circuit 1530(i, j) and the second display element 1550(i, j).

The insulating film 1528 is positioned between the insulating film 1521 and the substrate 1570 and has an opening in a region overlapping with the second display element 1550(i, j). The insulating film 1528 along the edge of the third electrode 1551 can avoid a short circuit between the third electrode 1551 and the fourth electrode 1552.

The insulating film 1518 has a region positioned between the insulating film 1521 and the pixel circuit 1530(i, j). The insulating film 1516 has a region positioned between the insulating film 1518 and the pixel circuit 1530(i, j).

Moreover, the display panel described in this embodiment includes a bonding layer 1505, a sealant 1705, and a structure body KB1.

The bonding layer 1505 is positioned between the functional layer 1520 and the substrate 1570 and has a function of bonding the functional layer 1520 and the substrate 1570.

The sealant 1705 is positioned between the functional layer 1520 and the substrate 1770 and has a function of bonding the functional layer 1520 and the substrate 1770.

The structure body KB1 has a function of making a predetermined gap between the functional layer 1520 and the substrate 1770.

In addition, the display panel described in this embodiment includes a terminal 1519C, a conductive film 1511C, and a conductor CP.

The insulating film 1501C has a region interposed between the terminal 1519C and the conductive film 1511C. In addition, the insulating film 1501C has an opening 1591C.

The terminal 1519C is electrically connected to the conductive film 1511C in the opening 1591C. In addition, the conductive film 1511C is electrically connected to the pixel circuit 1530(i, j).

The conductor CP is interposed between the terminal 1519C and the second electrode 1752 for electrically connecting the terminal 1519C and the second electrode 1752. For example, a conductive particle can be used as the conductor CP.

Moreover, the display panel described in this embodiment includes a driver circuit GD and a driver circuit SD (see FIGS. 53A and 56A).

The driver circuit GD is electrically connected to the scan line G1(i). The driver circuit GD includes, for example, a transistor MD. Specifically, a transistor which includes a semiconductor film and can be formed in the same step as the transistor included in the pixel circuit 1530(i, j) can be used as the transistor MD (see FIGS. 54A and 54B).

The driver circuit SD is electrically connected to the signal line S1(j). The driver circuit SD is electrically connected to a terminal using a conductive material, for example. The terminal can be formed in the same step as the terminal 1519B or the terminal 1519C.

Individual components of the display panel will be described below. Note that these components cannot be clearly distinguished and one component serves as another one or includes part of another one in some cases.

For example, the first conductive film can be used as the first electrode 1751(i, j). The first conductive film can be used as a reflective film.

In addition, the second conductive film can be used as the conductive film 1512B serving as a source electrode or a drain electrode of a transistor.

<Structure Example>

The display panel of one embodiment of the present invention includes the substrate 1570, the substrate 1770, the structure body KB1, the sealant 1705, or the bonding layer 1505.

In addition, the display panel of one embodiment of the present invention includes the functional layer 1520, the insulating film 1521, and the insulating film 1528.

In addition, the display panel of one embodiment of the present invention includes the signal line S1(j), the signal line S2(j), the scan line G1(i), the scan line G2(i), the wiring CSCOM, and the wiring ANO.

In addition, the display panel of one embodiment of the present invention includes the first conductive film or the second conductive film.

In addition, the display panel of one embodiment of the present invention includes the terminal 1519B, the terminal 1519C, the conductive film 1511B, or the conductive film 1511C.

In addition, the display panel of one embodiment of the present invention includes the pixel circuit 1530($i, j$) or the switch SW1.

In addition, the display panel of one embodiment of the present invention includes the first display element 1750($i, j$), the first electrode 1751($i, j$), the reflective film, the opening 1751H, the layer 1753 containing a liquid crystal material, and the second electrode 1752.

In addition, the display panel of one embodiment of the present invention includes the alignment film AF1, the alignment film AF2, the coloring film CF1, the light-shielding film BM, the insulating film 1771, and the functional film 1770P.

In addition, the display panel of one embodiment of the present invention includes the second display element 1550($i, j$), the third electrode 1551($i, j$), the fourth electrode 1552, or the layer 1553($j$) containing a light-emitting organic compound.

Furthermore, the display panel of one embodiment of the present invention includes the insulating film 1501C.

In addition, the display panel of one embodiment of the present invention includes the driver circuit GD or the driver circuit SD.

<Substrate 1570>

The substrate 1570 and the like can be formed using a material having heat resistance high enough to withstand heat treatment in the manufacturing process. Specifically, a non-alkali glass with a thickness of 0.7 mm can be used For example, a large-sized glass substrate having any of the following sizes can be used as the substrate 1570 and the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 1570 and the like, an organic material, an inorganic material, a composite material of an organic material and an inorganic material, or the like can be used. For example, an inorganic material such as glass, ceramic, or a metal can be used for the substrate 1570 and the like.

Specifically, non-alkali glass, soda-lime glass, potash glass, crystal glass, quartz, sapphire, or the like can be used for the substrate 1570 and the like. Specifically, an inorganic oxide film, an inorganic nitride film, an inorganic oxynitride film, or the like can be used for the substrate 1570 and the like. For example, a film of silicon oxide, silicon nitride, silicon oxynitride, aluminum oxide, or the like can be used for the substrate 1570 and the like. SUS, aluminum, or the like can be used for the substrate 1570 and the like.

For example, a single crystal semiconductor substrate or a polycrystalline semiconductor substrate of silicon or silicon carbide, a compound semiconductor substrate of silicon germanium, or an SOI substrate can be used as the substrate 1570 and the like. Thus, a semiconductor element can be formed over the substrate 1570 and the like.

For example, an organic material such as a resin, a resin film, or plastic can be used for the substrate 1570 and the like. Specifically, a resin film or resin plate of polyester, polyolefin, polyamide, polyimide, polycarbonate, an acrylic resin, or the like can be used for the substrate 1570 and the like.

For example, a composite material, such as a resin film to which a metal plate, a thin glass plate, or an inorganic film is bonded can be used for the substrate 1570 and the like. For example, a composite material formed by dispersing a fibrous or particulate metal, glass, inorganic material, or the like into a resin film can be used for the substrate 1570 and the like. For example, a composite material formed by dispersing a fibrous or particulate resin, organic material, or the like into an inorganic material can be used for the substrate 1570 and the like.

A single-layer material or a material in which a plurality of layers are stacked can be used for the substrate 1570 and the like. For example, a material in which a base, an insulating film that prevents diffusion of impurities contained in the base, and the like are stacked can be used for the substrate 1570 and the like. Specifically, a material in which glass and one or a plurality of films that prevent diffusion of impurities contained in the glass and that are selected from a silicon oxide layer, a silicon nitride layer, a silicon oxynitride layer, and the like are stacked can be used for the substrate 1570 and the like. Alternatively, a material in which a resin and a film for preventing diffusion of impurities that penetrate the resin, such as a silicon oxide film, a silicon nitride film, and a silicon oxynitride film are stacked can be used for the substrate 1570 and the like.

Specifically, a resin film, a resin plate, a stack, or the like of polyester, polyolefin, polyamide, polyimide, polycarbonate, an acrylic resin, or the like can be used for the substrate 1570 and the like.

Specifically, a material including polyester, polyolefin, polyamide (e.g., nylon or aramid), polyimide, polycarbonate, polyurethane, an acrylic resin, an epoxy resin, or a resin having a siloxane bond can be used for the substrate 1570 and the like.

Specifically, polyethylene terephthalate (PET), polyethylene naphthalate (PEN), polyethersulfone (PES), acrylic, or the like can be used for the substrate 1570 and the like.

Alternatively, paper, wood, or the like can be used for the substrate 1570 and the like.

For example, a flexible substrate can be used as the substrate 1570 and the like.

Note that a transistor, a capacitor, or the like can be directly formed on the substrate. Alternatively, a transistor, a capacitor, or the like can be formed over a substrate that is for use in manufacturing processes and withstands heat applied in the processes, and then can be transferred to the substrate 1570 or the like. Accordingly, a transistor, a capacitor, or the like can be formed over a flexible substrate.

<Substrate 1770>

For example, a light-transmitting material can be used for the substrate 1770. Specifically, a material selected from the materials used for the substrate 1570 can be used for the substrate 1770. Specifically, a non-alkali glass which is polished to a thickness of approximately 0.7 mm or 0.1 mm can be used.

<Structure Body KB1>

For example, an organic material, an inorganic material, or a composite material of an organic material and an inorganic material can be used for the structure body KB1 or the like. Thus, components between which the structure body KB1 or the like is interposed can have a predetermined gap.

Specifically, for the structure body KB1 or the like, polyester, polyolefin, polyamide, polyimide, polycarbonate, polysiloxane, an acrylic resin, or the like, or a composite material of plural kinds of resins selected from these can be used. Alternatively, a photosensitive material may be used.

<Sealant 1705>

For the sealant 1705 or the like, an inorganic material, an organic material, a composite material of an inorganic material and an organic material, or the like can be used.

For example, an organic material such as a thermally fusible resin or a curable resin can be used for the sealant 1705 or the like.

For the sealant 1705 or the like, an organic material such as a reactive curable adhesive, a photo-curable adhesive, a thermosetting adhesive, and/or an anaerobic adhesive can be used.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the sealant 1705 or the like.

<Bonding Layer 1505>

For example, a material that can be used for the sealant 1705 can be used for the bonding layer 1505.

<Insulating Film 1521>

For example, an insulating inorganic material, an insulating organic material, or an insulating composite material containing an inorganic material and an organic material can be used for the insulating film 1521 or the like.

Specifically, an inorganic oxide film, an inorganic nitride film, an inorganic oxynitride film, or a material obtained by stacking any of these films can be used for the insulating film 1521 or the like. For example, a film including any of a silicon oxide film, a silicon nitride film, a silicon oxynitride film, and an aluminum oxide film, or a film including a material obtained by stacking any of these films can be used for the insulating film 1521 or the like.

Specifically, polyester, polyolefin, polyamide, polyimide, polycarbonate, polysiloxane, an acrylic resin, or a stacked or composite material including resins selected from these, or the like can be used for the insulating film 1521 or the like. Alternatively, a photosensitive material may be used.

Thus, for example, steps due to components overlapping with the insulating film 1521 can be eliminated.

<Insulating Film 1528>

For example, a material that can be used for the insulating film 1521 can be used for the insulating film 1528 or the like. Specifically, a 1-μm-thick film containing polyimide can be used for the insulating film 1528.

<Insulating Film 1501C>

For example, the material that can be used for the insulating film 1521 can be used for the insulating film 1501C. Specifically, a material containing silicon and oxygen can be used for the insulating film 1501C. Thus, impurity diffusion into the pixel circuit or the second display element can be suppressed.

For example, a 200-nm-thick film containing silicon, oxygen, and nitrogen can be used as the insulating film 1501C.

Note that the insulating film 1501C includes the opening 1591A, 1591B, or 1591C.

<Wiring, Terminal, Conductive Film>

A conductive material can be used for a wiring or the like. Specifically, the conductive material can be used for the signal line S1($j$), the signal line S2($j$), the scan line G1($i$), the scan line G2($i$), the wiring CSCOM, the wiring ANO, the terminal 1519B, the terminal 1519C, the conductive film 1511B, the conductive film 1511C, or the like.

For example, an inorganic conductive material, an organic conductive material, a metal material, a conductive ceramic material, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film including graphene oxide is formed and is reduced, so that a film including graphene can be formed. As a reducing method, a method using heat, a method using a reducing agent, or the like can be employed.

Specifically, a conductive high molecule can be used for the wiring or the like.

<First Conductive Film, Second Conductive Film>

For example, the material that can be used for the wiring or the like can be used for the first conductive film or the second conductive film.

The first electrode 1751($i, j$), the wiring, or the like can be used for the first conductive film.

The conductive film 1512B, the wiring, or the like of the transistor that can be used as the switch SW1 can be used as the second conductive film.

<Pixel Circuit 1530($i, j$)>

The pixel circuit 1530($i, j$) is electrically connected to the signal line S1($j$), the signal line S2($j$), the scan line G1($i$), the scan line G2($i$), the wiring CSCOM, and the wiring ANO (see FIG. 55).

The pixel circuit 1530($i, j+1$) is electrically connected to a signal line S1($j+1$), a signal line S2($j+1$), the scan line G1($i$), the scan line G2($i$), the wiring CSCOM, and the wiring ANO.

Note that in the case where a voltage used as a signal supplied to the signal line S2($j$) is different from a voltage used as a signal supplied to the signal line S1($j+1$), the signal line S1($j+1$) is positioned apart from the signal line S2($j$). Specifically, the signal line S2($j+1$) is positioned adjacent to the signal line S2($j$).

The pixel circuit 1530($i, j$) includes the switch SW1, a capacitor C1, a switch SW2, a transistor M, and a capacitor C2.

For example, a transistor including a gate electrode electrically connected to the scan line G1($i$) and a first electrode electrically connected to the signal line S1($j$) can be used as the switch SW1.

The capacitor C1 includes a first electrode electrically connected to a second electrode of the transistor used as the switch SW1 and a second electrode electrically connected to the wiring CSCOM.

For example, a transistor that includes a gate electrode electrically connected to the scan line G2(*i*) and a first electrode electrically connected to the signal line S2(*j*) can be used as the switch SW2.

The transistor M includes a gate electrode electrically connected to the second electrode of the transistor used as the switch SW2, and a first electrode electrically connected to the wiring ANO.

Note that a transistor that includes a semiconductor film provided between a gate electrode and a conductive film can be used as the transistor M. For example, a conductive film electrically connected to a wiring that can supply the same potential as the first electrode of the transistor M can be used.

The capacitor C2 includes a first electrode electrically connected to a second electrode of a transistor used as the switch SW2 and a second electrode electrically connected to the first electrode of the transistor M.

Note that the first electrode of the first display element 1750 is electrically connected to the second electrode of the transistor used as the switch SW1, and the second electrode of the first display element 1750 is electrically connected to the wiring VCOM1. Accordingly, the first display element 1750 can be driven.

In addition, the first electrode of the second display element 1550 is electrically connected to the second electrode of the transistor M and the second electrode of the second display element 1550 is electrically connected to the wiring VCOM2. Accordingly, the second display element 1550 can be driven.

<Switch SW1, Switch SW2, Transistor M, Transistor MD>

For example, any of the transistors described in the above embodiments can be used as the switch SW1, the switch SW2, the transistor M, the transistor MD, or the like.

Thus, a pixel circuit can hold an image signal for a longer time than a pixel circuit including a transistor that uses amorphous silicon for a semiconductor film. Specifically, the selection signal can be supplied with a frequency of lower than 30 Hz, preferably lower than 1 Hz, and more preferably less than once per minute while flickering is suppressed. Consequently, eyestrain on a user of a data processor can be reduced, and power consumption for driving can be reduced.

With the transistor having high field-effect mobility, the resolution of a display device can be increased. For example, the transistor can be favorably used for a pixel circuit or a driver circuit of a high-resolution display device typified by a display device with 4 K×2 K pixels (3840 pixels in the horizontal direction and 2160 pixels in the vertical direction) or 8 K×4 K pixels (7680 pixels in the horizontal direction and 4320 pixels in the vertical direction). The transistor used in this embodiment in which the generation of parasitic capacitance is reduced and can operate at high speed, and thus is capable of suppressing signal delay. Therefore, the quality of images of the display device can be improved.

<First Display Element 1750(*i, j*)>

For example, a display element having a function of controlling transmission or reflection of light can be used as the first display element 1750(*i, j*) or the like. For example, a combined structure of a liquid crystal element and a polarizing plate or a MEMS shutter display element can be used. The use of a reflective display element can reduce the power consumption of a display panel. Specifically, a reflective liquid crystal display element can be used as the first display element 1750.

Specifically, a liquid crystal element driven in any of the following driving modes can be used: an in-plane-switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

For example, thermotropic liquid crystal, low-molecular liquid crystal, high-molecular liquid crystal, polymer dispersed liquid crystal, ferroelectric liquid crystal, anti-ferroelectric liquid crystal, or the like can be used. A liquid crystal material that exhibits a cholesteric phase, a smectic phase, a cubic phase, a chiral nematic phase, an isotropic phase, or the like can be used. Alternatively, a liquid crystal material that exhibits a blue phase can be used.

<First Electrode 1751(*i, j*)>

For example, the material of the wiring or the like can be used for the first electrode 1751(*i, j*). Specifically, a reflective film can be used for the first electrode 1751(*i, j*).

<Reflective Film>

For example, a material reflecting visible light can be used for the reflective film. Specifically, a material containing silver can be used for the reflective film. For example, a material containing silver, palladium, and the like or a material containing silver, copper, and the like can be used for the reflective film.

The reflective film reflects, for example, light passing through the layer 1753 containing a liquid crystal material. This allows the first display element 1750 to serve as a reflective liquid crystal element. Alternatively, a material with an uneven surface can be used for the reflective film. In that case, incident light can be reflected in various directions so that a white image can be displayed.

Note that one embodiment of the present invention is not limited to the structure in which the first electrode 1751(*i, j*) is used as the reflective film. For example, a structure in which the reflective film is positioned between the layer 1753 containing a liquid crystal material and the first electrode 1751(*i, j*) can be used. Alternatively, a structure in which the first electrode 1751(*i, j*) having light-transmitting properties is positioned between the reflective film and the layer 1753 containing a liquid crystal material can be used.

<Opening 1751H>

If the ratio of the total area of the opening 1751H to the total area except for the opening is too high, display performed using the first display element 1750(*i, j*) is dark. If the ratio of the total area of the opening 1751H to the total area except for the opening is too low, display performed using the second display element 1550(*i, j*) is dark.

Also, if the area of the opening 1751H in the reflective film is too small, light emitted from the second display element 1550 is not efficiently extracted.

The opening 1751H may have a polygonal shape, a quadrangular shape, an elliptical shape, a circular shape, a cross-like shape, or the like. The opening 1751H may also have a stripe shape, a slit-like shape, or a checkered pattern. The opening 1751H may be positioned close to an adjacent pixel. Preferably, the opening 1751H is positioned close to another pixel having a function of emitting light of the same color. In that case, a phenomenon in which light emitted from the second display element 1550 enters a coloring film of the adjacent pixel (also called cross talk), can be suppressed.

<Second Electrode 1752>

For example, a material having a visible-light transmitting property and conductivity can be used for the second electrode 1752.

For example, a conductive oxide, a metal film thin enough to transmit light, or a metal nanowire can be used as the second electrode 1752.

Specifically, a conductive oxide containing indium can be used for the second electrode 1752. Alternatively, a metal thin film with a thickness more than or equal to 1 nm and less than or equal to 10 nm can be used for the second electrode 1752. Further alternatively, a metal nanowire containing silver can be used for the second electrode 1752.

Specifically, indium oxide, indium tin oxide, indium zinc oxide, zinc oxide, zinc oxide to which gallium is added, zinc oxide to which aluminum is added, or the like can be used for the second electrode 1752.

<Alignment Films AF1 and AF2>

For example, the alignment films AF1 and AF2 can be formed with a material containing polyimide or the like. Specifically, it is possible to use a material formed to be aligned in a predetermined direction by a rubbing process or an optical alignment process.

For example, a film containing soluble polyimide can be used as the alignment film AF1 or AF2.

<Coloring Film CF1>

A material transmitting light of a predetermined color can be used for the coloring film CF1. Thus, the coloring film CF1 can be used as, for example, a color filter.

For example, a material transmitting light of blue, green, red, yellow, or white can be used for the coloring film CF1.

<Light-Shielding Film BM>

A material that prevents light transmission can be used for the light-shielding film BM. Thus, the light-shielding film BM can be used as, for example, a black matrix.

<<Insulating Film 1771>>

For example, polyimide, epoxy resin, acrylic resin, or the like can be used for the insulating film 1771.

<Functional Film 1770P>

For example, a polarizing plate, a retardation plate, a diffusing film, an anti-reflective film, a condensing film, or the like can be used as the functional film 1770P. Alternatively, a polarizing plate containing a dichromatic pigment can be used as the functional film 1770P.

Alternatively, an antistatic film preventing the attachment of dust, a water repellent film suppressing the attachment of stain, a hard coat film suppressing generation of a scratch in use, or the like can be used as the functional film 1770P.

<Second Display Element 1550(i, j)>

For example, a light-emitting element can be used as the second display element 1550(i, j). Specifically, an organic electroluminescence element, an inorganic electroluminescence element, a light-emitting diode, or the like can be used for the second display element 1550(i, j).

For example, a stack body for emitting blue light, green light, or red light can be used as the layer 1553(j) containing a light-emitting organic compound.

For example, a stack body extending linearly in the column direction along the signal line SW) can be used as the layer 1553(j) containing a light-emitting organic compound. In addition, a stack body that extends linearly in the column direction along the signal line S1(j+1) and emits light of a color different from that of the layer 1553(j) containing a light-emitting organic compound can be used as the layer 1553(j+1) containing a light-emitting organic compound.

Alternatively, for example, a stack body for emitting white light can be used as the layer 1553(j) containing a light-emitting organic compound and the layer 1553(j+1) containing a light-emitting organic compound. Specifically, a stack of a layer containing a light-emitting organic compound containing a fluorescent material that emits blue light, and a layer containing a material that is other than the fluorescent material and that emits green light and red light or a layer containing a material that is other than the fluorescent material and that emits yellow light can be used as the layer 1553(j) containing a light-emitting organic compound and the layer 1553(j+1) containing a light-emitting organic compound.

For example, a material that can be used for the wiring or the like can be used for the third electrode 1551(i, j) or the fourth electrode 1552.

For example, a material that transmits visible light and is selected from the materials used for the wiring or the like can be used for the third electrode 1551(i, j).

Specifically, conductive oxide, indium-containing conductive oxide, indium oxide, indium tin oxide, indium zinc oxide, zinc oxide, zinc oxide to which gallium is added, or the like can be used for the third electrode 1551(i, j). Alternatively, a metal film that is thin enough to transmit light can be used as the third electrode 1551(i, j).

For example, a material that reflects visible light and is selected from the materials used for the wiring or the like can be used for the fourth electrode 1552.

<Driver Circuit GD>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed at the same step as the semiconductor film of the transistor M can be used.

The transistor MD can have a structure different from that of the transistor used as the switch SW1.

A conductive film 1504 may be positioned between a semiconductor film 1508 and a conductive film, the insulating film 1516 is positioned between the conductive film and the semiconductor film 1508, and a metal oxide film 1507 and an insulating film 1506 may be positioned between the semiconductor film 1508 and the conductive film 1504. For example, the conductive film is electrically connected to a wiring supplying the same potential as that supplied to the conductive film 1504.

Note that the transistor MD can have the same structure as the transistor M.

<Driver Circuit SD>

For example, an integrated circuit can be used in the driver circuit SD. Specifically, an integrated circuit formed on a silicon substrate can be used as the driver circuit SD.

For example, a chip on glass (COG) method can be used to mount the driver circuit SD on a pad electrically connected to the pixel circuit 1530(i, j). Specifically, an anisotropic conductive film can be used to mount the integrated circuit on the pad.

Note that the pad can be formed in the same step as the terminal 1519B or 1519C.

The structures, the methods, and the like described in this embodiment can be combined as appropriate with any of the structures, the methods, and the like described in the other embodiments and examples.

Embodiment 7

In this embodiment, an example of a circuit configuration of a semiconductor device which can hold stored data even when not powered and does not have a limitation on the number of write cycles will be described with reference to FIG. 57.

<7-1. Circuit Configuration>

Figure 57:
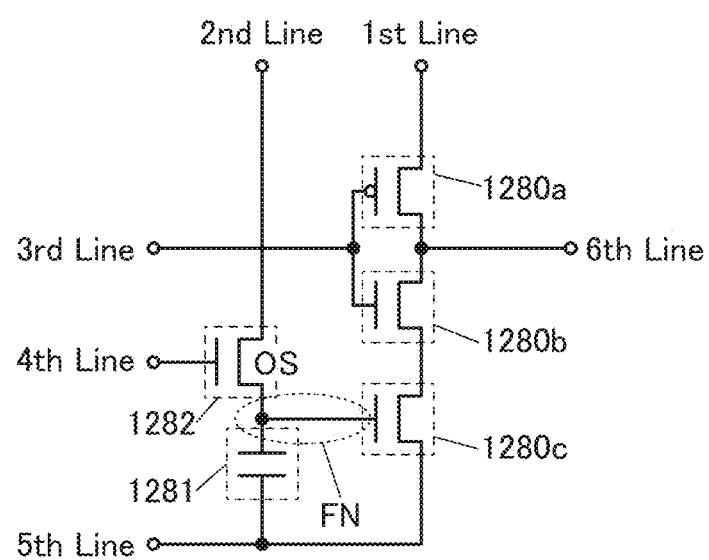
FIG. 57 illustrates a circuit configuration of a semiconductor device.

FIG. 57 illustrates a circuit configuration of a semiconductor device. In FIG. 57, a first wiring (1st Line) is electrically connected to one of a source electrode and a drain electrode of a p-channel transistor 1280*a*. The other of the source electrode and the drain electrode of the p-channel transistor 1280*a* is electrically connected to one of a source electrode and a drain electrode of an n-channel transistor 1280*b*. The other of the source electrode and the drain electrode of the n-channel transistor 1280*b* is electrically connected to one of a source electrode and a drain electrode of an n-channel transistor 1280*c*.

A second wiring (2nd Line) is electrically connected to one of a source electrode and a drain electrode of a transistor 1282. The other of the source electrode and the drain electrode of the transistor 1282 is electrically connected to one electrode of a capacitor 1281 and a gate electrode of the n-channel transistor 1280*c*.

A third wiring (3rd Line) is electrically connected to gate electrodes of the p-channel transistor 1280*a* and the n-channel transistor 1280*b*. A fourth wiring (4th Line) is electrically connected to a gate electrode of the transistor 1282. A fifth wiring (5th Line) is electrically connected to the other electrode of the capacitor 1281 and the other of the source electrode and the drain electrode of the n-channel transistor 1280*c*. A sixth wiring (6th Line) is electrically connected to the other of the source electrode and the drain electrode of the p-channel transistor 1280*a* and the one of the source electrode and the drain electrode of the n-channel transistor 1280*b*.

Note that the transistor 1282 can be formed using an oxide semiconductor (OS). Therefore, in FIG. 57, "OS" is written beside the transistor 1282. Any of the transistors described in the above embodiments is applicable to the transistor 1282. Note that the transistor 1282 may be formed using a material other than an oxide semiconductor.

In FIG. 57, "FN", which denotes a floating node, is written at a connection portion of the other of the source electrode and the drain electrode of the transistor 1282, the one electrode of the capacitor 1281, and the gate electrode of the n-channel transistor 1280*c*. When the transistor 1282 is turned off, a potential supplied to the floating node, the one electrode of the capacitor 1281, and the gate electrode of the n-channel transistor 1280*c* can be held.

The circuit configuration in FIG. 57 utilizes the advantage that the potential of the gate electrode of the n-channel transistor 1280*c* can be held, whereby writing, holding, and reading of data can be performed as described below.

<7-2. Writing and Holding of Data>

First, writing and holding of data will be described. The potential of the fourth wiring is set to a potential at which the transistor 1282 is turned on, so that the transistor 1282 is turned on. Accordingly, the potential of the second wiring is supplied to the gate electrode of the n-channel transistor 1280*c* and the capacitor 1281. That is, predetermined charge is applied to the gate electrode of the n-channel transistor 1280*c* (writing). After that, the potential of the fourth wiring is set to a potential at which the transistor 1282 is turned off, so that the transistor 1282 is turned off. Accordingly, charge applied to the gate electrode of the n-channel transistor 1280*c* is held (holding).

Since the off-state current of the transistor 1282 is extremely low, the charge in the gate electrode of the n-channel transistor 1280*c* is held for a long time.

<7-3. Data Reading>

Next, data reading will be described. When the potential of the third wiring is set to a low-level potential, the p-channel transistor 1280*a* is turned on and the n-channel transistor 1280*b* is turned off. In this case, the potential of the first wiring is supplied to the sixth wiring. On the other hand, when the potential of the third wiring is set to a high-level potential, the p-channel transistor 1280*a* is turned off and the n-channel transistor 1280*b* is turned on. In this case, the potential of the sixth wiring depends on the amount of charge held in the floating node (FN). Therefore, the stored data can be read out by measuring the potential of the sixth wiring (reading).

The transistor 1282, whose channel region is formed using an oxide semiconductor, has extremely low off-state current. The off-state current of the transistor 1282 including an oxide semiconductor is less than or equal to one hundred-thousandth of the off-state current of a transistor formed using a silicon semiconductor or the like; thus, loss of charge accumulated in the floating node (FN) due to leakage current of the transistor 1282 is negligible. That is, the transistor 1282 including an oxide semiconductor makes it possible to provide a nonvolatile memory circuit which can hold data even when not powered.

By using the semiconductor device having the above-described circuit configuration for a memory device such as a register or a cache memory, data in the memory device can be prevented from being lost owing to the stop of the supply of a power supply voltage. Furthermore, shortly after the supply of the power supply voltage is restarted, the memory device can return to the same state as before the power supply is stopped. Therefore, the power supply can be stopped even for a short time when the whole memory device or one or a plurality of logic circuits constituting a part of the memory device is in a standby state. Accordingly, power consumption can be suppressed.

The structures, the methods, and the like described in this embodiment can be combined as appropriate with any of the structures, the methods, and the like described in the other embodiments and examples.

Embodiment 8

In this embodiment, a configuration of a pixel circuit that can be used for a semiconductor device of one embodiment of the present invention will be described below with reference to FIG. 58A.

<8-1. Configuration of Pixel Circuit>

Figure 58A:
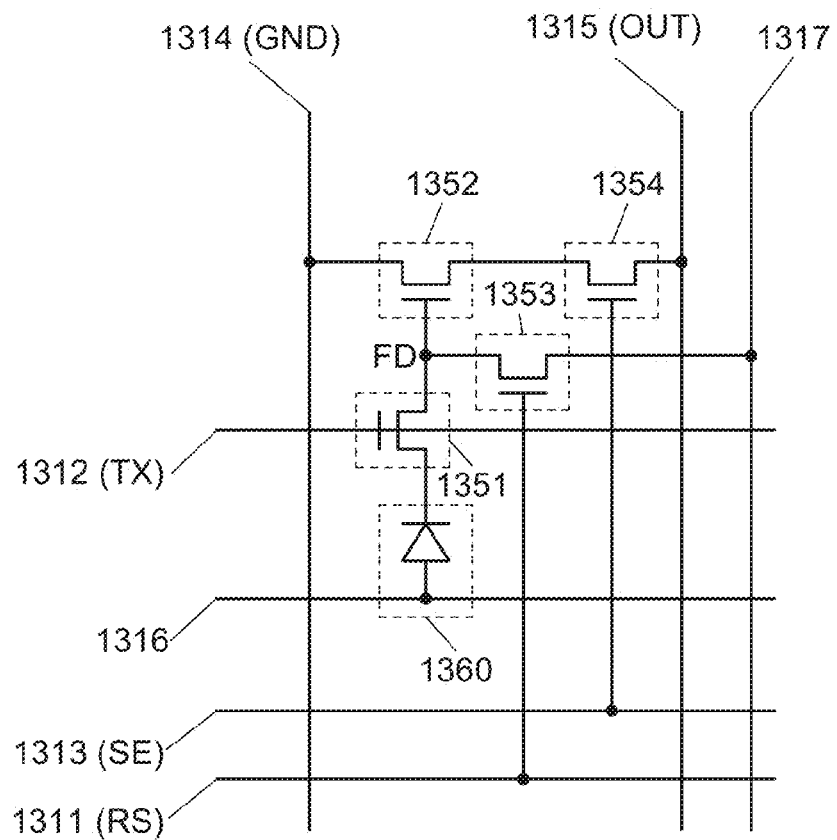
FIG. 58A is a diagram illustrating a configuration of a pixel circuit.

FIG. 58A illustrates a configuration of a pixel circuit. The circuit in FIG. 58A includes a photoelectric conversion element 1360, a transistor 1351, a transistor 1352, a transistor 1353, and a transistor 1354.

An anode of the photoelectric conversion element 1360 is connected to a wiring 1316, and a cathode of the photoelectric conversion element 1360 is connected to one of a source electrode and a drain electrode of the transistor 1351. The other of the source electrode and the drain electrode of the transistor 1351 is connected to a charge accumulation portion (FD). A gate electrode of the transistor 1351 is connected to a wiring 1312 (TX). One of a source electrode and a drain electrode of the transistor 1352 is connected to a wiring 1314 (GND). The other of the source electrode and the drain electrode of the transistor 1352 is connected to one of a source electrode and a drain electrode of the transistor 1354. A gate electrode of the transistor 1352 is connected to the charge accumulation portion (FD). One of a source electrode and a drain electrode of the transistor 1353 is connected to the charge accumulation portion (FD). The other of the source electrode and the drain electrode of the transistor 1353 is connected to a wiring 1317. A gate electrode of the transistor 1353 is connected to a wiring 1311 (RS). The other of the source electrode and the drain electrode of the transistor 1354 is connected to a wiring 1315 (OUT). A gate electrode of the transistor 1354 is connected to a wiring 1313 (SE). Note that all the above connections are electrical connections.

A potential such as GND, VSS, or VDD may be supplied through the wiring 1314. Here, a potential or a voltage has a relative value. Therefore, the potential GND is not necessarily 0 V.

The photoelectric conversion element 1360 is a light-receiving element and has a function of generating current corresponding to the amount of light that enters the pixel circuit. The transistor 1353 has a function of controlling accumulation of charge in the charge accumulation portion (FD) by the photoelectric conversion element 1360. The transistor 1354 has a function of outputting a signal corresponding to the potential of the charge accumulation portion (FD). The transistor 1352 has a function of resetting the potential of the charge accumulation portion (FD). The transistor 1352 has a function of controlling selection of the pixel circuit at the time of reading.

Note that the charge accumulation portion (FD) is a charge retention node and retains charge that is changed depending on the amount of light received by the photoelectric conversion element 1360.

Note that the transistor 1352 and the transistor 1354 only need to be connected in series between the wiring 1314 and the wiring 1315. Therefore, the wiring 1314, the transistor 1352, the transistor 1354, and the wiring 1315 may be arranged in this order, or the wiring 1314, the transistor 1354, the transistor 1352, and the wiring 1315 may be arranged in this order.

The wiring 1311 (RS) functions as a signal line for controlling the transistor 1353. The wiring 1312 (TX) functions as a signal line for controlling the transistor 1351. The wiring 1313 (SE) functions as a signal line for controlling the transistor 1354. The wiring 1314 (GND) functions as a signal line for supplying a reference potential (e.g., GND). The wiring 1315 (OUT) functions as a signal line for reading a signal output from the transistor 1352. The wiring 1316 functions as a signal line for outputting charge from the charge accumulation portion (FD) through the photoelectric conversion element 1360 and is a low potential line in the circuit in FIG. 58A. The wiring 1317 functions as a signal line for resetting the potential of the charge accumulation portion (FD) and is a high potential line in the circuit in FIG. 58A.

Next, the structure of each component in FIG. 58A will be described.

<8-2. Photoelectric Conversion Element>

An element including selenium or a selenium-containing compound (hereinafter referred to as a selenium-based material) or an element including silicon (e.g., an element in which a pin junction is formed) can be used as the photoelectric conversion element 1360. The photoelectric conversion element including a selenium-based material is preferably used in combination with a transistor including an oxide semiconductor, in which case high reliability can be achieved.

<8-3. Transistor>

Although a silicon semiconductor such as amorphous silicon, microcrystalline silicon, polycrystalline silicon, or single-crystal silicon can be used to form the transistor 1351, the transistor 1352, the transistor 1353, and the transistor 1354, an oxide semiconductor is preferably used to form the transistors. A transistor whose channel formation region is formed using an oxide semiconductor has extremely low off-state current. The transistor described in Embodiment 1 can be used as a transistor whose channel region is formed using an oxide semiconductor.

In particular, when the transistor 1351 and the transistor 1353 which are connected to the charge accumulation portion (FD) have high leakage current, charge accumulated in the charge accumulation portion (FD) cannot be held for a sufficient time. The use of an oxide semiconductor at least for the two transistors prevents unwanted leakage of charge from the charge accumulation portion (FD).

Unwanted leakage of charge to the wiring 1314 or the wiring 1315 also occurs when the transistor 1352 and the transistor 1354 have high leakage current; thus, a transistor whose channel region is formed using an oxide semiconductor is preferably used as each of these transistors.

One embodiment of the present invention is not limited to the example in FIG. 58A, in which the transistor includes one gate electrode. For example, the transistor may include a plurality of gate electrodes. The transistor including a plurality of gate electrodes may include, for example, a first gate electrode and a second gate electrode (also referred to as a back gate electrode) which overlap with a semiconductor film in which a channel region is formed. The back gate electrode may be supplied with the same potential as the first gate electrode, a floating potential, or a potential different from that supplied to the first gate electrode, for example.

<8-4. Timing Chart of Circuit Operation>

An example of the operation of the circuit in FIG. 58A will be described with reference to a timing chart in FIG. 58B.

Figure 58B:
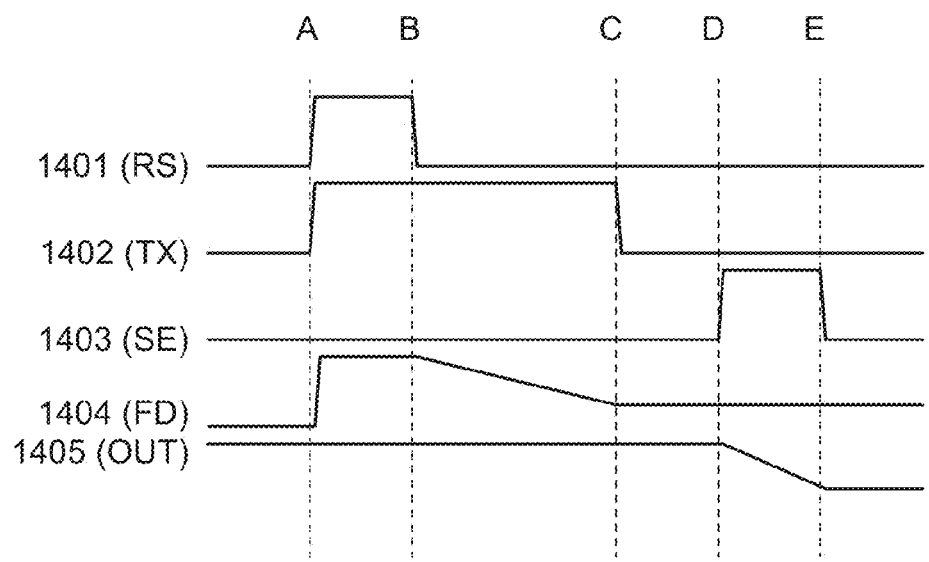
FIG. 58B is a timing chart of the operation of the pixel circuit.

In FIG. 58B, the potential of each wiring is denoted by a signal which varies between two levels for simplicity. Note that each potential is an analog signal; therefore, in practice, the potential can have various levels depending on conditions without being limited to two levels. In FIG. 58B, a signal 1401 corresponds to the potential of the wiring 1311 (RS), a signal 1402 corresponds to the potential of the wiring 1312 (TX), a signal 1403 corresponds to the potential of the wiring 1313 (SE), a signal 1404 corresponds to the potential of the charge accumulation portion (FD), and a signal 1405 corresponds to the potential of the wiring 1315 (OUT). The potential of the wiring 1316 is always at a low level, and the potential of the wiring 1317 is always at a high level.

At time A, the potential of the wiring 1311 (signal 1401) and the potential of the wiring 1312 (signal 1402) are set to the high level, so that the potential of the charge accumulation portion (FD) (signal 1404) is initialized to the potential (high level) of the wiring 1317, and reset operation is started. Note that the potential of the wiring 1315 (signal 1405) is precharged to the high level.

At time B, the potential of the wiring 1311 (signal 1401) is set to the low level, so that the reset operation is terminated and accumulation operation is started. Here, a reverse bias is applied to the photoelectric conversion element 1360, so that the potential of the charge accumulation portion (FD) (signal 1404) starts to decrease owing to reverse current. Since irradiation of the photoelectric conversion element 1360 with light increases the reverse current, the rate of decrease in the potential of the charge accumulation portion (FD) (signal 1404) changes depending on the amount of irradiation light. In other words, the channel resistance between the source and the drain of the transistor 1354 changes depending on the amount of light delivered to the photoelectric conversion element 1360.

At time C, the potential of the wiring 1312 (signal 1402) is set to the low level to terminate the accumulation operation, so that the potential of the charge accumulation portion (FD) (signal 1404) becomes constant. Here, the potential is determined by the amount of charge generated by the photoelectric conversion element 1360 during the accumulation operation. That is, the potential changes depending on the amount of light delivered to the photoelectric conversion element 1360. Furthermore, since each of the transistors 1351 and 1353 is a transistor whose channel region is formed using an oxide semiconductor and which has extremely low off-state current, the potential of the charge accumulation portion (FD) can be kept constant until subsequent selection operation (read operation) is performed.

When the potential of the wiring 1312 (signal 1402) is set to the low level, the potential of the charge accumulation portion (FD) might change owing to parasitic capacitance between the wiring 1312 and the charge accumulation portion (FD). In the case where the potential change is significant, the amount of charge generated by the photoelectric conversion element 1360 during the accumulation operation cannot be obtained accurately. Examples of effective measures to reduce the potential change include reducing the capacitance between the gate electrode and the source electrode (or between the gate electrode and the drain electrode) of the transistor 1351, increasing the gate capacitance of the transistor 1352, and providing a storage capacitor in the charge accumulation portion (FD). In this embodiment, the potential change can be ignored by the adoption of these measures.

At time D, the potential of the wiring 1313 (signal 1403) is set to the high level to turn on the transistor 1354, so that the selection operation is started and the wiring 1314 and the wiring 1315 are electrically connected to each other through the transistor 1352 and the transistor 1354. Thus, the potential of the wiring 1315 (signal 1405) starts to decrease. Note that the precharge of the wiring 1315 is terminated before time D. Here, the rate at which the potential of the wiring 1315 (signal 1405) decreases depends on current between the source electrode and the drain electrode of the transistor 1352, that is, the amount of light delivered to the photoelectric conversion element 1360 during the accumulation operation.

At time E, the potential of the wiring 1313 (signal 1403) is set to the low level to turn off the transistor 1354, so that the selection operation is terminated and the potential of the wiring 1315 (signal 1405) becomes a constant value. Here, the constant value changes depending on the amount of light delivered to the photoelectric conversion element 1360. Therefore, the amount of light delivered to the photoelectric conversion element 1360 during the accumulation operation can be determined by measuring the potential of the wiring 1315.

Specifically, when the photoelectric conversion element 1360 is irradiated with intense light, the potential of the charge accumulation portion (FD), that is, the gate voltage of the transistor 1352 decreases. Therefore, the current flowing between the source electrode and the drain electrode of the transistor 1352 becomes low; as a result, the potential of the wiring 1315 (signal 1405) gradually decreases. Thus, a relatively high potential can be read out from the wiring 1315.

In contrast, when the photoelectric conversion element 1360 is irradiated with light with low intensity, the potential of the charge accumulation portion (FD), that is, the gate voltage of the transistor 1352 increases. Therefore, the current flowing between the source electrode and the drain electrode of the transistor 1352 becomes high; as a result, the potential of the wiring 1315 (signal 1405) rapidly decreases. Thus, a relatively low potential can be read out from the wiring 1315.

This embodiment can be implemented in an appropriate combination with any of the structures described in the other embodiments and examples.

Embodiment 9

In this embodiment, a display device including a semiconductor device of one embodiment of the present invention will be described with reference to FIGS. 59A to 59C.
<9. Circuit Configuration of Display Device>

A display device illustrated in FIG. 59A includes a region including pixels of display elements (hereinafter referred to as a pixel portion 502), a circuit portion which is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504*a*) and a circuit for supplying a signal (data signal) to drive a display element in a pixel (hereinafter, the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter referred to as scan lines GL_1 to GL_X). Note that a plurality of gate drivers 504*a* may be provided to control the scan lines GL_1 to GL_X separately. Alternatively, the gate driver 504*a* has a function of supplying an initialization signal. Without being limited thereto, another signal can be supplied from the gate driver 504*a*.

The source driver 504*b* includes a shift register or the like. The source driver 504*b* receives a signal (image signal) from which a data signal is generated, as well as a signal for driving the shift register, through the terminal portion 507. The source driver 504*b* has a function of generating a data signal to be written to the pixel circuit 501 from the image signal. In addition, the source driver 504*b* has a function of controlling output of a data signal in response to an input pulse signal such as a start pulse signal or a clock signal. Furthermore, the source driver 504*b* has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 59A:
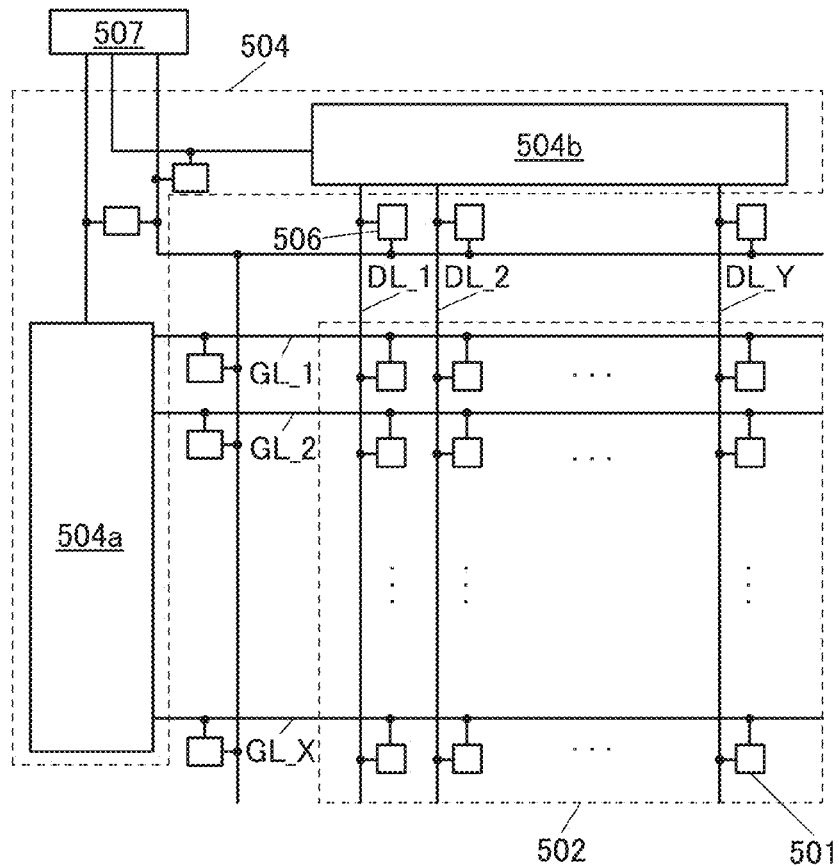
FIGS. 59A to 59C are a block diagram and circuit diagrams illustrating a display device.

The protection circuit 506 in FIG. 59A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 59A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 59A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single-crystal semiconductor film or a polycrystalline semiconductor film) may be mounted.

Figure 59B:
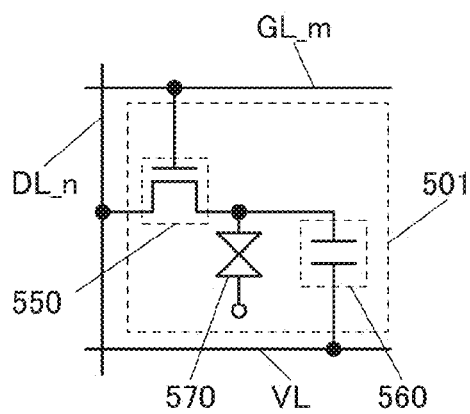

Each of the plurality of pixel circuits 501 in FIG. 59A can have the configuration illustrated in FIG. 59B, for example.

The pixel circuit 501 in FIG. 59B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to control whether to write a data signal.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 59B, the gate driver 504a in FIG. 59A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 59C:
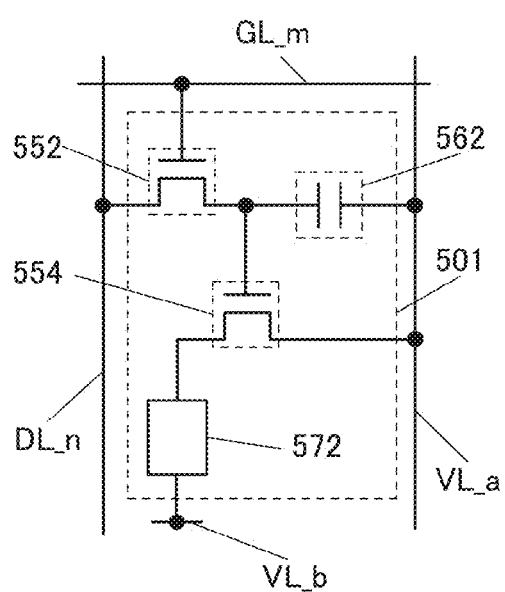

Alternatively, each of the plurality of pixel circuits 501 in FIG. 59A can have the configuration illustrated in FIG. 59C, for example.

The pixel circuit 501 in FIG. 59C includes transistors 552 and 554, a capacitor 562, and a light-emitting element 572. Any of the transistors described in the above embodiments can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to control whether to write a data signal.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential VDD is supplied to one of the potential supply line VL_a and the potential supply line VL_b, and a low power supply potential VSS is supplied to the other of the potential supply line VL_a and the potential supply line VL_b.

In the display device including the pixel circuits 501 in FIG. 59C, the gate driver 504a in FIG. 59A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structures described in this embodiment can be combined as appropriate with any of the structures described in the other embodiments and examples.

Embodiment 10

In this embodiment, circuit configuration examples to which the transistors described in the above embodiments can be applied will be described with reference to FIGS. 60A to 60C, FIGS. 61A to 61C, FIGS. 62A and 62B, and FIGS. 63A and 63B.

Note that in the following description in this embodiment, the transistor including an oxide semiconductor described in any of the above embodiments is referred to as an OS transistor.

<10. Configuration Example of Inverter Circuit>

Figure 60A:
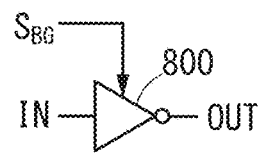
FIGS. 60A to 60C are circuit diagrams and a timing chart illustrating one embodiment of the present invention.

FIG. 60A is a circuit diagram of an inverter which can be used for a shift register, a buffer, or the like included in a driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 60B:
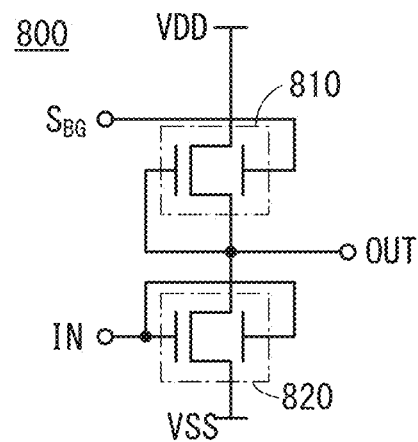

FIG. 60B shows an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including S1 transistors. Since the inverter 800 can be provided so as to overlap with the CMOS circuit, no additional area is required for the inverter 800, and thus, an increase in circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 60C:
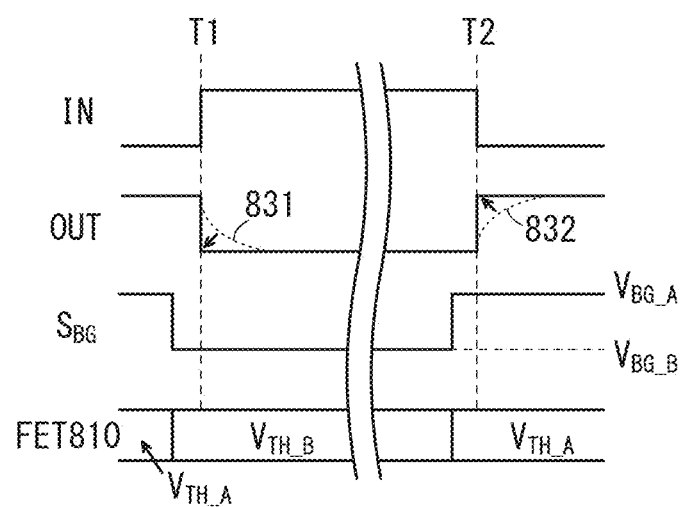

FIG. 60C is a timing chart showing the operation of the inverter 800. The timing chart in FIG. 60C shows changes of a signal waveform of the input terminal IN, a signal waveform of the output terminal OUT, a signal waveform of the signal $S_{BG}$, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 61A:
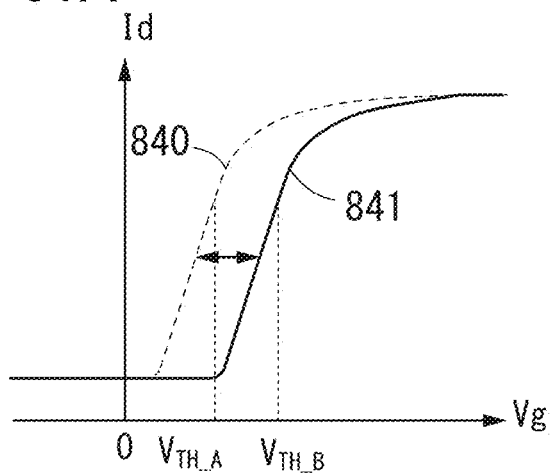
FIGS. 61A to 61C are a graph and circuit diagrams illustrating one embodiment of the present invention.

To visualize the above description, FIG. 61A shows an $I_d$-$V_g$ curve, which is one of the electrical characteristics of a transistor.

When a high voltage such as the voltage $V_{BG\_A}$ is applied to the second gate, the electrical characteristics of the OS transistor 810 can be shifted to match a curve shown by a dashed line 840 in FIG. 61A. When a low voltage such as the voltage $V_{BG\_B}$ is applied to the second gate, the electrical characteristics of the OS transistor 810 can be shifted to match a curve shown by a solid line 841 in FIG. 61A. As shown in FIG. 61A, switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 61B:
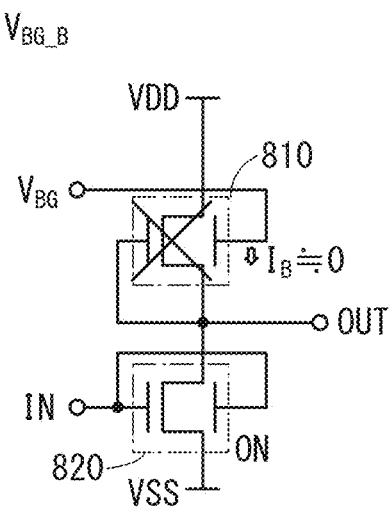

The shift of the threshold voltage in the positive direction toward the threshold voltage $V_{TH\_B}$ can make current less likely to flow in the OS transistor 810. FIG. 61B visualizes the state.

As shown in FIG. 61B, a current h that flows in the OS transistor 810 can be extremely low. Thus, when a signal supplied to the input terminal IN is at a high level and the OS transistor 820 is on (ON), the voltage of the output terminal OUT can drop sharply.

Since a state in which current is less likely to flow in the OS transistor 810 as shown in FIG. 61B can be obtained, a signal waveform 831 of the output terminal in the timing chart in FIG. 60C can be made steep. Shoot-through current between the wiring that supplies the voltage VDD and the wiring that supplies the voltage VSS can be low, leading to low-power operation.

Figure 61C:
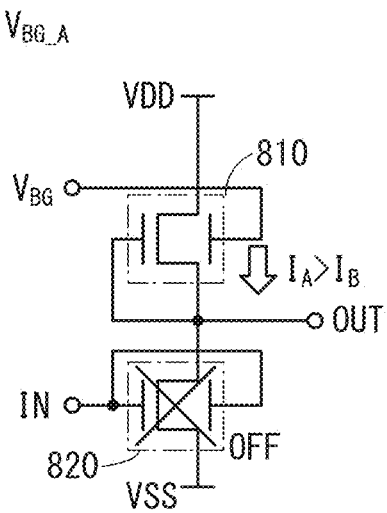

The shift of the threshold voltage in the negative direction toward the threshold voltage $V_{TH\_A}$ can make current flow easily in the OS transistor 810. FIG. 61C visualizes the state. As shown in FIG. 61C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply. Since a state in which current is likely to flow in the OS transistor 810 as shown in FIG. 61C can be obtained, a signal waveform 832 of the output terminal in the timing chart in FIG. 60C can be made steep.

Note that the threshold voltage of the OS transistor 810 is preferably controlled by the signal $S_{BG}$ before the state of the OS transistor 820 is switched, i.e., before time T1 or time T2. For example, as in FIG. 60C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 60C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 62A:
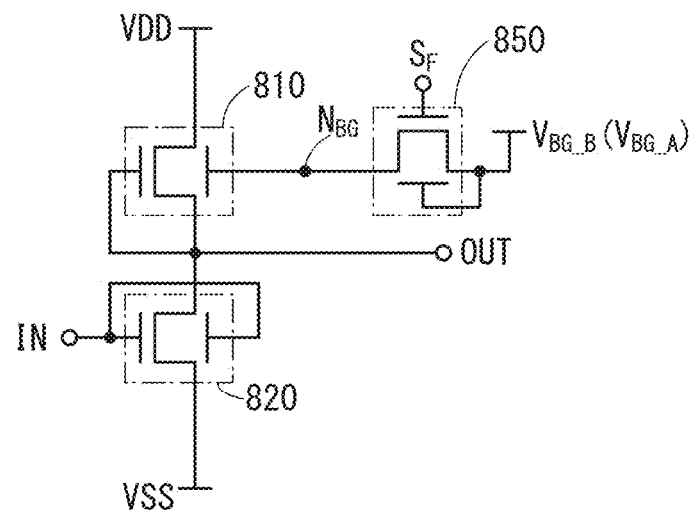
FIGS. 62A and 62B are a circuit diagram and a timing chart illustrating one embodiment of the present invention.

Although the timing chart in FIG. 60C shows the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 62A shows an example of such a circuit configuration.

The circuit configuration in FIG. 62A is the same as that in FIG. 60B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 62B:
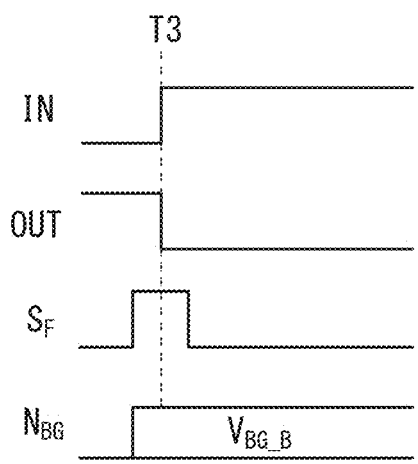

The operation with the circuit configuration in FIG. 62A will be described with reference to a timing chart in FIG. 62B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 63A:
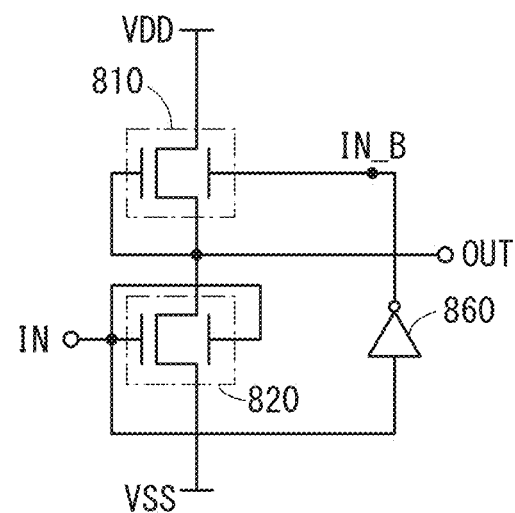
FIGS. 63A and 63B are a circuit diagram and a timing chart illustrating one embodiment of the present invention.

Although FIG. 60B and FIG. 62A each show the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 63A shows an example of such a circuit configuration.

The circuit configuration in FIG. 63A is the same as that in FIG. 60B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 63A is described with reference to a timing chart in FIG. 63B. The timing chart in FIG. 63B shows changes of a signal waveform of the input terminal IN, a signal waveform of the output terminal OUT, an output waveform IN_B of the CMOS inverter 860, and the threshold voltage of the OS transistor 810.

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 61A to 61C. For example, the signal supplied to the input terminal IN is at a high level and the OS transistor 820 is turned on at time T4 in FIG. 63B. At this time, the output waveform IN_B is at a low level. Accordingly, current can be made less likely to flow in the OS transistor 810; thus, the voltage of the output terminal OUT can be sharply decreased.

Figure 63B:
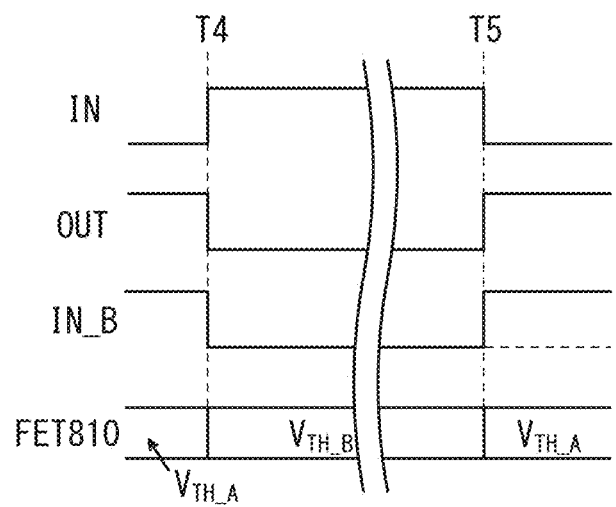

Moreover, the signal supplied to the input terminal IN is at a low level and the OS transistor 820 is turned off at time T5 in FIG. 63B. At this time, the output waveform IN_B is at a high level. Accordingly, current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structures described in this embodiment can be used in appropriate combination with any of the structures described in the other embodiments and examples.

Embodiment 11

In this embodiment, examples of a semiconductor device in which any of the transistors including an oxide semiconductor (OS transistors) described in the above embodiments is used in a plurality of circuits will be described with reference to FIGS. 64A to 64E, FIGS. 65A and 65B, FIGS. 66A and 66B, FIGS. 67A to 67C, FIGS. 68A and 68B, FIGS. 69A to 69C, and FIGS. 70A and 70B.

<11. Circuit Configuration Example of Semiconductor Device>

Figure 64A:
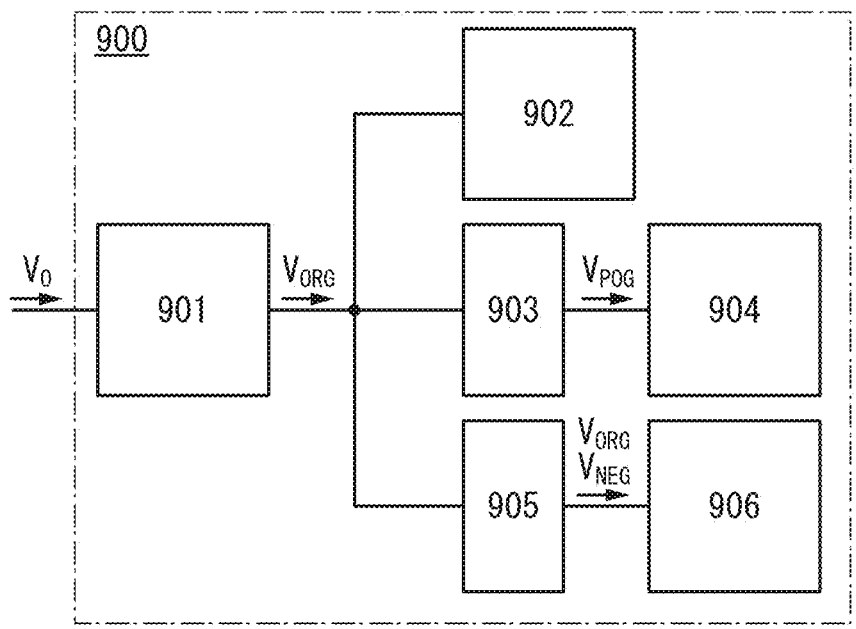
FIGS. 64A to 64E are a block diagram, circuit diagrams, and waveform charts illustrating one embodiment of the present invention.

FIG. 64A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$), the power supply voltage of the circuit 904 is a voltage applied on the basis of a voltage $V_{POG}$ and the voltage $V_{SS}$ ($V_{POG}>V_{ORG}$), and the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is set to a ground potential (GND), the kinds of voltages generated by the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 64B:
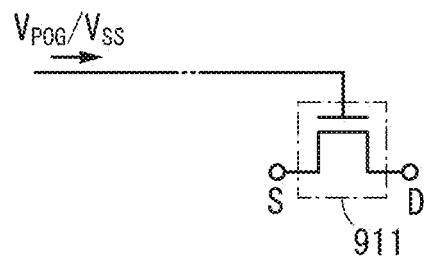
Figure 64D:
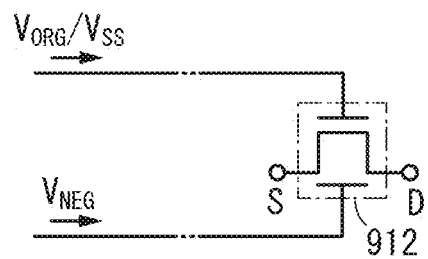
Figure 64C:
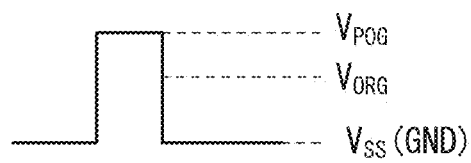

FIG. 64B shows an example of the circuit 904 that operates with the voltage $V_{POG}$ and FIG. 64C shows an example of a waveform of a signal for operating the circuit 904.

FIG. 64B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ to turn on the transistor 911 and on the basis of the voltage $V_{SS}$ to turn off the transistor 911. As shown in FIG. 64C, the voltage $V_{POG}$ is higher than the voltage $V_{ORG}$. Thus, a source (S) and a drain (D) of the transistor 911 can be electrically connected to each other without fail. As a result, the frequency of malfunction of the circuit 904 can be reduced.

Figure 64E:
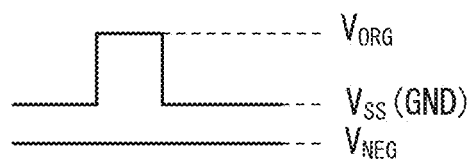

FIG. 64D shows an example of the circuit 906 that operates with the voltage $V_{NEG}$ and FIG. 64E shows an example of a waveform of a signal for operating the circuit 906.

FIG. 64D shows a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ to turn on the transistor 912 and on the basis of the voltage $V_{SS}$ to turn off the transistor 912. A signal supplied to the back gate of the transistor 912 is generated on the basis of the voltage $V_{NEG}$. As shown in FIG. 64E, the voltage $V_{NEG}$ is lower than the voltage $V_{SS}$ (GND). Thus, the threshold voltage of the transistor 912 can be controlled to shift in the positive direction. Thus, the transistor 912 can be turned off without fail and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may also be supplied to the back gate of the transistor 912.

Figure 65A:
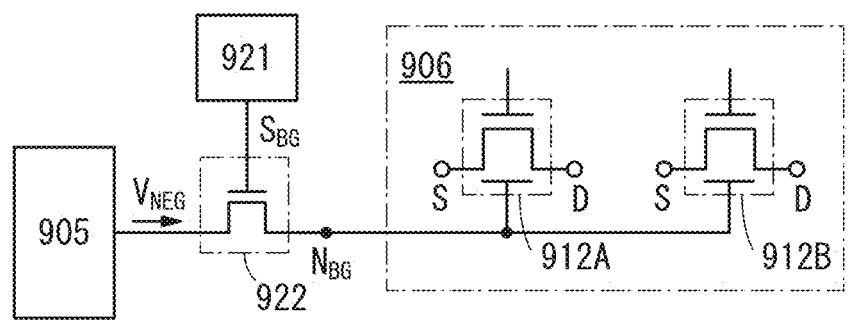
FIGS. 65A and 65B are a circuit diagram and a timing chart illustrating one embodiment of the present invention.
Figure 65B:
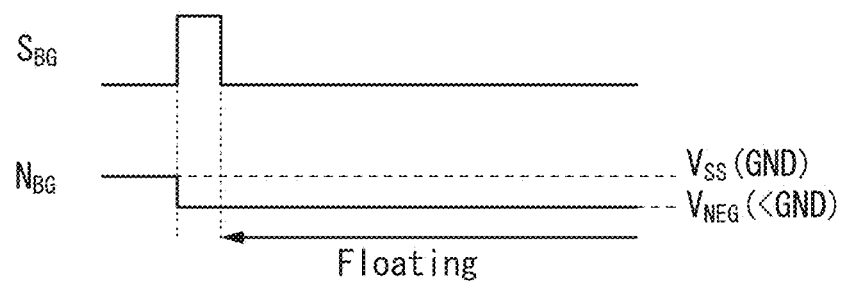

FIGS. 65A and 65B show a modification example of FIGS. 64D and 64E.

In a circuit diagram shown in FIG. 65A, a transistor 922 whose on/off state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the on/off state of the transistor 922. Transistors 912A and 912B included in the circuit 906 are OS transistors like the transistor 922.

A timing chart in FIG. 65B shows changes in a potential of the control signal $S_{BG}$ and a potential of the node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is low. Accordingly, even when the node $N_{BG}$ is in an electrically floating state, the voltage $V_{NEG}$ which has been supplied can be held.

Figure 66A:
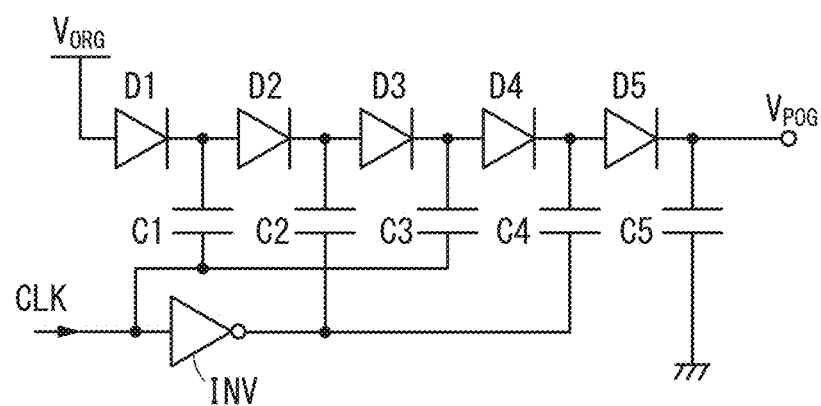
FIGS. 66A and 66B are circuit diagrams each illustrating one embodiment of the present invention.

FIG. 66A shows an example of a circuit configuration applicable to the above-described voltage generation circuit 903. The voltage generation circuit 903 shown in FIG. 66A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{POG}$.

Figure 66B:
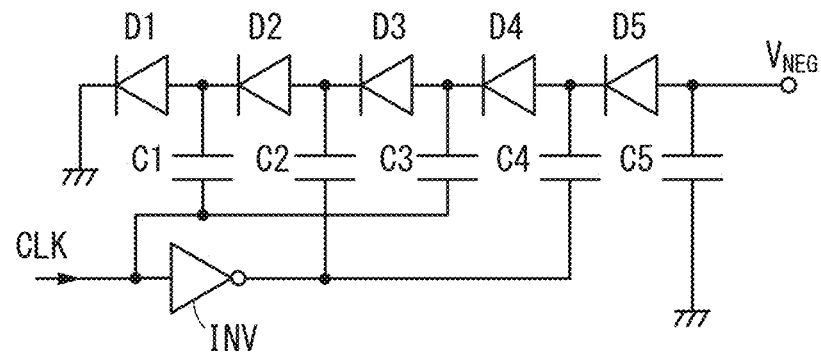

FIG. 66B shows an example of a circuit configuration applicable to the above-described voltage generation circuit 905. The voltage generation circuit 905 shown in FIG. 66B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{NEG}$.

The circuit configuration of the voltage generation circuit 903 is not limited to the configuration in the circuit diagram shown in FIG. 66A. Modification examples of the voltage generation circuit 903 are shown in FIGS. 67A to 67C and FIGS. 68A and 68B.

Figure 67A:
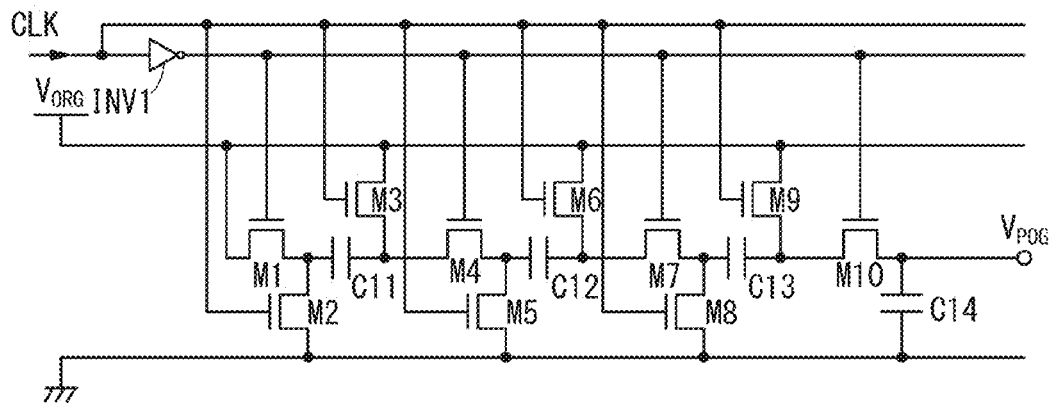
FIGS. 67A to 67C are circuit diagrams each illustrating one embodiment of the present invention.

The voltage generation circuit 903A shown in FIG. 67A includes transistors M1 to M10, capacitors C11 to C14, and an inverter INV1. The clock signal CLK is supplied to gates of the transistors M11 to M10 directly or through the inverter INV1. By application of the clock signal CLK, the voltage $V_{POG}$, which has been increased to a positive voltage having a positively quadrupled value of the voltage $V_{ORG}$, can be obtained. The number of stages can be changed to obtain a desired voltage $V_{POG}$. In the voltage generation circuit 903A in FIG. 67A, off-state current of each of the transistors M1 to M10 can be low when the transistors M1 to M10 are OS transistors, and leakage of charge held in the capacitors C11 to C14 can be suppressed. Accordingly, the voltage $V_{ORG}$ can be efficiently increased to the voltage $V_{POG}$.

Figure 67B:
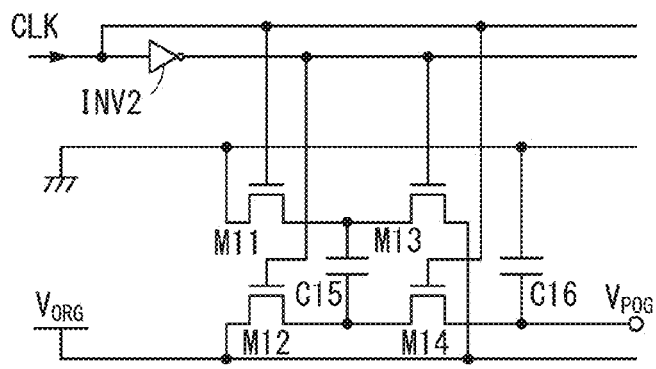

The voltage generation circuit 903B shown in FIG. 67B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 67B, off-state current of each of the transistors M11 to M14 can be low when the transistors M11 to M14 are OS transistors, and leakage of charge held in the capacitors C15 and C16 can be suppressed. Accordingly, the voltage $V_{ORG}$ can be efficiently increased to the voltage $V_{POG}$.

Figure 67C:
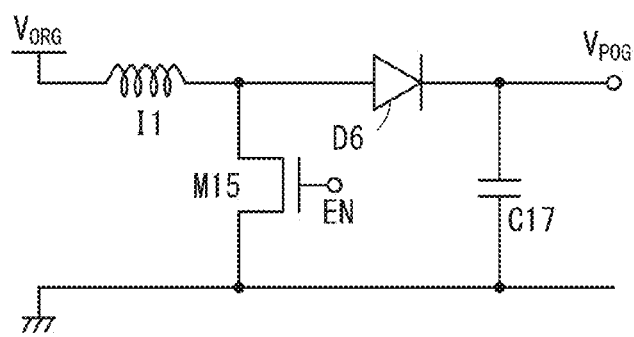

A voltage generation circuit 903C shown in FIG. 67C includes an inductor I1, a transistor M15, a diode D6, and a capacitor C17. The on/off state of the transistor M15 is controlled by a control signal EN. Owing to the control signal EN, the voltage $V_{POG}$ increased from the voltage $V_{ORG}$ can be obtained. Since the voltage generation circuit 903C in FIG. 67C increases the voltage using the inductor I1, the voltage can be efficiently increased.

Figure 68A:
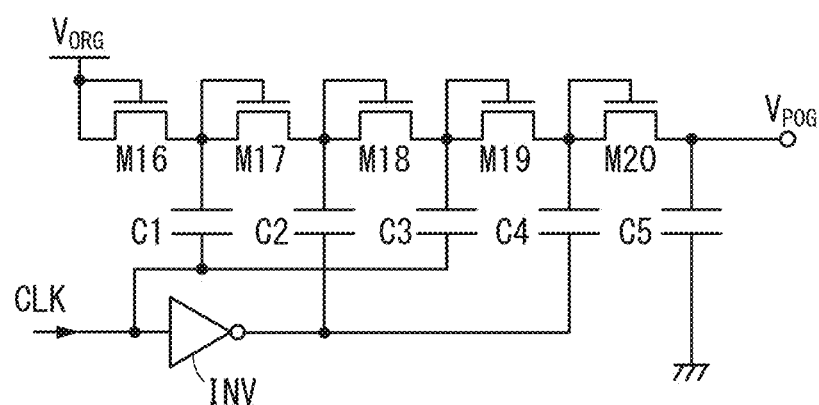
FIGS. 68A and 68B are circuit diagrams each illustrating one embodiment of the present invention.

A voltage generation circuit 903D shown in FIG. 68A has a configuration in which the diodes D1 to D5 of the voltage generation circuit 903 shown in FIG. 66A are replaced by diode-connected transistors M16 to M20. In the voltage generation circuit 903D in FIG. 68A, off-state current of each of the transistors M16 to M20 can be low when the transistors M16 to M20 are OS transistors, and leakage of charge held in the capacitors C1 to C5 can be suppressed. Accordingly, the voltage $V_{ORG}$ can be efficiently increased to the voltage $V_{POG}$.

Figure 68B:
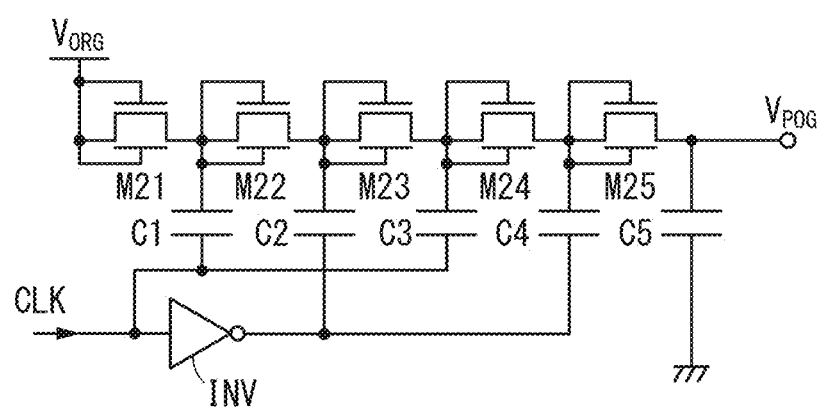
Figure 69A:
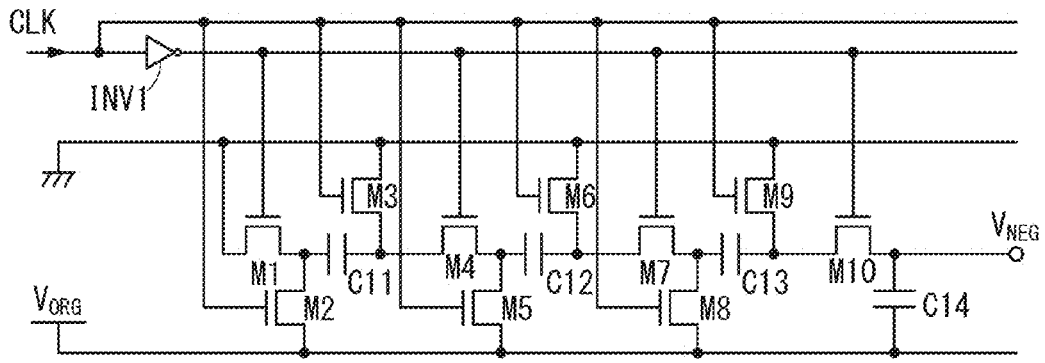
FIGS. 69A to 69C are circuit diagrams each illustrating one embodiment of the present invention.
Figure 69B:
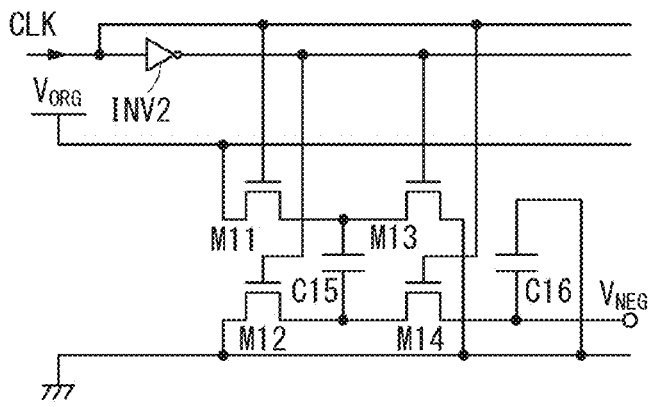
Figure 69C:
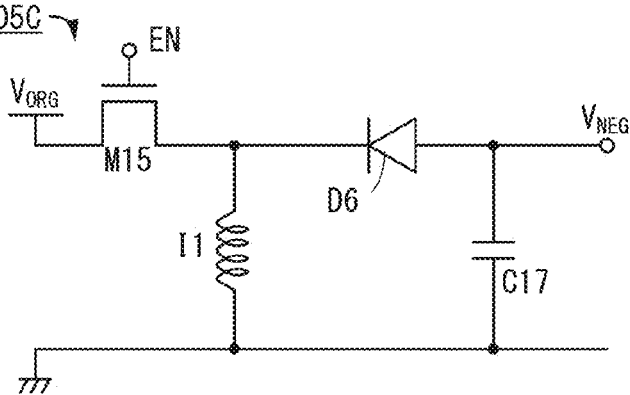
Figure 70A:
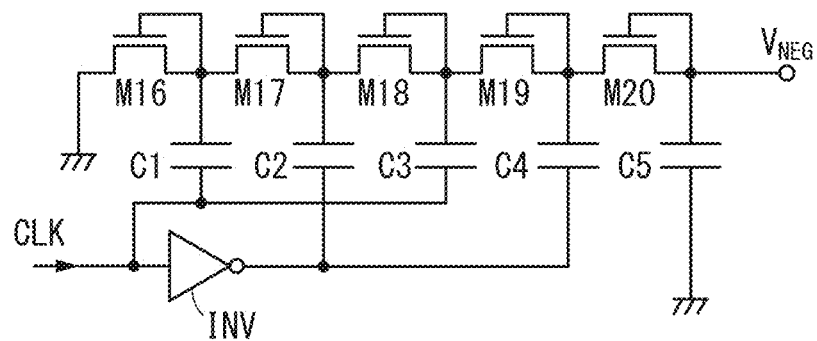
FIGS. 70A and 70B are circuit diagrams each illustrating one embodiment of the present invention.
Figure 70B:
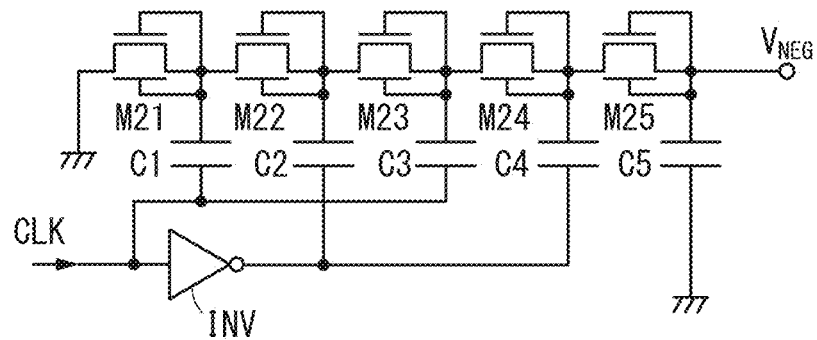

A voltage generation circuit 903E shown in FIG. 68B has a configuration in which the transistors M16 to M20 of the voltage generation circuit 903D shown in FIG. 68A are replaced by transistors M21 to M25 including back gates. In the voltage generation circuit 903E shown in FIG. 68B, the back gates can be supplied with the same voltages as the respective gates; thus, the amount of current flowing in the transistor can be increased. Accordingly, the voltage $V_{ORG}$ can be efficiently increased to the voltage $V_{POG}$.

Note that the modification examples of the voltage generation circuit 903 are also applicable to the voltage generation circuit 905 shown in FIG. 66B. FIGS. 69A to 69C and FIGS. 70A and 70B are circuit diagrams showing configuration examples of such a case. In a voltage generation circuit 905A shown in FIG. 69A, the voltage $V_{NEG}$, which has been reduced from the voltage $V_{SS}$ to a negative voltage having a negatively tripled value of the voltage $V_{ORG}$ by application of the clock signal CLK, can be obtained. In a voltage generation circuit 905B shown in FIG. 69B, the voltage $V_{NEG}$, which has been reduced from the voltage $V_{SS}$ to a negative voltage having a negatively doubled value of the voltage $V_{ORG}$ by application of the clock signal CLK, can be obtained.

Voltage generation circuits 905A to 905E shown in FIGS. 69A to 69C and FIGS. 70A and 70B have the same configurations as the voltage generation circuits 903A to 903E shown in FIGS. 67A to 67C and FIGS. 68A and 68B except for voltages applied to wirings or element arrangement. Similarly to the voltage generation circuits 903A to 903E, the voltage generation circuits 905A to 905E shown in FIGS. 69A to 69C and FIGS. 70A and 70B can perform efficient voltage reduction from the voltage $V_{SS}$ to the voltage $V_{NEG}$.

As described above, in any of the configurations of this embodiment, voltage required for circuits included in the semiconductor device can be internally generated. Thus, in the semiconductor device, the number of kinds of power supply voltages supplied from the outside can be reduced.

The structures and the like described in this embodiment can be combined as appropriate with any of the structures described in the other embodiments and examples.

Embodiment 12

In this embodiment, an input/output device of one embodiment of the present invention will be described with reference to FIGS. 71A and 71B.

<12. Structure Example of Input/Output Device>

The input/output device of one embodiment of the present invention is an in-cell touch panel that has a function of displaying an image and serves as a touch sensor.

There is no particular limitation on a display element included in the input/output device of one embodiment of the present invention. As the display element, a variety of display elements including a liquid crystal element, an optical element that utilizes micro electro mechanical systems (MEMS), a light-emitting element such as an organic electroluminescent (EL) element or a light-emitting diode (LED), and an electrophoretic element can be used.

In this embodiment, a transmissive liquid crystal display device using a liquid crystal element in a horizontal electric field mode will be described as an example.

There is no particular limitation on a sensor element included in the input/output device of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, an input/output device including a capacitive sensor element will be described as an example.

Examples of the capacitive sensor element are a surface capacitive sensor element, a projected capacitive sensor element, and the like. Examples of the projected capacitive sensor element are a self-capacitive sensor element, a mutual capacitive sensor element, and the like. The use of a mutual capacitive sensor element is preferable because multiple points can be sensed simultaneously.

As typical examples of the in-cell touch panel, a hybrid in-cell type and a full-in-cell type can be given. The hybrid in-cell type refers to a structure in which an electrode and the like constituting a part of a sensor element are provided for only a counter substrate or both a substrate that supports a display element and the counter substrate. The full-in-cell type refers to a structure in which an electrode and the like constituting a part of a sensor element are provided for only a substrate that supports a display element. The input/output device of one embodiment of the present invention is a full-in-cell touch panel. The full-in-cell touch panel is preferable because a structure of a counter substrate can be simplified.

The input/output device of one embodiment of the present invention is preferable because an electrode constituting a part of the display element also serves as an electrode constituting a part of the sensor element and thus the manufacturing process can be simplified and the manufacturing cost can be reduced.

One embodiment of the present invention can reduce the thickness or weight of the input/output device or the number of components of the input/output device as compared with a structure in which a display panel and a sensor element separately formed are attached to each other or a structure in which a sensor element is formed on the counter substrate side.

In the input/output device of one embodiment of the present invention, both an FPC for supplying a signal for driving a pixel and an FPC for supplying a signal for driving a sensor element are on one substrate side. With this structure, the touch panel can be easily incorporated into an electronic device, and the number of components can be reduced. Note that the signal for driving a pixel and the signal for driving a sensor element may be supplied by one FPC.

The structure of the input/output device of one embodiment of the present invention will be described below.

[Cross-Sectional Structure Example 1 of Input/Output Device]

FIG. 71A is a cross-sectional view of two adjacent sub-pixels in the input/output device. The two sub-pixels illustrated in FIG. 71A are included in different pixels.

As illustrated in FIG. 71A, the input/output device includes, over a substrate 211, a transistor 201, a transistor 203, a liquid crystal element 207a, and the like. Furthermore, insulating films such as an insulator 212, an insulator 213, an insulator 215, an insulator 217, and an insulator 219 are provided over the substrate 211.

For example, a subpixel exhibiting a red color, a subpixel exhibiting a green color, and a subpixel exhibiting a blue color form one pixel, and thus full-color display can be achieved in a display portion. Note that the color exhibited by subpixels is not limited to red, green, and blue. For example, a subpixel exhibiting white, yellow, magenta, cyan, or the like may be used for a pixel.

Note that any of the transistors described as examples in the above embodiments is applicable to the transistors 201 and 203 included in the sub-pixels.

The liquid crystal element 207a is a liquid crystal element having a fringe field switching (FFS) mode. The liquid crystal element 207a includes a conductor 251, a conductor 252, and a liquid crystal 249. Orientation of the liquid crystal 249 can be controlled with an electric field generated between the conductors 251 and 252. The conductor 251 can serve as a pixel electrode. The conductor 252 can serve as a common electrode.

When a conductive material that transmits visible light is used for the conductors 251 and 252, the input/output device can serve as a transmissive liquid crystal display device. When a conductive material that reflects visible light is used for the conductor 251 and a conductive material that transmits visible light is used for the conductor 252, the input/output device can serve as a reflective liquid crystal display device.

For example, a material containing one of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide to which silicon oxide is added, zinc oxide, and zinc oxide to which gallium is added are given, for example. Note that a film including graphene can be used as well. The film including graphene can be formed, for example, by reducing a film containing graphene oxide.

An oxide conductor is preferably used as the conductor 251. Furthermore, an oxide conductor is preferably used as the conductor 252. The oxide conductor preferably contains one or more kinds of metal elements included in the oxide semiconductor 223. For example, the conductor 251 preferably contains indium, further preferably an In-M-Zn oxide (M is Al, Ga, Y, or Sn). Similarly, the conductor 252 preferably contains indium, further preferably an In-M-Zn oxide.

Note that at least one of the conductors 251 and 252 may be formed using an oxide semiconductor. As described above, when two or more layers constituting a part of the input/output device are formed using oxide semiconductors containing the same metal element, the same manufacturing apparatus (e.g., deposition apparatus or processing apparatus) can be used in two or more steps and manufacturing cost can thus be reduced.

For example, when a silicon nitride film containing hydrogen is used for an insulator 253 and an oxide semiconductor is used for the conductor 251, the conductivity of the oxide semiconductor can be increased owing to hydrogen supplied from the insulator 253.

Examples of a conductive material that reflects visible light include aluminum, silver, and an alloy including any of these metal elements.

The conductor 251 functioning as a pixel electrode is electrically connected to a source or a drain of the transistor 203.

The conductor 252 has a comb-like top surface shape or a top surface shape provided with a slit (a top surface shape is also referred to as a planar surface shape). The insulator 253 is provided between the conductors 251 and 252. The conductor 251 partly overlaps with the conductor 252 with the insulator 253 interposed therebetween. In a region where a coloring film 241 overlaps with the conductor 251, there is a portion where the conductor 252 is not provided over the conductor 251.

A conductor 255 is provided over the insulator 253. The conductor 255 is electrically connected to the conductor 252 and can serve as an auxiliary wiring of the conductor 252. With the auxiliary wiring electrically connected to the common electrode, voltage drop due to the resistance of the common electrode can be suppressed. In that case, a stacked-layer structure of a conductor including a metal oxide and a conductor including a metal is preferably used because these conductors can be formed by a patterning technique using a half tone mask and thus the process can be simplified.

The conductor 255 can have a lower resistivity than the conductor 252. For example, the conductor 255 can be formed to have a single-layer structure or a stacked-layer structure using any of metal materials such as molybdenum, titanium, chromium, tantalum, tungsten, aluminum, copper, silver, neodymium, and scandium, and an alloy material containing any of these elements.

To prevent the user of the input/output device from perceiving the conductor 255, the conductor 255 is preferably provided in a position overlapping with a light-shielding film 243 and the like.

The coloring film 241 partly overlaps with the liquid crystal element 207a. The light-shielding film 243 partly overlaps with at least one of the transistors 201 and 203.

The insulator 245 preferably has a function of an overcoat preventing impurities contained in the coloring film 241, the light-shielding film 243, and the like from diffusing into the liquid crystal 249. The insulator 245 is not necessarily provided.

Note that an alignment film may be provided on surfaces of components formed on the substrates 211 and 261 which are in contact with the liquid crystal 249. The alignment film can control the alignment of the liquid crystal 249. In the structure in FIG. 71A, for example, an alignment film that covers the conductor 252 may be provided, or an alignment film may be provided between the insulator 245 and the liquid crystal 249. The insulator 245 may function as both an alignment film and an overcoat.

The input/output device includes a spacer 247. The spacer 247 has a function of preventing the distance between the substrate 211 and a substrate 261 from being shorter than or equal to a certain distance.

FIG. 71A shows an example in which the spacer 247 is provided over the insulator 253 and the conductor 252; however, one embodiment of the present invention is not limited thereto. The spacer 247 may be provided on the substrate 211 side or on the substrate 261 side. For example, the spacer 247 may be formed on the insulator 245. Moreover, although FIG. 71A shows an example in which the spacer 247 is in contact with the insulators 253 and 245, the spacer 247 is not necessarily in contact with a component provided on the substrate 211 side or on the substrate 261 side.

A particulate spacer may be used as the spacer 247. Although a material such as silica can be used for the particulate spacer, an elastic material such as a resin or rubber is preferably used. In that case, the particulate spacer may be vertically crushed.

The substrates 211 and 261 are attached to each other with an adhesive layer (not illustrated). A region surrounded by the substrate 211, the substrate 261, and the adhesive layer is filled with the liquid crystal 249.

Note that when the input/output device serves as a transmissive liquid crystal display device, two polarizing plates are placed so that a display portion is interposed between the two polarizing plates. Light from a backlight provided outside the polarizing plate enters through the polarizing plate. At this time, the alignment of the liquid crystal 249 is controlled with a voltage applied between the conductors 251 and 252, whereby optical modulation of light can be controlled. In other words, the intensity of light emitted through the polarizing plate can be controlled. Light excluding light in a particular wavelength range is absorbed by the coloring film 241, so that red, blue, or green light is emitted.

In addition to the polarizing plate, a circularly polarizing plate can be used, for example. As the circularly polarizing plate, for example, a stack including a linear polarizing plate and a quarter-wave retardation plate can be used. With the circularly polarizing plate, the viewing angle dependence of display of the input/output device can be reduced.

Note that the liquid crystal element 207a is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned microcell (ASM) mode, an optically compensated birefringence (OCB) mode, a ferroelectric liquid crystal (FLC) mode, an antiferroelectric liquid crystal (AFLC) mode, or the like can be used.

Furthermore, a normally black liquid crystal display device, for example, a transmissive liquid crystal display device using a vertical alignment (VA) mode, may be used as the input/output device. As a vertical alignment mode, a multi-domain vertical alignment (MVA) mode, a patterned vertical alignment (PVA) mode, an ASV mode, or the like can be employed.

Note that the liquid crystal element is an element that controls transmission or non-transmission of light by utilizing optical modulation action of the liquid crystal. Note that the optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode and design to be used.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which 5 weight % or more of a chiral material is mixed is used for the liquid crystal 249 in order to increase the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

A substrate with which a sensing target, such as a finger or a stylus, is to be in contact may be provided above the substrate 261. In that case, a polarizing plate or a circularly polarizing plate is preferably provided between the substrate 261 and the above substrate. In that case, a protective layer (such as a ceramic coat) is preferably provided over the above substrate. The protective layer can be formed using an inorganic insulating material such as silicon oxide, aluminum oxide, yttrium oxide, or yttria-stabilized zirconia (YSZ). Alternatively, tempered glass may be used for the substrate. The tempered glass that can be used here is one that has been subjected to physical or chemical treatment by an ion exchange method, a thermal tempering method, or the like and has a surface to which compressive stress has been applied.

In the input/output device in FIG. 71A, capacitance formed between the conductor 252 in the left subpixel and the conductor 252 in the right subpixel is utilized to sense proximity, touch, or the like of a sensing target. That is, in the input/output device of one embodiment of the present invention, the conductor 252 serves as a common electrode of the liquid crystal element and an electrode of the sensor element.

As described above, an electrode constituting a part of the liquid crystal element also serves as an electrode constituting a part of the sensor element in the input/output device of one embodiment of the present invention; thus, the manufacturing process can be simplified and the manufacturing cost can be reduced. In addition, the thickness and weight of the input/output device can be reduced.

The conductor 252 is electrically connected to the conductor 255 functioning as an auxiliary wiring. With the conductor 255, the resistance of the electrode of the sensor element can be lowered. With the lowered resistance of the electrode of the sensor element, the time constant of the electrode of the sensor element can be small. The smaller the time constant of the electrode of the sensor element is, the higher the detection sensitivity and the detection accuracy are.

When the capacitance between the electrode of the sensor element and a signal line is too large, the time constant of the electrode of the sensor element becomes too large in some cases. Thus, an insulator having a planarizing function is preferably provided between the electrode of the sensor element and the transistors to reduce the capacitance between the electrode of the sensor element and the signal line. For example, in FIG. 71A, as the insulator having a planarizing function, the insulator 219 is provided. With the insulator 219, the capacitance between the conductor 252 and the signal line can be small. Accordingly, the time constant of the electrode of the sensor element can be small. As described above, the smaller the time constant of the electrode of the sensor element is, the higher the detection sensitivity and the detection accuracy are.

For example, the time constant of the electrode of the sensor element is greater than 0 seconds and less than or equal to $1\times10^{-4}$ seconds, preferably greater than 0 seconds and less than or equal to $5\times10^{-5}$ seconds, further preferably greater than 0 seconds and less than or equal to $5\times10^{-6}$ seconds, further preferably greater than 0 seconds and less than or equal to $5\times10^{-7}$ seconds, and further preferably greater than 0 seconds and less than or equal to $2\times10^{-7}$ seconds. In particular, when the time constant is less than or equal to $1\times10^{-6}$ seconds, high detection sensitivity can be achieved while the influence of noise is reduced.

[Cross-Sectional Structure Example 2 of Input/Output Device]

FIG. 71B is a cross-sectional view of two adjacent pixels that are different from those in FIG. 71A. Two subpixels illustrated in FIG. 71B are included in respective pixels.

Structure example 2 illustrated in FIG. 71B differs from Structure example 1 illustrated in FIG. 71A in the stacking order of the conductor 251, the conductor 252, the insulator 253, and the conductor 255. Note that in Structure example 2, the above description can be referred to for portions similar to those in Structure example 1.

Specifically, in Structure example 2, the conductor 255 is over the insulator 219, the conductor 252 is over the conductor 255, the insulator 253 is over the conductor 252, and the conductor 251 is over the insulator 253.

As illustrated in a liquid crystal element 207b in FIG. 71B, the conductor 251 which is provided on the upper side and whose top surface shape is a comb-like shape or has a slit can serve as a pixel electrode, and the conductor 252 provided on the lower side can serve as a common electrode. The conductor 251 is electrically connected to the source or the drain of the transistor 203 also in that case.

In FIG. 71B, capacitance formed between the conductor 252 in the left subpixel and the conductor 252 in the right subpixel is utilized to sense proximity, touch, or the like of a sensing target. That is, in the input/output device of one embodiment of the present invention, the conductor 252 serves as the common electrode of the liquid crystal element and the electrode of the sensor element.

Note that in Structure example 1 (FIG. 71A), the conductor 252 serving as the electrode of the sensor element and the common electrode is closer to the display surface side (the side near a sensing target) than the conductor 251 serving as the pixel electrode is. Thus, in some cases, the detection sensitivity of Structure example 1 is higher than that of Structure example 2 in which the conductor 251 is closer to the display surface side than the conductor 252 is.

The structures described in this embodiment can be combined as appropriate with any of the structures described in the other embodiments and examples.

Embodiment 13

In this embodiment, a display module and electronic devices, each of which includes a semiconductor device of one embodiment of the present invention, will be described with reference to FIG. 72, FIGS. 73A to 73G, and FIGS. 74A and 74B.

<13-1. Display Module>

Figure 72:
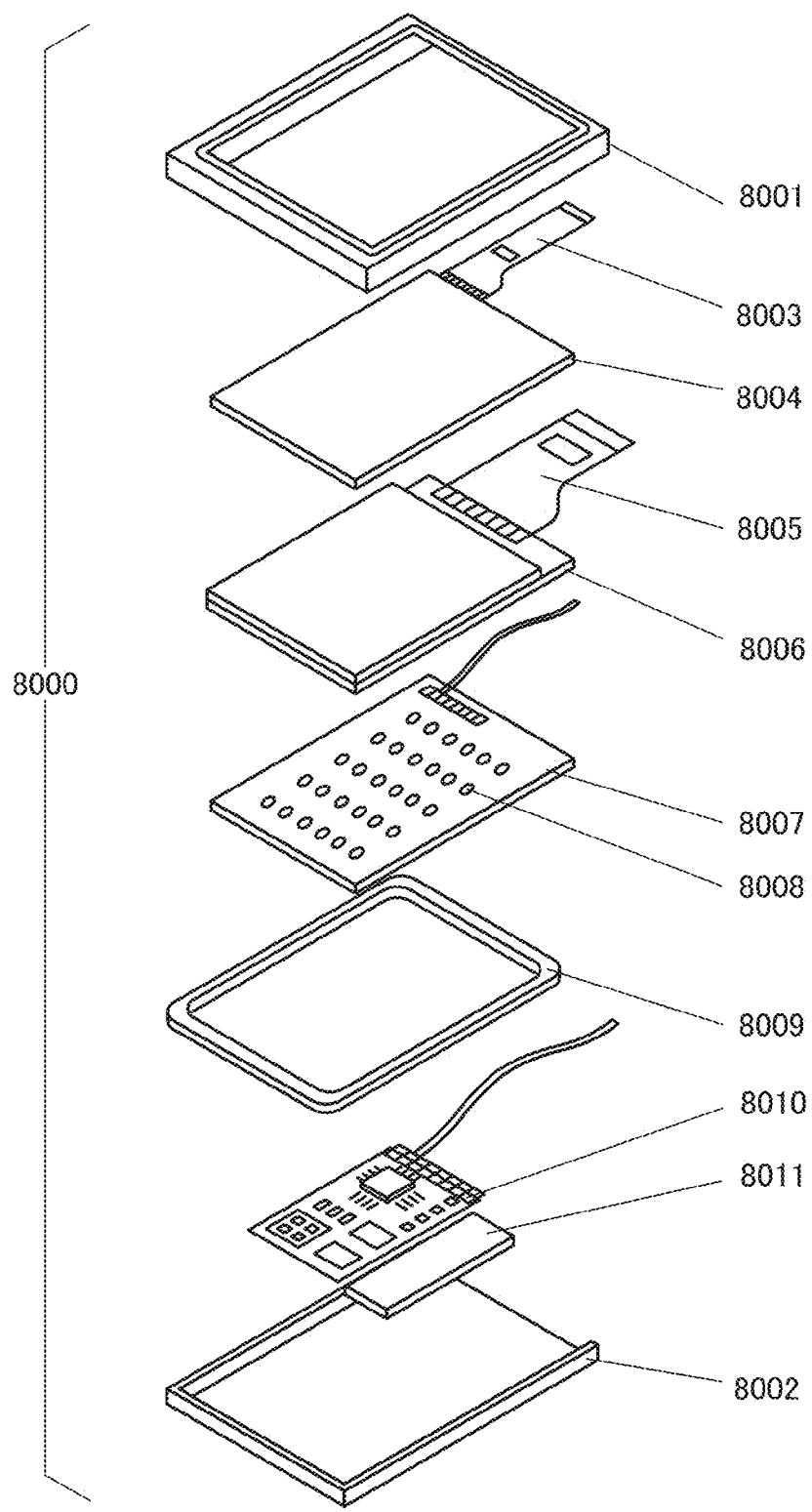
FIG. 72 illustrates a display module.

In a display module 8000 illustrated in FIG. 72, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and overlap with the display panel 8006. Alternatively, a counter substrate (a sealing substrate) of the display panel 8006 can have a touch panel function. Alternatively, a photosensor may be provided in each pixel of the display panel 8006 to form an optical touch panel.

The backlight 8007 includes a light source 8008. One embodiment of the present invention is not limited to the structure in FIG. 72, in which the light source 8008 is provided over the backlight 8007. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 may also function as a radiator plate.

The printed board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case where a commercial power source is used.

The display module 8000 may be additionally provided with a member such as a polarizing plate, a retardation plate, or a prism sheet.

<13-2. Electronic Device>

FIGS. 73A to 73G illustrate electronic devices. These electronic devices can include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 73A to 73G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 73A to 73G are not limited thereto, and the electronic devices can have a variety of functions. Although not illustrated in FIGS. 73A to 73G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 73A to 73G will be described in detail below.

Figure 73A:
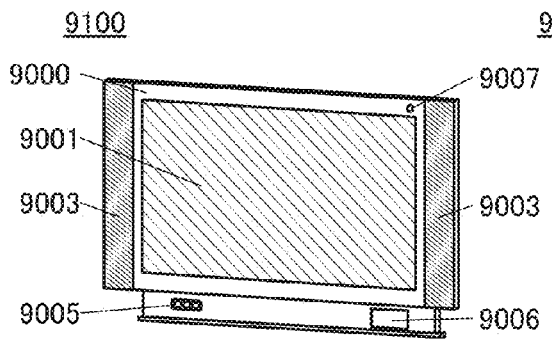
FIGS. 73A to 73G illustrate electronic devices.

FIG. 73A is a perspective view illustrating a television device 9100. The television device 9100 can include the display portion 9001 having a large screen size of, for example, 50 inches or more, or 100 inches or more.

Figure 73D:
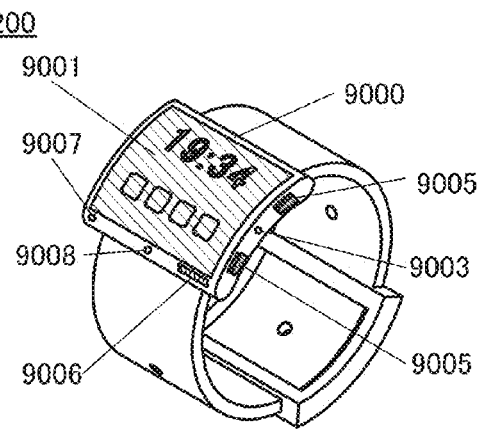
Figure 73B:
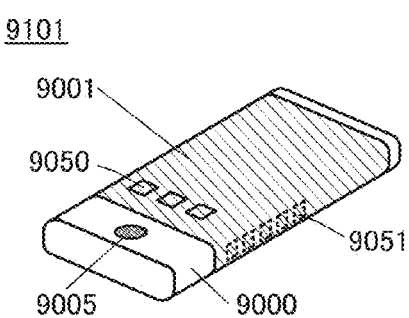

FIG. 73B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include the speaker 9003, the connection terminal 9006, the sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Instead of the information 9051, the operation buttons 9050 or the like may be displayed on the position where the information 9051 is displayed.

Figure 73E:
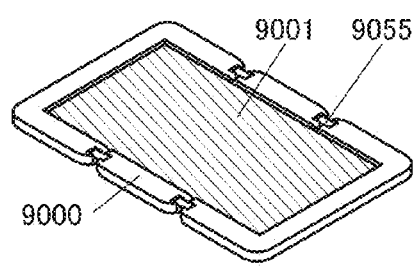
Figure 73C:
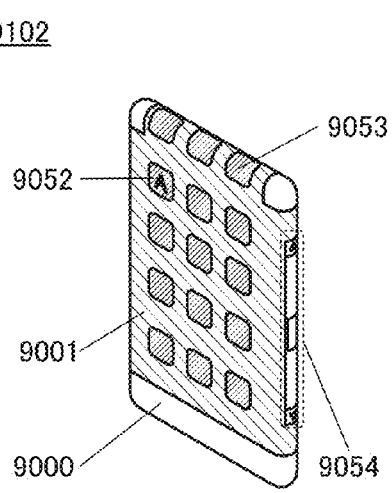

FIG. 73C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 73D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 73F:
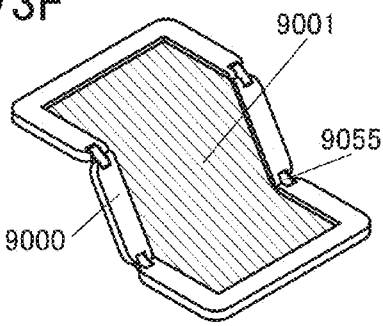
Figure 73G:
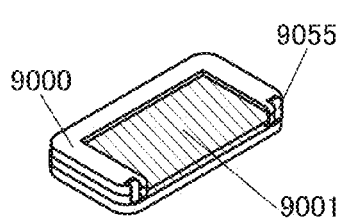

FIGS. 73E, 73F, and 73G are perspective views of a foldable portable information terminal 9201. FIG. 73E is a perspective view illustrating the portable information terminal 9201 that is opened. FIG. 73F is a perspective view illustrating the portable information terminal 9201 that is shifted from the opened state to the folded state or from the folded state to the opened state. FIG. 73G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 74A:
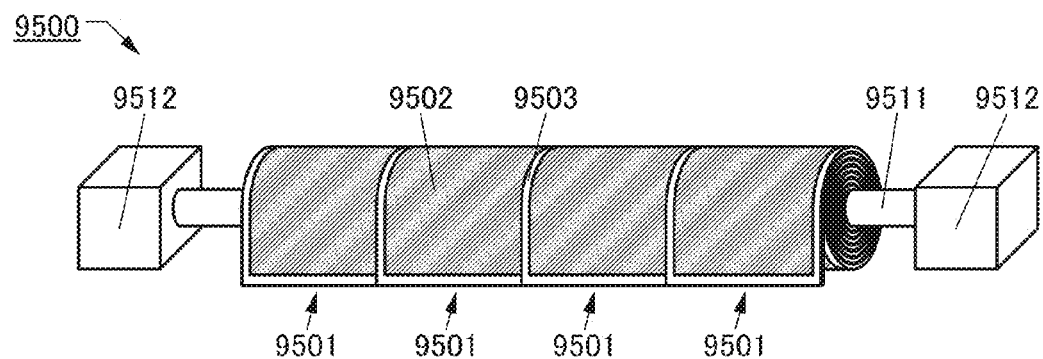
FIGS. 74A and 74B are perspective views illustrating a display device.
Figure 74B:
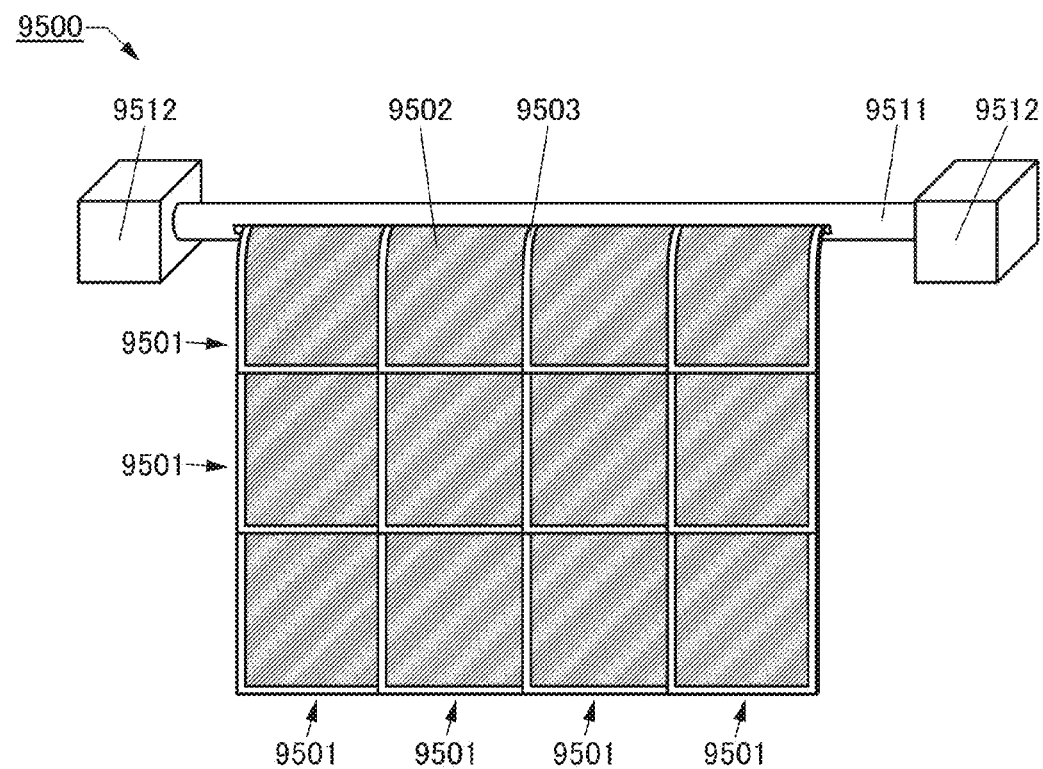

FIGS. 74A and 74B are perspective views of a display device including a plurality of display panels. Note that the plurality of display panels are wound in the perspective view in FIG. 74A and are unwound in the perspective view in FIG. 74B.

A display device 9500 illustrated in FIGS. 74A and 74B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 74A and 74B, without limitation to this structure, the display regions 9502 of the adjacent display panels 9501 may overlap with each other without any space so that a continuous display region 9502 is obtained, for example.

The electronic devices described in this embodiment are characterized by having a display portion for displaying some sort of information. Note that the semiconductor device of one embodiment of the present invention can also be used for an electronic device that does not have a display portion.

The structures described in this embodiment can be combined as appropriate with any of the structures described in the other embodiments and examples.

Embodiment 14

In this embodiment, the structure of a data processor including a semiconductor device of one embodiment of the present invention will be described with reference to FIGS. 75A and 75B.

Figure 75A:
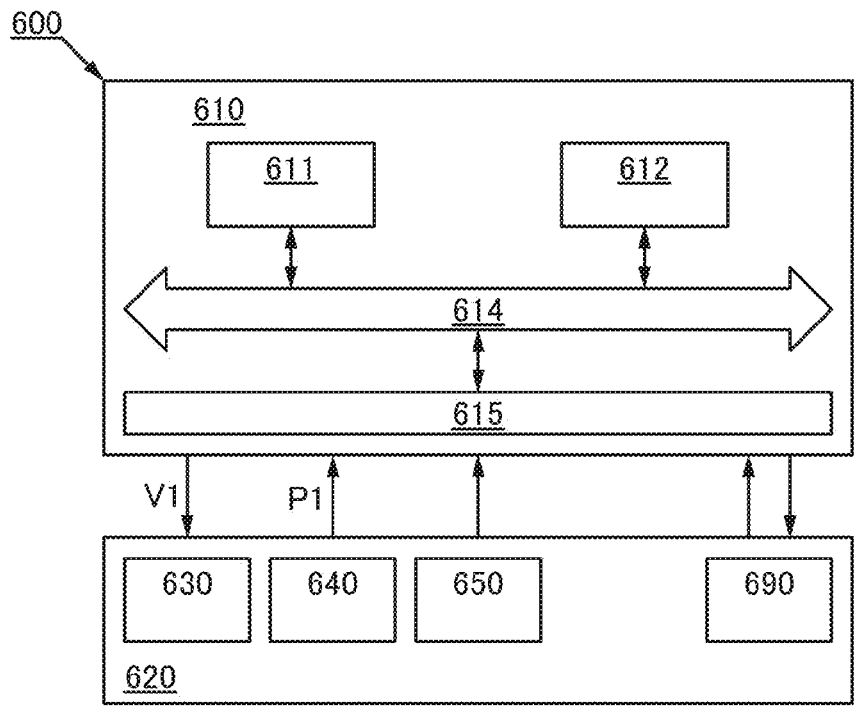
FIGS. 75A and 75B each illustrate a structure of a data processor.
Figure 75B:
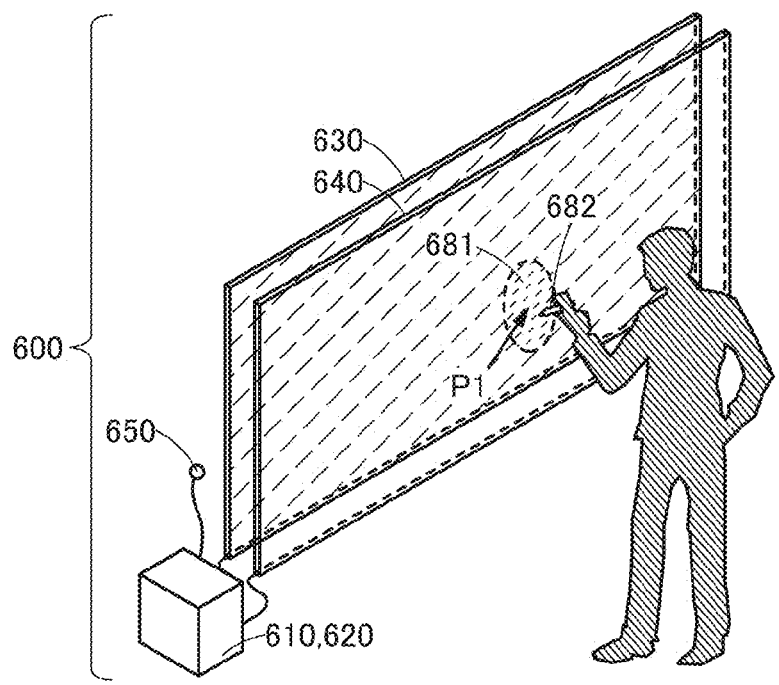

FIG. 75A is a block diagram showing the structure of a data processor 600 including a semiconductor device of one embodiment of the present invention. FIG. 75B is a schematic diagram illustrating the data processor 600 in operation.

Components of the data processor 600 are described below. In some cases, the components cannot be clearly distinguished from each other and one component also serves as another component or includes part of another component.

<14. Structure Example of Data Processor>

The data processor 600 includes an arithmetic device 610 and an input/output device 620.

[Arithmetic Unit]

The arithmetic device 610 includes an arithmetic portion 611, a memory portion 612, a transmission path 614, and an input/output interface 615.

[Arithmetic Portion]

The arithmetic portion 611 has a function of executing a program.

[Memory Portion]

The memory portion 612 has a function of storing a program executed by the arithmetic portion 611, initial information, setting information, an image, or the like.

Specifically, a hard disk, a flash memory, a memory including a transistor formed using an oxide semiconductor, or the like can be used as the memory portion 612.

[Program]

A program is executed by the arithmetic portion 611 through three steps described below with reference to FIG. 75B, for example.

In a first step, positional data P1 is acquired.

In a second step, a first region 681 is determined on the basis of the positional data P1.

In a third step, an image (image data V1) with higher luminance than an image displayed on a region other than the first region 681 is produced as an image displayed on the first region 681.

For example, the arithmetic device 610 determines the first region 681 on the basis of the positional data P1. The first region 681 can have, specifically, an elliptical shape, a circular shape, a polygonal shape, a rectangular shape, or the like. A region within a 60-cm radius, preferably within a 5-30-cm radius, from the positional data P1 is determined as the first region 681, for example.

To produce an image with higher luminance than an image displayed on a region other than the first region 681 as an image displayed on the first region 681, the luminance of the image displayed on the first region 681 is increased to 110% or more, preferably 120% or more and 200% or less, of the luminance of the image displayed on the region other than the first region 681. Alternatively, the average luminance of the image displayed on the first region is increased to 110% or more, preferably 120% or more and 200% or less, of the average luminance of the image displayed on the region other than the first region 681.

As a result of the program, the data processor 600 can generate the image data V1 with higher luminance than an image displayed on a region other than the first region 681 as an image displayed on the first region 681 on the basis of the positional data P1. Consequently, the data processor 600 can have high convenience and can provide operators with comfortable operation.

[Input/Output Interface]

The input/output interface 615 includes a terminal or a wiring. The input/output interface 615 has a function of supplying data and a function of receiving data. The input/output interface 615 can be electrically connected to the transmission path 614 and/or the input/output device 620, for example.

[Transmission Path]

The transmission path 614 includes a wiring. The transmission path 614 has a function of supplying data and a function of receiving data. The transmission path 614 can be electrically connected to the arithmetic portion 611, the memory portion 612, or the input/output interface 615, for example.

[Input/Output Device]

The input/output device 620 includes a display portion 630, an input portion 640, a sensor portion 650, and a communication portion 690.

[Display Portion]

The display portion 630 includes a display panel. The display panel includes a pixel having a structure including a reflective display element and a transmissive light-emitting element. The luminance of a displayed image can be increased by increasing the reflectance of the reflective display element or the luminance of the light-emitting element with the use of the image data.

[Input Portion]

The input portion 640 includes an input panel. The input panel includes, for example, a proximity sensor. The proximity sensor has a function of sensing a pointer 682. Note that a finger, a stylus pen, or the like can be used as the pointer 682. For the stylus pen, a light-emitting element such as a light-emitting diode, a metal piece, a coil, or the like can be used.

As the proximity sensor, a capacitive proximity sensor, an electromagnetic inductive proximity sensor, an infrared proximity sensor, a proximity sensor including a photoelectric conversion element, or the like can be used.

The capacitive proximity sensor includes a conductor and has a function of sensing the proximity to the conductor. To determine positional data, for example, a plurality of conductors are provided in different regions of the input panel and a region where a finger or the like used as the pointer 682 approaches can be determined in accordance with a change in parasitic capacitance of the conductors.

The electromagnetic inductive proximity sensor has a function of sensing the proximity of a metal piece, a coil, or the like to a sensor circuit. To determine positional data, for example, a plurality of oscillation circuits are provided in different regions of the input panel and a region where a metal piece, a coil, or the like included in a stylus pen or the like used as the pointer 682 approaches can be determined in accordance with a change in the circuit constant of the oscillation circuits.

The proximity sensor including a photoelectric conversion element has a function of sensing the proximity of a light-emitting element. To determine positional data, for example, a plurality of photoelectric conversion elements are provided in different regions of the input panel and a region where a light-emitting element included in a stylus pen or the like used as the pointer 682 approaches can be determined in accordance with a change in the electromotive force of the photoelectric conversion elements.

[Sensor Portion]

As the sensor portion 650, an illuminance sensor that senses the environmental brightness, a human motion sensor, or the like can be used.

[Communication Portion]

The communication portion 690 has a function of supplying data to a network and acquiring data from the network.

The data processor 600 described above can be used for education, or can be used for a digital signage or a smart television system, for example.

This embodiment can be combined with any of the other embodiments and examples in this specification as appropriate.

Embodiment 15

In this embodiment, a display device including a semiconductor device of one embodiment of the present invention will be described with reference to FIG. 96 and FIG. 97.

<15-1. Schematic Perspective View of Display Device>

A display device of this embodiment is described with reference to FIG. 96. FIG. 96 is a schematic perspective view of a display device 510.

In the display device 510, a substrate 511 and a substrate 512 are attached to each other. In FIG. 96, the substrate 512 is denoted by a dashed line.

The display device 510 includes a display portion 514, a circuit 516, a wiring 518, and the like. FIG. 96 illustrates an example in which the display device 510 is provided with an IC 520 and an FPC 522. Thus, the structure illustrated in FIG. 96 can be referred to as a display module including the display device 510, the IC 520, and the FPC 522.

As the circuit 516, for example, a scan line driver circuit can be used.

The wiring 518 has a function of supplying a signal and power to the display portion 514 and the circuit 516. The signal and power are input to the wiring 518 from the outside through the FPC 522 or from the IC 520.

Figure 96:
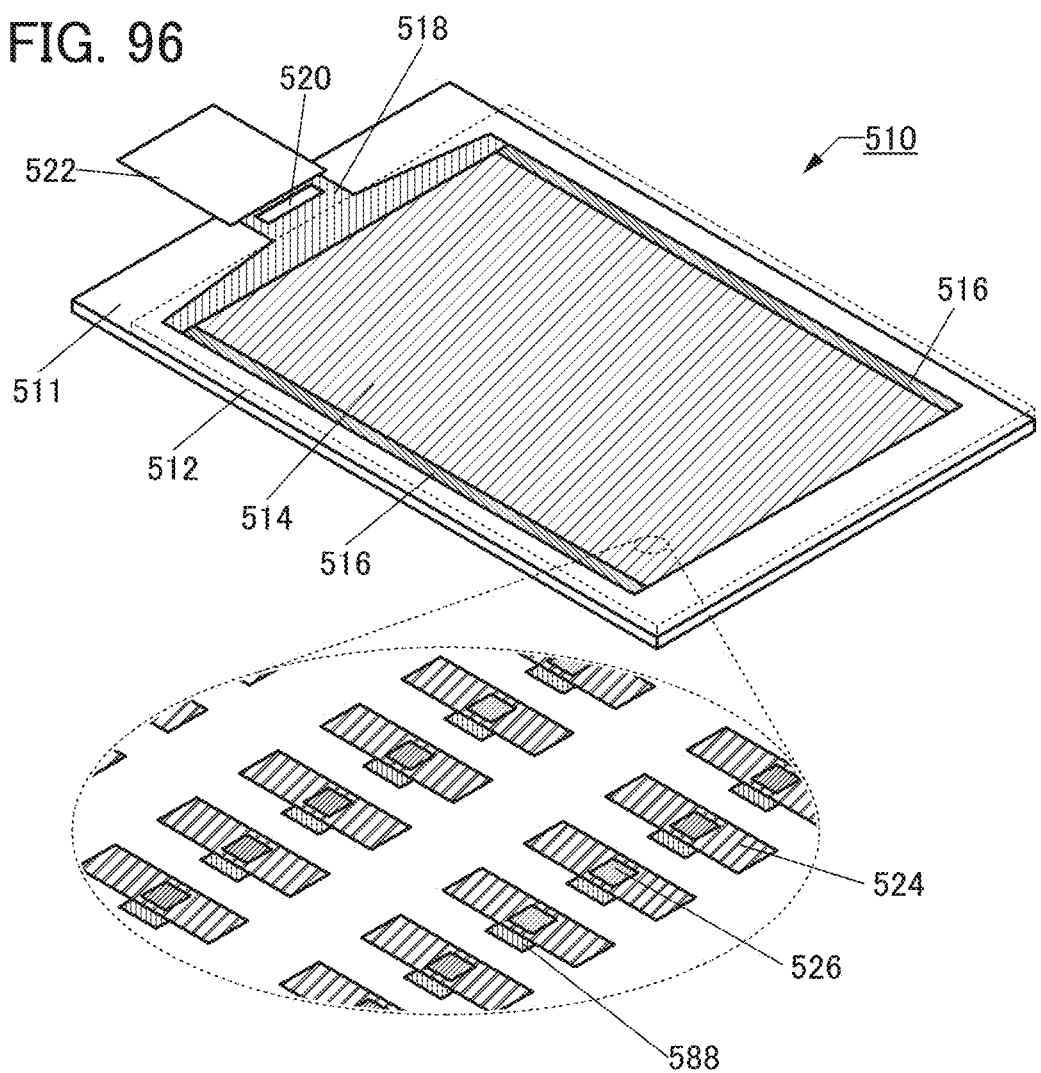
FIG. 96 is a perspective view illustrating an example of a display device.

FIG. 96 illustrates an example in which the IC 520 is provided over the substrate 511 by a chip on glass (COG) method, a chip on film (COF) method, or the like. An IC including a scan line driver circuit, a signal line driver circuit, or the like can be used as the IC 520, for example. Note that the display device 510 is not necessarily provided with the IC 520. Furthermore, the IC 520 may be provided over the FPC by a COF method or the like.

FIG. 96 illustrates an enlarged view of part of the display portion 514. Electrodes 524 included in a plurality of display elements are arranged in a matrix in the display portion 514. The electrode 524 has a function of reflecting visible light, and serves as a reflective electrode of a liquid crystal element 574, which is described later.

Furthermore, as illustrated in FIG. 96, the electrode 524 includes an opening 526. In addition, the display portion 514 includes a light-emitting element 588 that is positioned closer to the substrate 511 than the electrode 524 is. Light from the light-emitting element 588 is emitted to the substrate 512 side through the opening 526 in the electrode 524. The area of a light-emitting region in the light-emitting element 588 may be equal to that of the opening 526. One of the area of the light-emitting region in the light-emitting element 588 and the area of the opening 526 is preferably larger than the other because a margin for misalignment can be increased.

<15-2. Cross-Sectional View of Display Device>

Figure 97:
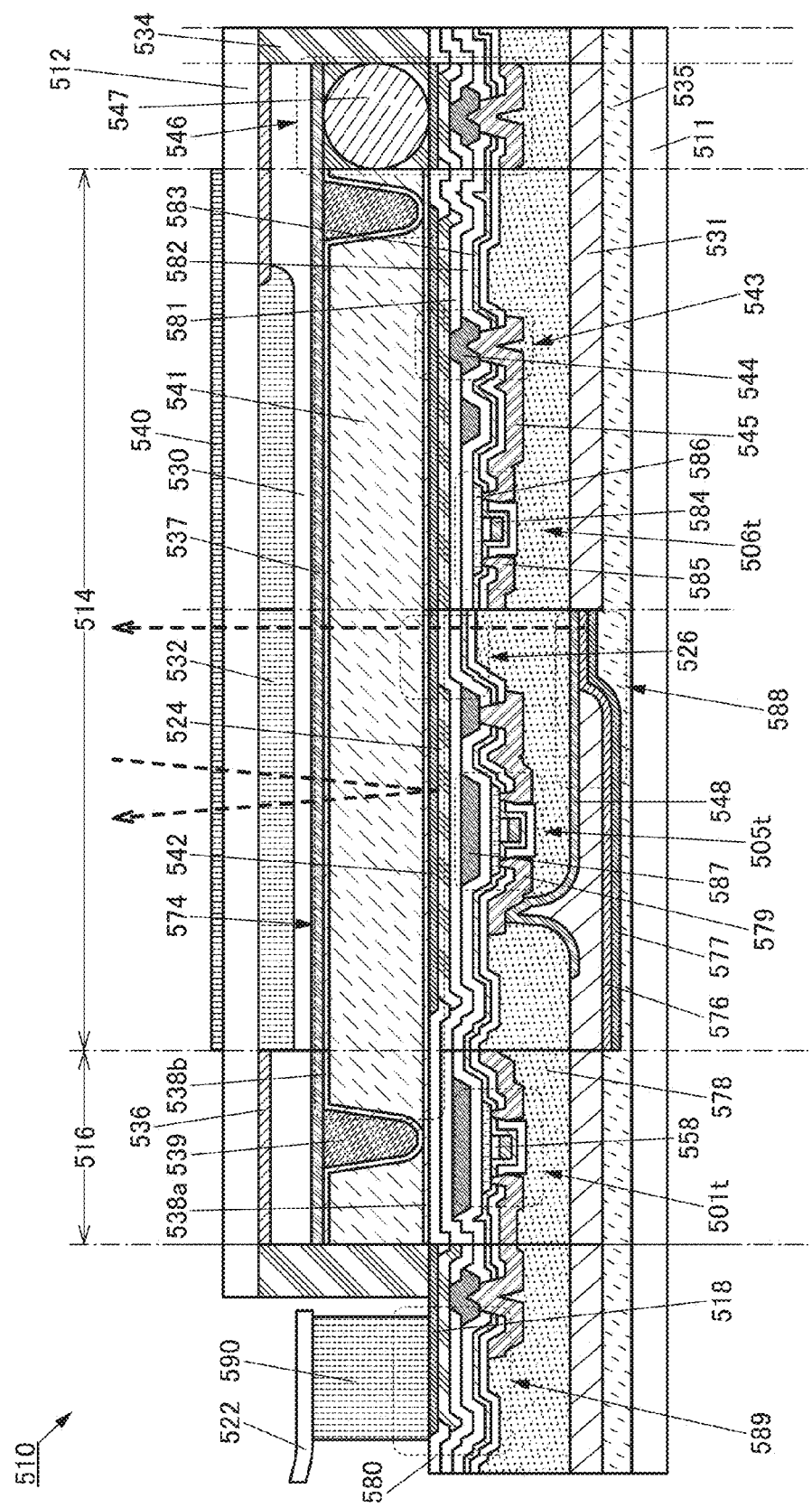
FIG. 97 is a cross-sectional view illustrating an example of a display device.

FIG. 97 illustrates an example of cross-sectional views of part of a region including the FPC 522, part of a region including the circuit 516, and part of a region including the display portion 514 of the display device 510 illustrated in FIG. 96.

The display device 510 illustrated in FIG. 97 includes a transistor 501$t$, a transistor 505$t$, a transistor 506$t$, the liquid crystal element 574, the light-emitting element 588, an insulating layer 530, an insulating layer 531, a coloring layer 532, and the like between the substrate 511 and the substrate 512. The substrate 512 is bonded to the insulating layer 530 with a bonding layer 534. The substrate 511 is bonded to the insulating layer 531 with a bonding layer 535.

Note that the display device 510 illustrated in FIG. 97 is an example of a hybrid display. The display device 510 can perform hybrid display.

Hybrid display is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display performing hybrid display is locally observed, a pixel or a subpixel performing display using any one of the plurality of display elements and a pixel or a subpixel performing display using two or more of the plurality of display elements are included in some cases.

Note that in the present specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display has a function of displaying a letter and/or an image using one or both of reflected light and self-emitted light in a display portion.

The substrate 512 is provided with the coloring layer 532, a light-blocking layer 536, the insulating layer 530, an electrode 537 functioning as a common electrode of the liquid crystal element 574, an alignment film 538b, an insulating layer 539, and the like. A polarizing plate 540 is provided on an outer surface of the substrate 512. The insulating layer 530 may have a function of a planarization layer. The insulating layer 530 enables the electrode 537 to have an almost flat surface, resulting in a uniform alignment state of a liquid crystal layer 541. The insulating layer 539 serves as a spacer for holding a cell gap of the liquid crystal element 574. In the case where the insulating layer 539 transmits visible light, the insulating layer 539 may be positioned to overlap with a display region of the liquid crystal element 574.

The liquid crystal element 574 is a reflective liquid crystal element. The liquid crystal element 574 has a stacked-layer structure of an electrode 542 functioning as a pixel electrode, the liquid crystal layer 541, and the electrode 537. The electrode 524 that reflects visible light is provided in contact with a surface of the electrode 542 on the substrate 511 side. The electrode 524 includes the opening 526. The electrode 542 and the electrode 537 transmit visible light. An alignment film 538a is provided between the liquid crystal layer 541 and the electrode 542. The alignment film 538b is provided between the liquid crystal layer 541 and the electrode 537.

In the liquid crystal element 574, the electrode 524 has a function of reflecting visible light, and the electrode 537 has a function of transmitting visible light. Light entering from the substrate 512 side is polarized by the polarizing plate 540, transmitted through the electrode 537 and the liquid crystal layer 541, and reflected by the electrode 524. Then, the light is transmitted through the liquid crystal layer 541 and the electrode 537 again to reach the polarizing plate 540. In this case, alignment of a liquid crystal can be controlled with a voltage that is applied between the electrode 524 and the electrode 537, and thus optical modulation of light can be controlled. In other words, the intensity of light exiting through the polarizing plate 540 can be controlled. Light excluding light in a particular wavelength region is absorbed by the coloring layer 532, and thus, exiting light is red light, for example.

As illustrated in FIG. 97, the electrode 542 that transmits visible light is preferably provided in the opening 526. Accordingly, the liquid crystal layer 541 is aligned in a region overlapping with the opening 526 as well as in the other regions, in which case defective alignment of the liquid crystal is prevented from being caused in the boundary portion of these regions and undesired light leakage can be suppressed.

In a connection portion 543, the electrode 524 is electrically connected to a conductive layer 545 included in the transistor 506t via a conductive layer 544. The transistor 506t has a function of controlling the driving of the liquid crystal element 574.

A connection portion 546 is provided in part of a region where the bonding layer 534 is provided. In the connection portion 546, a conductive layer obtained by processing the same conductive film as the electrode 542 is electrically connected to part of the electrode 537 with a connector 547. Accordingly, a signal or a potential input from the FPC 522 connected to the substrate 511 side can be supplied to the electrode 537 formed on the substrate 512 side through the connection portion 546.

As the connector 547, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 547.

The connector 547 is preferably provided so as to be covered with the bonding layer 534. For example, a paste or the like for forming the bonding layer 534 may be applied, and then, the connector 547 may be provided.

The light-emitting element 588 is a bottom-emission light-emitting element. The light-emitting element 588 has a stacked-layer structure in which an electrode 548 functioning as a pixel electrode, an EL layer 576, and an electrode 577 functioning as a common electrode are stacked in this order from the insulating layer 530 side. The electrode 548 is connected to a conductive layer 579 included in the transistor 505t through an opening provided in an insulating layer 578. The transistor 505t has a function of controlling the driving of the light-emitting element 588. The insulating layer 531 covers an end portion of the electrode 548. The electrode 577 includes a material that reflects visible light, and the electrode 548 includes a material that transmits visible light. Light is emitted from the light-emitting element 588 to the substrate 512 side through the insulating layer 530, the opening 526, and the like.

The liquid crystal element 574 and the light-emitting element 588 can exhibit various colors when the color of the coloring layer varies among pixels. The display device 510 can perform color display using the liquid crystal element 574. The display device 510 can perform color display using the light-emitting element 588.

The transistors 501t, 505t, and 506t are formed on the substrate 511 side of an insulating layer 580. These transistors can be fabricated using the same process.

Furthermore, for each of the transistors 501t, 505t, and 506t, any of the semiconductor devices of embodiments of the present invention which are described in Embodiment 1 and Embodiment 2 can be used. That is, by combining a semiconductor device of one embodiment of the present invention and a plurality of display elements, a change in electrical characteristics of a display device can be prevented and the reliability of the display device can be improved. Thus, a display device having a high display quality can be provided.

A circuit electrically connected to the liquid crystal element 574 and a circuit electrically connected to the light-emitting element 588 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 574 is positioned opposite to the pixel electrode of the light-emitting element 588 with respect to a gate insulating layer of the transistor.

The transistor 505t is a transistor (also referred to as a driving transistor) for controlling current flowing to the light-emitting element 588. Note that as a material used for a channel formation region in the transistor, a metal oxide is preferably used. In addition to the transistor 505t, a transistor (also referred to as a switching transistor or a selection transistor) for controlling whether the pixel is selected or not may be provided.

Insulating layers such as an insulating layer 581, an insulating layer 582, and an insulating layer 583 are provided on the substrate 511 side of the insulating layer 580. Part of the insulating layer 581 functions as a base insulating layer of each transistor. The insulating layer 582 functions as a gate insulating layer of the transistor. The insulating layer 583 functions as a protective insulating film of the transistor. The insulating layer 578 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

The transistors 501t, 505t, and 506t include a conductive layer 584 functioning as a gate, an insulating layer 558 functioning as a gate insulating layer, the conductive layer 545 and a conductive layer 585 functioning as a source and a drain, and a semiconductor layer 586. Here, a plurality of layers obtained by processing the same conductive film are shown with the same hatching pattern.

The transistors 501t and 505t include a conductive layer 587 functioning as a gate in addition to the components of the transistor 506t.

The structure in which the semiconductor layer where a channel is formed is provided between two gates is used as an example of the transistors 501t and 505t. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistors can be controlled.

Note that the structure of the transistors included in the display device is not limited. The transistor included in the circuit 516 and the transistor included in the display portion 514 may have the same structure or different structures. A plurality of transistors included in the circuit 516 may have the same structure or a combination of two or more kinds of structures. Similarly, a plurality of transistors included in the display portion 514 may have the same structure or a combination of two or more kinds of structures.

A connection portion 589 is provided in a region of the substrate 511 that does not overlap with the substrate 512. In the connection portion 589, the wiring 518 is electrically connected to the FPC 522 via a connection layer 590. The connection portion 589 has a similar structure to the connection portion 543. On the top surface of the connection portion 589, a conductive layer obtained by processing the same conductive film as the electrode 542 is exposed. Thus, the connection portion 589 and the FPC 522 can be electrically connected to each other through the connection layer 590.

As the polarizing plate 540 provided on the outer surface of the substrate 512, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 574 are controlled depending on the kind of the polarizing plate so that desirable contrast is obtained.

Note that a variety of optical members can be arranged on the outer surface of the substrate 512. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 512.

For each of the substrates 511 and 512, glass, quartz, ceramic, sapphire, an organic resin, or the like can be used. When the substrates 511 and 512 are formed using a flexible material, the flexibility of the display device can be increased.

A liquid crystal element having, for example, a vertical alignment (VA) mode can be used as the liquid crystal element 574. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 574. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal in order to improve the temperature range. The liquid crystal composition that includes liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 540 is provided on the display surface side. In addition, a light diffusion plate is preferably provided on the display surface side to improve visibility.

A front light may be provided on the outer side of the polarizing plate 540. As the front light, an edge-light front light is preferably used. A front light including a light-emitting diode (LED) is preferably used to reduce power consumption.

The structures described in this embodiment can be combined as appropriate with any of the structures described in the other embodiments and examples.

EXAMPLE 1

In this example, Samples G1 to G4 were fabricated and subjected to TDS measurement and sheet resistance measurement.

<1-1. Structure of Samples>

Figure 76:
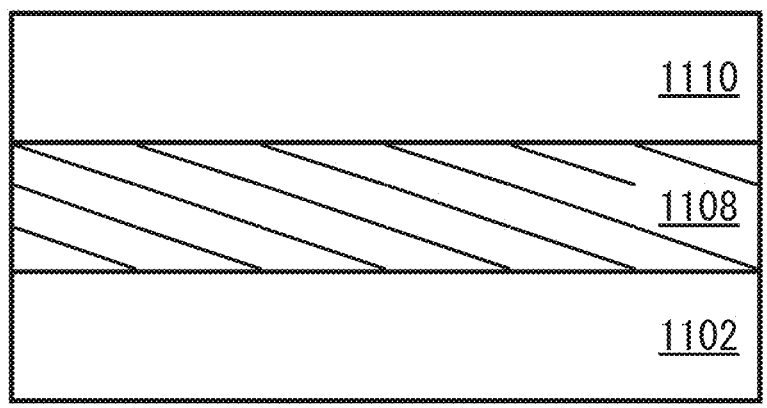
FIG. 76 illustrates a cross-sectional structure of samples in Example.

First, the structure of the samples will be described with reference to FIG. 76. FIG. 76 is a cross-sectional view illustrating the structure of the samples in this example.

Each of Samples G1 to G4 includes a substrate 1102, an oxide semiconductor 1108 over the substrate 1102, and an insulator 1110 over the oxide semiconductor 1108.

<1-2. Methods for Fabricating Samples>

Next, methods for fabricating the samples will be described.

[Method for Fabricating Sample G1]

First, the oxide semiconductor 1108 was formed over the substrate 1102.

A glass substrate was used as the substrate 1102, and a 40-nm-thick In—Ga—Zn oxide was formed as the oxide semiconductor 1108 with a sputtering apparatus. The In—Ga—Zn oxide was formed under the following conditions: the substrate temperature was 170° C.; an argon gas at a flow rate of 35 sccm and an oxygen gas at a flow rate of 15 sccm were introduced into a chamber; the pressure was 0.2 Pa; and an AC power of 1500 W was supplied to a metal oxide target (In:Ga:Zn=4:2:4.1 [atomic ratio]) placed in the sputtering apparatus.

Next, the insulator 1110 was formed over the oxide semiconductor 1108.

For the insulator 1110, a 20-nm-thick silicon oxynitride film was formed with a plasma CVD apparatus. The silicon oxynitride film was formed under the following conditions: the substrate temperature was 350° C.; a silane gas at a flow rate of 6 sccm and a dinitrogen monoxide gas at a flow rate of 18000 sccm were introduced into a chamber; the pressure was 250 Pa; and an RF power of 500 W was supplied between parallel-plate electrodes provided in the plasma CVD apparatus.

Next, heat treatment was performed at a substrate temperature of 350° C. in a nitrogen atmosphere for one hour.

Through the above steps, Sample G1 of this example was fabricated.

[Method for Fabricating Sample G2]

To fabricate Sample G2, first, the oxide semiconductor 1108 was formed over the substrate 1102 under the same conditions as in the case of Sample G1.

Next, the insulator 1110 was formed over the oxide semiconductor 1108.

For the insulator 1110, a 20-nm-thick silicon oxynitride film was formed with a plasma CVD apparatus. The silicon oxynitride film was formed under the following conditions: the substrate temperature was 350° C.; a silane gas at a flow rate of 20 sccm and a dinitrogen monoxide gas at a flow rate of 3000 sccm were introduced into a chamber; the pressure was 200 Pa; and an RF power of 100 W was supplied between parallel-plate electrodes provided in the plasma CVD apparatus.

Next, heat treatment was performed at a substrate temperature of 350° C. in a nitrogen atmosphere for one hour.

Through the above steps, Sample G2 of this example was fabricated.

[Method for Fabricating Sample G3]

To fabricate Sample G3, first, the oxide semiconductor 1108 was formed over the substrate 1102 under the same conditions as in the case of Sample G1.

Next, for the insulator 1110, a 50-nm-thick silicon oxynitride film was formed over the oxide semiconductor 1108 under the same conditions as in the case of Sample G1.

Next, heat treatment was performed at a substrate temperature of 350° C. in a nitrogen atmosphere for one hour.

Through the above steps, Sample G3 of this example was fabricated.

[Method for Fabricating Sample G4]

To fabricate Sample G4, first, the oxide semiconductor 1108 was formed over the substrate 1102 under the same conditions as in the case of Sample G2.

Next, for the insulator 1110, a 50-nm-thick silicon oxynitride film was formed over the oxide semiconductor 1108 under the same conditions as in the case of Sample G1.

Next, heat treatment was performed at a substrate temperature of 350° C. in a nitrogen atmosphere for one hour.

Through the above steps, Sample G4 of this example was fabricated.

<1-3. TDS Measurement Results of Samples>

Figure 77A:
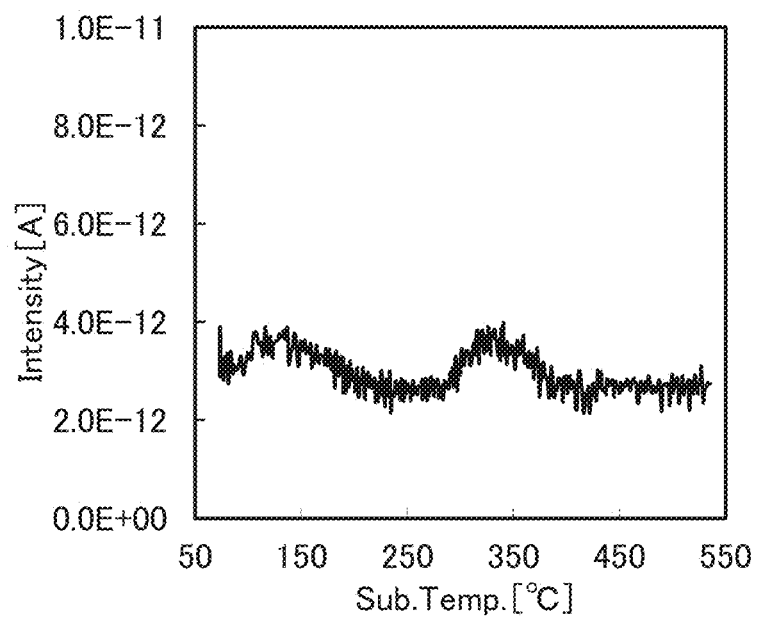
FIGS. 77A and 77B show TDS measurement results in Example.
Figure 77B:
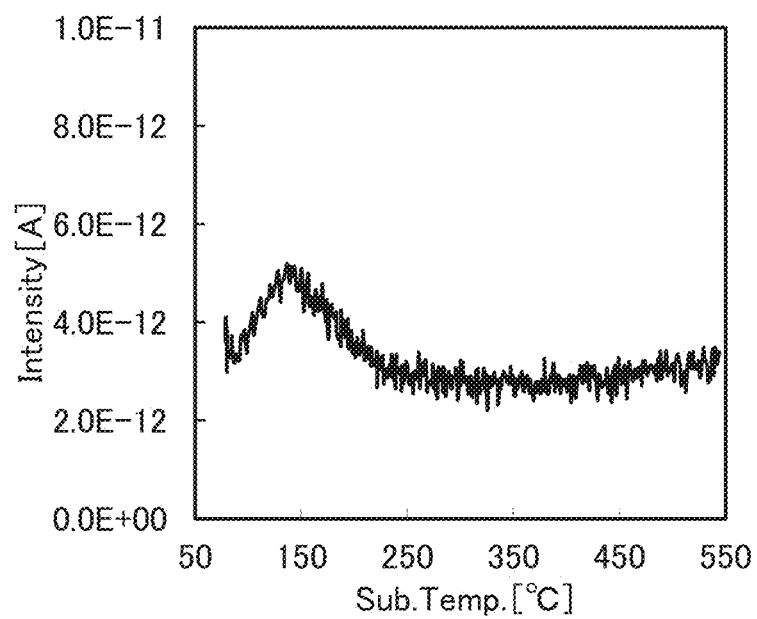

FIGS. 77A and 77B show the TDS measurement results of Samples G3 and G4 fabricated as described above. Note that FIG. 77A shows the results of Sample G3, and FIG. 77B shows the results of Sample G4. The temperature range for the TDS measurement was from 50° C. to 550° C.

Note that FIGS. 77A and 77B show the TDS measurement results of the amount of a released gas with a mass-to-charge ratio of 32, which corresponds to an oxygen molecule. Note that an oxygen gas adsorbed on a surface is detected in a temperature range from 50° C. to 200° C.

The results in FIGS. 77A and 77B confirm that the insulator 1110 in Sample G3 contains more excess oxygen than the insulator 1110 in Sample G4.

<1-4. Sheet Resistance Measurement Results of Samples>

FIG. 78 shows the sheet resistance measurement results of Samples G1 to G4 fabricated as described above. The results in FIG. 78 show that Sample G1 is more resistant than Sample G2 and that Sample G3 is more resistant than Sample G4. That is, it has been confirmed that the use of a film containing more excess oxygen as the insulator 1110 makes the oxide semiconductor 1108 more resistant when the thickness of the insulator 1110 is the same.

The results in FIG. 78 also show that each of Samples G1 to G4 becomes more resistant by being heated. This suggests that the oxide semiconductor 1108 effectively becomes more resistant by being heated because oxygen is supplied to the oxide semiconductor 1108 from the film containing excess oxygen.

The structure described in this example can be combined as appropriate with any of the structures described in other examples and the above embodiments.

EXAMPLE 2

In this example, transistors were fabricated and subjected to cross-sectional observation and characteristics observation with an emission microscope.

Figure 79A:
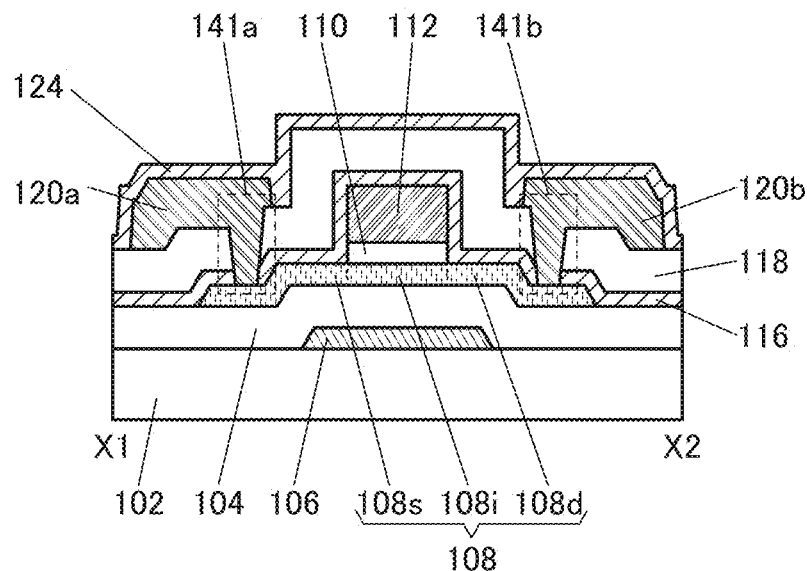
FIGS. 79A and 79B illustrate a cross-sectional structure of samples in Example.
Figure 79B:
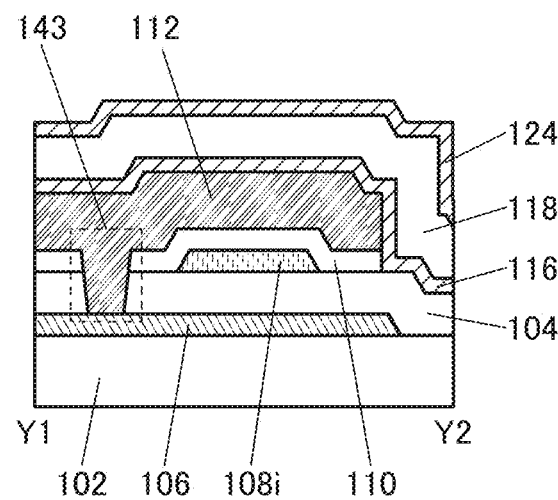

Samples (Samples H1 and H2) in each of which a transistor corresponding to a transistor 100Z illustrated in FIGS. 79A and 79B was formed were fabricated and observed. Note that a top view of the transistor 100Z illustrated in FIGS. 79A and 79B is similar to that of the transistor 100A illustrated in FIGS. 4A to 4C and thus is not described here.

Note that in fabricating Sample H1, plasma treatment was performed in a mixed atmosphere of an argon gas and a nitrogen gas before the formation of the insulator 116. In fabricating Sample H2, plasma treatment was performed in an argon gas atmosphere before the formation of the insulator 116.

Samples H1 and H2 fabricated in this example will be described below. Note that reference numerals used for the transistor 100Z in FIGS. 79A and 79B are used in the following description.

<2-1. Methods for Fabricating Samples H1 and H2>

First, the conductor 106 was formed over the substrate 102. A glass substrate was used as the substrate 102. For the conductor 106, a 10-nm-thick tantalum nitride film and a 100-nm-thick copper film were formed with a sputtering apparatus.

Next, the insulator 104 was formed over the substrate 102 and the conductor 106. For the insulator 104, a 400-nm-thick silicon nitride film and a 50-nm-thick silicon oxynitride film were formed with a plasma CVD apparatus.

The insulator 104 was formed as follows. First, a 50-nm-thick silicon nitride film was formed under the following conditions: the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was 100 Pa; and an RF power of 2000 W was supplied between parallel-plate electrodes provided in the plasma CVD apparatus. Next, the flow rate of the ammonia gas was changed to 2000 sccm to form a 300-nm-thick silicon nitride film. Then, the flow rate of the ammonia gas was changed to 100 sccm to form a 50-nm-thick silicon nitride film. After that, a 50-nm-thick silicon oxynitride film was formed under the following conditions: the substrate temperature was 350° C.; a silane gas at a flow rate of 20 sccm and a dinitrogen monoxide gas at a flow rate of 3000 sccm were introduced into the chamber; the pressure was 40 Pa; and an RF power of 100 W was supplied between the parallel-plate electrodes provided in the plasma CVD apparatus.

Then, the oxide semiconductor 108 was formed over the insulator 104. The oxide semiconductor 108 was formed with a sputtering apparatus.

As the oxide semiconductor 108, a 40-nm-thick oxide semiconductor was formed under the following conditions: the substrate temperature was 170° C.; an argon gas at a flow rate of 35 sccm and an oxygen gas at a flow rate of 15 sccm were introduced into a chamber; the pressure was 0.2 Pa; and an AC power of 1500 W was supplied to a metal oxide target (In:Ga:Zn=4:2:4.1 [atomic ratio]) placed in the sputtering apparatus.

After that, the insulator 110 was formed over the insulator 104 and the oxide semiconductor 108.

For the insulator 110, a 20-nm-thick silicon oxynitride film was formed with a plasma CVD apparatus. The silicon oxynitride film was formed under the following conditions: the substrate temperature was 350° C.; a silane gas at a flow rate of 6 sccm and a dinitrogen monoxide gas at a flow rate of 18000 sccm were introduced into a chamber; the pressure was 250 Pa; and an RF power of 500 W was supplied between parallel-plate electrodes provided in the plasma CVD apparatus.

Next, the insulators 110 and 104 in a desired region were removed to form the opening 143 that reaches the conductor 106.

Subsequently, the conductor 112 was formed over the insulator 110 so as to cover the opening 143. For the conductor 112, a 10-nm-thick first In—Ga—Zn oxide and a 90-nm-thick second In—Ga—Zn oxide were formed with a sputtering apparatus. The first In—Ga—Zn oxide was formed under the following conditions: the substrate temperature was 170° C.; an oxygen gas at a flow rate of 200 sccm was introduced into a chamber; the pressure was 0.6 Pa; and an AC power of 2500 W was supplied to the metal oxide target (In:Ga:Zn=4:2:4.1 [atomic ratio]) placed in the sputtering apparatus. The second In—Ga—Zn oxide was formed under the following conditions: the substrate temperature was 170° C.; an argon gas at a flow rate of 180 sccm and an oxygen gas at a flow rate of 20 sccm were introduced into the chamber; the pressure was 0.6 Pa; and an AC power of 2500 W was supplied to the metal oxide target (In:Ga:Zn=4:2:4.1 [atomic ratio]) placed in the sputtering apparatus.

After that, the insulator 110 and the conductor 112 were processed into island shapes with a dry etching apparatus and a surface of the oxide semiconductor 108 was partly exposed.

Then, the insulator 116 was formed to a thickness of 100 nm over the insulator 104, the oxide semiconductor 108, and the conductor 112. The insulator 116 was formed through two steps: plasma treatment and deposition treatment.

To fabricate Sample H1, the plasma treatment was performed under the following conditions: the substrate temperature was 220° C.; an argon gas at a flow rate of 100 sccm and a nitrogen gas at a flow rate of 1000 sccm were introduced into a chamber; the pressure was 40 Pa; and an RF power of 1000 W was supplied between parallel-plate electrodes provided in a plasma CVD apparatus. Subsequently, a silicon nitride film was formed under the following conditions: the substrate temperature was 220° C.; a silane gas at a flow rate of 50 sccm, a nitrogen gas at a flow rate of 5000 sccm, and an ammonia gas at a flow rate of 100 sccm were introduced into the chamber; the pressure was 100 Pa; and an RF power of 1000 W was supplied between the parallel-plate electrodes provided in the plasma CVD apparatus.

To fabricate Sample H2, the plasma treatment was performed under the following conditions: the substrate temperature was 220° C.; an argon gas at a flow rate of 100 sccm was introduced into a chamber; the pressure was 40 Pa; and an RF power of 1000 W was supplied between parallel-plate electrodes provided in a plasma CVD apparatus. Subsequently, a silicon nitride film was formed under the following conditions: the substrate temperature was 220° C.; a silane gas at a flow rate of 50 sccm, a nitrogen gas at a flow rate of 5000 sccm, and an ammonia gas at a flow rate of 100 sccm were introduced into the chamber; the pressure was 100 Pa; and an RF power of 1000 W was supplied between the parallel-plate electrodes provided in the plasma CVD apparatus.

Next, the insulator 118 was formed over the insulator 116.

The insulator 118 was formed under the following conditions: the substrate temperature was 220° C.; a silane gas at a flow rate of 160 sccm and a dinitrogen monoxide gas at a flow rate of 4000 sccm were introduced into the chamber; the pressure was 200 Pa; and an RF power of 1500 W was supplied between the parallel-plate electrodes provided in the plasma CVD apparatus.

Next, the insulators 116 and 118 in desired regions were removed to form the openings 141a and 141b that reach the oxide semiconductor 108.

The openings 141a and 141b were formed by a dry etching method.

Then, a conductor was formed over the insulator 118 so as to cover the openings 141a and 141b and the conductor was processed into an island shape, whereby the conductors 120a and 121a and the conductors 120b and 121b functioning as the source and drain electrodes were formed.

For the conductors 120a, 121a, 120b, and 121b, a 10-nm-thick titanium film and a 100-nm-thick copper film were formed with a sputtering apparatus. Note that a wet etching apparatus was used for processing into the conductors 120a, 121a, 120b, and 121b.

Next, heat treatment was performed at a substrate temperature of 250° C. in a nitrogen atmosphere for one hour.

Through the above steps, Samples H1 and H2 of this example were fabricated. Note that the highest temperature in the fabrication processes of Samples H1 and H2 was 350° C.

<2-2. Cross-Sectional Observation>

Figure 80A:
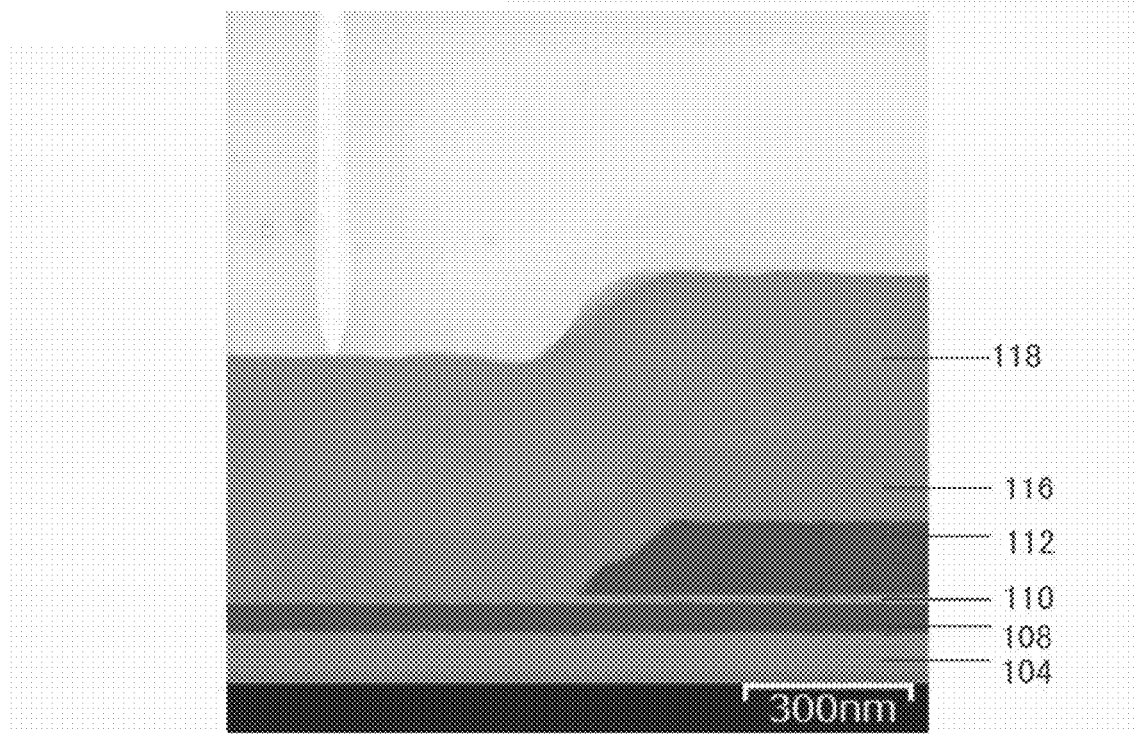
FIGS. 80A and 80B show cross-sectional photographs of samples in Example.
Figure 80B:
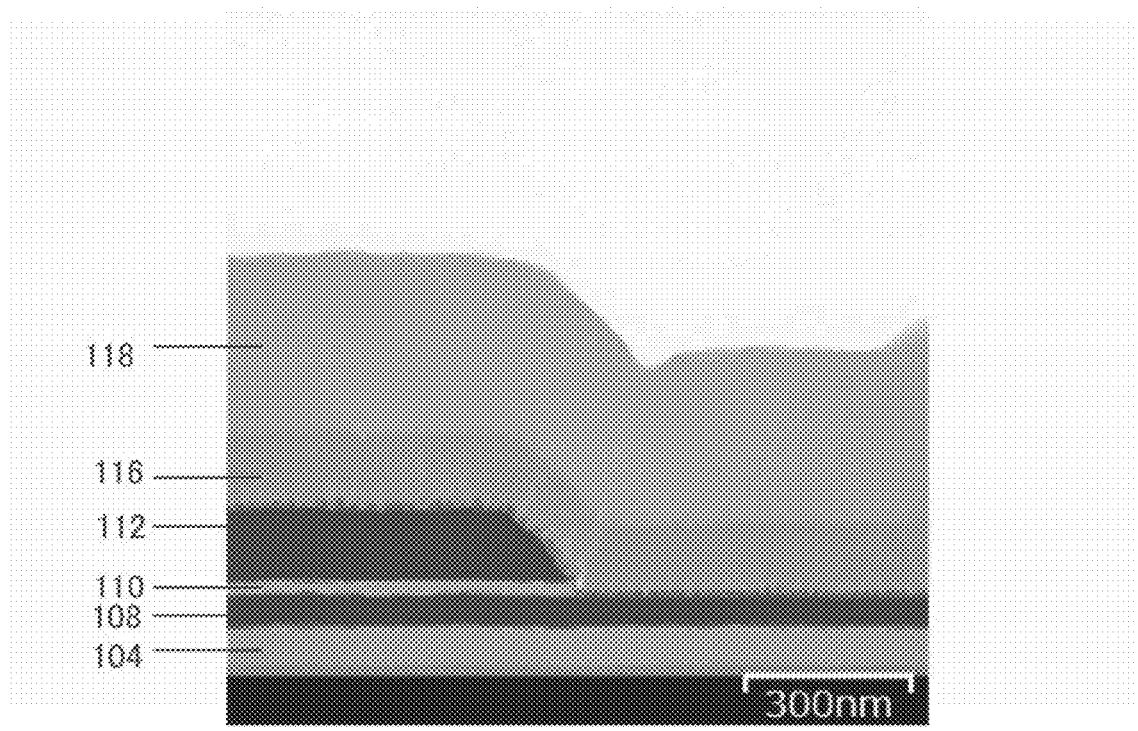

Next, cross sections of gate ends in the channel length direction of Samples H1 and H2 fabricated as described above were observed with a scanning transmission electron microscope (STEM). HD-2300 manufactured by Hitachi High-Technologies Corporation was used for the observation. FIG. 80A shows the cross-sectional STEM observation result of Sample H1. FIG. 80B shows the cross-sectional STEM observation result of Sample H2.

The cross-sectional observation of Sample H2 confirms that the interface between the insulator 116 and the conductor 112 and the interface between the insulator 116 and the oxide semiconductor 108 are uneven and the surfaces of the conductor 112 and the oxide semiconductor 108 are rough. In contrast, the cross-sectional observation of Sample H1 confirms that the interface between the insulator 116 and the conductor 112 and the interface between the insulator 116 and the oxide semiconductor 108 are flat and the surfaces of the conductor 112 and the oxide semiconductor 108 are not rough.

<2-3. Characteristics Observed with Emission Microscope>

Next, characteristics of a panel incorporating Sample H1 and a panel incorporating Sample H2 fabricated as described above were observed with an emission microscope. For the observation, an emission microscope (PHEMOS-1000) manufactured by Hamamatsu Photonics K.K. was used and pictures were taken with a charge-coupled device (CCD) camera. The wavelength range for observation with the CCD camera was from 300 nm to 1100 nm.

Figure 81A:
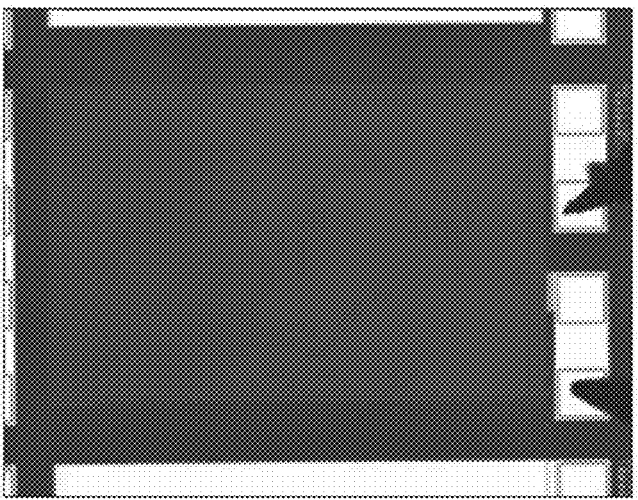
FIGS. 81A to 81C show results of observation with an emission microscope in Example.
Figure 81B:
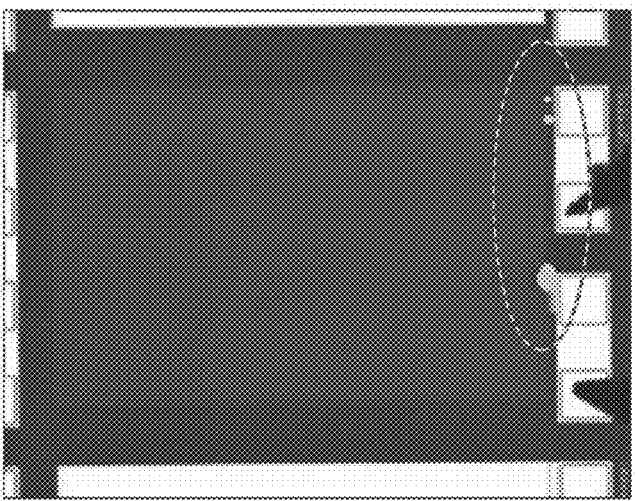
Figure 81C:
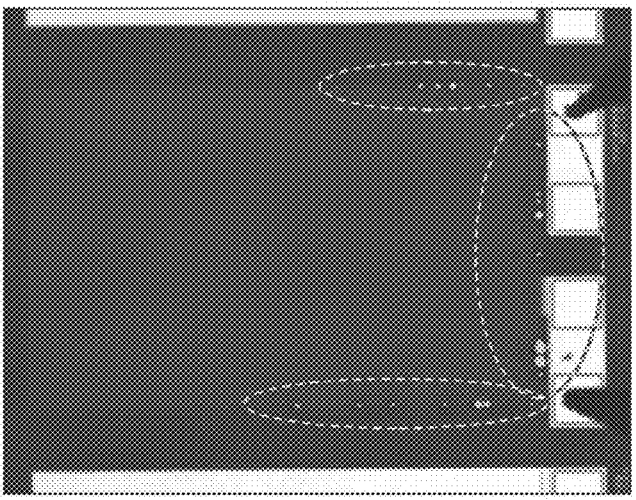

FIG. 81A shows characteristics of the panel incorporating Sample H1 which were observed using the emission microscope with a voltage of 15 V applied to the conductor 112 and with the conductors 120a and 120b fixed to GND. FIG. 81B shows characteristics of the panel incorporating Sample H1 which were observed using the emission microscope with a voltage of 20 V applied to the conductor 112 and with the conductors 120a and 120b fixed to GND. FIG. 81C shows characteristics of the panel incorporating Sample H2 which were observed using the emission microscope with a voltage of 5 V applied to the conductor 112 and with the conductors 120a and 120b fixed to GND.

In the panel incorporating Sample H2, light emission from regions enclosed by broken lines in FIG. 81C was observed when the voltage of 5 V was applied to the conductor 112. In contrast, in the panel incorporating Sample H1, no light emission was observed as shown in FIG. 81A even when the voltage of 15 V was applied to the conductor 112. In the panel incorporating Sample H1, light emission from a region enclosed by a broken line in FIG. 81B was observed when the voltage of 20 V was applied to the conductor 112.

Therefore, it has been found that surface roughness of the conductor 112 and the oxide semiconductor 108 and leakage current through the side surface of the insulator 110 which serves as a path can be suppressed when the plasma treatment in the mixed atmosphere of an argon gas and a nitrogen gas is performed.

The structure described in this example can be combined as appropriate with any of the structures described in other examples and the above embodiments.

EXAMPLE 3

In this example, transistors were fabricated and subjected to the $I_d$-$V_g$ characteristics measurement of the transistors, GBT tests of the transistors, gate-insulator dielectric withstand tests, and cross-sectional observation.

Samples (Samples J1 to J3) in each of which a transistor corresponding to the transistor 100Z illustrated in FIGS. 79A and 79B was formed were fabricated for evaluation. Note that a top view of the transistor 100Z illustrated in FIGS. 79A and 79B is similar to that of the transistor 100A illustrated in FIGS. 4A to 4C and thus is not described here.

In fabricating Sample J1, plasma treatment was performed in a mixed atmosphere of an argon gas and a nitrogen gas before the formation of the insulator 116, and the insulator 110 was deposited to a thickness of 50 nm. In fabricating Sample J2, plasma treatment was performed in a mixed atmosphere of an argon gas and a nitrogen gas before the formation of the insulator 116, and the insulator 110 was deposited to a thickness of 20 nm. In fabricating Sample J3, plasma treatment was performed in an argon gas atmosphere before the formation of the insulator 116, and the insulator 110 was deposited to a thickness of 20 nm under conditions different from those for Samples J1 and J2.

Samples J1 to J3 fabricated in this example will be described below. Note that the reference numerals used for the transistor 100Z in FIGS. 79A and 79B are used in the following description.

<3-1. Methods for Fabricating Samples J1 to J3>

First, the conductor 106 was formed over the substrate 102. A glass substrate was used as the substrate 102. For the conductor 106, a 10-nm-thick tantalum nitride film and a 100-nm-thick copper film were formed with a sputtering apparatus.

Next, the insulator 104 was formed over the substrate 102 and the conductor 106. For the insulator 104, a 400-nm-thick silicon nitride film and a 50-nm-thick silicon oxynitride film were formed with a plasma CVD apparatus.

The insulator 104 was formed as follows. First, a 50-nm-thick silicon nitride film was formed under the following conditions: the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was 100 Pa; and an RF power of 2000 W was supplied between parallel-plate electrodes provided in the plasma CVD apparatus. Next, the flow rate of the ammonia gas was changed to 2000 sccm to form a 300-nm-thick silicon nitride film. Then, the flow rate of the ammonia gas was changed to 100 sccm to form a 50-nm-thick silicon nitride film. After that, a 50-nm-thick silicon oxynitride film was formed under the following conditions: the substrate temperature was 350° C.; a silane gas at a flow rate of 20 sccm and a dinitrogen monoxide gas at a flow rate of 3000 sccm were introduced into the chamber; the pressure was 40 Pa; and an RF power of 100 W was supplied between the parallel-plate electrodes provided in the plasma CVD apparatus.

Then, the oxide semiconductor 108 was formed over the insulator 104. The oxide semiconductor 108 was formed with a sputtering apparatus.

As the oxide semiconductor 108, a 30-nm-thick oxide semiconductor was formed under the following conditions: the substrate temperature was 170° C.; an argon gas at a flow rate of 35 sccm and an oxygen gas at a flow rate of 15 sccm were introduced into a chamber; the pressure was 0.2 Pa; and an AC power of 1500 W was supplied to a metal oxide target (In:Ga:Zn=4:2:4.1 [atomic ratio]) placed in the sputtering apparatus.

After that, the insulator 110 was formed over the insulator 104 and the oxide semiconductor 108.

For the insulator 110 of Sample J1, a 50-nm-thick silicon oxynitride film was formed with a plasma CVD apparatus. The silicon oxynitride film was formed under the following conditions: the substrate temperature was 350° C.; a silane gas at a flow rate of 6 sccm and a dinitrogen monoxide gas at a flow rate of 18000 sccm were introduced into a chamber; the pressure was 250 Pa; and an RF power of 500 W was supplied between parallel-plate electrodes provided in the plasma CVD apparatus.

For the insulator 110 of Sample J2, a 20-nm-thick silicon oxynitride film was formed with a plasma CVD apparatus. The silicon oxynitride film was formed under the following conditions: the substrate temperature was 350° C.; a silane gas at a flow rate of 6 sccm and a dinitrogen monoxide gas at a flow rate of 18000 sccm were introduced into a chamber; the pressure was 250 Pa; and an RF power of 500 W was supplied between parallel-plate electrodes provided in the plasma CVD apparatus.

For the insulator 110 of Sample J3, a 20-nm-thick silicon oxynitride film was formed with a plasma CVD apparatus. The silicon oxynitride film was formed under the following conditions: the substrate temperature was 350° C.; a silane gas at a flow rate of 20 sccm and a dinitrogen monoxide gas at a flow rate of 3000 sccm were introduced into a chamber; the pressure was 200 Pa; and an RF power of 100 W was supplied between parallel-plate electrodes provided in the plasma CVD apparatus.

Next, the insulators 110 and 104 in a desired region were removed to form the opening 143 that reaches the conductor 106.

Subsequently, the conductor 112 was formed over the insulator 110 so as to cover the opening 143. For the conductor 112, a 10-nm-thick first In—Ga—Zn oxide and a 90-nm-thick second In—Ga—Zn oxide were formed with a sputtering apparatus. The first In—Ga—Zn oxide was formed under the following conditions: the substrate temperature was 170° C.; an oxygen gas at a flow rate of 200 sccm was introduced into a chamber; the pressure was 0.6 Pa; and an AC power of 2500 W was supplied to the metal oxide target (In:Ga:Zn=4:2:4.1 [atomic ratio]) placed in the sputtering apparatus. The second In—Ga—Zn oxide was formed under the following conditions: the substrate temperature was 170° C.; an argon gas at a flow rate of 180 sccm and an oxygen gas at a flow rate of 20 sccm were introduced into the chamber; the pressure was 0.6 Pa; and an AC power of 2500 W was supplied to the metal oxide target (In:Ga:Zn=4:2:4.1 [atomic ratio]) placed in the sputtering apparatus.

After that, the insulator 110 and the conductor 112 were processed into island shapes with a dry etching apparatus and a surface of the oxide semiconductor 108 was partly exposed.

Then, the insulator 116 was formed to a thickness of 100 nm over the insulator 104, the oxide semiconductor 108, and the conductor 112. The insulator 116 was formed through two steps: plasma treatment and deposition treatment.

To fabricate Samples J1 and J2, the plasma treatment was performed under the following conditions: the substrate temperature was 220° C.; an argon gas at a flow rate of 100 sccm and a nitrogen gas at a flow rate of 1000 sccm were introduced into a chamber; the pressure was 40 Pa; and an RF power of 1000 W was supplied between parallel-plate electrodes provided in a plasma CVD apparatus. Subsequently, a silicon nitride film was formed under the following conditions: the substrate temperature was 220° C.; a silane gas at a flow rate of 50 sccm, a nitrogen gas at a flow rate of 5000 sccm, and an ammonia gas at a flow rate of 100 sccm were introduced into the chamber; the pressure was 100 Pa; and an RF power of 1000 W was supplied between the parallel-plate electrodes provided in the plasma CVD apparatus.

To fabricate Sample J3, the plasma treatment was performed under the following conditions: the substrate temperature was 220° C.; an argon gas at a flow rate of 100 sccm was introduced into a chamber; the pressure was 40 Pa; and an RF power of 1000 W was supplied between parallel-plate electrodes provided in a plasma CVD apparatus. Subsequently, a silicon nitride film was formed under the following conditions: the substrate temperature was 220° C.; a silane gas at a flow rate of 50 sccm, a nitrogen gas at a flow rate of 5000 sccm, and an ammonia gas at a flow rate of 100 sccm were introduced into the chamber; the pressure was 100 Pa; and an RF power of 1000 W was supplied between the parallel-plate electrodes provided in the plasma CVD apparatus.

Next, the insulator 118 was formed over the insulator 116.

The insulator 118 was formed under the following conditions: the substrate temperature was 220° C.; a silane gas at a flow rate of 160 sccm and a dinitrogen monoxide gas at a flow rate of 4000 sccm were introduced into the chamber; the pressure was 200 Pa; and an RF power of 1500 W was supplied between the parallel-plate electrodes provided in the plasma CVD apparatus.

Next, the insulators 116 and 118 in desired regions were removed to form the openings 141a and 141b that reach the oxide semiconductor 108.

The openings 141a and 141b were formed by a dry etching method.

Then, a conductor was formed over the insulator 118 so as to cover the openings 141a and 141b and the conductor was processed into an island shape, whereby the conductors 120a and 121a and the conductors 120b and 121b functioning as the source and drain electrodes were formed.

For the conductors 120a, 121a, 120b, and 121b, a 10-nm-thick titanium film and a 100-nm-thick copper film were formed with a sputtering apparatus. Note that a wet etching apparatus was used for processing into the conductors 120a, 121a, 120b, and 121b.

Next, heat treatment was performed at a substrate temperature of 250° C. in a nitrogen atmosphere for one hour.

Through the above steps, Samples J1 to J3 of this example were fabricated. Note that the highest temperature in the fabrication processes of Samples J1 to J3 was 350° C.

<3-2. $I_d$-$V_g$ Characteristics>

Next, the $I_d$-$V_g$ characteristics of Samples J1 to J3 were measured. In measuring the $I_d$-$V_g$ characteristics, a voltage ($V_g$, $V_{bg}$) applied to the conductor 106 and the conductor 112 that respectively function as the first gate electrode and the second gate electrode of the transistor 100Z was changed from −15 V to +15 V for Sample J1 and from −10 V to +10 V for Samples J2 and J3, each in increments of 0.25 V. A voltage ($V_s$) applied to the conductors 120a and 121a functioning as the source electrode was 0 V (common), and a voltage ($V_d$) applied to the conductors 120b and 121b functioning as the drain electrode was 0.1 V and 10 V.

FIG. 82 shows the $I_d$-$V_g$ characteristics of Samples J1 to J3. In FIG. 82, the vertical axis represents $I_d$ (A), and the horizontal axis represents $V_g$ (V).

The results in FIG. 82 confirm that Samples J1 and J2 fabricated in this example each include a transistor with a high on-state current and a suppressed variation in electrical characteristics as compared with that in Sample J3. That is, the results confirm that a transistor with a high on-state current and a suppressed variation in electrical characteristics is obtained by performing plasma treatment in a mixed atmosphere of argon and nitrogen. The results also confirm that since the insulator 110 functioning as a gate insulator includes an oxygen excess region, the thickness of the gate insulator can be decreased.

<3-3. Gate Bias-Temperature Stress Rest (GBT Test)>

Next, the reliability of Sample J2 was evaluated. For the reliability evaluation, GBT tests were performed.

The GBT tests in this example were performed under the conditions where the gate voltage ($V_g$) was ±5 V; the drain voltage ($V_d$) and the source voltage ($V_s$) were 0 V (common); the stress temperature was 60° C.; the time for stress application was one hour; and two kinds of measurement environments, a dark environment and an illuminated environment (irradiated with light having approximately 10000 lx with a white LED), were employed. In other words, the source electrode and the drain electrode of the transistor were set at the same potential, and a potential different from that of the source and drain electrodes was applied to the gate electrode for a certain time (one hour, here).

A case where the potential applied to the gate electrode is higher than that of the source and drain electrodes is called positive stress, and a case where the potential applied to the gate electrode is lower than that of the source and drain electrodes is called negative stress. Thus, the reliability evaluation was performed under four conditions in total, i.e., positive GBT (dark), negative GBT (dark), positive GBT (illuminated), and negative GBT (illuminated).

Note that positive GBT (dark) can be referred to as positive bias temperature stress (PBTS), negative GBT (dark) as negative bias temperature stress (NBTS), positive GBT (illuminated) as positive bias illumination temperature stress (PBITS), and negative GBT (illuminated) as negative bias illumination temperature stress (NBITS).

Figure 83:
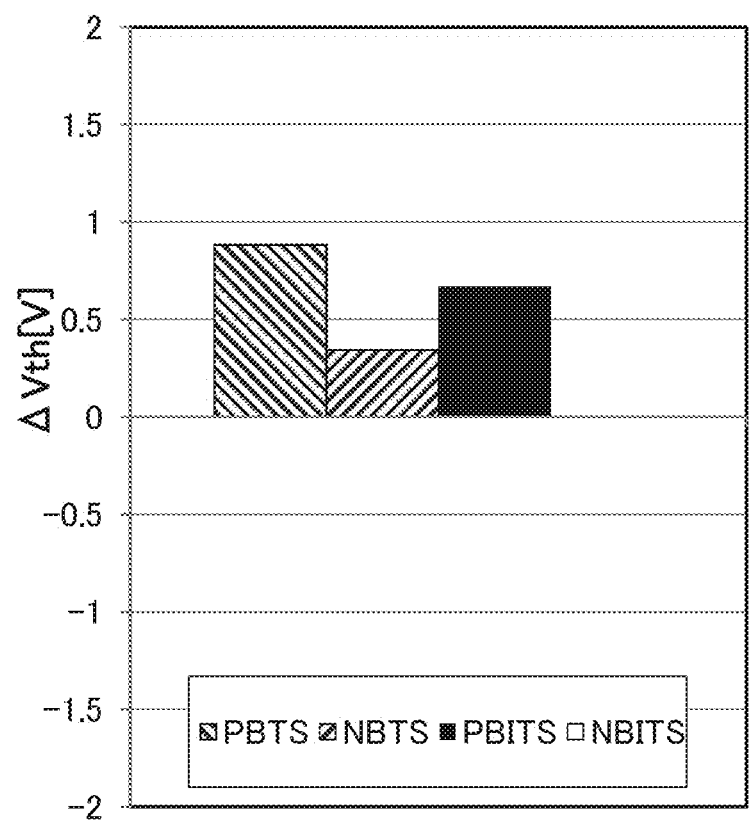
FIG. 83 shows GBT test results of transistors in Example.

FIG. 83 shows the GBT test results of Sample J2. In FIG. 83, the vertical axis represents the amount of change in the threshold voltage ($\Delta V_{th}$) of the transistors and the horizontal axis represents the stress conditions.

The results in FIG. 83 indicate that the amount of change in the threshold voltage ($\Delta V_{th}$) of the transistors included in Sample J2 fabricated in this example is within ±1 V in the GBT tests. Thus, it is confirmed that the transistors included in Sample J2 have high reliability. That is, it is confirmed that a transistor with a gate insulator containing excess oxygen has high reliability.

<3-4. Gate-Insulator Dielectric Withstand Test>

Next, gate-insulator dielectric withstand tests were performed on Samples J2 and J3 fabricated as described above. The drain voltage ($V_d$) and the source voltage ($V_s$) were fixed to GND, and the gate voltage ($V_g$) in the range from 0 V to 30 V was applied.

Figure 84A:
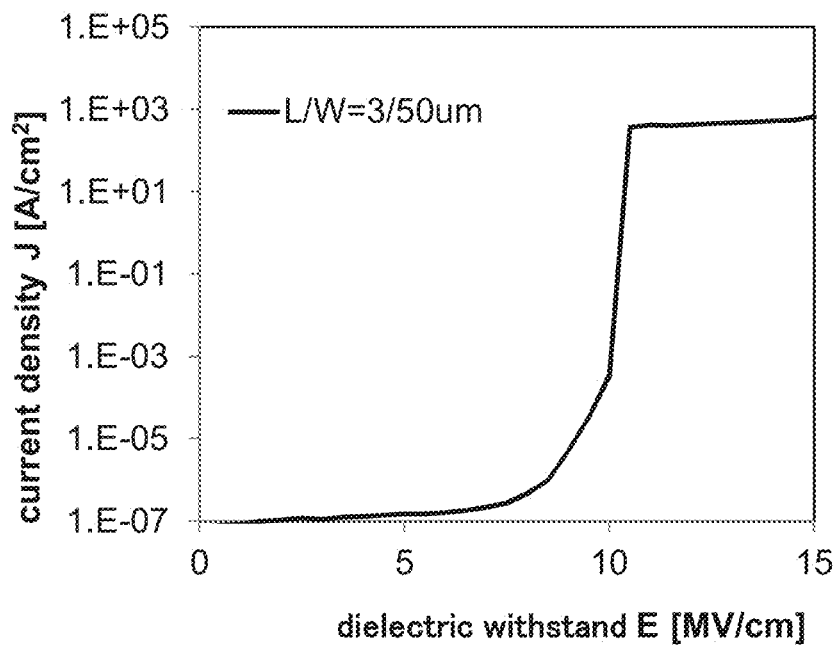
FIGS. 84A and 84B show dielectric withstand test results of transistors in Example.
Figure 84B:
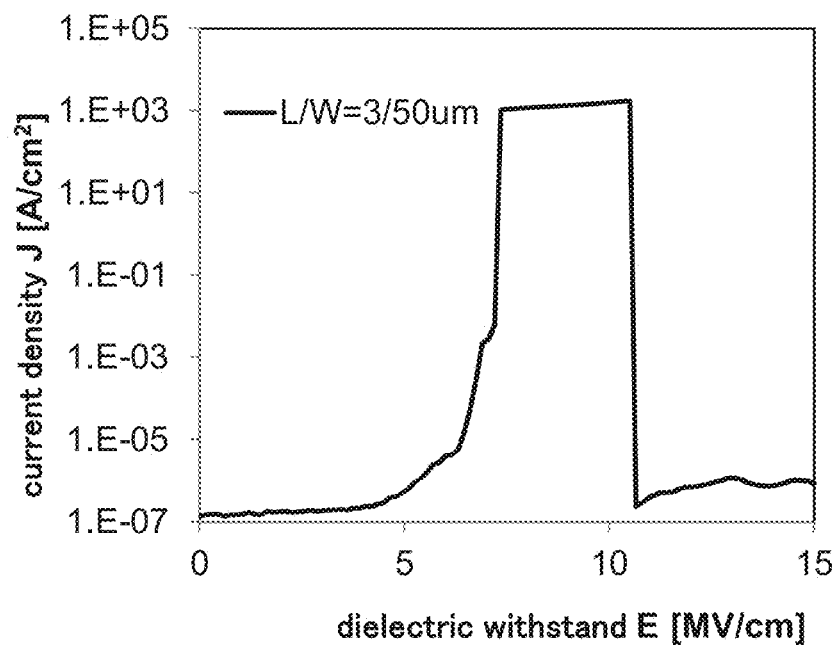

FIG. 84A shows the gate-insulator dielectric withstand test results of Sample J2. FIG. 84B shows the gate-insulator dielectric withstand test results of Sample J3. Note that in each of FIGS. 84A and 84B, the vertical axis represents current density (A/cm$^2$), and the horizontal axis represents the intensity of an electric field (MV/cm) applied to the gate insulator. Note that it is assumed that leakage current is generated when the current density is higher than or equal to $1.0\times10^{-6}$ A/cm$^2$.

The results in FIGS. 84A and 84B confirm that the generation of leakage current in Sample J2 fabricated in this example is suppressed until the electric field intensity reaches 8 MV/cm ($8.0\times10^6$ V/cm). It can be found that the thickness of the gate insulator can be decreased because the surface of the oxide semiconductor is flat. In addition, since the surface of the oxide semiconductor is flat, the dielectric strength of a transistor in one embodiment of the present invention can be 8 MV/cm or more, preferably 10 MV/cm ($1.0\times10^7$ V/cm) or more.

<3-5. Cross-Sectional Observation>

Figure 85A:
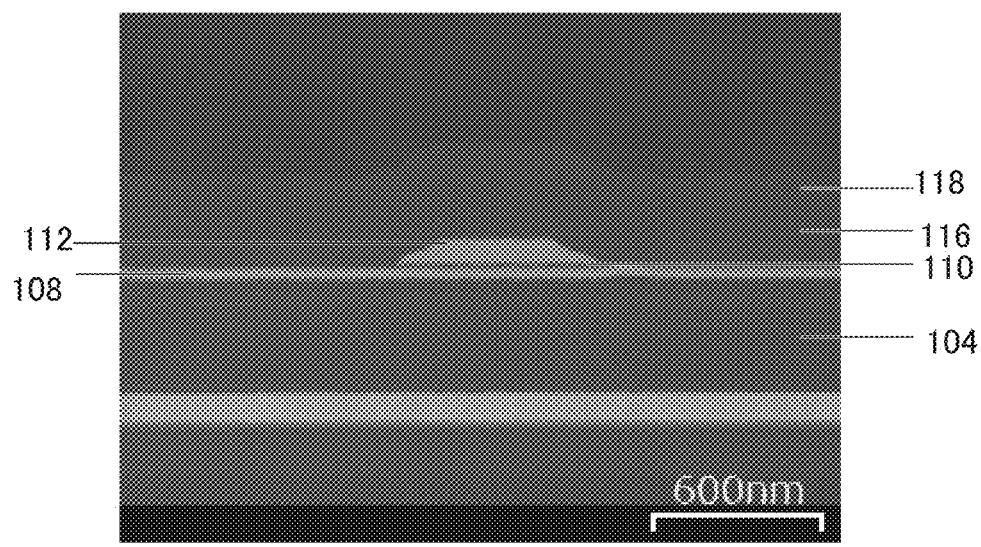
FIGS. 85A and 85B show a cross-sectional photograph and $I_d$-$V_g$ characteristics of a transistor in Example.
Figure 85B:
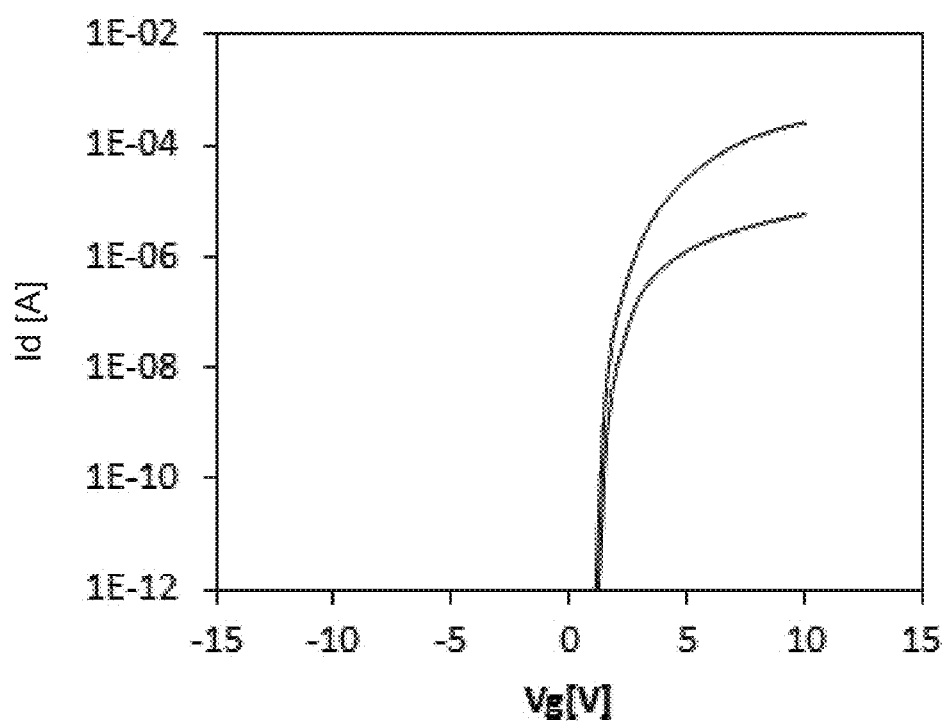

Next, a cross section in the channel length direction of the transistor with a channel length L of 0.7 μm and a channel width W of 50 μm in Sample J2 fabricated as described above was observed, and the $I_d$-$V_g$ characteristics of the transistor were measured. FIG. 85A shows the observed cross section, and FIG. 85B shows the measured $I_d$-$V_g$ characteristics. Note that the cross section was observed under conditions similar to those in <2-2. Cross-sectional observation>. The $I_d$-$V_g$ characteristics were measured under conditions similar to those in <3-2. $I_d$-$V_g$ characteristics>.

The observed cross section of Sample J2 confirms that the upper surfaces of the conductor 112 and the oxide semiconductor 108 are flat and not rough. The results in FIG. 85B confirm that Sample J2 fabricated in this example includes a transistor which exhibits high field-effect mobility and little variation in electrical characteristics.

The structure described in this example can be combined as appropriate with any of the structures described in other examples and the above embodiments.

EXAMPLE 4

Figure 86A:
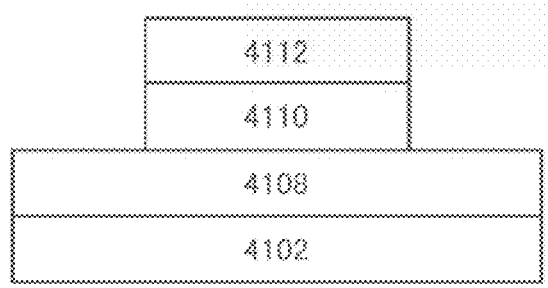
FIGS. 86A to 86C show a cross-sectional structure and results of surface roughness measurement of samples in Example.

In this example, Samples K1 and K2 having a structure illustrated in FIG. 86A were fabricated and subjected to surface roughness measurement.

Samples K1 and K2 fabricated in this example will be described below. Note that reference numerals used for the structure in FIG. 86A are used in the following description.
<4-1. Methods for Fabricating Samples K1 and K2>

First, an oxide semiconductor 4108 was formed over a substrate 4102. A glass substrate was used as the substrate 4102. The oxide semiconductor 4108 was formed with a sputtering apparatus.

As the oxide semiconductor 4108, a 30-nm-thick oxide semiconductor was deposited under the following conditions: the substrate temperature was 170° C.; an argon gas at a flow rate of 35 sccm and an oxygen gas at a flow rate of 15 sccm were introduced into a chamber; the pressure was 0.2 Pa; and an AC power of 1500 W was supplied to the metal oxide target (In:Ga:Zn=4:2:4.1 [atomic ratio]) placed in the sputtering apparatus.

After that, an insulator 4110 was formed over the oxide semiconductor 4108.

For the insulator 4110, a 30-nm-thick first silicon oxynitride film, a 100-nm-thick second silicon oxynitride film, and a 20-nm-thick third silicon oxynitride film were formed with a plasma CVD apparatus. The first silicon oxynitride film was formed under the following conditions: the substrate temperature was 350° C.; a silane gas at a flow rate of 20 sccm and a dinitrogen monoxide gas at a flow rate of 3000 sccm were introduced into a chamber; the pressure was 200 Pa; and an RF power of 100 W was supplied between parallel-plate electrodes provided in the plasma CVD apparatus. The second silicon oxynitride film was formed under the following conditions: the substrate temperature was 220° C.; a silane gas at a flow rate of 160 sccm and a dinitrogen monoxide gas at a flow rate of 4000 sccm were introduced into the chamber; the pressure was 200 Pa; and an RF power of 1500 W was supplied between the parallel-plate electrodes provided in the plasma CVD apparatus. The third silicon oxynitride film was formed under the same conditions as the first silicon oxynitride film.

Subsequently, a conductor 4112 was formed over the insulator 4110. For the conductor 4112, a 10-nm-thick first In—Ga—Zn oxide and a 90-nm-thick second In—Ga—Zn oxide were formed with a sputtering apparatus. The first In—Ga—Zn oxide was formed under the following conditions: the substrate temperature was 170° C.; an oxygen gas at a flow rate of 200 sccm was introduced into a chamber; the pressure was 0.6 Pa; and an AC power of 2500 W was supplied to the metal oxide target (In:Ga:Zn=4:2:4.1 [atomic ratio]) placed in the sputtering apparatus. The second In—Ga—Zn oxide was formed under the following conditions: the substrate temperature was 170° C.; an argon gas at a flow rate of 180 sccm and an oxygen gas at a flow rate of 20 sccm were introduced into the chamber; the pressure was 0.6 Pa; and an AC power of 2500 W was supplied to the metal oxide target (In:Ga:Zn=4:2:4.1 [atomic ratio]) placed in the sputtering apparatus.

After that, the insulator 4110 and the conductor 4112 were processed into island shapes with a dry etching apparatus and a surface of the oxide semiconductor 4108 was partly exposed.

Next, plasma treatment was performed from above the oxide semiconductor 4108 and the conductor 4112.

To fabricate Sample K1, the plasma treatment was performed under the following conditions: the substrate temperature was 220° C.; an argon gas at a flow rate of 100 sccm and a nitrogen gas at a flow rate of 1000 sccm were introduced into a chamber; the pressure was 40 Pa; and an RF power of 1000 W was supplied between parallel-plate electrodes provided in a plasma CVD apparatus.

To fabricate Sample K2, the plasma treatment was performed under the following conditions: the substrate temperature was 220° C.; an argon gas at a flow rate of 100 sccm was introduced into a chamber; the pressure was 40 Pa; and an RF power of 1000 W was supplied between parallel-plate electrodes provided in a plasma CVD apparatus.

Through the above steps, Samples K1 and K2 of this example were fabricated.
<4-2. Results of Surface Roughness Measurement>

The surface roughness of the oxide semiconductor 4108 in each of Samples K1 and K2 fabricated as described above was measured with SPA-500 manufactured by SII NanoTechnology Inc. The measured area was 1 μm×1 μm, the measurement mode was DFM, and an SI-DF40 cantilever (with back-side Al) was used. Note that the average surface roughness (Ra) of a formation surface (here, the oxide semiconductor 4108) in the area of 1 μm×1 μm, the root-mean-square (RMS) roughness thereof in the area of 1 μm×1 μm, and the maximum peak-to-valley height (P-V) thereof in the area of 1 μm×1 μm were measured.

Figure 86B:
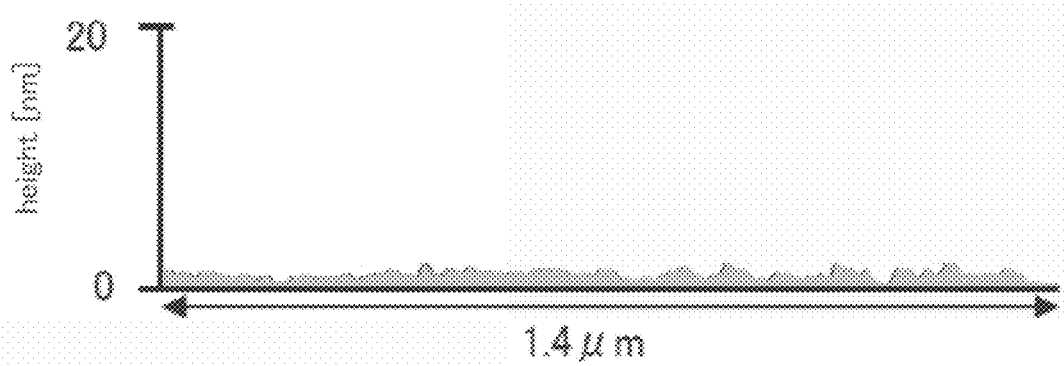
Figure 86C:
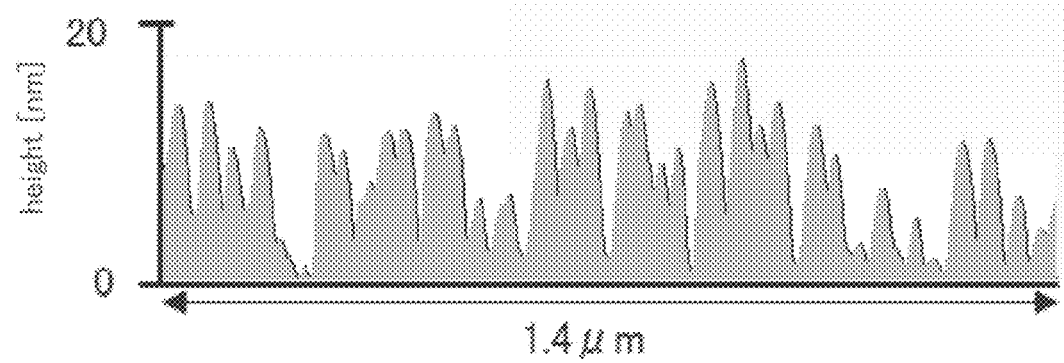

FIG. 86B shows the Ra profile of Sample K1, and FIG. 86C shows the Ra profile of Sample K2. Table 1 shows quantified results of surface roughness measurement of the samples.

TABLE 1

| | Ra [nm] | RMS [nm] | P-V [nm] |
|---|---|---|---|
| Sample K1 | 0.3269 | 0.5186 | 9.494 |
| Sample K2 | 3.478 | 4.126 | 27.28 |

The results show that the average surface roughness, the root-mean-square roughness, and the maximum peak-to-valley height of Sample K1 are one-tenth, one-eighth, and one-third of those of Sample K2, respectively. Therefore, it has been confirmed that Sample K1 has higher flatness than Sample K2. It is suggested that this is attributable to the conditions of the plasma treatment performed from above the oxide semiconductor 4108. The plasma treatment for Sample K1 was performed in the mixed atmosphere of an argon gas and a nitrogen gas, whereas the plasma treatment for Sample K2 was performed in the argon gas atmosphere. Accordingly, it has been confirmed that the surface roughness of an oxide semiconductor can be reduced by using the manufacturing method of one embodiment of the present invention.

The structure described in this example can be combined as appropriate with any of the structures described in other examples and the above embodiments.

EXPLANATION OF REFERENCE

100: transistor, 100A: transistor, 100B: transistor, 100C: transistor, 100D: transistor, 100E: transistor, 100F: transistor, 100G: transistor, 100H: transistor, 100J: transistor, 100K: transistor, 100L: transistor, 100M: transistor, 100N: transistor, 100P: transistor, 100Q: transistor, 100R: transistor, 100S: transistor, 100T: transistor, 100U: transistor, 100V: transistor, 100W: transistor, 100X: transistor, 100Y: transistor, 100Z: transistor, 102: substrate, 104: insulator, 106: conductor, 107: oxide semiconductor, 108: oxide semiconductor, 108_1: oxide semiconductor, 108_2: oxide semiconductor, 108_3: oxide semiconductor, 108*f*: region, 108*i*: region, 108*s*: region, 108*d*: region, 110: insulator, 110_0: insulator, 111: metal oxide, 111_0: metal oxide, 112: conductor, 112_0: conductor, 113: metal oxide, 113_0: metal oxide, 113_1: metal oxide, 116: insulator, 118: insulator, 120*a*: conductor, 120*b*: conductor, 121*a*: conductor, 121*b*: conductor, 122: insulator, 140: mask, 141*a*: opening, 141*b*: opening, 143: opening, 201: transistor, 203: transistor, 207*a*: liquid crystal element, 207*b*: liquid crystal element, 211: substrate, 212: insulator, 213: insulator, 215: insulator, 217: insulator, 219: insulator, 223: oxide semiconductor, 241: coloring film, 243: light-blocking film, 245: insulator, 247: spacer, 249: liquid crystal, 251: conductor, 252: conductor, 253: insulator, 255: conductor, 261: substrate, 305: substrate, 310: conductor, 312: conductor, 315: conductor, 320: conductor, 325: conductor, 330: resist, 332: exposed region, 335: unexposed region, 336: exposed region, 338: unexposed region, 340: resist mask, 345: resist mask, 350: insulator, 355: insulator, 360: photomask, 362: photomask, 501: pixel circuit, 501*t*: transistor, 505*t*: transistor, 506*t*: transistor, 502: pixel portion, 504: driver circuit portion, 504*a*: gate driver, 504*b*: source driver, 506: protection circuit, 507: terminal portion, 510: display device, 511: substrate, 512: substrate, 514: display portion, 516: circuit, 518: wiring, 520: IC, 522: FPC, 524: electrode, 526: opening, 530: insulating layer, 531: insulating layer, 532: coloring layer, 534: bonding layer, 535: bonding layer, 536: light-blocking layer, 537: electrode, 538*a*: alignment film, 538*b*: alignment film, 539: insulating layer, 540: polarizing plate, 541: liquid crystal layer, 542: electrode, 543: connection portion, 544: conductive layer, 545: conductive layer, 546: connection portion, 547: connector, 548: electrode, 550: transistor, 552: transistor, 554: transistor, 560: capacitor, 562: capacitor, 570: liquid crystal element, 572: light-emitting element, 600: data processor, 610: arithmetic device, 611: arithmetic portion, 612: memory portion, 614: transmission path, 615: input/output interface, 620: input/output device, 630: display portion, 640: input portion, 650: sensor portion, 681: region, 682: pointer, 690: communication portion, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 574: liquid crystal element, 576: EL layer, 577: electrode, 578: insulating layer, 579: conductive layer, 580: insulating layer, 581: insulating layer, 582: insulating layer, 583: insulating layer, 584: conductive layer, 585: conductive layer, 586: semiconductor layer, 587: conductive layer, 588: light-emitting element, 589: connection portion, 590: connection layer, 730: insulator, 732: sealing film, 734: insulator, 736: coloring film, 738: light-shielding film, 750: transistor, 752: transistor, 760: connection electrode, 770: planarization insulator, 772: conductor, 773: insulator, 774: conductor, 775: liquid crystal element, 776: liquid crystal layer, 778: structure, 780: anisotropic conductor, 782: light-emitting element, 784: conductor, 786: EL layer, 788: conductor, 790: capacitor, 800: inverter, 810: OS transistor, 820: OS transistor, 831: signal waveform, 832: signal waveform, 840: dashed line, 841: solid line, 850: OS transistor, 860: CMOS inverter, 900: semiconductor device, 901: power supply circuit, 902: circuit, 903: voltage generation circuit, 903A: voltage generation circuit, 903B: voltage generation circuit, 903C: voltage generation circuit, 903D: voltage generation circuit, 903E: voltage generation circuit, 904: circuit, 905: voltage generation circuit, 905A: voltage generation circuit, 905E: voltage generation circuit, 906: circuit, 911: transistor, 912: transistor, 912A: transistor, 912B: transistor, 921: control circuit, 922: transistor, 1102: substrate, 1108: oxide semiconductor, 1110: insulator, 1280*a*: p-channel transistor, 1280*b*: n-channel transistor, 1280*c*: n-channel transistor, 1281: capacitor, 1282: transistor, 1311: wiring, 1312: wiring, 1313: wiring, 1314: wiring, 1315: wiring, 1316: wiring, 1317: wiring, 1351: transistor, 1352: transistor, 1353: transistor, 1354: transistor, 1360: photoelectric conversion element, 1401: signal, 1402: signal, 1403: signal, 1404: signal, 1405: signal, 1501C: insulating film, 1504: conductive film, 1505: bonding layer, 1506: insulating film, 1507: metal oxide film, 1508: semiconductor film, 1511B: conductive film, 1511C: conductive film, 1512A: conductive film, 1512B: conductive film, 1516: insulating film, 1518: insulating film, 1519B: terminal, 1519C: terminal, 1520: functional layer, 1521: insulating film, 1522: contact portion, 1524: conductive film, 1528: insulating film, 1530: pixel circuit, 1550: display element, 1551: electrode, 1552: electrode, 1553: layer, 1570: substrate, 1591A: opening, 1591B: opening 1591C: opening, 1700: display panel, 1702: pixel, 1705: sealant, 1750: display element, 1751: electrode, 1751H: opening, 1752: electrode, 1753: layer, 1770: substrate, 1770P: functional film, 1771: insulating film, 4102: substrate, 4108: oxide semiconductor, 4110: insulator, 4112: conductor, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal, 9500: display device, 9501: display panel, 9502: display region, 9503: region, 9511: hinge, and 9512: bearing.

This application is based on Japanese Patent Application serial no. 2015-201657 filed with Japan Patent Office on Oct. 12, 2015 and Japanese Patent Application serial no. 2015-201671 filed with Japan Patent Office on Oct. 12, 2015, the entire contents of which are hereby incorporated by reference.

The invention claimed is:

1. A method for manufacturing a semiconductor device, comprising the steps of:

forming an oxide semiconductor film over a substrate;

forming an insulating film over the oxide semiconductor film;

forming a metal oxide film over the insulating film;

forming a conductive film over the metal oxide film;

exposing a portion of the oxide semiconductor film by removing a portion of the conductive film, the metal oxide film, and the insulating film over the oxide semiconductor film;

forming a source region and a drain region in the oxide semiconductor film by performing plasma treatment on a surface of the exposed portion of the oxide semiconductor film; and forming a nitride insulating film over the exposed portion of the oxide semiconductor film and over the conductive film, wherein the plasma treatment is performed in a mixed atmosphere comprising an argon gas and a nitrogen gas, and wherein in the mixed atmosphere, a flow rate of the nitrogen gas is 10 times as large as a flow rate of the argon gas.

2. The method for manufacturing a semiconductor device according to claim 1, wherein the plasma treatment is performed at a temperature higher than or equal to 150° C. and lower than 300° C.

3. The method for manufacturing a semiconductor device according to claim 1, wherein the formation of the nitride insulating film is performed at a temperature higher than or equal to 150° C. and lower than 300° C.

4. The method for manufacturing a semiconductor device according to claim 1, wherein the plasma treatment and the formation of the nitride insulating film are successively performed using a plasma-enhanced chemical vapor deposition apparatus.

5. The method for manufacturing a semiconductor device according to claim 1, wherein the metal oxide film functions as a gate insulator.

6. The method for manufacturing a semiconductor device according to claim 1, wherein the metal oxide film functions as a gate electrode.

7. A method for manufacturing an electronic device,
wherein the electronic device comprises a semiconductor device, an antenna, a battery, an operation key, or a housing, and
wherein the semiconductor device is manufactured by the method for manufacturing a semiconductor device according to claim 1.

8. The method for manufacturing a semiconductor device according to claim 1, wherein the plasma treatment and the formation of the nitride insulating film are successively performed in a vacuum.

9. A method for manufacturing a semiconductor device, comprising the steps of:
forming an oxide semiconductor film over a substrate;
forming an insulating film over the oxide semiconductor film;
forming a metal oxide film over the insulating film;
forming a conductive film over the metal oxide film;
exposing a portion of the oxide semiconductor film by removing a portion of the conductive film, the metal oxide film, and the insulating film over the oxide semiconductor film;
forming a source region and a drain region in the oxide semiconductor film by performing plasma treatment on a surface of the exposed portion of the oxide semiconductor film; and
forming a nitride insulating film over the exposed portion of the oxide semiconductor film and over the conductive film, wherein the plasma treatment is performed in a mixed atmosphere comprising an argon gas and a nitrogen gas, wherein the plasma treatment and the formation of the nitride insulating film are successively performed using the same apparatus, and wherein in the mixed atmosphere, a flow rate of the nitrogen gas is 10 times as large as a flow rate of the argon gas.

10. The method for manufacturing a semiconductor device according to claim 9, wherein the plasma treatment is performed at a temperature higher than or equal to 150° C. and lower than 300° C.

11. The method for manufacturing a semiconductor device according to claim 9, wherein the formation of the nitride insulating film is performed at a temperature higher than or equal to 150° C. and lower than 300° C.

12. The method for manufacturing a semiconductor device according to claim 9, wherein the plasma treatment and the formation of the nitride insulating film are successively performed using a plasma-enhanced chemical vapor deposition apparatus.

13. The method for manufacturing a semiconductor device according to claim 9, wherein the metal oxide film functions as a gate insulator.

14. The method for manufacturing a semiconductor device according to claim 9, wherein the metal oxide film functions as a gate electrode.

15. A method for manufacturing an electronic device,
wherein the electronic device comprises a semiconductor device, an antenna, a battery, an operation key, or a housing, and
wherein the semiconductor device is manufactured by the method for manufacturing a semiconductor device according to claim 9.

16. The method for manufacturing a semiconductor device according to claim 9, wherein the plasma treatment and the formation of the nitride insulating film are successively performed in a vacuum.

* * * * *